US011963389B2

(12) United States Patent
Fusella et al.

(10) Patent No.: US 11,963,389 B2

(45) **Date of Patent: *Apr. 16, 2024**

(54) PLASMONIC OLEDS AND VERTICAL DIPOLE EMITTERS

(71) Applicant: Universal Display Corporation, Ewing, NJ (US)

(72) Inventors: Michael Fusella, Lawrenceville, NJ (US); Nicholas J. Thompson, New Hope, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/083,809

(22) Filed: Dec. 19, 2022

(65) Prior Publication Data

US 2023/0129581 A1 Apr. 27, 2023

Related U.S. Application Data

(63) Continuation of application No. 17/229,136, filed on Apr. 13, 2021, now Pat. No. 11,569,480, which is a (Continued)

(51) Int. Cl.

*H01L 33/00* (2010.01)
*H01L 33/44* (2010.01)

(Continued)

(52) U.S. Cl.

CPC ............. *H10K 50/85* (2023.02); *H01L 33/44* (2013.01); *H10K 50/11* (2023.02);

(Continued)

(58) Field of Classification Search

CPC ........... H01L 2251/552; H01L 51/5262; H01L 51/5012

See application file for complete search history.

(56) References Cited

U.S. PATENT DOCUMENTS 4,769,292 A 9/1988 Tang
5,061,569 A 10/1991 Vanslyke (Continued)

FOREIGN PATENT DOCUMENTS

EP 0650955 5/1995
EP 1725079 11/2006

(Continued)

OTHER PUBLICATIONS

1 Japanese Office Action (including English translation) issued in App. No. JP2020-042874, dated Apr. 18, 2023, 10 pages.

(Continued)

*Primary Examiner* — Nicholas J Tobergte

(74) *Attorney, Agent, or Firm* — Butzel Long

(57) ABSTRACT

Provided are compounds, formulations comprising compounds, and devices that utilize compounds, where the devices include a substrate, a first electrode, an organic emissive layer comprising an organic emissive material disposed over the first electrode. The device includes an enhancement layer, comprising a plasmonic material exhibiting surface plasmon resonance that non-radiatively couples to the organic emissive material and transfers excited state energy from the organic emissive material to the non-radiative mode of surface plasmon polaritons. The enhancement layer is provided no more than a threshold distance away from the organic emissive layer, where the organic emissive material has a total non-radiative decay rate constant and a total radiative decay rate constant due to the presence of the enhancement layer. At least one of the organic emissive material and the organic emissive layer has a vertical dipole ratio (VDR) value of equal or greater than 0.33.

20 Claims, 31 Drawing Sheets

Example Inorganic LED design

Example Inorganic LED with enhancement layer and nanoparticle outcoupling

Related U.S. Application Data continuation-in-part of application No. 16/814,858, filed on Mar. 10, 2020, now Pat. No. 11,139,442.

(60) Provisional application No. 63/078,084, filed on Sep. 14, 2020, provisional application No. 63/072,550, filed on Aug. 31, 2020, provisional application No. 63/058,410, filed on Jul. 29, 2020, provisional application No. 63/050,562, filed on Jul. 10, 2020, provisional application No. 62/870,272, filed on Jul. 3, 2019, provisional application No. 62/817,424, filed on Mar. 12, 2019, provisional application No. 62/817,284, filed on Mar. 12, 2019, provisional application No. 62/817,368, filed on Mar. 12, 2019.

(51) Int. Cl.

| | |
|---|---|
| ***H10K 50/11*** | (2023.01) |
| ***H10K 50/85*** | (2023.01) |
| *H10K 101/10* | (2023.01) |
| *H10K 101/30* | (2023.01) |
| *H10K 102/00* | (2023.01) |

(52) U.S. Cl.

CPC ..... *H10K 2101/10* (2023.02); *H10K 2101/30* (2023.02); *H10K 2102/3031* (2023.02); *H10K 2102/331* (2023.02)

(56) References Cited

U.S. PATENT DOCUMENTS

| | | | |
|---|---|---|---|
| 5,247,190 | A | 9/1993 | Friend |
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 6,528,187 | B1 | 3/2003 | Okada |
| 6,687,266 | B1 | 2/2004 | Ma |
| 6,835,469 | B2 | 12/2004 | Kwong |
| 6,921,915 | B2 | 7/2005 | Takiguchi |
| 7,087,321 | B2 | 8/2006 | Kwong |
| 7,090,928 | B2 | 8/2006 | Thompson |
| 7,154,114 | B2 | 12/2006 | Brooks |
| 7,250,226 | B2 | 7/2007 | Tokito |
| 7,279,704 | B2 | 10/2007 | Walters |
| 7,332,232 | B2 | 2/2008 | Ma |
| 7,338,722 | B2 | 3/2008 | Thompson |
| 7,393,599 | B2 | 7/2008 | Thompson |
| 7,396,598 | B2 | 7/2008 | Takeuchi |
| 7,431,968 | B1 | 10/2008 | Shtein |
| 7,445,855 | B2 | 11/2008 | Mackenzie |
| 7,534,505 | B2 | 5/2009 | Lin |
| 7,750,352 | B2 | 7/2010 | Thurk |
| 7,968,146 | B2 | 6/2011 | Wagner |
| 8,557,400 | B2 | 10/2013 | Xia |
| 9,318,721 | B2 | 4/2016 | Carroll |
| 9,960,386 | B2 | 5/2018 | Thompson |
| 10,403,854 | B2 | 9/2019 | Thompson |
| 10,522,787 | B1 | 12/2019 | Montgomery |
| 10,600,980 | B1 | 3/2020 | Boardman |
| 10,663,631 | B2 | 5/2020 | Mikkelsen |
| 11,056,540 | B2 | 7/2021 | Thompson |
| 11,569,480 | B2 * | 1/2023 | Fusella .................. H01L 33/44 |
| 2002/0034656 | A1 | 3/2002 | Thompson |
| 2002/0134984 | A1 | 9/2002 | Igarashi |
| 2002/0158242 | A1 | 10/2002 | Son |
| 2003/0138657 | A1 | 7/2003 | Li |
| 2003/0152802 | A1 | 8/2003 | Tsuboyama |
| 2003/0162053 | A1 | 8/2003 | Marks |
| 2003/0175553 | A1 | 9/2003 | Thompson |
| 2003/0230980 | A1 | 12/2003 | Forrest |
| 2004/0036077 | A1 | 2/2004 | Ise |
| 2004/0137267 | A1 | 7/2004 | Igarashi |
| 2004/0137268 | A1 | 7/2004 | Igarashi |
| 2004/0174116 | A1 | 9/2004 | Lu |
| 2005/0025993 | A1 | 2/2005 | Thompson |
| 2005/0112407 | A1 | 5/2005 | Ogasawara |
| 2005/0238919 | A1 | 10/2005 | Ogasawara |
| 2005/0244673 | A1 | 11/2005 | Satoh |
| 2005/0260441 | A1 | 11/2005 | Thompson |
| 2005/0260449 | A1 | 11/2005 | Walters |
| 2006/0008670 | A1 | 1/2006 | Lin |
| 2006/0202194 | A1 | 9/2006 | Jeong |
| 2006/0240279 | A1 | 10/2006 | Adamovich |
| 2006/0251923 | A1 | 11/2006 | Lin |
| 2006/0263635 | A1 | 11/2006 | Ise |
| 2006/0280965 | A1 | 12/2006 | Kwong |
| 2007/0190359 | A1 | 8/2007 | Knowles |
| 2007/0278938 | A1 | 12/2007 | Yabunouchi |
| 2008/0015355 | A1 | 1/2008 | Schafer |
| 2008/0018221 | A1 | 1/2008 | Egen |
| 2008/0106190 | A1 | 5/2008 | Yabunouchi |
| 2008/0124572 | A1 | 5/2008 | Mizuki |
| 2008/0220265 | A1 | 9/2008 | Xia |
| 2008/0297033 | A1 | 12/2008 | Knowles |
| 2009/0008605 | A1 | 1/2009 | Kawamura |
| 2009/0009065 | A1 | 1/2009 | Nishimura |
| 2009/0017330 | A1 | 1/2009 | Iwakuma |
| 2009/0030202 | A1 | 1/2009 | Iwakuma |
| 2009/0039776 | A1 | 2/2009 | Yamada |
| 2009/0045730 | A1 | 2/2009 | Nishimura |
| 2009/0045731 | A1 | 2/2009 | Nishimura |
| 2009/0101870 | A1 | 4/2009 | Prakash |
| 2009/0108737 | A1 | 4/2009 | Kwong |
| 2009/0115316 | A1 | 5/2009 | Zheng |
| 2009/0165846 | A1 | 7/2009 | Johannes |
| 2009/0167162 | A1 | 7/2009 | Lin |
| 2009/0179554 | A1 | 7/2009 | Kuma |
| 2011/0037057 | A1 | 2/2011 | Lecloux |
| 2013/0146878 | A1 | 6/2013 | Oh |
| 2015/0041780 | A1 | 2/2015 | Ma |
| 2017/0077425 | A1 | 3/2017 | Ma |
| 2017/0133631 | A1 | 5/2017 | Thompson |
| 2017/0229663 | A1 | 8/2017 | Tsai |
| 2017/0299784 | A1 | 10/2017 | Mikkelsen |
| 2017/0324057 | A1 | 11/2017 | Friend |
| 2018/0212201 | A1 | 7/2018 | Bai |
| 2019/0081248 | A1 | 3/2019 | Lin |
| 2020/0176700 | A1 | 6/2020 | Fusella |
| 2020/0295093 | A1 | 9/2020 | Thompson |
| 2021/0249633 | A1 | 8/2021 | Fusella |
| 2022/0013731 | A1 | 1/2022 | Lin |
| 2022/0181561 | A1 | 6/2022 | Fleetham |

FOREIGN PATENT DOCUMENTS

| | | | |
|---|---|---|---|
| EP | 2034538 | | 3/2009 |
| EP | 3168890 | A1 | 5/2017 |
| JP | 2005011610 | | 1/2005 |
| JP | 2007123392 | | 5/2007 |
| JP | 2007254297 | | 10/2007 |
| JP | 2008074939 | | 4/2008 |
| JP | 2017526119 | | 9/2017 |
| KR | 20120003439 | | 1/2012 |
| KR | 20170012429 | | 2/2017 |
| KR | 20170036051 | | 3/2017 |
| NO | 2006100298 | | 9/2006 |
| WO | 0139234 | | 5/2001 |
| WO | 0202714 | | 1/2002 |
| WO | 02015645 | | 2/2002 |
| WO | 03040257 | | 5/2003 |
| WO | 03060956 | | 7/2003 |
| WO | 2004093207 | | 10/2004 |
| WO | 2004107822 | | 12/2004 |
| WO | 2005014551 | | 2/2005 |

(56) References Cited

FOREIGN PATENT DOCUMENTS

| | | |
|---|---|---|
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006095951 | 9/2006 |
| WO | 2006098120 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008057394 A1 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2010011390 A2 | 1/2010 |
| WO | 2016108990 A2 | 7/2016 |
| WO | 2020036278 | 2/2020 |

OTHER PUBLICATIONS

Mi, Bao-Xiu et al., "Thermally Stable Hole-Transporting Material for Organic Light-Emitting Diode: an Isoindole Derivative," Chem. Mater., 15(16):3148-3151 (2003).
Niu, Yu-Hua et al., "Highly Efficient Electrophosphorescent Devices with Saturated Red Emission from a Neutral Osmium Complex," Chem. Mater., 17(13):3532-3536 (2005).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
Tung, Yung-Liang et al., "Organic Light-Emitting Diodes Based on Charge-Neutral Rull PHosphorescent Emitters," Adv. Mater., 17(8):1059-1064 (2005).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
European Patent Office Communication pursuant to Article 94(3) EPC issued in App. No. EP20162531.6, dated May 2, 2022, 10 pages.
Hong Wonbin et al: "Optically Invisible Antenna Integrated Within an OLED Touch Display Panel for IoT Applications", IEEE Transactions on Antennas and Propagation, IEEE, USA, vol. 65, No. 7, Jul. 1, 2017 (Jul. 1, 2017), pp. 3750-3755, XP011655742, ISSN: 0018-926X, DOI: 10.1109/TAP.2017.2705127 [retrieved on Jul. 3, 2017].
Hong Wonbin et al: "Invisible antennas using mesoscale conductive polymer wires embedded within OLED displays", 2017 11th European Conference on Antennas and Propagation (EUCAP), EURAPP, Mar. 19, 2017 (Mar. 19, 2017), pp. 2809-2811, XP033097565, DOI: 10.23919/EUCAP.2017.7928446 [retrieved on May 15, 2017].
Huang Kevin C yet al: "Supplementary Information: Antenna-electrodes for controlling electroluminescence", Nature Communications 3, 1005 (2012), Aug. 14, 2012 (Aug. 14, 2012), XP055866309, DOI: 10.1038/ncomms1985 Retrieved from the Internet: URL:https://static-content.springer.com/esm/art%3A10.1038%2Fncomms1985/MediaObjects/41467_2012_BFncomms1985_MOESM1009_ESM.pdf [retrieved on Nov. 26, 2021].
Kroger M et al: "p. type doping of organic wide band gap materials by transition metal oxides: A case-study on Molybdenum trioxide", Organic Electronics, Elsevier, Amsterdam, NL, vol. 10, No. 5, Aug. 1, 2009 (Aug. 1, 2009), pp. 932-938, XP026235906, ISSN: 1566-1199, DOI: 10.1016/J.ORGEL.2009.05.007.
Markus Gantenbein et al: "New 4,4'-Bis(9-carbazolyl)-Biphenyl Derivatives with Locked Carbazole-Biphenyl Junctions: High-Triplet State Energy Materials", Chemistry of Materials, vol. 27, No. 5, Mar. 10, 2015 (Mar. 10, 2015), pp. 1772-1779, XP055191916, ISSN: 0897-4756, DOI: 10.1021/cm5045754.
Ting Zhang et al: "A CBP derivative as bipolar host for performance enhancement in phosphorescent organic light-emitting diodes", Journal of Materials Chemistry C, vol. 1, No. 4, Jan. 1, 2013 (Jan. 1, 2013), pp. 757-764, XP055191881, ISSN: 2050-7526, DOI: 10.1039/C2TC00305H.
Jung-Hwan Park et al: "New Bipolar Green Host Materials Containing Benzimidazole-Carbazole Moiety in Phosphorescent OLEDs", Bulletin of the Korean Chemical Society, vol. 32, No. 3, Mar. 20, 2011 (Mar. 20, 2011), pp. 841-846, XP055191890, ISSN: 0253-2964, DOI: 10.5012/bkcs.2011.32.3.841.
Namdas Ebinazar et al: "Simple color tuning of phosphorescent dendrimer light emitting diodes", Applied Physics Letters, A I P. Publishing LLC, US, vol. 86, No. 16, Apr. 11, 2005 (Apr. 11, 2005), pp. 161104-161104, XP012065079, ISSN: 0003-6951, DOI: 10.1063/1.1899256.
Extended European Search Report issued in App. No. EP22150265.1, dated May 31, 2022, 10 pages.
Wang et al., "Enhanced performance of solution-processed OLEDs by altering the molecular transition dipole moment orientation of emission layers", 2022, Spectrochimica Acta Part A: Molecular and Biomolecular Spectroscopy 271 pp. 1-6 (Year: 2022).
Baldo et al. "Highly efficient phosphorescent emission from organic electroluminescent devices", Nature, vol. 395, pp. 151-154, 1998.
Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.
Akselrod et al., "Probing the mechanisms of large Purcell enhancement in plasmonic nanoantennas", nature photonics, published online Oct. 12, 2014, p. 1-6.
Atzrodt et al., "The Renaissance of H/D Exchange", Angewandte Chemie, Angew. Chem. Int. Ed. 2007, 46, 7744-7765.
George et al., "Electrically tunable diffraction efficiency from gratings in Al-doped ZnO", Applied Physics Letters 110, 071110, 2017.
Hu et al., "A convenient synthesis of deuterium labeled amines and nitrogen heterocycles with KOt—Bu/DMSO—d6", Elsevier, Tetrahedron 71, 2015, 1425-1430.
Lassiter et al., "Plasmonic waveguide modes of film-coupled metallic nanocubes", Nano Letters, 201, 3, 13, 5866-5872downloaded via Universal Display Corp on Aug. 31, 2018, https://pubs.acs.org/sharingguidelines.
European Extended Search Report issued in EP20162531.6, dated Jul. 10, 2020, 9 pages.
In-Hwan Lee et al: "Performance enhancement of GaN-based light emitting diodes by the interaction with localized surface plasmons", Nano Energy, vol. 13, Apr. 1, 2015 (Apr. 1, 2015), pp. 140-173, XP055708113, ISSN: 2211-2855.
Kevin C.Y. Huang et al: "Antenna electrodes for controlling electroluminescence", Nature Communications, vol. 3, Aug. 14, 2012 (Aug. 14, 2012), p. 1005.
Yook, K. S., Chin, B. D., Lee, J. Y., Lassiter, B. E., and Forrest, S. R. "Vertical Orientation of Copper Phthalocyanine in Organic Solar

(56) References Cited

OTHER PUBLICATIONS

Cells Using a Small Molecular Weight Organic Templating Layer," Appl. Phys. Lett. 99, 043308 (2011).
Rand, B. P., Cheyns, D. Vasseur, K., Giebink, N. C., Mothy, S., Yi, Y., Coropceanu, V., Beljonne, D., Cornil, J., Bredas, J.-L., Genoe, J. "The impact of Molecular Orientation on the Photovoltaic Properties of a Phthalocyanine/Fullerene Heterojunction" Adv. Funct. Mater. 2012, 22, 2987-2995.
Barnes, W. L. "Fluorescence near interfaces: the role of photonic mode density" J. Mod. Opt. 1998, 45, 4, 661-699.
Adachi et al., "Nearly 100% Internal Phosphorescence Efficiency in an Organic Light Emitting Device," J. Appl. Phys., vol. 90, No. 10, 5048-5051 (2001).
Adachi, Chihaya et al., "High-Efficiency Red Electrophosphorescence Devices," Appl. Phys. Lett., 78(11):1622-1624 (2001).
Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.
Gao, Zhiqiang et al., "Bright-Blue Electroluminescence From a Silyl-Substituted ter-(phenylene-vinylene) derivative," Appl. Phys. Lett., 74(6):865-867 (1999).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi and Tokito, Shizuo, "Highly Efficient Phosphorescence From Organic Light-Emitting Devices with an Exciton-Block Layer," Appl. Phys. Lett., 79(2):156-158 (2001).
Ikeda, Hisao et al., "p. 185: Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., "1,2,4-Triazole Derivative as an Electron Transport Layer in Organic Electroluminescent Devices", Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong et al., "High Operational Stability of Electrophosphorescent Devices," Appl. Phys. Lett., vol. 81, No. 1, 162-164 (2002).
Lamansky, Sergey et al., "Synthesis and Characterization of Phosphorescent Cyclometalated Iridium Complexes," Inorg. Chem., 40(7):1704-1711 (2001).
Ma, Yuguang et al., "Triplet Luminescent Dinuclear-Gold(/) Complex-Based Light-Emitting Diodes with Low Turn-On voltage, " Appl. Phys. Lett, 74(10):1361-1363 (1999).
Nishida, Jun-ichi et al., "Preparation, Characterization, and Electroluminescence Characteristics of alpha-Diimine-type Platinum(II) Complexes with Perfluorinated Phenyl Groups as Ligands," Chem. Lett., 34(4):592-593 (2005).
Noda, Tetsuya and Shirota, Yasuhiko, "5,5'-Bis(dimesitylbory1)-2,2'-bithiophene and 5,5"-Bis(dimesitylbory1)-2,2':5',2"—terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91:209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes containing NACAN-Coordinating Tridentate Ligand," Appl. Phys. Lett., 86:153505-1-153505-3 (2005).
T. Ostergard et al., "Langmuir-Blodgett Light-Emitting Diodes of Poly(3-Hexylthiophene) Electra-Optical Characteristics Related to Structure," Synthetic Metals, 88:171-177 (1997).
Takizawa, Shin-ya et al., "Phosphorescent Iridium Complexes Based on 2-Phenylimidazo[1,2- a]pyridine Ligands Tuning of Emission Color toward the Blue Region and Application to Polymer Light-Emitting Devices," Inorg. Chem., 16(10):4308-4319 (2007).
Tang, C.W. and VanSlyke, S.A., "Organic Electroluminescent Diodes," Appl. Phys. Lett., 51(12):913-915 (1987).
Van Slyke, S. A. et al., "Organic Electroluminescent Devices with Improved Stability," Appl. Phys. Lett., 69(15):2160-2162 (1996).
Wong, Wai-Yeung, "Multifunctional Iridium Complexes Based on Carbazole Modules as Highly Efficient Electrophosphors," Angew. Chem. Int. Ed., 45:7800-7803 (2006).
Adachi, Chihaya et al., "Organic Electroluminescent Device Having a Hole Conductor as an Emitting Layer," Appl. Phys. Lett., 55(15):1489-1491 (1989).
Guo, Tzung-Fang et al., "Highly Efficient Electrophosphorescent Polymer Light-Emitting Devices," Organic Electronics, 1:15-20 (2000).
Hamada, Yuji et al., "High Luminance in Organic Electroluminescent Devices with Bis(10-hydroxybenzo[h]quinolinato) beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Huang, Jinsong et al., "Highly Efficient Red-Emission Polymer Phosphorescent Light-Emitting Diodes Based on Two Novel Tris(1-phenylisoquinolinato-C2, N)iridium(III) Derivatives," Adv. Mater., 19:739-743 (2007).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18 (21):5119-5129 (2006).
Korean Office Action (including English translation) issued in KR 10-2020-0030905 dated Nov. 23, 2023, 13 pages.

* cited by examiner a)

b)

c)

a)

b)

Two individual NPAs highlighted in dashed boxes.

a)

b)

c)

d)

e)

f)

Example Inorganic LED design

Example Inorganic LED with enhancement layer and nanoparticle outcoupling

Compound 1

Compound 2

Compound 3

Compound 6

Compound 7

Compound 4

Compound 5

Compound 8

Compound 9

Compound 10

Compound 11

Compound 12

Compound 13

Compound 14

Compound 15

PLASMONIC OLEDS AND VERTICAL DIPOLE EMITTERS

CROSS-REFERENCE TO RELATED APPLICATIONS

This application claims priority to U.S. Patent Application Ser. No. 63/050,562, filed Jul. 10, 2020, U.S. Patent Application Ser. No. 63/058,410, filed on Jul. 29, 2020, U.S. Patent Application Ser. No. 63/072,550, filed on Aug. 31, 2020, and to U.S. Patent Application Ser. No. 63/078,084, filed Sep. 14, 2020, and is a continuation U.S. patent application Ser. No. 17/229,136, filed Apr. 13, 2021, now U.S. Pat. No. 11,637,261, which is a continuation-in-part application of U.S. patent application Ser. No. 16/814,858, filed Mar. 10, 2020, now U.S. Pat. No. 11,139,442, which claims priority to U.S. Patent Application Ser. No. 62/817,368, filed on Mar. 12, 2019, U.S. Patent Application Ser. No. 62/817,284, filed on Mar. 12, 2019, U.S. Patent Application Ser. No. 62/870,272, filed on Jul. 3, 2019, and U.S. Patent Application Ser. No. 62/817,424, filed on Mach 12, 2019, the entire contents of each are incorporated herein by reference.

FIELD

The present disclosure generally relates to compounds and arrangements to increase a fraction of vertical dipoles to enhance coupling of excited energy state into a surface plasmon mode for use in organic light emitting diodes (OLEDs) and devices containing the same.

BACKGROUND

Opto-electronic devices that make use of organic materials are becoming increasingly desirable for various reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials.

OLEDs make use of thin organic films that emit light when voltage is applied across the device. OLEDs are becoming an increasingly interesting technology for use in applications such as flat panel displays, illumination, and backlighting.

One application for phosphorescent emissive molecules is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single emissive layer (EML) device or a stack structure. Color may be measured using CIE coordinates, which are well known to the art.

SUMMARY

According to an embodiment, a device is provided that may include a substrate, first electrode, and an organic emissive layer comprising an organic emissive material disposed over the first electrode. The device may include an enhancement layer, having a plasmonic material exhibiting surface plasmon resonance that non-radiatively couples to the organic emissive material and transfers excited state energy from the organic emissive material to the non-radiative mode of surface plasmon polaritons, disposed over the organic emissive layer. The enhancement layer is provided no more than a threshold distance away from the organic emissive layer. The organic emissive material may have a total non-radiative decay rate constant and a total radiative decay rate constant due to the presence of the enhancement layer, and the threshold distance may be where the total non-radiative decay rate constant is equal to the total radiative decay rate constant. At least one of the organic emissive material and the organic emissive layer may have a vertical dipole ratio (VDR) value of equal or greater than 0.33.

The organic emissive layer of the device may have a VDR value equal or greater than 0.33. The organic emissive material of the device may have a VDR value equal or greater than 0.33.

The organic emissive layer of the device may include a first layer having the organic emissive material, and a second layer disposed immediately adjacent to the first layer and comprising a second material. The first layer and the second layer may satisfy the condition $0 \leq Ex-\Delta E$, where Ex is the lowest emissive state energy level of the first layer or the second layer, and $\Delta E$ is the difference between a highest HOMO (Highest Occupied Molecular Orbital) energy level and a lowest LUMO (Lowest Unoccupied Molecular Orbital) energy level within the organic emissive layer. Ex may be the lowest triplet ($T_1$) energy level of the first layer and the first layer is phosphorescent. In some embodiments, Ex may be the lowest singlet (S1) energy level of the first layer and the first layer is fluorescent.

The organic emissive material of the device may be a phosphorescent material. The phosphorescent material may be a metal coordination complex having a metal-carbon bond, and/or a metal-nitrogen bond and/or a metal-oxygen bond. The metal may be Ir, Rh, Re, Ru, Os, Pt, Au, and/or Cu. The phosphorescent material has the formula of $M(L^1)_x(L^2)_y(L^3)_z$, where $L^1$, $L^2$, and $L^3$ can be the same or different, where x is 1, 2, or 3, where y is 0, 1, or 2, where z is 0, 1, or 2, where x+y+z may be the oxidation state of the metal M, and where $L^1$ may be selected from the group consisting of:

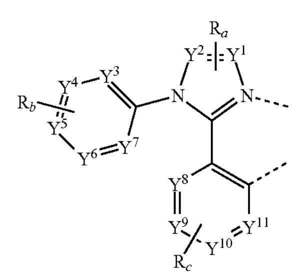

-continued
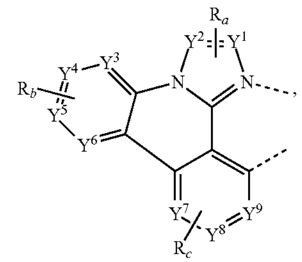
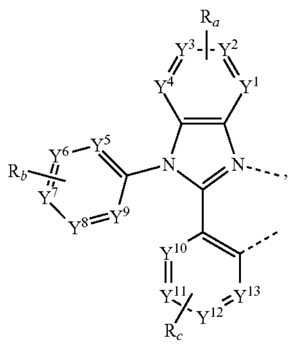
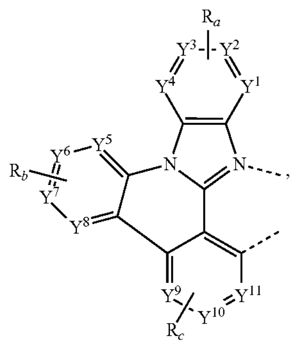
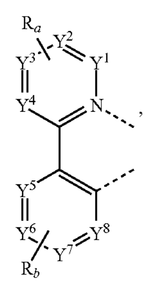
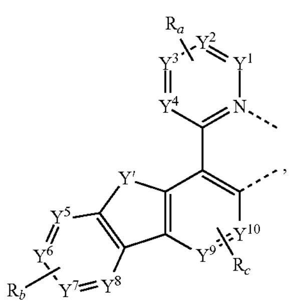
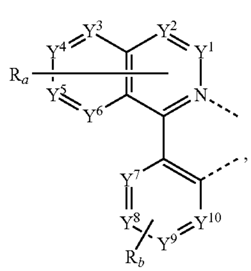
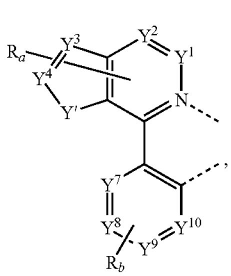
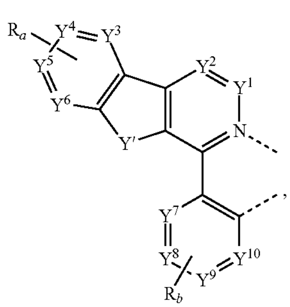
-continued
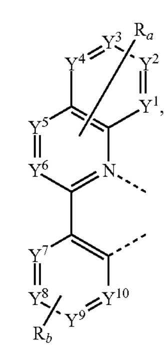
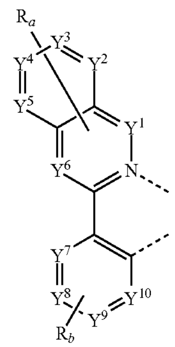
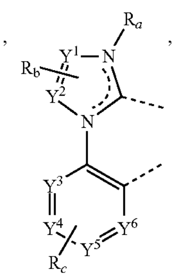
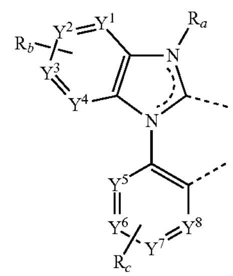
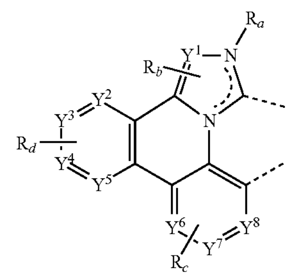
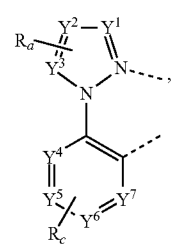
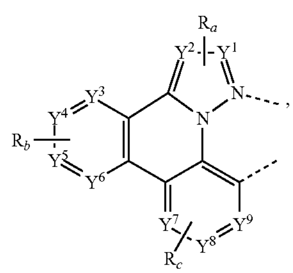
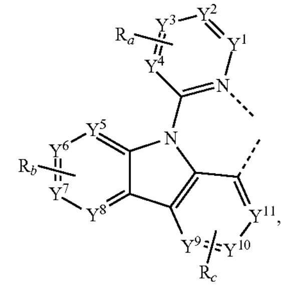
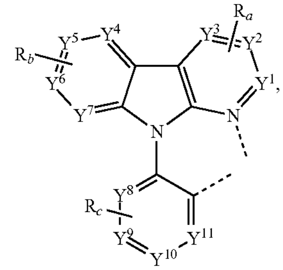
and -continued
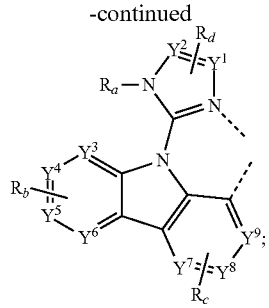
where $L^2$ and $L^3$ are independently selected from the group consisting of
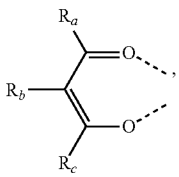
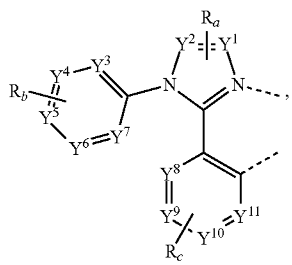
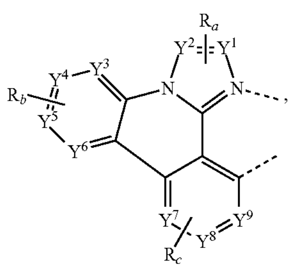
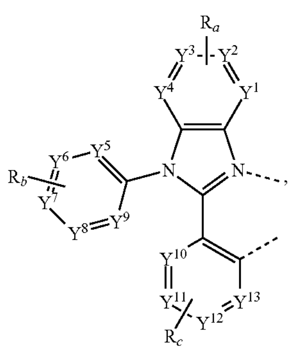
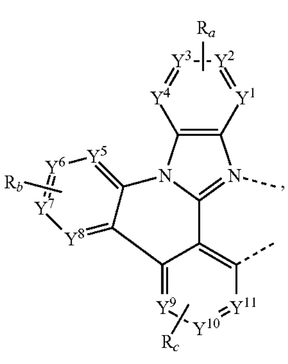
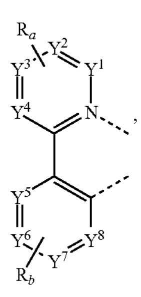
-continued
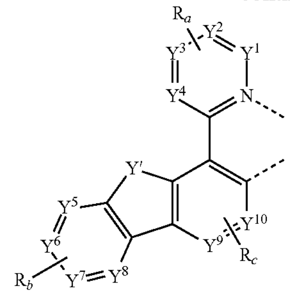
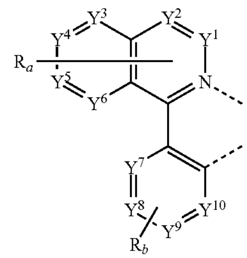
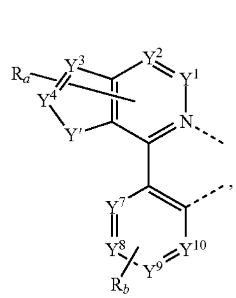
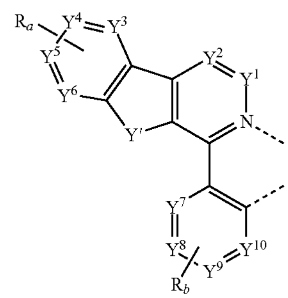
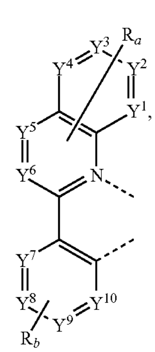
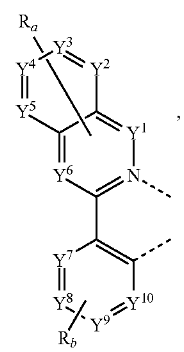
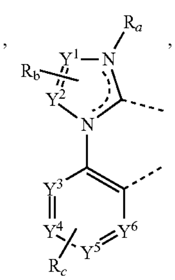
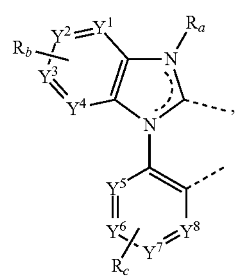
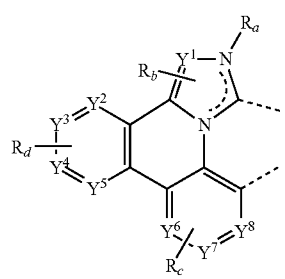
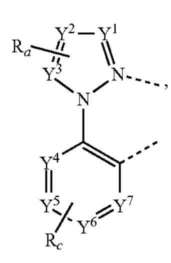
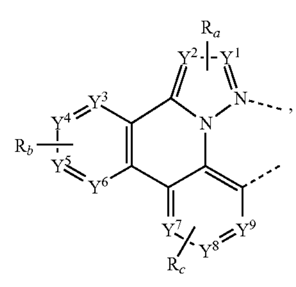

-continued

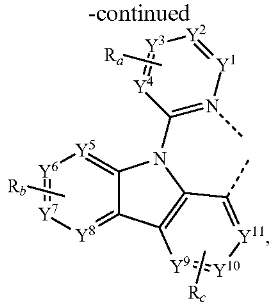

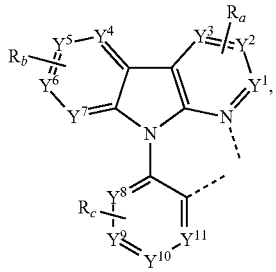

and

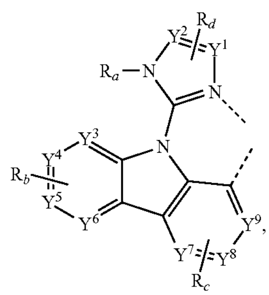

where each $Y^1$ to $Y^{13}$ may be independently selected from carbon and/or nitrogen, where Y' is selected from the group consisting of B $R_e$, N $R_e$, P $R_e$, O, S, Se, C=O, S=O, $SO_2$, $CR_eR_f$, $SiR_eR_f$, and $GeR_eR_f$, where $R_e$ and $R_f$ can be fused or joined to form a ring, where each $R_a$, $R_b$, $R_c$, and $R_d$ can independently represent from mono to the maximum possible number of substitutions, or no substitution, where each $R_a$, $R_b$, $R_c$, $R_d$, $R_e$, and $R_f$ may be independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof, and where any two adjacent substituents of $R_a$, $R_b$, $R_c$, and $R_d$ can be fused or joined to form a ring or form a multidentate ligand.

The phosphorescent material may have a formula selected from the group consisting of $Ir(L_A)_3$, $Ir(L_A)(L_B)_2$, $Ir(L_A)_2(L_B)$, $Ir(L_A)_2(L_C)$, $Ir(L_A)(L_B)(L_C)$, and $Pt(L_A)(L_B)$, where $L_A$, $L_B$, and $L_C$ are different from each other in the Ir compounds, where $L_A$ and $L_B$ can be the same or different in the Pt compounds, and where $L_A$ and $L_B$ can be connected to form a tetradentate ligand in the Pt compounds.

The organic emissive material of the device may be a fluorescent material. The fluorescent material may comprise at least one organic group selected from the group consisting of:

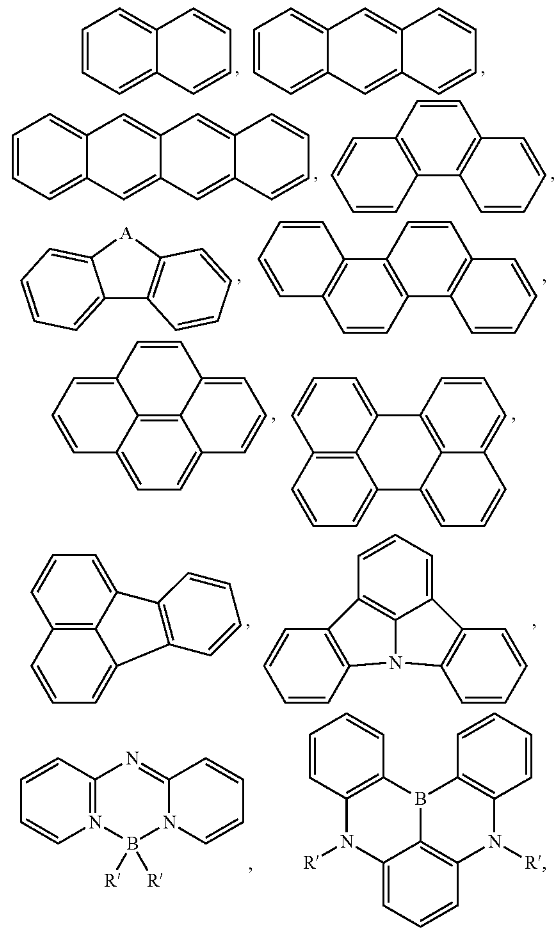

and aza analogues thereof, where A is selected from the group consisting of O, S, Se, NR' and CR'R'', where each R' can be the same or different and each R' is independently selected from the group consisting of alkyl, cycloalkyl, aryl, heteroaryl, and combinations thereof.

The fluorescent material of the device may be selected from the group consisting of:

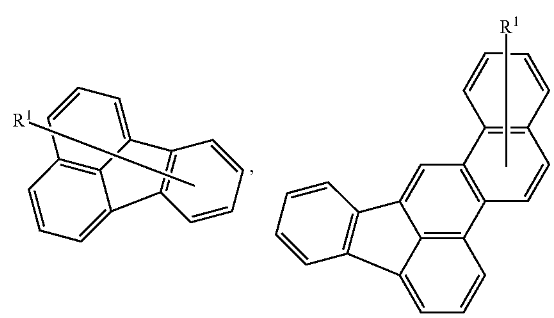

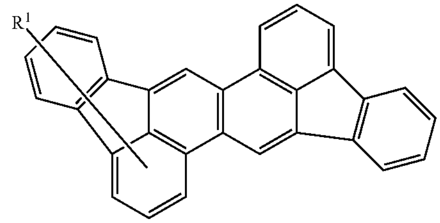

-continued
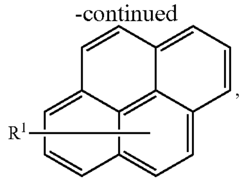
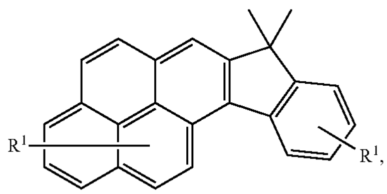
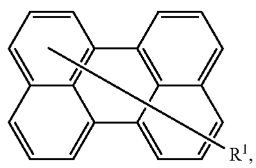
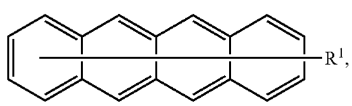
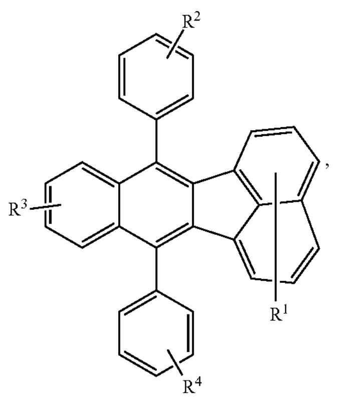
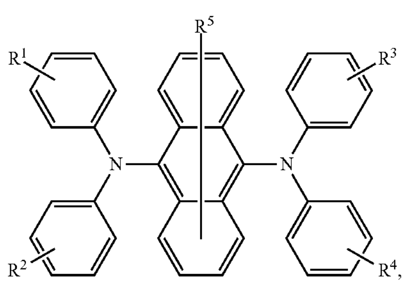
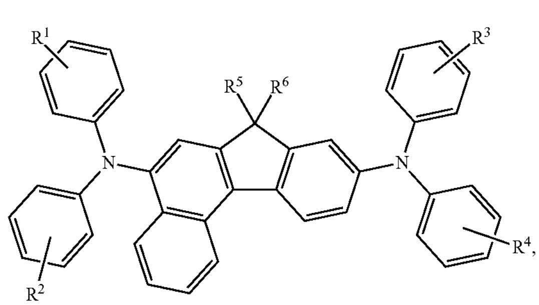
-continued
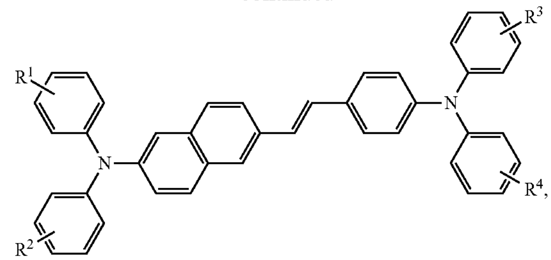
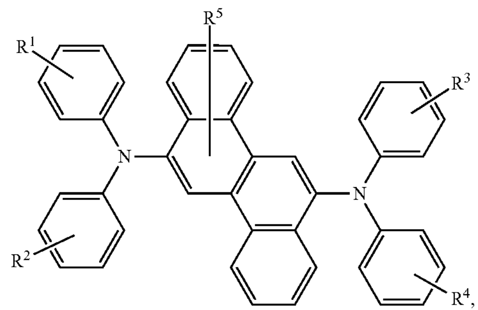
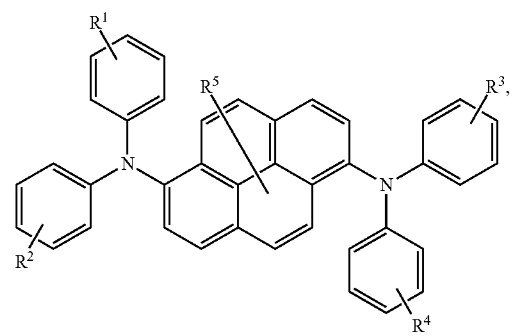
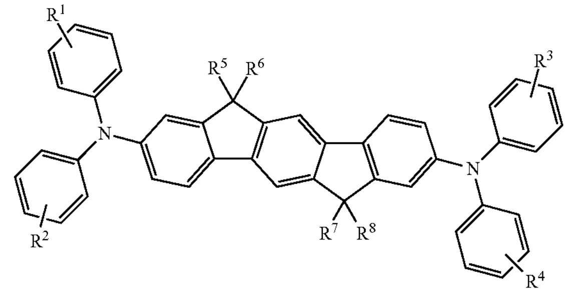
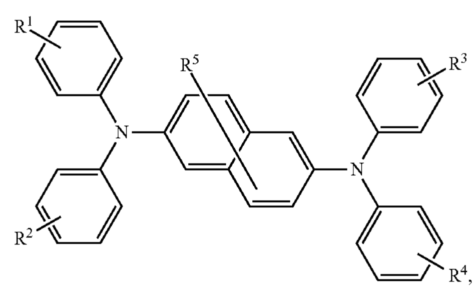

-continued

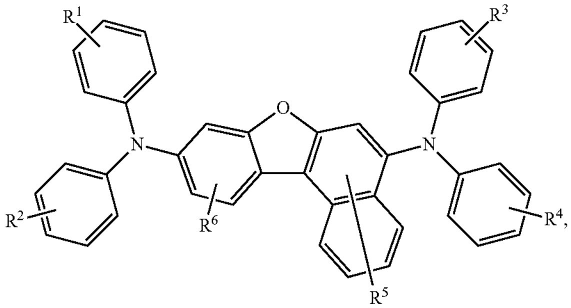

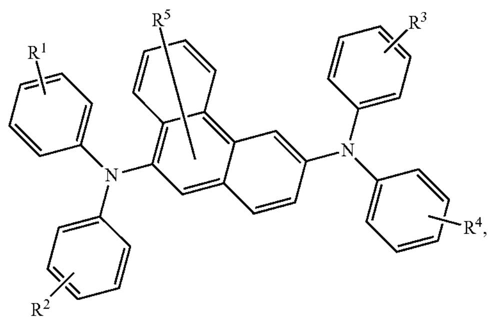

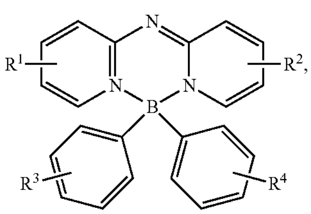

and

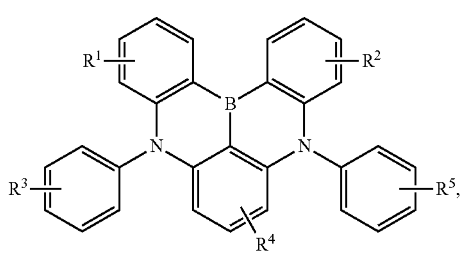

wherein $R^1$ to $R^5$ each independently represents from mono to maximum possible number of substitutions, or no substitution, and where $R^1$ to $R^5$ are each independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof.

The organic emissive material of the device may be a Thermally Activated Delayed Fluorescence (TADF) material. The TADF material may comprise at least one donor group and at least one acceptor group. In some embodiments, the TADF material may be a metal complex. The TADF material may be a non-metal complex. In some embodiments, the TADF material may be a Cu, Ag, or Au complex. The TADF material may comprise at least one of the chemical moieties selected from the group consisting of:

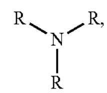

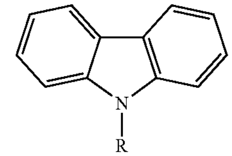

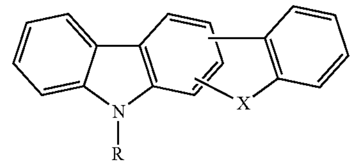

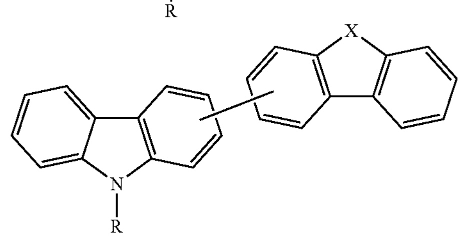

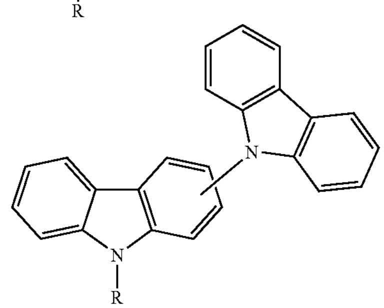

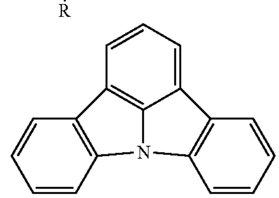

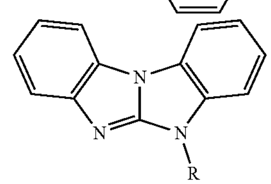

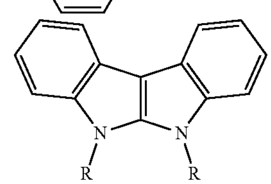

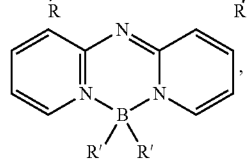

and

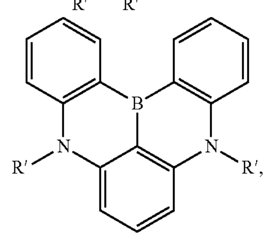

where X is selected from the group consisting of O, S, Se, and NR, where each R can be the same or different and each R is independently an acceptor group, an organic linker bonded to an acceptor group, or a terminal group selected from the group consisting of alkyl, cycloalkyl, heteroalkyl, heterocycloalkyl, arylalkyl, aryl, heteroaryl, and combinations thereof, and where each R' can be the same or different and each R' is independently selected from the group consisting of alkyl, cycloalkyl, aryl, heteroaryl, and combinations thereof.

The TADF material of the device may include at least one of the chemical moieties selected from the group consisting of nitrile, isonitrile, borane, fluoride, pyridine, pyrimidine, pyrazine, triazine, aza-carbazole, aza-dibenzothiophene, aza-dibenzofuran, aza-dibenzoselenophene, aza-triphenylene, imidazole, pyrazole, oxazole, thiazole, isoxazole, isothiazole, triazole, thiadiazole, and oxadiazole.

The emission of the device may originate from a combination of materials within the organic emissive layer. The combination of materials of the organic emissive layer may include a first material and a second material, where an exciplex is formed within the organic emissive layer. An exciplex is an emissive state that is formed between two materials. The energy of the exciplex may be determined by the energy difference between the lowest LUMO (Lowest Unoccupied Molecular Orbital) and highest HOMO (Highest Occupied Molecular Orbital) from all the materials in the organic emissive layer. A first material and the second material may satisfy the condition $0 \leq Ex - \Delta E$, where Ex is the lowest emissive state energy level of the first material or the second material, and ΔE is the difference between a highest HOMO (Highest Occupied Molecular Orbital) energy level and a lowest LUMO (Lowest Unoccupied Molecular Orbital) energy level within the organic emissive layer.

The organic emissive layer may further comprises a host. The host may include at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene.

In some embodiments, the host may be selected from the group consisting of:

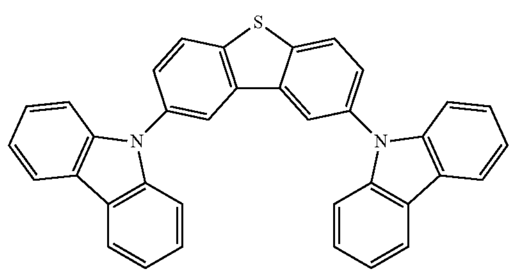

,

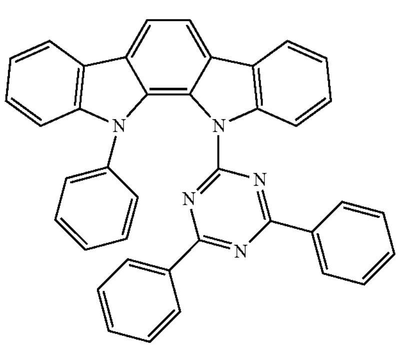

,

-continued

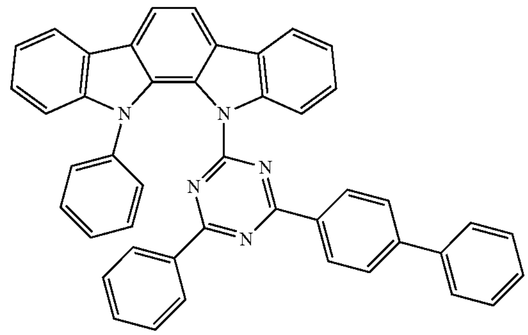

,

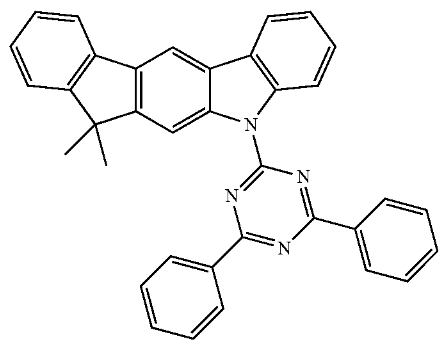

,

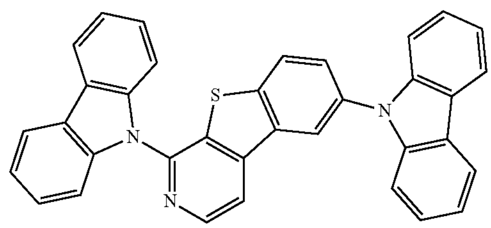

,

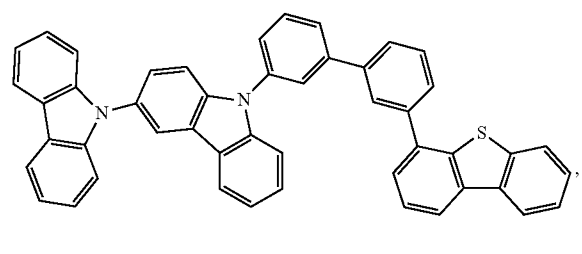

,

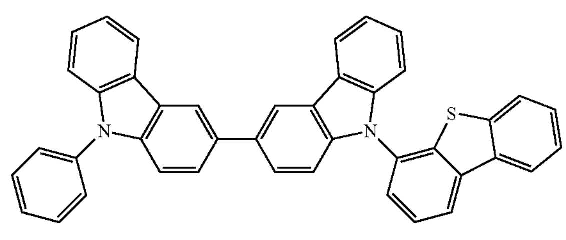

,

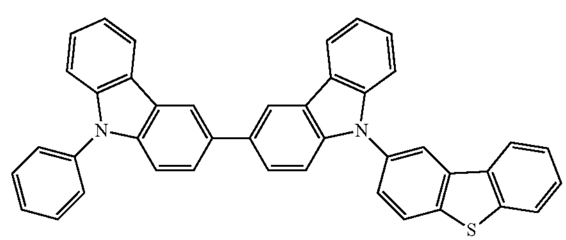

,

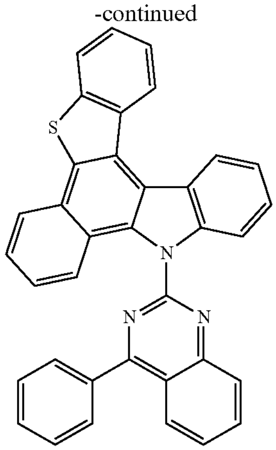
,
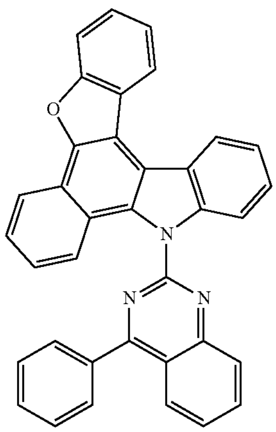
,
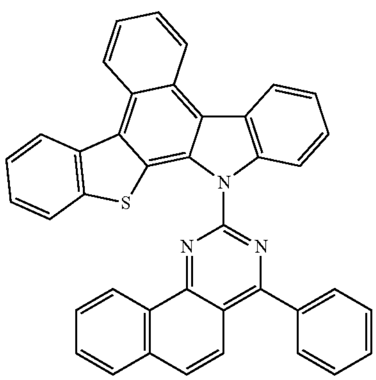
,
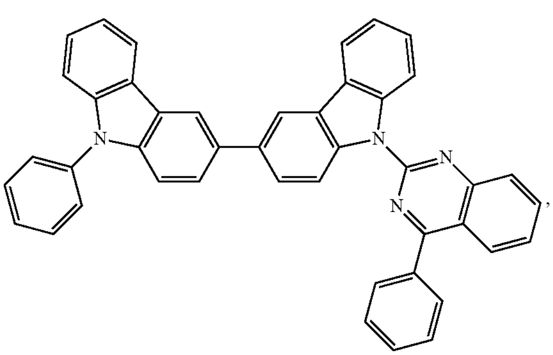
,
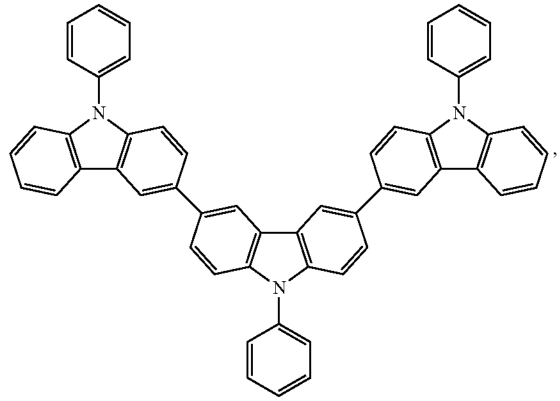
,
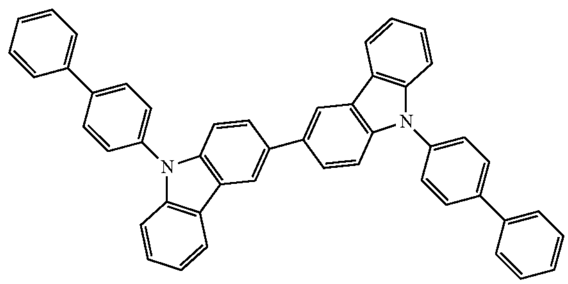
,
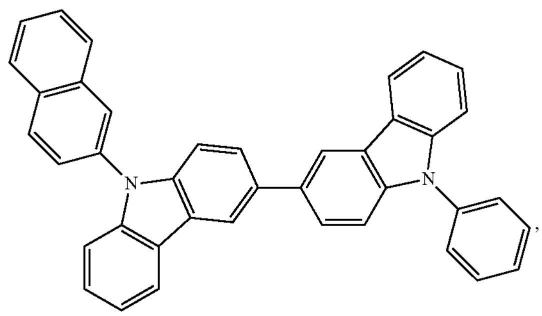
,
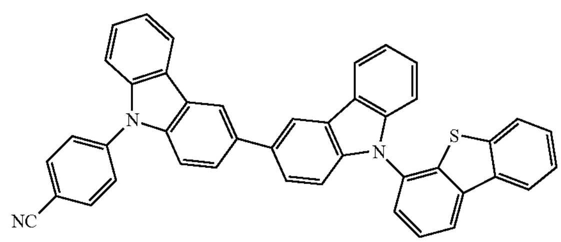
,
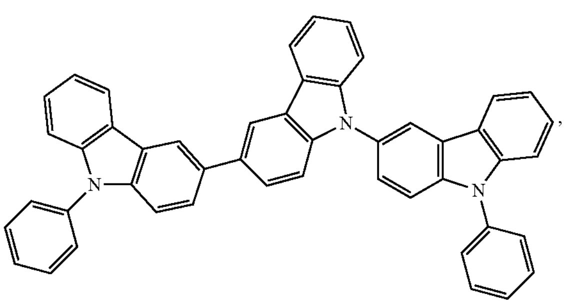
,

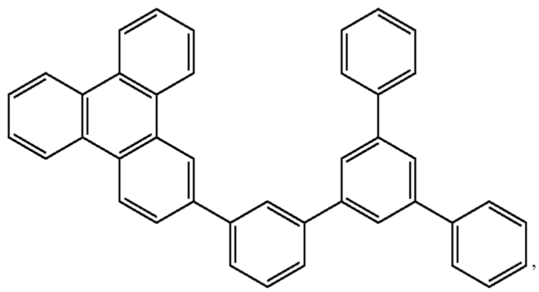
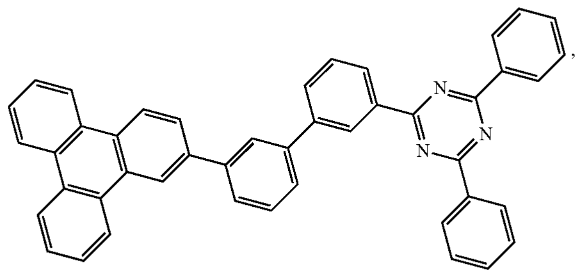
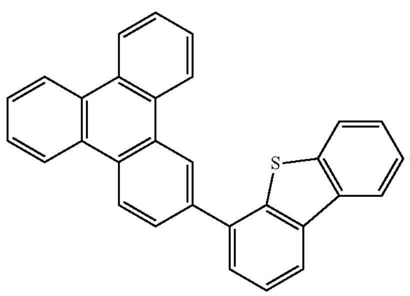
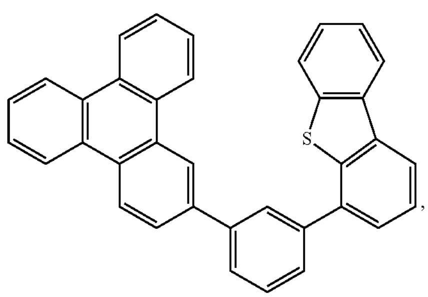
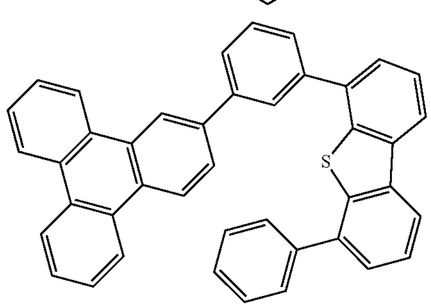
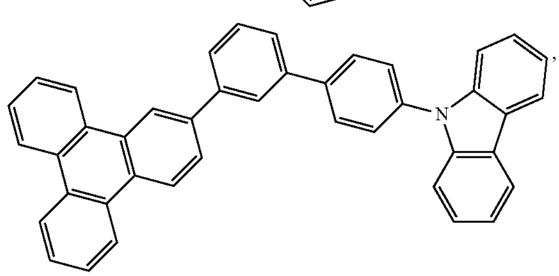
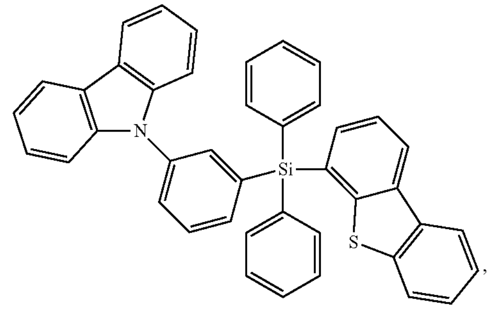
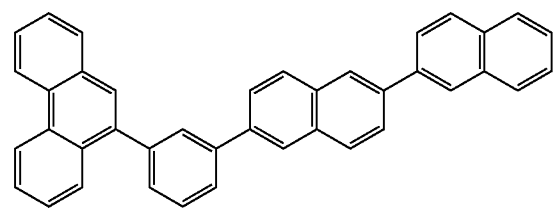
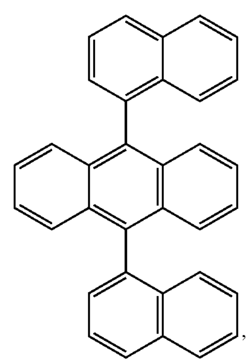
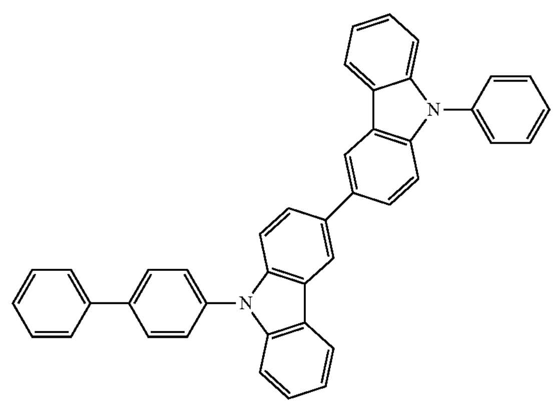
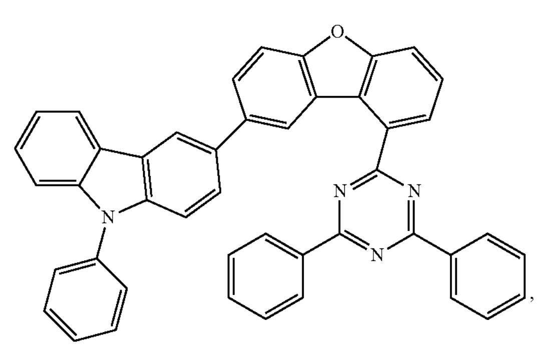

-continued

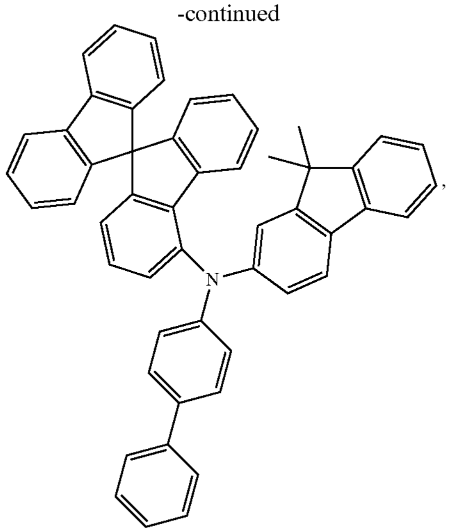

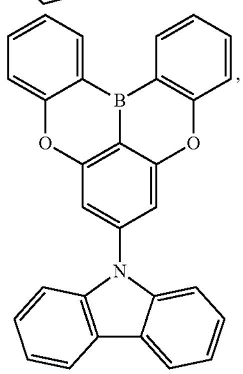

and combinations thereof.

The enhancement layer of the device may include a second electrode layer.

In some embodiments, the device may include a templating layer selected and arranged to orient molecules of the organic emissive layer. The templating layer may align dipoles of the organic emissive material and increases the verticality of the dipoles. The templating layer may be within the threshold distance of the enhancement layer.

The organic emissive layer may include a plurality of sub-layers. In some embodiment, the organic emissive material emits from a doublet state.

The device may include an outcoupling structure. The outcoupling structure may have a plurality of nanoparticles, and the device may have a material disposed between the enhancement layer and the plurality of nanoparticles. The plurality of nanoparticles are formed from at least one of: Ag particles, Al particles, Ag—Al alloys, Au particles, Au—Ag alloys, dielectric material, semiconductor materials, an alloy of metal, a mixture of dielectric materials, a stack of one or more materials, and/or a core of one type of material and that is coated with a shell of a different type of material. At least one of the plurality of nanoparticles may include an additional layer to provide lateral conduction among the plurality of nanoparticles. The plurality of nanoparticles may be coated. In some embodiments, the plurality of nanoparticles may be metallic and coated with a non-metallic coating. The plurality of nanoparticles may include at least one of a metal, a dielectric material, and/or a hybrid of metal and dielectric material.

The plurality of nanoparticles of the device may be coated with an oxide layer. A thickness of the oxide layer may be selected to tune a plasmonic resonance wavelength of the plurality of nanoparticles or a nanopatch antenna. The plurality of nanoparticles may be colloidally-synthesized nanoparticles formed from a solution. The plurality of nanoparticles may be arranged in a periodic array, which may have a predetermined array pitch. In some embodiments, the plurality of nanoparticles may be arranged in a non-periodic array. A shape of the plurality of nanoparticles may be at least one of: cubes, spheres, spheroids, cylindrical, parallelepiped, rod-shaped, star-shaped, pyramidal, and/or multi-faceted three-dimensional objects. A size of at least one of the plurality of nanoparticles may be from 5 nm to 1000 nm.

The material of the device may include a dielectric layer disposed on the enhancement layer, and an electrical contact layer disposed on the dielectric layer. The material may be a voltage-tunable refractive index material between the electrical contact layer and the first electrode. The voltage-tunable refractive index material may be aluminum-doped zinc oxide. The material may include an insulating layer.

The first electrode of the device may include is at least one of: a metal, a semiconductor, and/or a transparent conducting oxide. The electrode layer of the device may include at least one of: Ag, Al, Au, Ir, Pt, Ni, Cu, W, Ta, Fe, Cr, Mg, Ga, Rh, Ti, Ru, Pd, In, Bi, and/or Ca.

According to an embodiment, a consumer product may include a device having a substrate, a first electrode, and an organic emissive layer comprising an organic emissive material disposed over the first electrode. The device of the consumer product may include an enhancement layer, having a plasmonic material exhibiting surface plasmon resonance that non-radiatively couples to the organic emissive material and transfer excited state energy from the organic emissive material to non-radiative mode of surface plasmon polaritons, disposed over the organic emissive layer. The enhancement layer may be provided no more than a threshold distance away from the organic emissive layer. The organic emissive material has a total non-radiative decay rate constant and a total radiative decay rate constant due to the presence of the enhancement layer, and the threshold distance is where the total non-radiative decay rate constant is equal to the total radiative decay rate constant. At least one of the organic emissive material and the organic emissive layer has a vertical dipole ratio (VDR) value of equal or greater than 0.33.

The consumer product may be at least one of: display screens, lighting devices such as discrete light source devices or lighting panels, flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, cell phones, tablets, phablets, personal digital assistants (PDAs), wearable devices, laptop computers, digital cameras, camcorders, viewfinders, micro-displays that are less than 2 inches diagonal, 3-D displays, vehicle, aviation displays, a large area wall, a video walls comprising multiple displays tiled together, theater or stadium screen, a light therapy device, a sign, augmented reality (AR) or virtual reality (VR) displays, displays or visual elements in glasses or contact lenses, light emitting diode (LED) wallpaper, LED jewelry, and clothing.

DETAILED DESCRIPTION

A. Terminology

Figure 1:
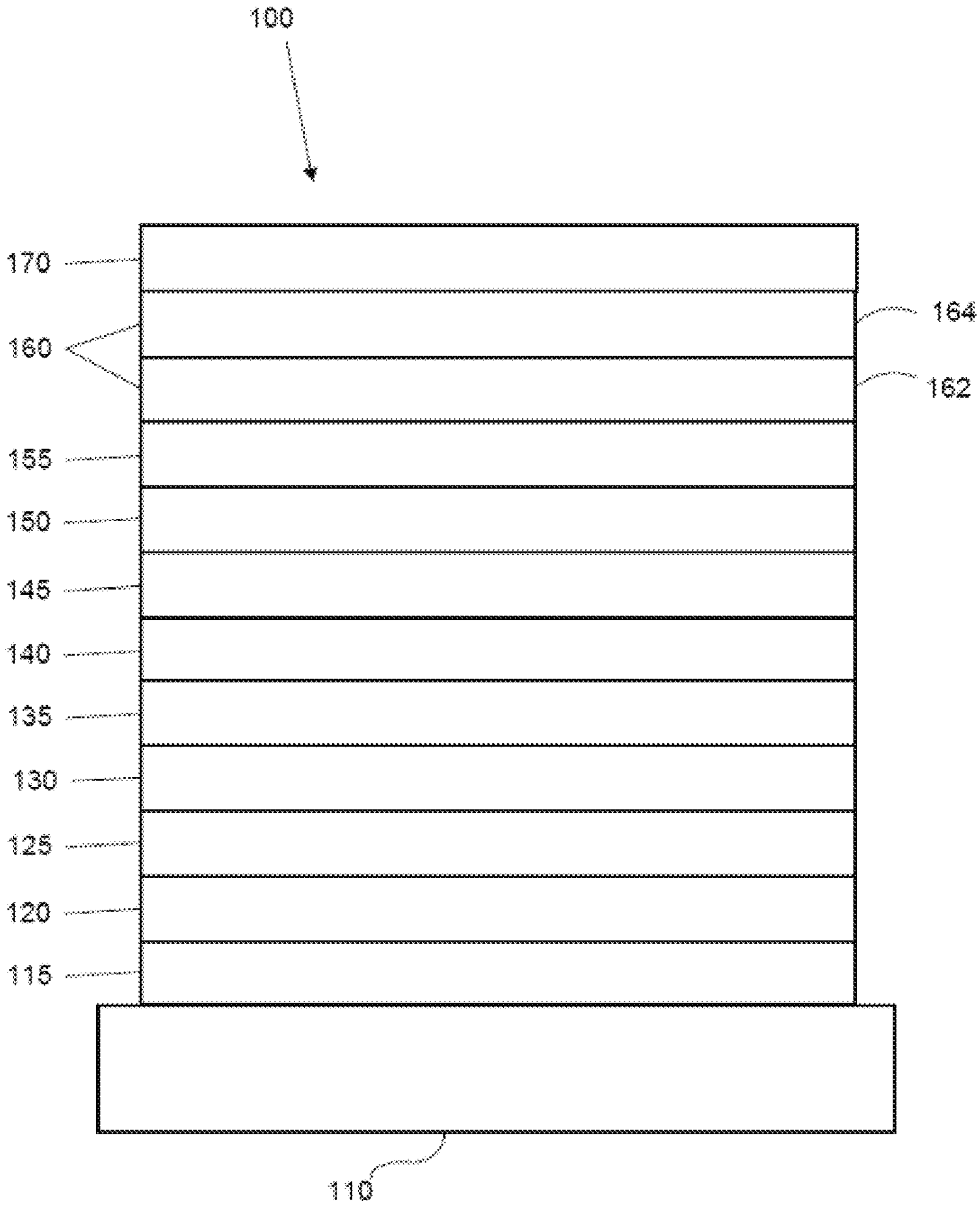
FIG. 1 shows an organic light emitting device.

Unless otherwise specified, the below terms used herein are defined as follows:

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —$OR_s$ radical.

The terms "sulfanyl" or "thio-ether" are used interchangeably and refer to a —$SR_s$ radical.

The term "sulfinyl" refers to a —S(O)—$R_s$ radical.

The term "sulfonyl" refers to a —$SO_2$—$R_s$ radical.

The term "phosphino" refers to a —$P(R_s)_3$ radical, wherein each $R_s$ can be same or different.

The term "silyl" refers to a —$Si(R_s)_3$ radical, wherein each $R_s$ can be same or different.

The term "boryl" refers to a —$B(R_s)_2$ radical or its Lewis adduct —$B(R_s)_3$ radical, wherein $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group may be optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, 0, S or N. Additionally, the heteroalkyl or heterocycloalkyl group may be optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group may be optionally substituted.

The term "alkynyl" refers to and includes both straight and branched chain alkyne radicals. Alkynyl groups are essentially alkyl groups that include at least one carbon-carbon triple bond in the alkyl chain. Preferred alkynyl groups are those containing two to fifteen carbon atoms. Additionally, the alkynyl group may be optionally substituted.

The terms "aralkyl" or "arylalkyl" are used interchangeably and refer to an alkyl group that is substituted with an aryl group. Additionally, the aralkyl group may be optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, boryl, alkenyl, cycloalkenyl, heteroalkenyl, alkynyl, aryl, heteroaryl, acyl, carboxylic acid, ether, ester, nitrile, isonitrile, sulfanyl, sulfanyl, sulfonyl, phosphino, boryl, and combinations thereof.

In some instances, the preferred general substituents are selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, boryl, and combinations thereof.

In some instances, the more preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the most preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents zero or no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

B. The OLEDs, Compounds, and Devices of the Present Disclosure

Figure 26A:
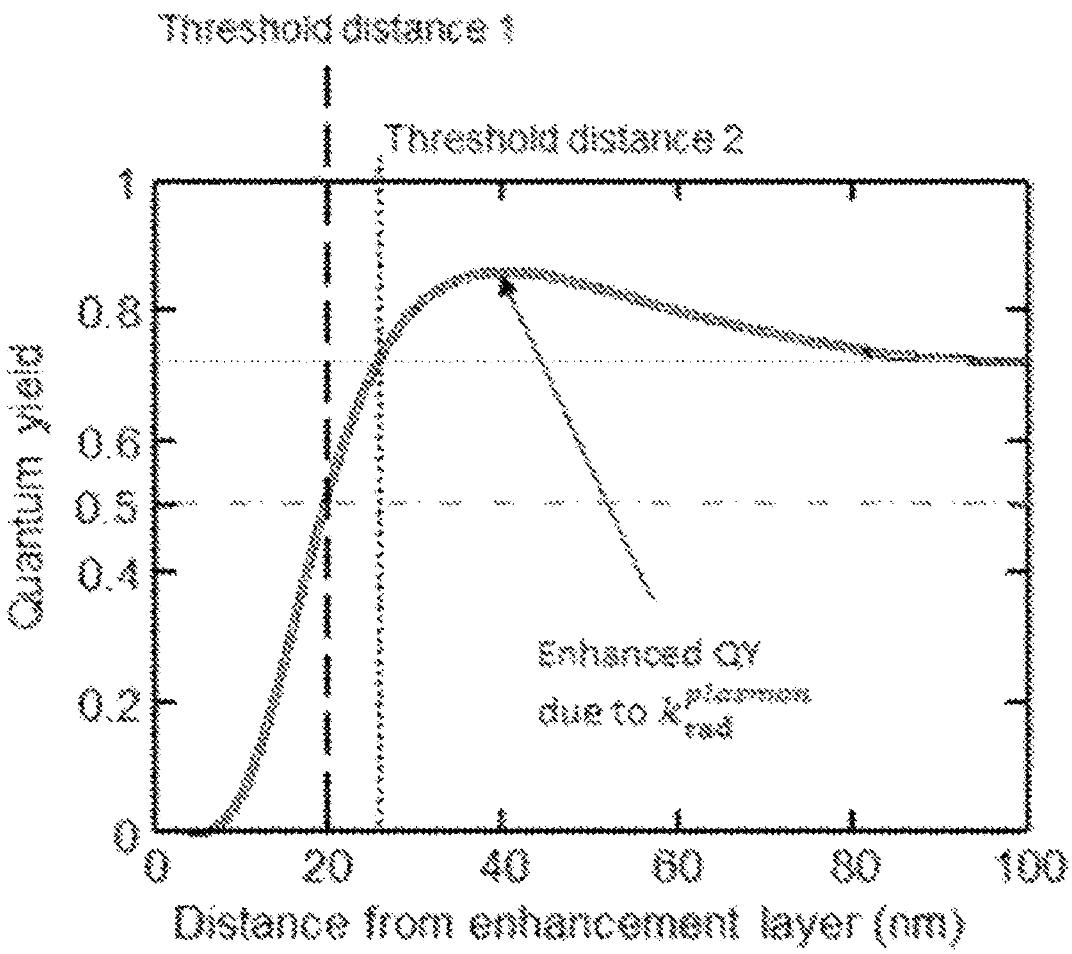
FIG. 26*a* shows a plot of quantum yield as a function of light emitting material's distance from the enhancement film with two threshold distances identified.
Figure 26B:
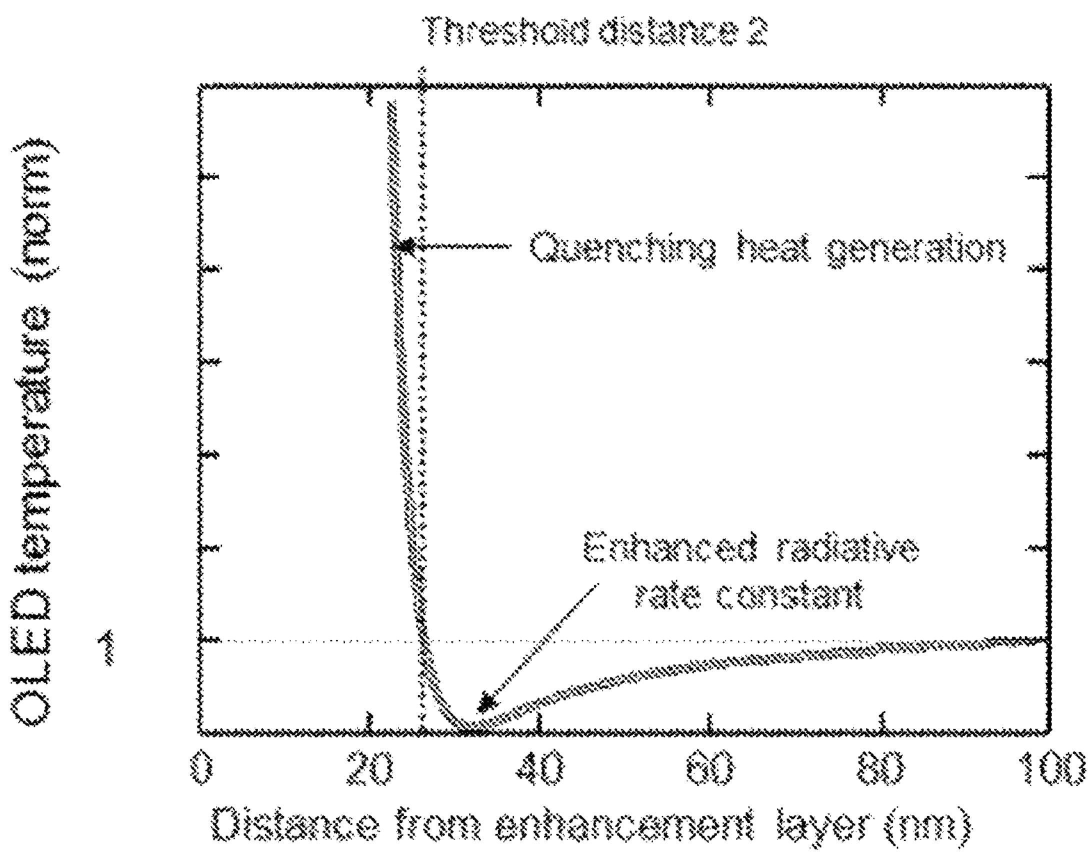
FIG. 26*b* shows a schematic depiction of the temperature of an OLED as a function of the light emitter's distance from the enhancement film when there is no outcoupling layer for the non-radiative OLED with the threshold distance 2 identified on the plot.

Outcoupling energy in the form of light from the SPR (surface plasmon energy) mode may be used to provide OLEDs that live longer at display brightness if the emissive layer is within a threshold distance of a plasmonically-active material, such as a metal cathode and/or anode (e.g., electrode layers). The threshold distance may be the distance at which the total non-radiative decay rate constant is equal to the total radiative decay rate constant, as disclosed in U.S. Pat. No. 9,960,386 and incorporated by reference in its entirety. FIG. 26*a* shows a plot in which quantum yield (QY) is plotted as a function of the emissive material's distance from the electrode layer (e.g., metal anode and/or cathode). Once the non-radiative decay rate constant becomes near in value to the radiative decay rate the QY starts to drop, creating a peak in the QY at some specific distance. FIG. 26*b* shows schematically illustrates the steady state temperature of the OLED as the distance between the emissive material and electrode layer is varied for a fixed current density of operation. For large distances of the emissive material from the electrode layer, there is no enhancement of the radiative or non-radiative decay rate constants. The temperature of the OLED depends only on the total current density of operation and the efficiency of the emissive material. As the emissive material is brought closer to the electrode layer, the radiative decay rate constant increases and the photon yield increases, reducing the heat generated in the OLED and the OLED's steady state temperature. For distances shorter than the threshold distance 2, the excitons on the light emitter are quenched as heat and the OLED's normalized temperature increases. This depiction of the temperature of the OLED is true when the enhancement layer is not outcoupling a predetermined significant fraction of energy in the surface plasmon mode as light. If there is outcoupling as part of the enhancement layer or an outcoupling layer is used in the device, such as layer is to be removed to perform this measurement of the threshold distance.

Embodiments of the disclosed subject matter may convert energy stored in the SPR mode of a plasmonically-active material to visible light via a nanopatch antenna.

Figure 3A:
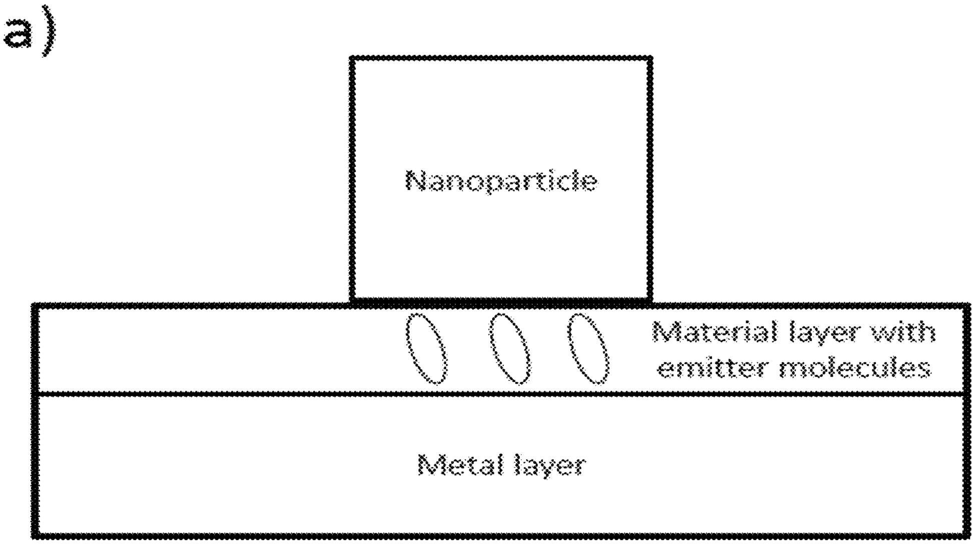
FIG. 3*a* shows a conventional nanopatch antenna, including a material layer with emitter molecules embedded therein between the nanoparticle and metal layer.
Figure 3B:
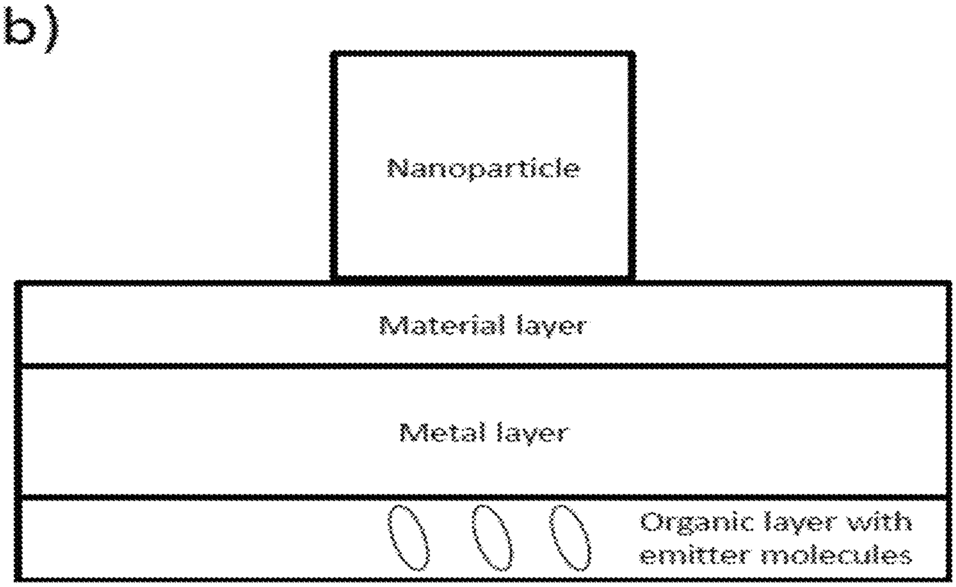
FIG. 3*b* shows a nanopatch antenna, including emitter molecules in an emissive layer are disposed beneath the metal layer (i.e., the electrode layer) according to an embodiment of the disclosed subject matter.
Figure 3C:
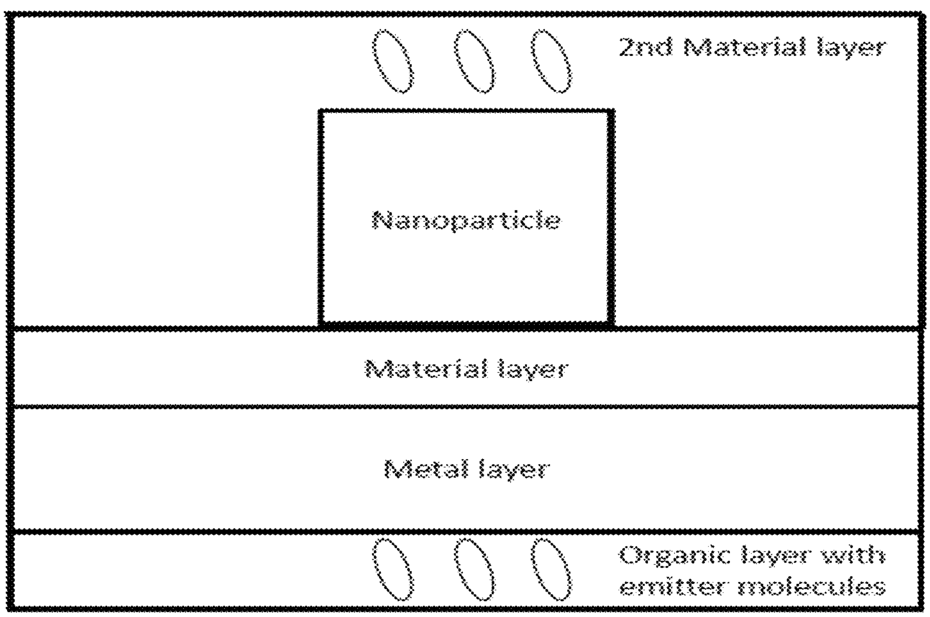
FIG. 3*c* shows a nanopatch antenna including a capping layer disposed on the nanoparticle, which may include additional emitter molecules, according to an embodiment of the disclosed subject matter.

The nanopatch antenna may include a planar metal film (e.g., an electrode layer), a gap material (e.g., a dielectric material or the like) disposed on the planar metal, and a nanoparticle disposed on the gap material, as shown in FIGS. 3*a*-3*c*. FIG. 3*a* shows a conventional nanopatch antenna that includes a gap layer with emitter molecules embedded therein between the nanoparticle and metal layer. FIG. 3*b* shows a nanopatch antenna according to an embodiment of the disclosed subject matter, where emitter molecules in the emissive layer are placed beneath the metal layer (i.e., not in the gap layer). FIG. 3*c* shows another embodiment of the disclosed subject matter, which includes a capping layer disposed atop the nanoparticle. In some embodiments, the capping layer may include additional emitter molecules.

Figure 4A:
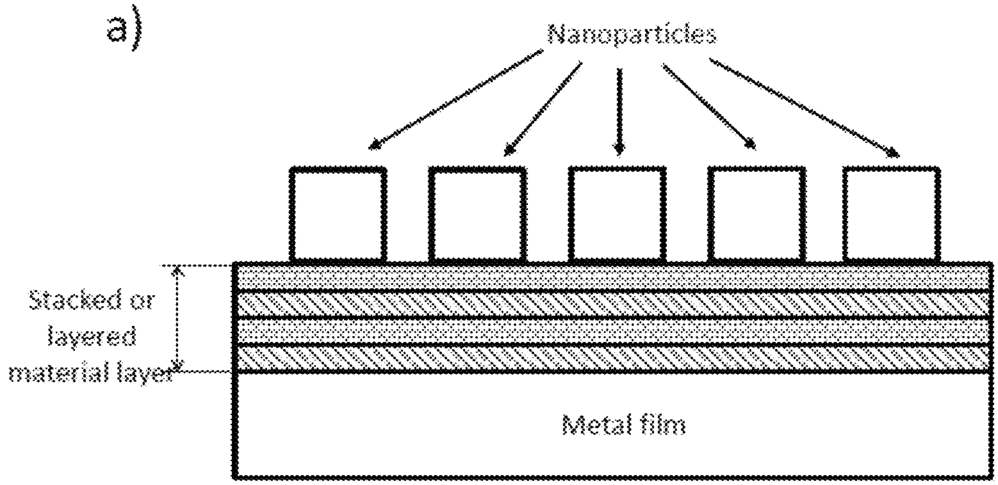
FIG. 4*a* shows a dielectric material including a plurality layers according to an embodiment of the disclosed subject matter.

The gap material may be organic (e.g., small molecule and/or polymer material), may include oxides, and/or other dielectric materials, including stacks, alloys, and/or mixtures of materials as shown, for example, in FIG. 4*a*. That is, FIG. 4*a* shows a dielectric material having a plurality of layers. This configuration may provide a resonant plasmon mode in the gap due to the high electric field intensity created in the gap medium. This large electric field may be used to enhance the emission rate of an emitter placed in the gap, known as the Purcell effect. The nanopatch antenna may radiate out the energy from this plasmonically-active mode with efficiencies up to 50%.

Figure 4B:
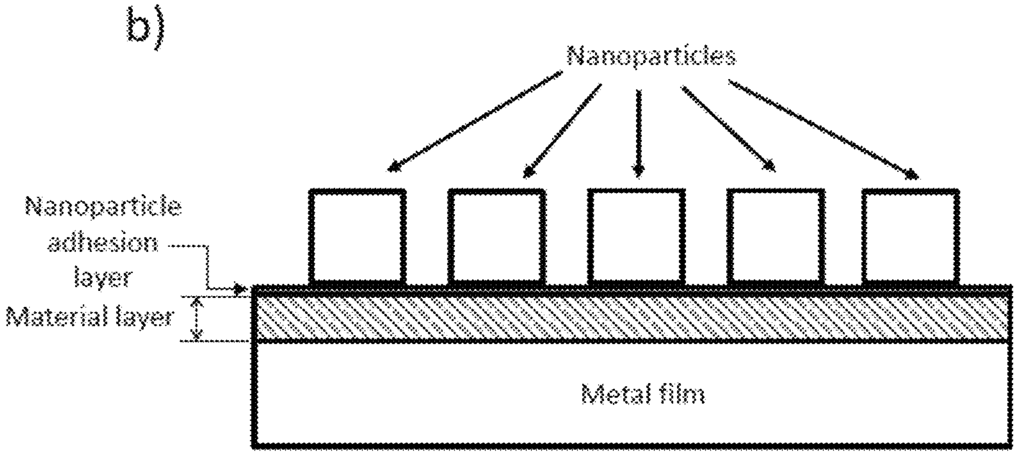
FIG. 4*b* shows two stacked dielectric materials including a thick dielectric layer and a thin nanoparticle adhesion layer according to an embodiment of the disclosed subject matter.

In an embodiment of the disclosed subject matter, two stacked dielectric materials may include one thicker layer which may be the primary dielectric gap material, and one thin layer that may act as a nanoparticle adhesion layer to increase nanoparticle density and/or reduce nanoparticle aggregation or clumping, as shown in FIG. 4*b*. For example, polyelectrolyte layers (such as poly(styrenesulfonate) or poly(allylamine) hydrochloride) may carry an electrostatic charge that may interact with the electrostatic charge on a nanoparticle coating (for example, poly(vinylpyrrolidinone), which may be used to coat silver nanoparticles, carries a negative electrostatic charge). While the summation of the thicknesses of these layers may determine the overall gap thickness, the adhesion layer thicknesses may be less than 5 nm, and gap layer thicknesses may be between 1 to 100 nm, and more preferably between 1 to 50 nm.

While Purcell factors on the order of 1000 may be achieved by placing an emitter in the nanopatch antenna gap, Purcell factors on the order of 10 may be sufficient for an enhancement in phosphorescent OLED emitter stability. It may be difficult to fabricate an entire OLED stack that maintains high internal quantum efficiency within the typical nanopatch antenna gap thickness, typically 2-15 nm, much less utilize the nanoparticle as one of the OLED electrodes. Embodiments of the disclosed subject matter may provide an arrangement where the emitter is placed beneath the planar metal, instead of in the antenna gap, as shown in FIG. 3*b*. A variation of this arrangement may include an additional capping layer disposed on the nanoparticle that may include additional emitter molecules, as shown in FIG. 3*c*. The capping layer may match the refractive index with the other side of the metal layer, thereby improving cross-coupling of the SPR mode across the metal layer and into the nanopatch antenna gap.

As shown in the arrangements of FIGS. 3*b*-3*c*, the emitter may be placed such that it is within a threshold distance of the planar metal, which, in turn, acts as one of the OLED contacts (i.e., either a cathode or anode). In one example, the emission may occur from the same side of the device as the nanoparticles, which makes this arrangement amenable to both top and bottom emission geometries.

Figure 5A:
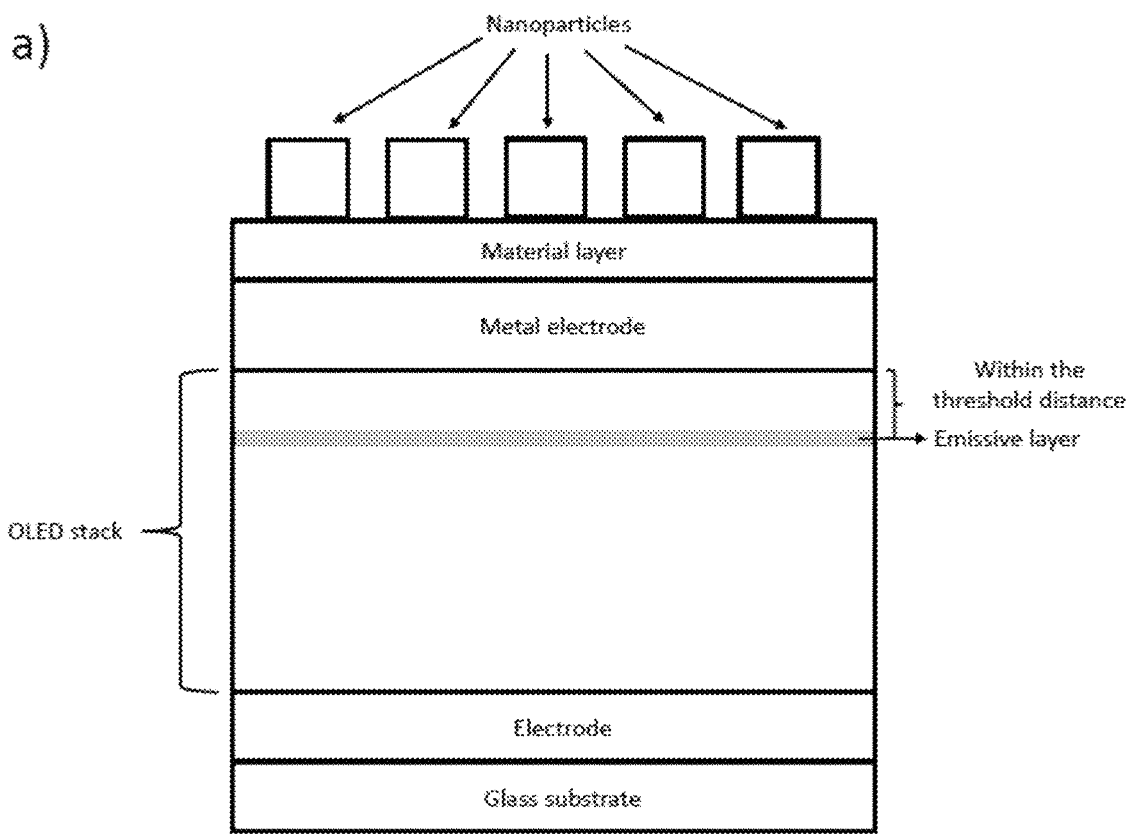
FIG. 5*a* shows emitter molecules in the emissive layer that are placed beneath the metal layer (i.e., the electrode layer) in combination with an OLED stack, where the emissive layer is within a threshold distance to the metal electrode, and the nanopatch antenna atop the electrode radiates out the side with the nanoparticles according to an embodiment of the disclosed subject matter.

In this configuration, the Purcell enhancement that stabilizes the emitter may originate from its proximity to the planar metal contact (e.g., an electrode layer). FIG. 5*a* shows an embodiment of the disclosed subject matter, where the emitter molecules in the emissive layer placed beneath the metal layer (i.e., not in the gap layer) may be combined with a conventional OLED stack where the emissive layer is within a threshold distance to the metal cathode, and the subsequent nanopatch antenna geometry atop the cathode radiates out the side with the nanoparticles.

Figure 5B:
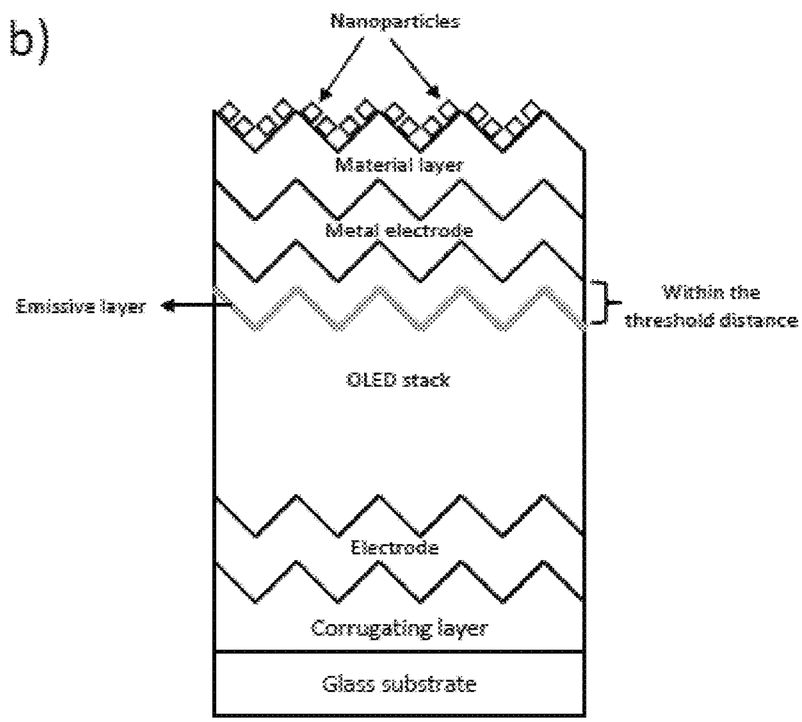
FIG. 5*b* shows a variation of the embodiment of FIG. 5*a*, where the stack may be corrugated for additional outcoupling of the SPR (surface plasmon energy) mode according to an embodiment of the disclosed subject matter.

In a variation of this configuration, the metal contact or the entire device stack may be corrugated to enhance the outcoupling of the SPR mode, as shown in FIG. 5*b*. This configuration may reduce the maximum achievable Purcell enhancement below those achieved by placing the emitter within the gap, but Purcell factors of ≥10 may still be achieved. By placing the emitter within a threshold distance of the metal (e.g., an electrode layer), the emitter energy may be coupled into the SPR mode induced along the metal's surface. For non-opaque metal films (e.g., Ag<200 nm thick, Al and Au<100 nm thick), this plasmon mode may couple to the opposite side of the metal where it may transfer its energy into the gap plasmon mode, and be converted to light via the nanopatch antenna, as shown in FIG. 6.

Figure 6:
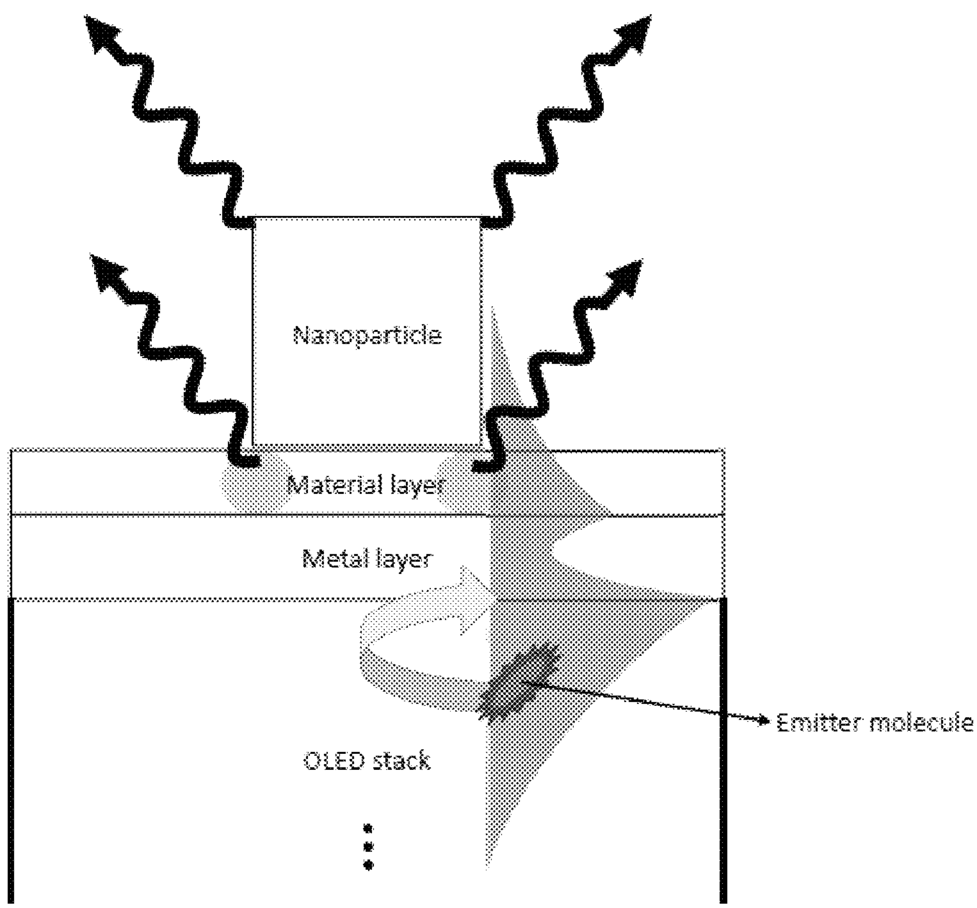
FIG. 6 shows that an excited emitter molecule's energy may be quenched to the SPR mode in the cathode, resulting in an electric field that may couple to the nanopatch antenna gap mode, and radiate out the energy as light according to an embodiment of the disclosed subject matter.

That is, FIG. 6 shows where energy is funneled through the SPR mode to be radiated as light. The excited emitter molecule's energy is quenched to the SPR mode in the cathode, resulting in an electric field that is, in turn, able to couple to the nanopatch antenna gap mode, and radiate out the energy as light.

Figure 7:
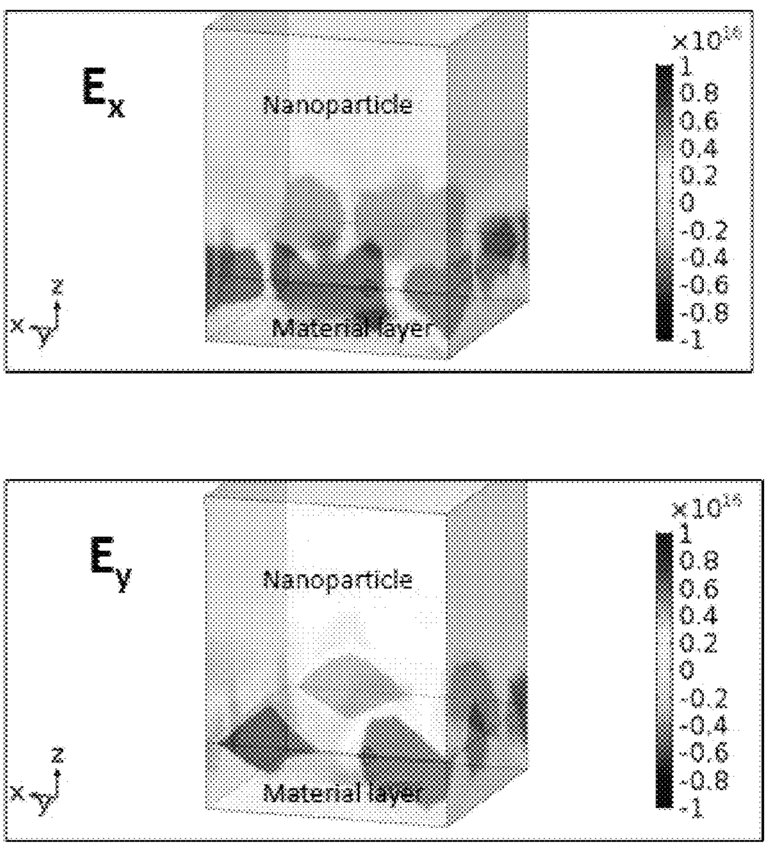
FIG. 7 shows a computer simulation of the electric field intensity in the x- and y-directions, Ex and Ey, respectively, in the material layer of a nanopatch antenna utilizing a nanocube as the nanoparticle, where the light outcoupled to the far field originates from the edge of the nanoparticle, according to an embodiment of the disclosed subject matter.

When a nanocube is used as the nanoparticle in the nanopatch antenna, the strength of the electric field may be highest at the corners of the nanocube, as shown in the simulations in FIG. 7. That is, FIG. 7 shows a simulation of the electric field intensity in the x- and y-directions, Ex and Ey, respectively, in the gap layer of a nanopatch antenna utilizing a nanocube as the nanoparticle. FIG. 7 shows that the light outcoupled to the far field originates from the edge of the nanoparticle.

Tuning the resonance of the nanopatch antenna to align with the emission spectrum of the phosphor may be for efficient conversion of the plasmon energy to light. Such tuning may be accomplished by any number of methods, including, but not limited to, varying the nanoparticle size, varying the nanoparticle shape (typical shapes are cubes, spheres, rods, disks, plates, stars, and modifications of these shapes with additional facets), changing the nanoparticle material (metal or dielectric), adjusting the thickness of the gap, changing the refractive index of the gap or the surrounding environment (for example, by depositing an additional capping layer atop the nanoparticles), and varying the planar metal thickness or metal type (e.g., where the metals may be Ag, Al, and/or Au, with a thicknesses range from 5 nm to 100 nm). An ordered array of nanoparticles may be used to enhance outcoupling efficiency, and/or to tune the resonant wavelength.

The planar metal film (e.g., an electrode layer) and/or metal nanoparticles may be pure or an alloy, preferably of Ag, Al, Ag—Al alloys, or Au. Some other materials include, but are not limited to Ir, Pt, Ni, Cu, W, Ta, Fe, Cr. The nanoparticles, additionally, may consist entirely of dielectric materials, may be an alloy of metal and dielectric materials, or may have a core of one type of material and be coated with a shell of a different type of material.

Gap thicknesses (e.g., material thickness) may be from 0-150 nm, and more preferably from 0-50 nm. When the gap is 0 nm (i.e., no gap), the nanoparticles may be disposed on the planar metal (e.g., the electrode layer) and may have a corrugation form to outcouple the SPR energy. Nanoparticle sizes for scattering out light in the visible part of the spectrum range (e.g., 400-700 nm wavelength) may be from 5 nm to 1000 nm, depending on the nanoparticle material and shape. The gap may be a dielectric material, such as an organic or metal oxide, with a refractive index from 1-5.

Figure 8:
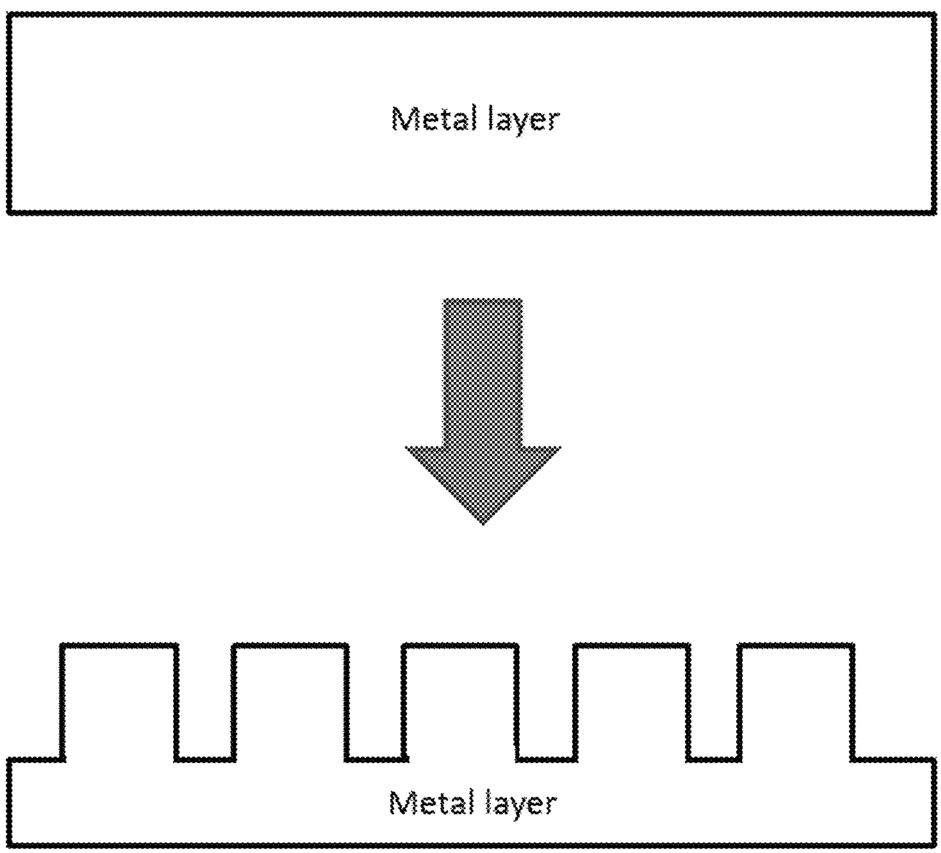
FIG. 8 shows a metal thin film (i.e., an electrode layer) that has been etched partially through the film thickness to produce a corrugated top surface while maintaining a planar bottom surface according to an embodiment of the disclosed subject matter.

The gap of 0 nm may be achieved without the use of nanoparticles. In an example device, shown in FIG. 8, a planar metal film may be etched partially through the film thickness to form a corrugated top surface, while the bottom surface of the film may be planar. This may be accomplished, for example, by using focused ion beam milling. The corrugation processing may be performed on a metal attached to a completed OLED device, or on a separate substrate from which the corrugated metal may be delaminated and attached to the OLED, or upon which the OLED may be grown.

Figure 9:
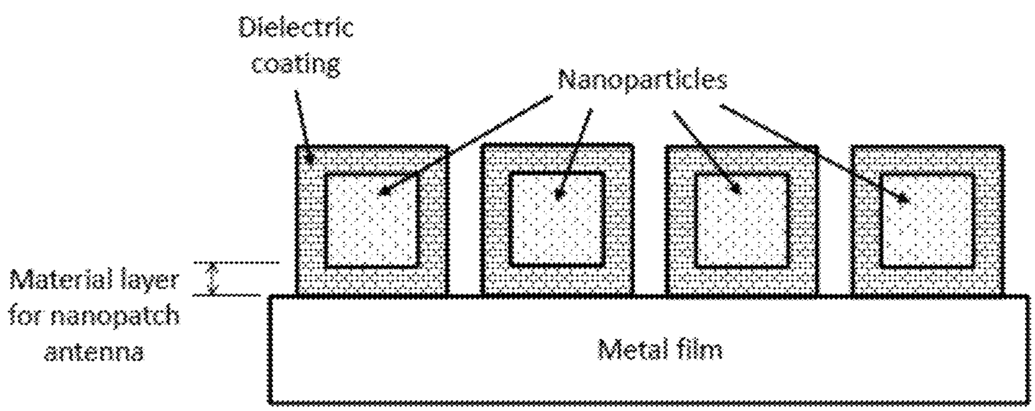
FIG. 9 shows that a nanoparticle coating may provide an appropriate gap thickness between the nanoparticle and the metal film according to an embodiment of the disclosed subject matter.

In another embodiment of the disclosed subject matter, the nanoparticles may be individually coated with a dielectric material to serve as part, or all, of the gap spacing (e.g., by a material), as shown in FIG. 9. For example, the particles may be coated with the entire gap thickness desired, thereby reducing the gap layer to zero. In another example, a combination of gap layer thickness plus nanoparticle coating may be achieve the desired total spacer thickness. The nanoparticle coating may act as an adhesion layer to improve nanoparticle adhesion to or increase nanoparticle density on the layers onto which they will be deposited.

Figure 10:
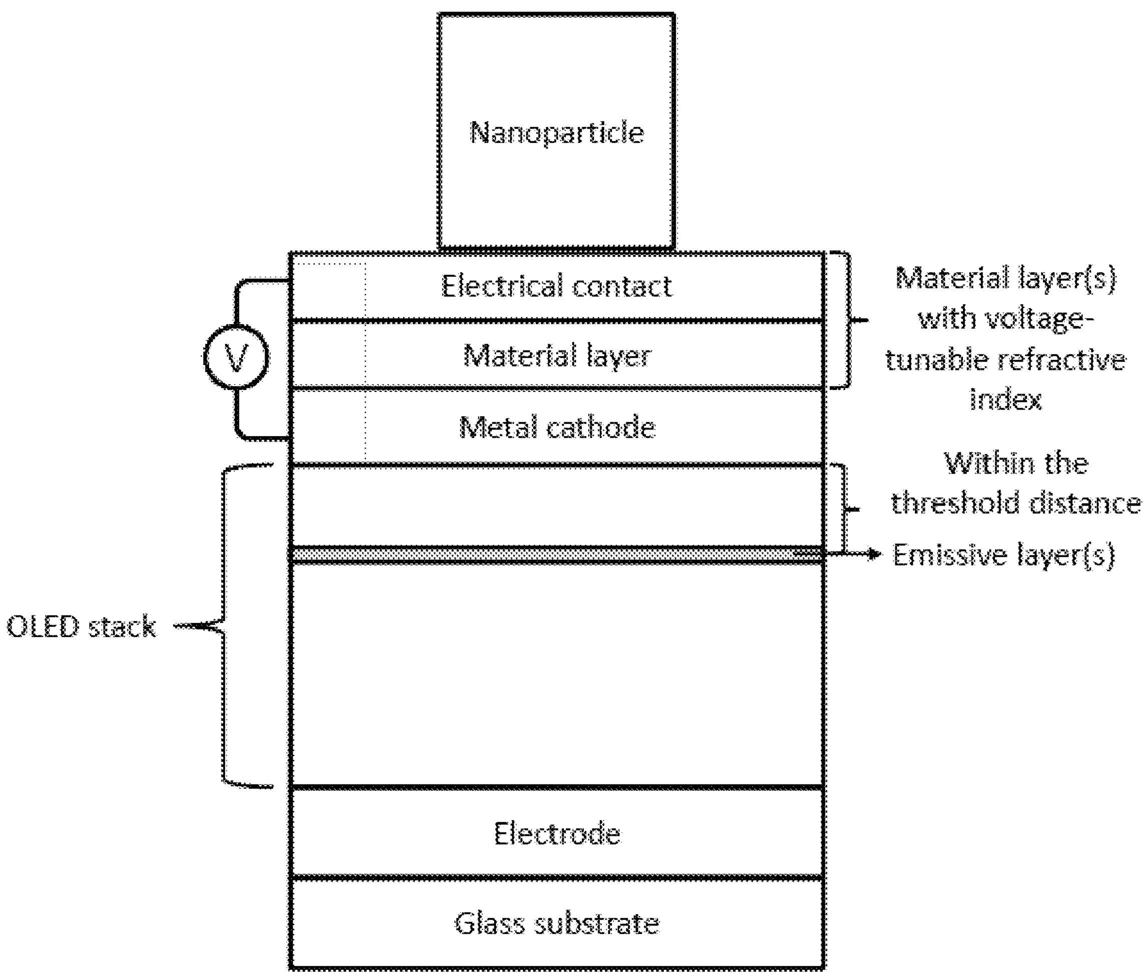
FIG. 10 shows an OLED combined with the nanopatch antenna utilizing a material(s) with voltage-tunable refractive index for selecting the wavelength of emitted light according to an embodiment of the disclosed subject matter.

Since the refractive index of the gap layer(s) may affect the resonance of the nanopatch antenna, using materials that have voltage-tunable refractive index may provide a way to tune the emission spectrum with voltage applied between the metal cathode and an electrical contact layer beneath the nanoparticle, as shown in FIG. 10. That is, FIG. 10 shows schematically an OLED combined with the nanopatch antenna utilizing a material(s) with voltage-tunable refractive index for selecting the wavelength of emitted light. In one example, aluminum-doped zinc oxide may be used as the voltage-tunable refractive index material since its permittivity is varied when an applied voltage modifies the carrier concentration. In this case, a second insulating layer may be used in the gap to build the charge. In some embodiments, the secondary insulating layer may be removed, depending on the material properties of the voltage-tunable refractive index layer. This may be useful when the OLED stack is a white OLED, i.e., containing red, green, and blue emission, since the voltage-tunable nanopatch resonance may act as a color filter to selectively pass the desired color. This effectively converts the OLED into a three-terminal device, with the voltage applied between the anode and cathode operating the OLED, and the voltage applied between the cathode and the electrical contact layer beneath the nanoparticle tuning the nanopatch resonance to select the emitted color.

That is, according to the embodiments shown in at least FIGS. 3*a*-10, a device may include an emissive layer, a first electrode layer, a plurality of nanoparticles, and a material disposed between the first electrode layer and the plurality of nanoparticles. The first electrode layer of the device may have a thickness from 5 nm to 300 nm.

The device may include a second electrode layer and a substrate, where the second electrode layer may be disposed on the substrate, and the emissive layer may be disposed on the second electrode layer. At least one of the first electrode layer and the second electrode layer may be a metal, a semiconductor, and/or a transparent conducting oxide. The first electrode layer may be spaced from the emissive layer by a predetermined threshold distance that is a distance at which a total non-radiative decay rate constant is equal to a total radiative decay rate constant. The material of the device may include at least one of organic material, oxides, and/or dielectric material. The material may have a refractive index from 1-5. The emissive layer of the device may include a transport layer. The emissive layer may be an organic layer with emitter molecules.

The emissive layer of the device may include at least one of a fluorescent material, a phosphorescent material, a thermally-activated delayed fluorescence (TADF) material, a quantum dot material, metal-organic frameworks, covalent-organic frameworks, and/or perovskite nanocrystals.

The device may include a nanopatch antenna, where the resonance of the nanopatch antenna may be tunable by at least one of varying a size of the plurality of nanoparticles, varying a ratio of a size of the plurality of nanoparticles, varying a shape of the plurality of nanoparticles, changing a material of the plurality of nanoparticles, adjusting a thickness of the material, changing the refractive index of the material, changing the refractive index of an additional layer disposed on the plurality of nanoparticles, varying a thickness of the first electrode layer, and/or varying the material of the first electrode layer. The plurality of nanoparticles may be formed from at least one of Ag particles, Al particles, Au particles, dielectric material, semiconductor materials, an alloy of metal, a mixture of dielectric materials, a stack of one or more materials, and a core of one type of material and that is coated with a shell of a different type of material. At least one of the plurality of nanoparticles of the device may include an additional layer to provide lateral conduction among the plurality of nanoparticles. The plurality of nanoparticles may be coated with an oxide layer, where a thickness of the oxide layer is selected to tune a plasmonic resonance wavelength of the plurality of nanoparticles or a nanopatch antenna. A shape of the plurality of nanoparticles may be at least one of cubes, spheres, spheroids, cylindrical, parallelepiped, rod-shaped, star-shaped, pyramidal, and/or multi-faceted three-dimensional objects. A size of at least one of the plurality of nanoparticles may be from 5 nm to 1000 nm.

The device may include a corrugated layer disposed on the substrate, where the second electrode layer, the emissive layer, the first electrode layer, and the material are correspondingly corrugated, as shown in FIG. 5*b*.

The material of the device may include a dielectric layer disposed on the first electrode layer, and an electrical contact layer disposed on the dielectric layer. The material may include a voltage-tunable refractive index material between the electrical contact layer and the first electrode layer. The voltage-tunable refractive index material may be aluminum-doped zinc oxide. The material may include an insulating layer. The first electrode layer of the device may be spaced from the emissive layer by a predetermined threshold distance. As discussed above, the predetermined threshold distance may be a distance at which a total non-radiative decay rate constant is equal to a total radiative decay rate constant.

In some embodiments, the device may include an additional layer disposed on the plurality of nanoparticles. The additional layer may include one or more emitter molecules. The additional layer may match a refractive index beneath the first electrode layer. The additional layer may have a thickness of 1000 nm or less.

A nanopatch antenna (NPA) may include a planar metal film (e.g., an electrode layer), a gap material (e.g., a dielectric material or the like) disposed on top of the planar metal, and a nanoparticle placed atop the gap material (e.g., as shown in FIG. 3*a*). This configuration results in a resonant plasmon mode due to the high electric field intensity created in the gap medium. This large electric field may be used to enhance the emission rate of an emitter placed in the gap, known as the Purcell effect which, in turn, will stabilize the emitter to detrimental processes that rely on the emitter being in the excited state. The nanopatch antenna may radiate out the energy from this plasmonically-active mode with efficiencies up to 50%. Previous NPA designs have typically been optically pumped (for example, by a laser).

Figure 11:
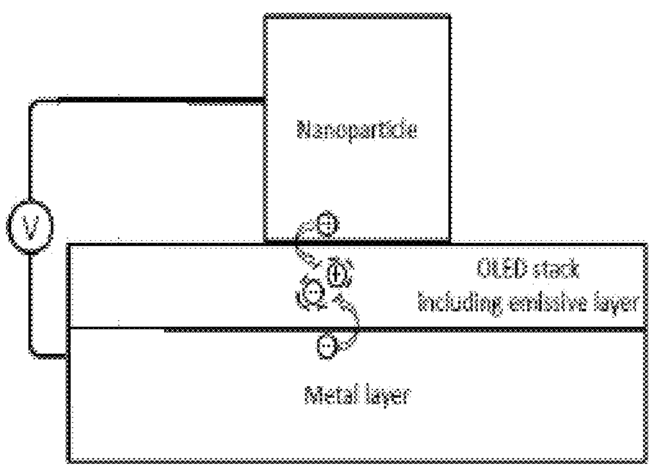
FIG. 11 shows an OLED stack deposited within the dielectric region, and using the nanoparticle and metal layer as electrodes to inject charge according to an embodiment of the disclosed subject matter.

In embodiments of the disclosed subject matter, an OLED stack may be disposed within the dielectric region or NPA gap, and the nanoparticle and planar metal may provide as electrical injection pathways to the device, as shown in FIG. 11. Traditionally, it was not expected that an OLED that is 5 to 20 nm thick would work, due to quenching to non-radiative modes. However, the large Purcell enhancement may enable fast coupling of the phosphor to the radiative mode, out-competing the loss processes that would normally be present in an OLED that is 5 to 20 nm thick.

Since typical NPA gap thicknesses are about 2-15 nm, it may seem infeasible to fabricate an entire OLED stack that maintains high internal quantum efficiency within the nanopatch antenna gap. The large electric fields present in NPA gaps of this thickness may be able to enhance the emission rate of an emitter placed in the gap by a factor of 1000. As discussed above, Purcell factors on the order of 10 may be sufficient for an enhancement in OLED emitter stability (e.g., phosphorescent OLED stability). In embodiment of the disclosed subject matter, some of the Purcell enhancement may be traded for a thicker NPA gap more amenable to an OLED stack approximately 5-100 nm in thickness.

Figure 12A:
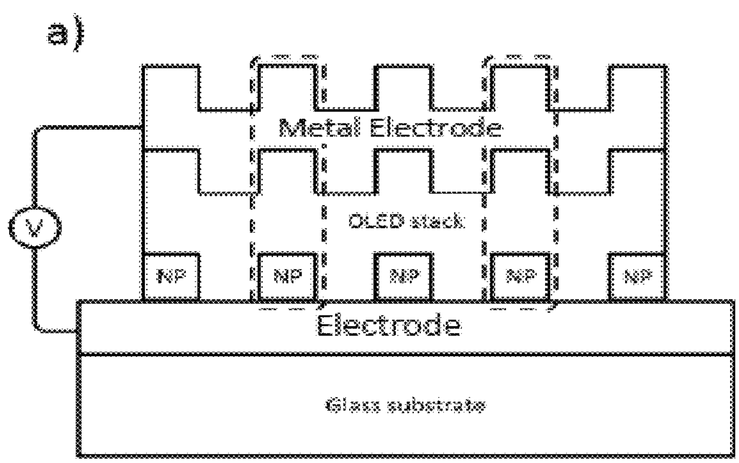
FIG. 12*a* shows a nanopatch antenna OLED device having metal nanoparticles deposited on top of an electrode and substrate, thereby allowing charge injection from both the ITO (indium tin oxide) and metal nanoparticles according to an embodiment of the disclosed subject matter.

It may seem infeasible to inject charge through a metal nanoparticle typically on the order of 5 nm to 1000 nm in size. Embodiments of the disclosed subject matter provide devices to address this. FIG. 12*a* shows an indium tin oxide (ITO) coated glass substrate upon which metal nanoparticles, typically Ag, Al, or Au, have been dispersed. In one example device, these nanoparticles may have been drop cast or spin cast from solution. In another example, the nanoparticles may have been processed directly on the substrate via photolithography and subsequent metal liftoff. The OLED stack may be deposited atop the metal nanoparticles and capped with a metal electrode, typically Ag, Al, or Au. This may form a corrugated device structure, as shown in FIG. 12*a*.

Figure 12B:
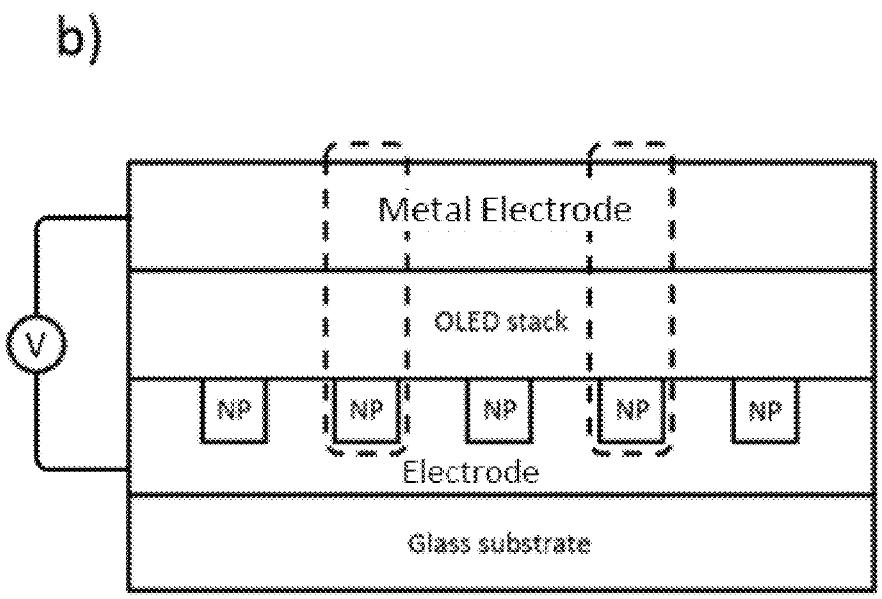
FIG. 12*b* shows an alternative planar OLED device to that shown in FIG. 12*a* according to an embodiment of the disclosed subject matter.

For applications where corrugation is undesirable, a device such as shown in FIG. 12*b* may be used. To form this device, the nanoparticle features are etched into the ITO, but not all the way through the ITO layer. In one example, the etching may be performed by a reactive ion etcher due to the directional nature of the etching process.

Figure 13:
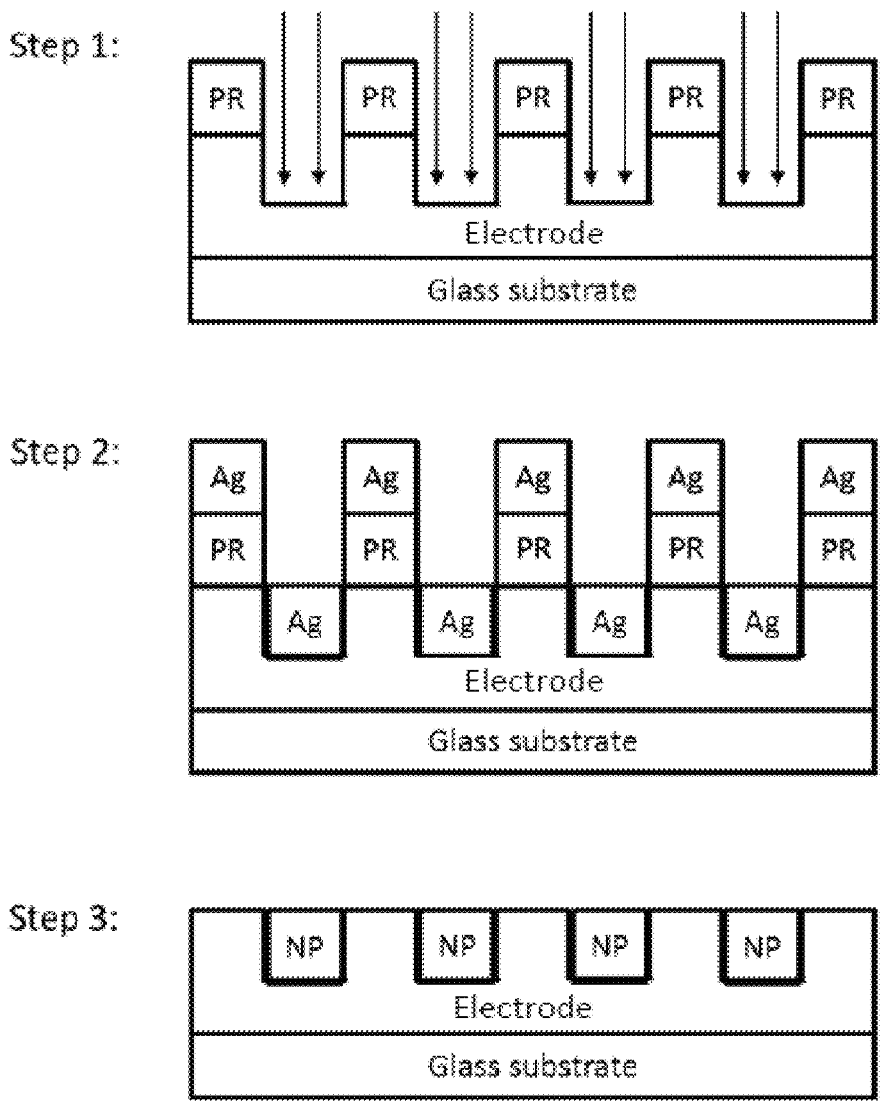
FIG. 13 shows a method of forming a bottom electrode for the planar electrically-driven OLED as shown in FIG. 12*b* according to an embodiment of the disclosed subject matter.

As shown in FIG. 13, a thickness of metal may be deposited matching the depth of the ITO etch, and liftoff of the metal (Ag) on photoresist (PR) may be performed. This may result in metal nanoparticles (NP) that are flush with the top surface of the ITO. The OLED stack may then be grown on this planar substrate, and a planar metal deposited as the top contact, to form the NPA OLED structure. Injection of charge into the OLED can occur from either the nanoparticles or the ITO.

In FIGS. 12*a*-12*b*, two individual NPAs are highlighted in dashed boxes. In the case that the nanoparticles as far enough apart from each other such that there is no coupling between nanoparticles, each NPA operates independently. In this case, the electric field (and hence, Purcell enhancement) may be higher for emitter molecules located within an individual NPA than outside of it. This may result in some variation in emitter rate spatially throughout the OLED emissive layer, but because the metal contact is in close proximity to all the emitter molecules in the stack, all emitter molecules will sense an increased density of photonic states, and therefore experience Purcell enhancement. When the nanoparticles are formed into an array such that coupling between nanoparticles can occur, it may result in a hybrid, spatially-delocalized mode that can reduce the variation in the Purcell enhancement. In some embodiments, the nanoparticles may be close enough that they form a hybridized mode. In another embodiment, the nanoparticles may not hybridize.

In some embodiments, the nanoparticles may be cubes, spheres, spheroids, cylindrical, parallelepiped, and/or rod-like. The nanoparticles may vary in size from 5 nm to 1000 nm, and more preferably from 5 nm to 200 nm. The nanoparticles may be dielectric, semiconductor, or metallic.

The gap material may be a dielectric or semiconductor and have a refractive index from 1 to 15. The gap material may include at least one light emitting material, which may be fluorescent, phosphorescent, thermally-activated delayed fluorescence (TADF), or a quantum dot. In some embodiments, there may be many light emitting materials of one or more types. The gap may include a host material. The gap may include may include a plurality of layers of material or may be only 1 layer. In some embodiments, the gap material may include a mixture of materials. The gap may range in thickness from 0.1 nm to 100 nm.

The planar metal film may be pure or an alloy, preferably of Ag, Al, Ag—Al alloys, or Au. Some other materials include, but are not limited to Ir, Pt, Ni, Cu, W, Ta, Fe, Cr. The top side of the planar film may be patterned with additional material. The top of the metal film may have an additional material on it; this material may include a light emitting element, including quantum dots.

That is, in the embodiments shown in FIGS. 11-12*b*, a device may include an emissive layer, a first electrode layer, a plurality of nanoparticles, and a material disposed between the first electrode layer and the plurality of nanoparticles. The material of the device may include the emissive layer. The plurality of nanoparticles and the first electrode layer may provide an electrical injection pathway to the device. The device may include a substrate and a second electrode layer, where the first electrode layer may be non-planar, where the second electrode layer may be disposed on the substrate, and the plurality of nanoparticles may be disposed on the second electrode layer, where the emissive layer may be non-planar and may be included in the material, and may be disposed on and conforms to the plurality of nanoparticles and the second electrode layer, and where the first electrode layer may be disposed on and conforms to the non-planar emissive layer. At least one of the first electrode layer and the second electrode layer may be a metal, a semiconductor, and/or a transparent conducting oxide.

As shown in FIG. 13, the method include disposing a first electrode layer on a substrate, disposing photoresist on the first electrode layer, etching at least a portion of the photoresist and the first electrode layer, depositing a metal on the portions of the photoresist that remain, and to match the depth of the etched portion of the first electrode layer, removing the metal and the photoresist so as to form nanoparticles from the deposited metal that are flush with a surface of the first electrode layer, disposing an emitting layer on the first electrode layer and the nanoparticles, and disposing a second electrode layer on the emitting layer.

Embodiments of the disclosed subject matter provide improved organic light emitting diode (OLED) performance by using nanostructures having one or more different geometries, shapes, materials, and/or lattice symmetries. The nanostructures may enhance emission rates, increase surface plasmon polariton (SPP) mode out-coupling, improve device stability, and/or provide a far-field radiation pattern.

For efficient coupling of an excited state energy into a plasmon mode, an emitter or emissive layer may be placed within a threshold distance of a structure and/or layer(s) that increase the photonic density of states (as shown in FIGS. 14*a*-14*f*), subsequently resulting in an enhanced emission rate, known as the above-described Purcell effect. As discussed above, the threshold distance may be a distance at which the total non-radiative decay rate constant is equal to the total radiative decay rate constant.

Figure 14A:
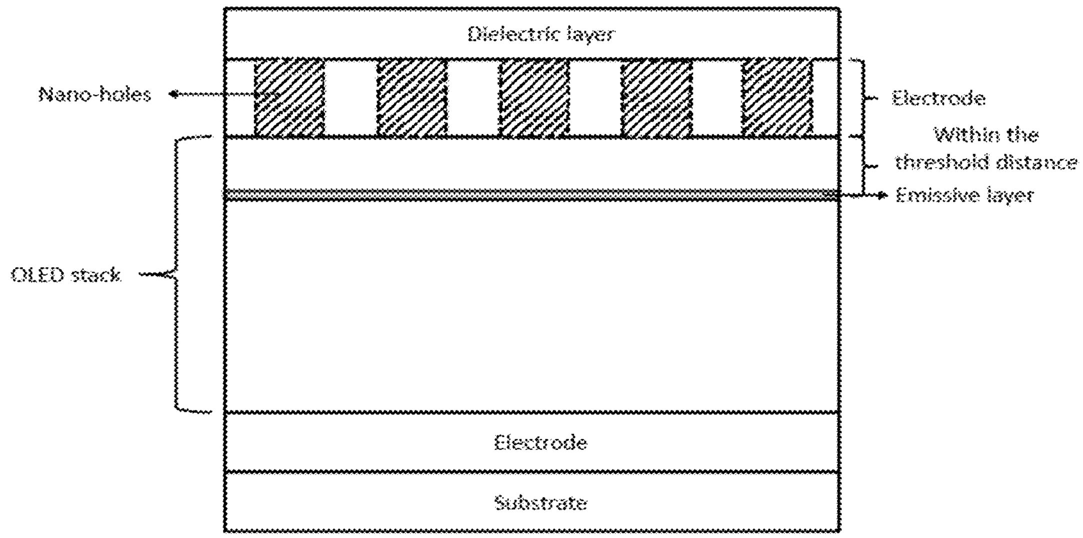
FIG. 14*a*-14*f* show example show examples of OLED devices with various nanostructures, either with or without a dielectric capping layer, according to embodiments of the disclosed subject matter.
Figure 14B:
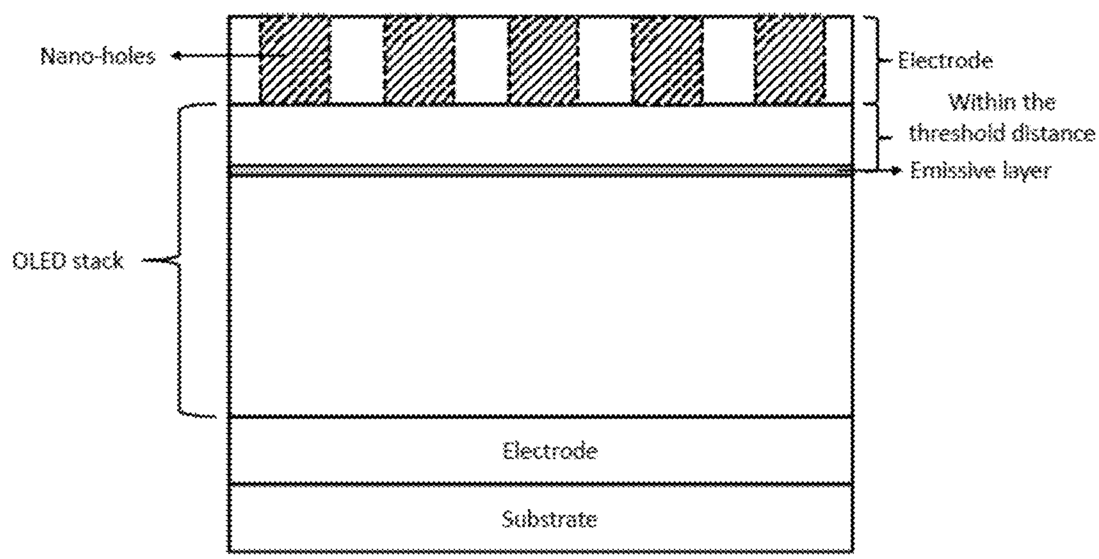
Figure 14C:
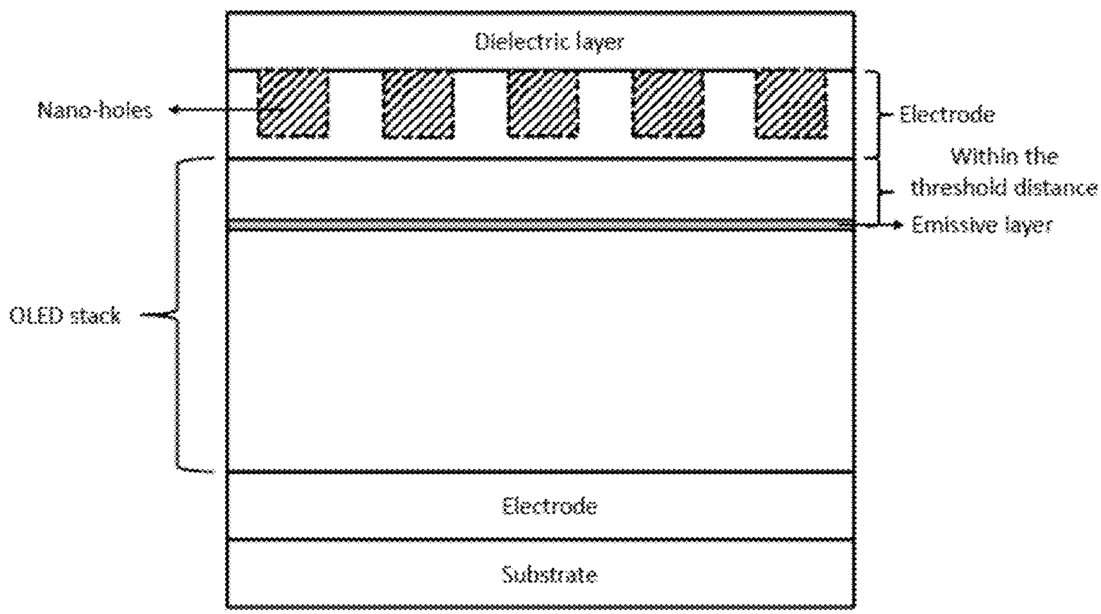
Figure 14D:
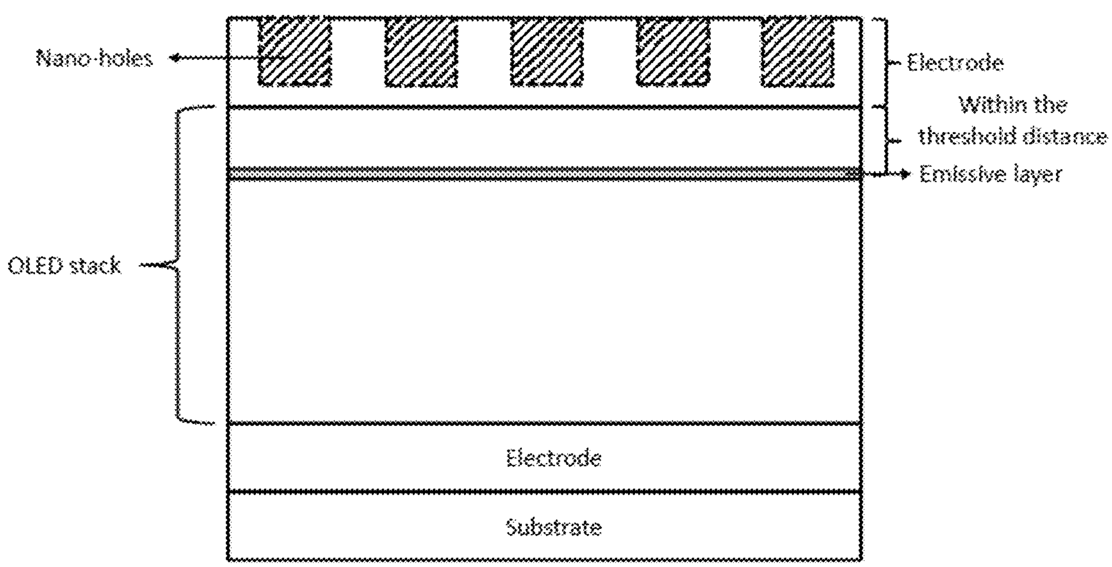
Figure 14E:
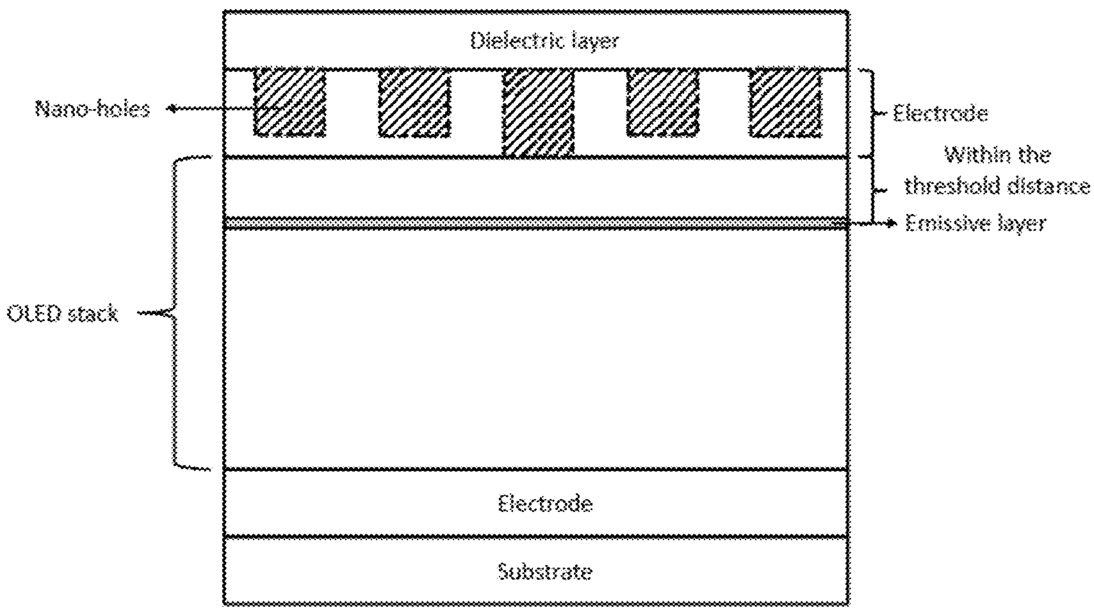
Figure 14F:
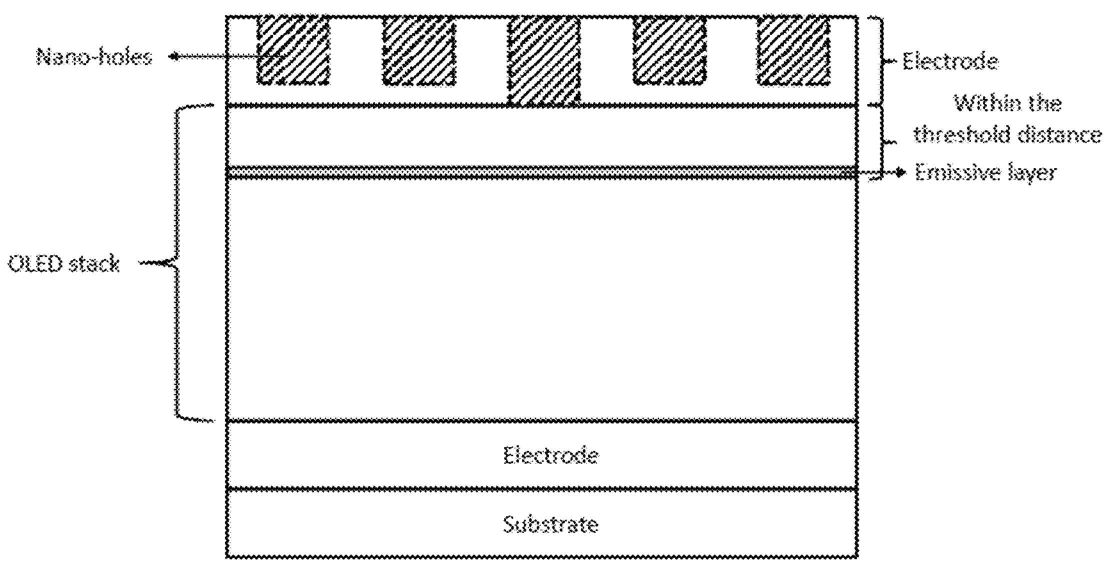

The example devices in FIGS. 14*a*-14*f* show variations of the nanostructured cathode (cross-section view) according to embodiments of the disclosed subject matter. These include nano-holes (which may also be referred to as nanostructures) that may be etched all the way through the metal film (shown in FIGS. 14*a*, 14*b*), partially through the metal film (shown in FIGS. 14*c*, 14*d*), or where some holes may be etched fully through the metal film while others are only partially etched (shown in FIGS. 14*e*, 14*f*). FIGS. 14*a*-14*f* show variations in which the nanostructured cathode is capped with a dielectric layer (as shown in FIGS. 14*a*, 14*c*, 14*e*) or without a dielectric layer (as shown in FIGS. 14*b*, 14*d*, 14*f*) for the purpose of matching the refractive index to that beneath the cathode to improve cross-coupling of the surface plasmon mode across the metal film's thickness. The profile of the hole (nanostructure), i.e., whether the hole edge and/or sidewall may be perpendicular to the film's surface or if the sidewall of the hole has a radius of curvature, may be used to tune the properties of the nanostructured array.

Figure 15:
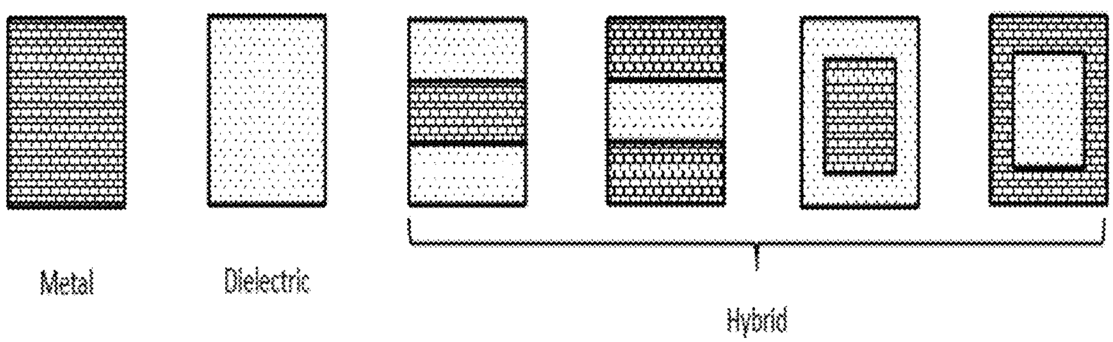
FIG. 15 shows how a material composition of the nanostructures may be metal, dielectric, or some combination (i.e., a hybrid) of the two according to an embodiment of the disclosed subject matter.

The nanostructures may be made of metals, dielectrics or some combination of these. FIG. 15 shows some examples of different possible combinations according to embodiments of the disclosed subject matter. The use of composites (e.g., a metal and a dielectric) provides flexibility in the device design, as a resonant frequency of a localized mode may be tuned and/or selected by the composite used. For each of these material, the localized electromagnetic mode may be tuned. Typical metals used include, but are not limited to: Ag, Al, Au, Ir, Pt, Ni, Cu, W, Ta, Fe, Cr, Mg, Ga, Rh, Ti, Ru, Pd, In, Bi, and/or Ca, and may include stacks and/or alloys of these materials. Dielectrics used may include, but are not limited to: organic material, titania, silicon dioxide, silicon nitride, aluminum oxide, zinc oxide, nickel oxide, germanium oxide, lithium fluoride, magnesium fluoride, and/or molybdenum oxide.

Figure 16:
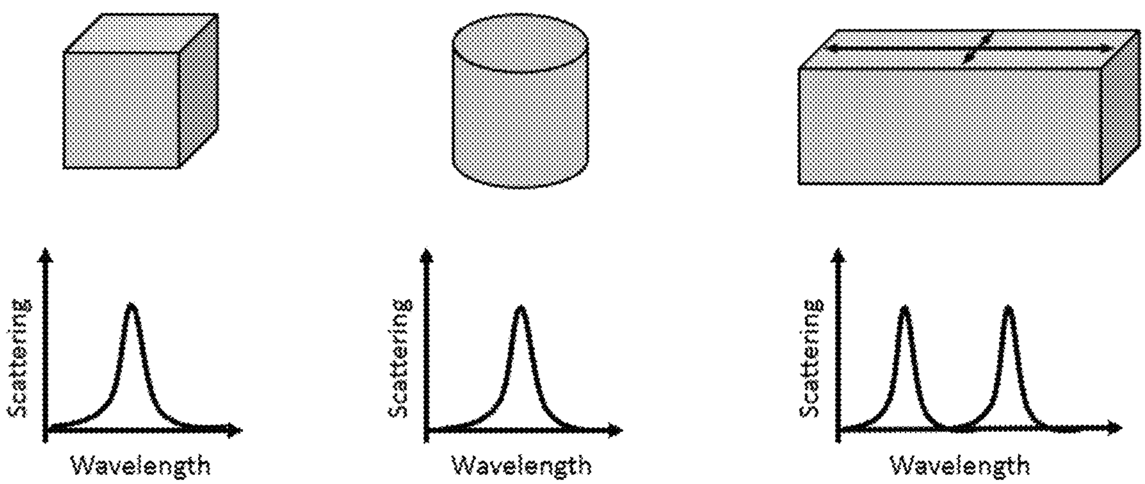
FIG. 16 shows that particle shape may affects the resonant plasmon mode frequency according to embodiments of the disclosed subject matter.

The localized electromagnetic resonance of a nanostructure or a portion of the nanostructure may be tuned by a shape of the nanostructure. The shape may include any cylindrical, spherical, and/or cubic shape, or any shape that has single or multiple localized resonances, as shown in FIG. 16. A radius of curvature for edges and/or corners in faceted nanostructures may be used to tune the resonant frequency of the nanostructure. Examples of some multiple-localized-resonance shapes may include ellipses and rectangles that support multiple modes with different frequencies induced by the asymmetry of the nanostructure. For example, FIG. 16 shows how differing length and/or width of a rectangular nanostructure may result in two distinct resonant frequencies. These multiple-frequency nanostructures may provide enhanced outcoupling for multi-wavelength or white emission OLEDs.

That is, in the embodiments shown in FIGS. 14*a*-16, a device may include an emissive layer, a first electrode layer, a plurality of nanoparticles, and a material disposed between the first electrode layer and the plurality of nanoparticles. The device may include a substrate and a second electrode layer, the material is a first dielectric layer, and a second dielectric layer, where the second electrode layer is disposed on the substrate, the emissive layer is disposed on the second electrode layer, the first electrode layer is disposed on the emissive layer, the first dielectric layer is disposed on the first electrode layer, the plurality of nanoparticles are disposed on the first dielectric layer, and the second dielectric layer is disposed on the plurality of nanoparticles and the first dielectric layer. At least one of the first electrode layer and the second electrode layer may be a metal, a semiconductor, and/or a transparent conducting oxide. The second electrode layer may be spaced from the emissive layer by a predetermined threshold distance that is a distance at which a total non-radiative decay rate constant is equal to a total radiative decay rate constant. The material may include at least one selected from the group consisting of: organic material, oxides, and dielectric material. The material may have a refractive index from 1-5. The emissive layer may include a transport layer. The emissive layer may be an organic layer with emitter molecules. The emissive layer may include at least one of a fluorescent material, a phosphorescent material, a thermally-activated delayed fluorescence (TADF) material, a quantum dot material, metal-organic frameworks, covalent-organic frameworks, and perovskite nanocrystals. The first electrode layer may have a thickness from 5 nm to 300 nm.

The device may include a nanopatch antenna, where the resonance of the nanopatch antenna may be tunable by at least one of varying a size of the plurality of nanoparticles, varying a ratio of a size of the plurality of nanoparticles, varying a shape of the plurality of nanoparticles, changing a material of the plurality of nanoparticles, adjusting a thickness of the material, changing the refractive index of the material, changing the refractive index of an additional layer disposed on the plurality of nanoparticles, varying a thickness of the first electrode layer, and/or varying the material of the first electrode layer. The plurality of nanoparticles may be formed from at least one of Ag particles, Al particles, Au particles, dielectric material, semiconductor materials, an alloy of metal, a mixture of dielectric materials, a stack of one or more materials, and a core of one type of material and that is coated with a shell of a different type of material. At least one of the plurality of nanoparticles of the device may include an additional layer to provide lateral conduction among the plurality of nanoparticles. The plurality of nanoparticles may be coated with an oxide layer, where a thickness of the oxide layer is selected to tune a plasmonic resonance wavelength of the plurality of nanoparticles or a nanopatch antenna. A shape of the plurality of nanoparticles may be at least one of cubes, spheres, spheroids, cylindrical, parallelepiped, rod-shaped, star-shaped, pyramidal, and/or multi-faceted three-dimensional objects. A size of at least one of the plurality of nanoparticles may be from 5 nm to 1000 nm.

The device may include a substrate and a second electrode layer, where the material may be a first dielectric layer, where the second electrode layer may be disposed on the substrate, the emissive layer may be disposed on the second electrode layer, the first electrode layer may be disposed on the emissive layer, the first dielectric layer may be disposed on the first electrode layer, and the plurality of nanoparticles may be disposed on the first dielectric layer. At least one of the first electrode layer and the second electrode layer may be a metal, a semiconductor, and/or a transparent conducting oxide.

The device may include a substrate and a second electrode layer, where the material is a first dielectric layer, and a second dielectric layer, where the plurality of nanoparticles may be disposed in the second dielectric layer, and where the second dielectric layer and the plurality of nanoparticles may be disposed on the substrate, the first dielectric layer may be disposed on the second dielectric layer and the plurality of nanoparticles, the first electrode layer may be disposed on the first dielectric layer, the emissive layer may be disposed on the first electrode, and the second electrode may be disposed on the emissive layer. At least one of the first electrode layer and the second electrode layer may be a metal, a semiconductor, and/or a transparent conducting oxide.

The device may include a substrate and a second electrode layer, the material may be a first dielectric layer, a second dielectric layer, and the first electrode layer may be disposed on the substrate, the first dielectric layer may be disposed on the first electrode layer, the plurality of nanoparticles may be disposed on the first dielectric layer, the second dielectric layer may be disposed on the plurality of nanoparticles and the first dielectric layer, the emissive layer may be disposed on the second dielectric layer, and the second electrode layer may be disposed on the emissive layer.

The device may include a substrate and a second electrode layer, the material is a first dielectric layer, and a second dielectric layer, where the second electrode layer may be disposed on the substrate, the emissive layer may be disposed on the second electrode layer, the plurality of nanoparticles may be disposed on the emissive layer, the second dielectric layer may be disposed on the plurality of nanoparticles and the emissive layer, the first dielectric layer may be disposed on the second dielectric layer, and the first electrode layer is disposed on the first dielectric layer. At least one of the first electrode layer and the second electrode layer may be a metal, a semiconductor, and/or a transparent conducting oxide.

The material of the device may include at least one of organic material, oxides, and/or dielectric material. The material may include a first layer and a second layer, where the first layer is thicker than the second layer. The first layer may be a dielectric material, and the second layer may be a nanoparticle adhesion layer. The thickness of the first layer may be between 1 to 100 nm, and the thickness of the second layer may be less than 5 nm. The material may have a thickness of 1000 nm or less. The material of the device may have a refractive index from 1-5. The material may include a least a portion of a coating disposed on the plurality of nanoparticles. The coating disposed on the plurality of nanoparticles may be a dielectric coating.

The device may include a second electrode layer, where the emissive layer is included in an organic light emitting diode (OLED), and where the OLED is disposed between the first electrode layer and the second electrode layer. At least one of the first electrode layer and the second electrode layer may be a metal, a semiconductor, and/or a transparent conducting oxide. The emissive layer may include a transport layer. The emissive layer may be an organic layer with emitter molecules. The emissive layer may include at least one of fluorescent material, phosphorescent material, thermally-activated delayed fluorescence (TADF) material, a quantum dot material, metal-organic frameworks, covalent-organic frameworks, and/or perovskite nanocrystals.

The first electrode layer of the device may be spaced from the emissive layer by a predetermined threshold distance, wherein the threshold distance is a distance at which a total non-radiative decay rate constant is equal to a total radiative decay rate constant. The first electrode layer may include at least one of Ag, Al, Au, Ir, Pt, Ni, Cu, W, Ta, Fe, Cr, Mg, Ga, Rh, Ti, Ru, Pd, In, Bi, and/or Ca. The first electrode layer may be patterned with an additional material. The additional material may include a light emitting element of a fluorescent emitter, a phosphorescent emitter, quantum dots, metal-organic frameworks, covalent-organic frameworks, and/or perovskite nanocrystals. The first electrode layer may has a thickness from 5 nm to 300 nm. The first electrode layer of the device may have at least one nonplanar surface.

The device may include a nanopatch antenna, and where the resonance of the nanopatch antenna may be tunable by at least one of varying a size of the plurality of nanoparticles, varying a ratio of a size of the plurality of nanoparticles, varying a shape of the plurality of nanoparticles, changing a material of the plurality of nanoparticles, adjusting a thickness of the material, changing the refractive index of the material, changing the refractive index of an additional layer disposed on the plurality of nanoparticles, varying a thickness of the first electrode layer, and/or varying the material of the first electrode layer.

The plurality of nanoparticles of the device may be formed from at least one of Ag particles, Al particles, Au particles, dielectric material, semiconductor materials, an alloy of metal, a mixture of dielectric materials, a stack of one or more materials, and/or a core of one type of material and that is coated with a shell of a different type of material.

At least one of the plurality of nanoparticles of the device may include an additional layer to provide lateral conduction among the plurality of nanoparticles. The plurality of nanoparticles are coated with an oxide layer, where a thickness of the oxide layer is selected to tune a plasmonic resonance wavelength of the plurality of nanoparticles or a nanopatch antenna. The plurality of nanoparticles may be colloidally-synthesized nanoparticles formed from a solution. A shape of the plurality of the nanoparticles may be at least one of cubes, spheres, spheroids, cylindrical, parallelepiped, rod-shaped, star-shaped, pyramidal, and multi-faceted three-dimensional objects. A size of at least one of the plurality of nanoparticles may be from 5 nm to 1000 nm. The size of at least one of the plurality of nanoparticles may be from 5 nm to 200 nm. The size of at least one of the plurality of nanoparticles may be from 5 nm to 100 nm.

The device may include a substrate, a second electrode layer, where the second electrode layer may be disposed on the substrate, and the nanoparticles may be disposed in the second electrode layer, where the emissive layer may be included in the material, and may be disposed on the second electrode layer that includes the plurality of nanoparticles, and where the first electrode layer is disposed on the emissive layer. At least one of the first electrode layer and the second electrode layer may be a metal, a semiconductor, and/or a transparent conducting oxide.

Inorganic light emitting diodes (LEDs) are gaining prominence lighting and display applications. Some inorganic light emitting diodes suffer from outcoupling issues, which include efficiency problems and angular dependence, as well as efficiency roll off at high brightness. While the physical origin of "efficiency droop" depends on the LED system (e.g., the materials, device design, and the like), one explanation is that efficiency droop arises from luminescence quenching phenomena, such as Auger recombination, that reduce luminescence efficiency through non-radiative processes. The likelihood of such luminescence-quenching events increases as the local carrier density increases, since interactions may be more common.

The disclosed subject matter provides a device that includes an enhancement layer. The enhancement layer may be a plasmonic system, a hyperbolic metamaterial, and/or an optically active metamaterial, which is a material that has both negative permittivity and negative permeability. Examples of an enhancement layer may include a metal cathode or anode thin film, stacks of metal films and/or dielectric layers, or even-spaced metal nanoparticles.

For example, FIG. 5*a* shows the enhancement layer as a metal electrode. Variations of the enhancement layer may be placed within a threshold distance of the recombination zone, such as shown in FIG. 5*a*, to speed up the emission rate due to the increased density of optical states quickly quenching the excited state energy to the surface plasmon mode of the enhancement layer. The threshold distance may be the distance at which a total non-radiative decay rate constant is equal to a total radiative decay rate constant. This may reduce the efficiency roll off at high current density by reducing excited state interactions.

Figure 17:
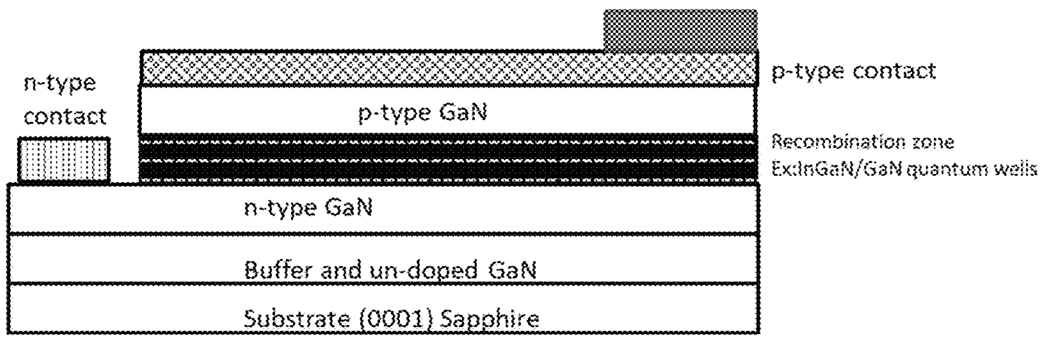
FIG. 17 shows example inorganic LEDs, which may include an enhancement layer (e.g., an electrode layer) and an outcoupling layer according to embodiments of the disclosed subject matter. The bottom embodiment enables a larger area of light emission as the top contact p-type in this embodiment is incorporated into the enhancement layer.
Figure 17:
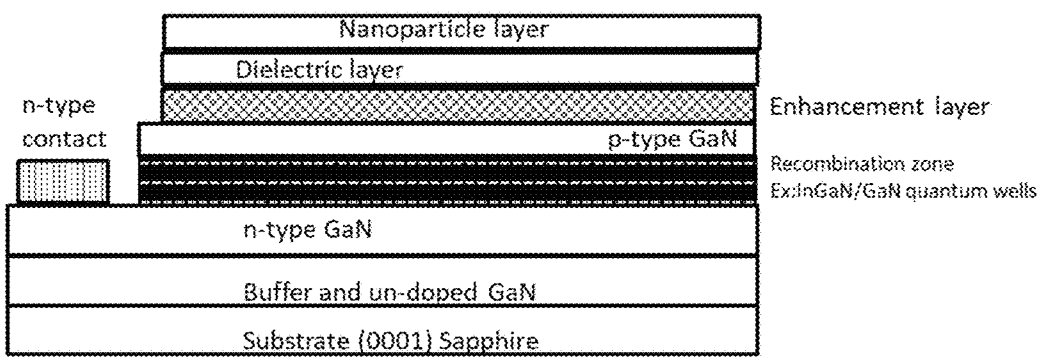

In another example, the enhancement layer may have a plurality of layers, as shown in FIG. 17. Each layer may include a unit cell having a plurality of unit cell subcomponent layers. Each unit cell may have a first unit cell subcomponent and a second unit cell subcomponent.

Increased junction temperature in an LED typically results in reduced light output. This is particularly true for yellow and/or red AlGaInP LEDs. Manufactures sometime apply compensation circuitry to mitigate this light loss with temperature but this can result in a reduced lifetime of the LED. The LED junction temperature may be dependent on the ambient temperature, current through the LED, and/or efficiency of the surround materials, including any applied heat-sinking features. The enhancement layer of the disclosed subject matter may reduce the excited state lifetime of the LED, and may reduce the heating of the LED device, leading to an increase in the stability of the LED device or any components in contact with the LED device. By reducing the current through the LED to produce a given light output, the resultant reduced junction temperature and/or heat load to the device may allow a reduction of heat sinking and compensation circuitry. This may reduce manufacturing costs and/or complexity, and may reduce the size and/or form factor of the LEDs.

Despite the reduction in efficiency roll off at high current densities, the embodiments of the disclosed subject matter may be lower efficiency than without the enhancement layer, since much of the excited state energy may be quenched into the non-radiative modes of the enhancement layer. To regain device efficiency, some embodiments may include a nano-size object-based outcoupling structure. In some embodiments, the outcoupling structure features may be included in the enhancement layer.

In an embodiment of the disclosed subject matter, an enhancement layer and a nano size outcoupling including a planar metal, a dielectric gap material, and a layer of nanoparticles. As used throughout, this may be an enhancement layer with a nanopatch outcoupling structure. This outcoupling structure may convert the plasmon energy back into photons and may not be constrained by the index contrast external quantum efficiency limit of typical LEDs. That is, a LED with the enhancement layer of the disclosed subject matter may match or exceed a conventional device efficiency without the enhancement layer and outcoupling structure. In some embodiments, the enhancement layer may be a planar metal film and/or metal nanoparticles and may be pure, or an alloy, or a mixture, preferably of Ag, Al, Ag—Al alloys, or Au, as shown, for example, in FIGS. 14-14*f*. The enhancement layer may be composed of one or more other materials, such as Ag, Al, Au, Ir, Pt, Ni, Cu, W, Ta, Fe, Cr, Mg, Ga, Rh, Ti, Ca, Ru, Pd, In, and/or Bi. The outcoupling structure may include metal cathode or anode thin film, stacks of metal film, dielectric layers, and nanoparticles, gratings (e.g., one-dimensional gratings, two-dimensional gratings, hexagonal gratings, bullseye gratings, and the like), and/or a distributed Bragg reflector. The grating may include dielectric materials, or a mixture of dielectric, semiconducting, and metallic materials.

The nanoparticles may be entirely comprised of dielectric materials. In some embodiments, the nanoparticles may be an alloy of metals, may be dielectric materials, and/or may have a core of one type of material and be coated with a shell of a different type of material. Typical nanoparticle sizes for scattering out light in the visible part of the spectrum may range from 5 nm to 1000 nm, depending on the nanoparticle material and shape. If the LED is designed for emission in the near infrared or infrared, the particle size may range from 500 nm to 5000 nm. Table 1 below discloses example LED materials, enhancement layer and/or metal nanoparticle materials, and/or particle size ranges. Gap thicknesses may range from 0-150 nm, more preferably from 0-50 nm for visible emission (e.g., 400-700 nm), and larger gaps for the infrared spectrum (e.g., 700 nm-1 mm). Where the gap may be 0 nm (i.e., no gap), the nanoparticles may sit directly atop the planar metal, and may serve as a form of corrugation to outcouple the surface plasmon energy. The gap may typically be comprised of a dielectric material, such as an organic material, metal oxide (crystalline or amorphous), and/or a nitride, with a refractive index from 1-5. The refractive index of the gap may range from 1.01 to 5, depending on the material utilized.

The nanopatch antenna resonance may be tunable by at least one of varying a size of the plurality of nanoparticles, varying a shape of the plurality of nanoparticles, changing a material of the plurality of nanoparticles, adjusting a thickness of the material, changing the refractive index of the material layer, changing the refractive index of the material or an additional layer disposed on the plurality of nanoparticles, varying a thickness of the electrode layer, and/or varying the material of the first electrode layer. The plurality of nanoparticles may be formed from at least one of Ag particles, Al particles, Au particles, dielectric material, semiconductor materials, an alloy of metal, a mixture of dielectric materials, a stack of one or more materials, and/or a core of one type of material and that is coated with a shell of a different type of material. At least one of the plurality of nanoparticles of the device may include an additional layer to provide lateral conduction among the plurality of nanoparticles. The plurality of nanoparticles may be coated with an oxide layer, where a thickness of the oxide layer may be selected to tune a plasmonic resonance wavelength of the plurality of nanoparticles or a nanopatch antenna. A shape of the plurality of nanoparticles may be at least one of cubes, spheres, spheroids, cylindrical, parallelepiped, rod-shaped, star-shaped, pyramidal, and/or multi-faceted three-dimensional objects. A size of at least one of the plurality of nanoparticles may be from 5 nm to 1000 nm.

In some embodiments, the device may include an additional layer disposed on the plurality of nanoparticles. The additional layer may include one or more emitter molecules or emitting materials, such as quantum dots, inorganic phosphors, or the like. The additional layer may match a refractive index beneath the first electrode layer. The additional layer has a thickness of 1000 nm or less.

In some embodiments, the plurality of nanoparticles may be deposited via inkjet printing. In other embodiments, the plurality of nanoparticles may be deposited via a mechanism that involves touch, such as brushing. In some embodiments, the plurality of nanoparticles may be deposited via spraying the particles suspended in a solvent or aerosol. In other embodiments, the plurality of nanoparticles may be fabricated using a top-down approach, which may include a lift-off process, a development process, a light-based lithography such as photolithography or laser interference lithography or zone plate lithography, an electron beam lithography process, and/or focused ion milling process. In some embodiments, the plurality of nanoparticles may be deposited via spin coating, doctor blading process, slot-die coating, bar coating, and/or dip coating. Once the nanoparticles are deposited, a drying process may be used to remove any residual solvent, air, or moisture from the deposition surface. Such drying methods may include vacuum drying, nitrogen blow off, HEPA (High Efficiency Particulate Air) drying, drying in a convection oven, surface tension gradient drying, IPA vapor vacuum drying, and/or spin drying. In other embodiments, the nanoparticles may be formed through self-assembly including assembly of the particles themselves or self-assembly of another material like a co-polymer or nano-size shapes of a polymer. The plurality of nanoparticles may be formed by depositing a second material onto the self-assembled material. The self-assembled material may or may not be removed afterward formation of the plurality of nanoparticles. In some embodiments, the LED, enhancement layer, and/or nanoparticles may be encapsulated. Such encapsulation materials may include oxide coatings and epoxies, such as polyurethane, silicone, and the like.

In some embodiments, the plurality of nanoparticles may be formed in a plurality of different sizes or shapes, rather than a single size or shape. This may enable the outcoupling layer or structure to efficiently scatter light of multiple frequencies or colors all with the same layer.

In some embodiments, a white LED may utilize a nanoparticle outcoupling structure of a predetermined resonance to selectively outcouple a certain wavelength range. In this way, a white LED may be fabricated over a predetermined large area, and the resonance of the nanoparticle outcoupling structure (via a selected nanoparticle size, refractive index, and the like) may be used to create red, green, blue, and/or any other desired color subpixels.

Since the refractive index of the gap layer(s) affects the resonance of the nanopatch antenna, incorporating gap materials that have non-linear optical properties and/or voltage-tunable refractive index may tune the emission spectrum with voltage applied between the metal cathode and an electrical contact layer beneath the nanoparticle, as shown in FIG. 10. In one example, aluminum-doped zinc oxide may be used as the voltage-tunable refractive index material, since its permittivity is varied when an applied voltage modifies the carrier concentration. In this case, a second insulating layer may be disposed in the gap to build the charge. Such a secondary layer may not always be used, depending on the material properties of the voltage-tunable refractive index layer. This is particularly useful when the LED is a white LED (i.e., a LED having red, green, and blue emission), since the voltage-tunable nanopatch resonance may act as a color filter to selectively pass the desired color. This may effectively convert the LED into a three-terminal device, with the voltage applied between the anode and cathode operating the LED, and the voltage applied between the cathode and the electrical contact layer beneath the nanoparticle tuning the nanopatch resonance to select the emitted color.

For individual LED subpixels, such as in a display, the resonance of the nanoparticle outcoupling structure may be purposely mismatched from the native emission of the LED. In this way, the nanoparticle outcoupling structure may act as a color filter to shift the peak wavelength. In another embodiment, a resonance-mismatched nanoparticle outcoupling structure may be used to narrow the emission spectrum. For example, a green LED paired with a blue resonant outcoupling structure may provide a narrowing by reducing the red wavelengths of the LED. Conversely, pairing a green LED with a red resonance outcoupling structure may provide a narrowing by reducing the blue wavelengths of the LED.

In another embodiment, the device may include an emissive outcoupling layer within a predetermined proximity to the enhancement layer, as shown in FIGS. 3*a*-3*c*. The emissive outcoupling layer(s) may include an emissive material that may be excited by the energy of the surface plasmon polaritons in the nearby enhancement layer. The emissive material may be, but is not limited to, a quantum dot, perovskite nanocrystals, metal-organic frameworks, covalent-organic frameworks, a thermally activated delayed fluorescence (TADF) emitter, a fluorescent emitter, and/or a phosphorescent organic emitter. In one example device, it may be advantageous for the emissive material to have absorption and emission spectra demonstrating a small Stokes shift, such that a predetermined small red-shift occurs between the LED excited state energy that is quenched into the enhancement layer and the emitted light from the emissive outcoupling layer(s). This may preserve the emission color of the device. In another example device, the emissive material may be selected to down-convert a higher-energy excitation (e.g., blue) to a lower-energy wavelength (e.g., green or red). This may enable a single LED structure to be utilized in every pixel of a display, with the color chosen by the emissive outcoupling layer. For example, this may be accomplished by depositing different-sized quantum dots in the outcoupling layer(s) of different pixels to tune the emission wavelength. The emissive outcoupling layer may or may not be combined with the nanoparticle based outcoupling structure. In one embodiment, the emissive outcoupling layer may be disposed between the enhancement layer and the nanoparticle. In this case, the outcoupling efficiency may be enhanced, as the radiative rate of the emissive material in the emissive outcoupling layer may be sped up.

The arrangement of the nanoparticles on the surface of the dielectric gap may be designed to fit the device application. In one embodiment, a random arrangement of nanoparticles may provide a nearly Lambertian emission profile, which may be preferable for use in lighting applications or display applications (e.g., where point source emission is not desired). Inorganic LEDs tend to suffer from directional emission profiles, which may make the random nanoparticle array particularly attractive in certain applications. In another embodiment, the nanoparticles may be arranged into an array, thereby resulting in a dispersive emission profile that may be desired for some mobile applications, or in applications that require the largest outcoupling of light regardless of the angular dependence. Nanoparticles arranged into an array may achieve greater efficiencies than randomly arranged nanoparticles, and selecting a specific array pitch and duty cycle may enable tuning of the array resonance and hence outcoupling wavelength at which the array has the largest efficiency.

In other embodiments, the nanoparticles may be metallic and coated with a non-metallic coating. The nanoparticles may be placed on top of the enhancement layer directly, as shown in FIG. 9. In this embodiment, the refractive index of the coating may be between 1.01 and 5. The thickness of the coating may be from 3 nm to 1000 nm, more preferably from 3 nm to 100 nm. In one embodiment, the nanoparticle coating may serve as part, or all, of the gap spacing. This may be achieved by coating the particles with the entire gap thickness desired, thereby reducing the cap layer to zero, or a combination of gap layer thickness and nanoparticle coating to achieve the desired total spacer thickness. Further, the nanoparticle coating may act as an adhesion layer to improve nanoparticle adhesion to or increase nanoparticle density on the layers onto which they may be deposited. The nanoparticles made be composed of Ag, Al, Ag—Al alloys, Au, Au—Ag alloys, and/or Au—Al alloys. The enhancement layer and/or nanoparticles may be composed of other materials including, but are not limited to Ag, al Au, Ir, Pt, Ni, Cu, W, Ta, Fe, Cr, Mg, Ga, Rh, Ti, Ca, Ru, Pd, In, and/or Bi. In embodiments, the metallic core may include more than one material, such as an Ag sphere that is coated in Rh and then coated with a dielectric material like $SiO_2$, as shown in FIG. 9.

Figure 18:
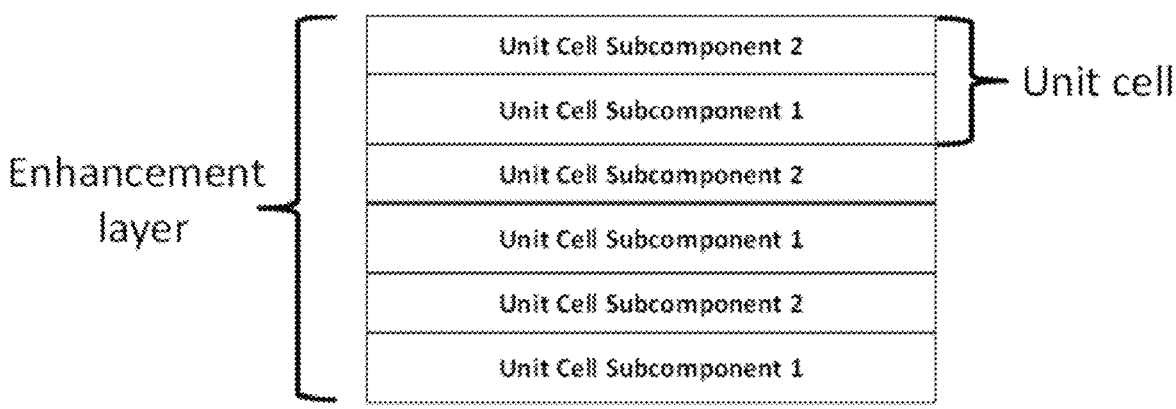
FIG. 18 shows an example structure of the enhancement layer (e.g., electrode layer) having a unit cell and subcomponents according embodiments of the disclosed subject matter.

The enhancement layer and/or nanoparticles may include planar metals, stacks of metal layers and dielectric layers, stacks of metal layers and semiconducting layers, and/or perforated metal layers, as shown, for example, in FIGS. 15 and 18. The dielectric materials that are part of the enhancement layer may include, but are not limited to, oxides, fluorides, nitrides, and/or amorphous mixtures of materials. Other non-limiting example materials may include: material combinations listed as LED materials in Table 1 shown below, GeTe, InSb, InAs, Ge, GaSb, Si, GaAs, CdTe, AlSb, HgSe, AlAs, GaP, ScN, ZnTe, CdS, CuBr, CuI, AlP, SiC, CuCl, GaN, ZnS, BN, ZnO, $GeO_2$, AlN, CsI, CsBr, NaBr, CsCl, KBr, KCl, and/or $SiO_2$. The metal layers can include alloys and mixtures of metals that may include: Ag, Au, Al, Zn, Ir, Pt, Ni, Cu, W, Ta, Fe, Cr, Mg, Ga, Rh, Ti, Ca, Ru, Pd, In, and/or Bi. The enhancement layer may be graphene, conductive oxides, and/or conductive nitrides for LEDs outside the visible range.

In some embodiments, the enhancement layer may be patterned with nano-size holes, as shown, for example, in FIGS. 14*a*-14*f*. These holes may be in an array, may be randomly arranged, or may be pseudo-randomly arranged. The size, shape, and/or orientation of the holes may set the frequency of light that may be outcoupled from the enhancement layer.

In some embodiments, the enhancement layer may have a bullseye grating patterned on top of it. In some embodiments, the enhancement layer may have a gap, and may have a bullseye grating patterned on top of the gap material. In some embodiments, the bullseye grating maybe circular. In other embodiments, the bullseye grating may be elliptical.

In some embodiments, the enhancement layer may be partially etched through to form nano-size outcoupling features on one side of the enhancement layer, as shown, for example, in FIGS. 14*a*-14*f*. In some embodiments, there may be nano-sized features on both sides of the enhancement layer. In some cases when there are nano-sized features on both sides of the enhancement layer, the smallest dimension of the features may exceed 10 nm, in other cases the smallest dimension of the features may exceed 20 nm, and in other cases the smallest dimension of the features may exceed 50 nm.

For vertical LEDs, some embodiments may resolve the issue of shading from the top electrode as the incoupling of the excited states to the enhancement layer may be done over as much area as possible, and the excited states may be outcoupled from the nanoparticle based outcoupling layer to air. In some embodiments, the enhancement layer may function as the electric contact.

If the enhancement layer acts as the electrical contact, there is no longer any shading of the light emitted out the top. Surface plasmons may propagate up to ten to hundreds of micrometers in smooth silver, which means that excited states from the recombination zone may be coupled to the enhancement layer at one position of the device and outcoupled to photons in free space at another location up to ten to hundreds of micrometers away. This may eliminate shading from the electrodes by careful design of the outcoupling structure's lateral patterning.

The use of the nano size outcoupling structure may increase the LED yield, as the outcoupling may have a dispersion that is designed to minimize the dispersion due to layer thicknesses across the wafer. Thus, the final LED with the enhancement layer and outcoupling may show less variation across the wafer compared to a reference LED.

Devices fabricated in accordance with embodiments of the invention can be incorporated into a wide variety of electronic component modules (or units) that may be incorporated into a variety of electronic products or intermediate components. Examples of such electronic products or intermediate components may include display screens, lighting devices such as discrete light source devices or lighting panels, or the like that may be utilized by the end-user product manufacturers. Such electronic component modules may optionally include the driving electronics and/or power source(s). Devices fabricated in accordance with embodiments of the invention can be incorporated into a wide variety of consumer products that have one or more of the electronic component modules (or units) incorporated therein. Such consumer products may include any kind of products that include one or more light source(s) and/or one or more of some type of visual displays. Some examples of such consumer products may include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, micro-displays, 3-D displays, vehicles, aviation displays, a large area wall, theater or stadium screen, or a sign.

Other examples of such consumer products include Augmented Reality/Virtual Reality (AR/VR) displays, displays or visual elements in glasses or contact lenses (e.g., micro LEDs combined with sapphire chips), LED wallpaper, LED jewelry and clothing.

Various control mechanisms may be used to control devices fabricated in accordance with the disclosed subject matter, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Device fabricated in accordance with the disclosed subject matter may include other components for controlling and manipulating light from the end product. These components include polarizers, color filters, and liquid crystals.

Inorganic LEDs of the disclosed subject matter may be fabricated from materials that may include, but are not limited to: GaAs, AlGaAs, GaAsP, AlGaInP, GaP, GaAsP, GaN, InGaN, ZnSe, SiC, $Si_3N_4$, Si, Ge, Sapphire, BN, ZnO, AlGaN, perovskites, and/or quantum confined systems. Quantum confined systems may include systems where the size of the particle is around the size of the exciton's Bohr radius, leading to an increase in the bandgap of the material and emissive states that are above the bulk bandgap energy. For example, CdS's bulk bandgap is approximately 2.42 eV (~512 nm), while quantum dots (QD) made from CdS emitter from approximately 380 to 480 nm when they are sized from 1-8 nm. Electroluminescent devices may be composed of quantum confined materials which may benefit from the enhancement layer for reducing the excited state transient. Electroluminescent devices that are based on quantum confined materials have not yet been commercialized, indicating that there could be stability improvements in addition to improvements in efficiency realized for these systems. Some electroluminescent devices using quantum confined materials may utilize a mixture of inorganic quantum confined materials in the recombination zone, like CdS quantum dots, along with organic or inorganic transport layers. For example, some EL quantum dot devices may use NPD as a hole transporting layer and a $Alq_3$ as the electron transporting layer while others may use NPD as the hole transporting layer and a ZnO nanoparticle electron transporting layer. Quantum confined systems are not limited to only inorganic semiconductors. For example, mixed organic-inorganic perovskite materials like $CsPbBr_3$ form emissive quantum dots that can be used in EL devices are well. Other heavy metal free quantum dot materials include: InP/ZnS, CuInS/ZnS, Si, Ge and C or peptides. Typically, QD materials may be deposited from a solution or suspension via spin coating or contact printing.

Transition dipole orientation may affect plasmon coupling efficiency and coupling distance, with coupling increasing as the dipole is more vertically oriented. Therefore, vertically oriented dipoles are most preferable for enhancement layers that are planar or close to planar. However, in practice, due to surface roughness of the enhancement layer, even perfectly horizontal dipoles may have some coupling efficiency to the plasmon mode of planar and nearly planar enhancement layers.

The inorganic LEDs used in the embodiments of the disclosed subject matter may be combined with one or more phosphorescent emitters to produce to produce a wider range of colors from the LED (e.g., white). The phosphor(s) may be placed: (a) in the epoxy used to encapsulate the LED, or (b) the phosphor can be placed remote from the LED. The phosphor may act as a 'down conversion' layer designed to absorb photons from the LED and reemit photons of a lower energy. Other down conversion materials that can used can be made of inorganic or organic phosphors, fluorescent, TADF, quantum dot, perovskite nanocrystals, metal-organic frameworks, or covalent-organic frameworks materials. Therefore, the embodiments of the disclosed subject matter that include enhancement layer and a nano-sized outcoupling may include a metal, and a dielectric gap material, and a layer of nanoparticles can be placed between the inorganic LED and the phosphor or down conversion layer. The LED, metal, a dielectric gap material, and/or layer of nanoparticles device may be encapsulated with epoxy or a film including the down conversion medium. The down conversion material may be placed outside of the LED, metal, a dielectric gap material, and/or layer of nanoparticles encapsulation.

Other options to produce white light may include: the use homoepitaxial ZnSe blue LED grown on a ZnSe substrate, which simultaneously produces blue light from the active region and yellow emission from the substrate; and GaN on Si (or SiC or sapphire) substrates. One or more embodiments of the disclosed subject matter may be combined with these devices.

Devices fabricated in accordance with embodiments of the disclosed subject matter may be combined with QNED technology (quantum dot nano cell) in which GaN-based blue light emitting nanorod LEDs replace discreet inorganic LEDs as the pixelated blue light sources in a display. The formation of GaN nanorods can be found in the scientific and patent literature, for example in "Electrically Tunable Diffraction Efficiency from Gratings in Al-doped ZnO" by George et al., Applied Physics Letters 110, 071110 (2017), and in patent publication WO2020036278 entitled "LIGHT EMITTING DEVICE, PIXEL STRUCTURE COMPRISING LIGHT EMITTING DEVICE, AND MANUFACTURING METHOD THEREFOR." Embodiments of the disclosed may be combined with these devices.

Some embodiments may include the enhancement layer and a nano size outcoupling structure having a metal a dielectric gap material, and a layer of nanoparticles. This outcoupling structure may be combined with a spacer (or surface plasmon amplification by stimulated emission of radiation or plasmonic laser), or surface plasmon polariton (SPP) spacers or nanolasers, and will convert the plasmon energy back into photons.

LEDs formed using one or more embodiments of the disclosed subject matter may be directly fabricated on a wafer and then pick and placed to create a larger electronic component module. Within the module, there may be additional LEDs which do not utilize the enhancement layer.

In some embodiments, the LEDs formed with the enhancement layer and outcoupling structure may be directly patterned on a wafer or substrate which then is incorporated into the electronic component module. In these cases, if one wishes to eliminate devices (e.g., ideal peak wavelength), they may be eliminated by not including the outcoupling layer on the device, since not including the enhancement layer will make the LED more dim. In some embodiments of patterning a Red, Green, Blue (RGB) full color module on a single substrate, at least one color sub-pixel may have the enhancement layer and outcoupling.

According to an embodiment of the disclosed subject matter, a light emitting diode and/or device (LED) may be provided. The LED can include a substrate, an anode (or p-type contact), a cathode (n-type contact), and recombination zone disposed between the anode and the cathode and an enhancement layer, as shown, for example, in FIG. 17. Recombination zones may include inorganic semiconducting quantum wells. According to an embodiment, the light emitting device may be incorporated into one or more devices, such as a consumer product, an electronic component module, a lighting panel, and/or a sign or display.

Table 1 below shows non-limiting examples of LED materials and potential enhancement layer and/or metal nanoparticle materials and particle size ranges, and assumes a dielectric layer between the enhancement layer and metal nano size material with a refractive index of 1.5 and assumes monodisperse monolayer of nanoparticles. Particle sizes may be assumed as nanocubes, and particles with variable length axis may have different ranges.

TABLE 1

| $\lambda_{max}$ wavelength [nm] | Semiconductor material | Potential enhancement layer and/or metal nanoparticle materials | Particle size range |
|---|---|---|---|
| >760 | GaAs, AlGaAs | Ag, Au, ITO, Si, Ge | 100-250 nm |
| 610 to 760 | AlGaAs, GaAsP, AlGaInP, GaP | Ag, Au, SiO2, Si, Ge | 75-200 nm |
| 590 to 610 | GaAsP, AlGaInP, GaP | Ag, Au, SiO2, Si, Ge | 60-150 nm |
| 570 to 590 | GaAsP, AlGaInP, GaP | Ag, Au, SiO2, Si, Ge | 50-100 nm |
| 500 to 570 | GaAsP, AlGaInP, GaP, InGaN/GaN | Ag, Al, Rh, Pt, SiO2, Si, Ge, TiO2 | 40-125 nm |
| 450 to 500 | ZnSe, InGaN, SiC, Si | Ag, Al, Rh, Pt, TiO2 | 40-125 nm |
| 400 to 450 | InGaAs | Al, Rh, Pt, TiO2 | 50-100 nm |
| <400 | Diamond (235 nm), BN (215 nm), AlN (210 nm), AlGaN. AlGaInN | Al, Rh, Pt, TiO2 | 30-75 nm |
| White | Blue LED (e.g. GaN) with yellow phosphor | Ag, Al, Rh, Pt, TiO2 | 40-125 nm |

When the nanoparticles clump together, the resonance wavelength of outcoupling may increase. For example, large clumps of even UV-resonant particles may achieve IR NPA resonances. Thus considering clumping, some preferred embodiments of LED semiconductor materials and nanoparticle outcoupling material and size distributions are provided. Table 2 below shows non-limiting examples of LED materials and potential enhancement layer and/or metal nanoparticle materials and particle size ranges which assume a dielectric layer between the enhancement layer and metal nano size material with a refractive index of 1.5 and which allow for nanoparticle clumping.

TABLE 2

| $\lambda_{max}$ wavelength [nm] | Semiconductor material | Potential enhancement layer and/or metal nanoparticle materials | Particle size range |
|---|---|---|---|
| >760 | GaAs, AlGaAs | Ag, Au, ITO, Si, Ge, SiO2, Al, Rh, Pt | 5-250 nm |
| 610 to 760 | AlGaAs, GaAsP, AlGaInP, GaP | Ag, Au, SiO2, Al, Rh, Pt, Si, Ge | 5-200 nm |
| 590 to 610 | GaAsP, AlGaInP, GaP | Ag, Au, SiO2, Al, Rh, Pt, Si, Ge | 5-150 nm |
| 570 to 590 | GaAsP, AlGaInP, GaP | Ag, Au, SiO2, Al, Rh, Pt, Si, Ge | 5-100 nm |
| 500 to 570 | GaAsP, AlGaInP, GaP, InGaN/GaN | Ag, Al, Rh, Pt, SiO2, TiO2, Si, Ge | 5-125 nm |
| 450 to 500 | ZnSe, InGaN, SiC, Si | Ag, Al, Rh, Pt, TiO2 | 5-125 nm |
| 400 to 450 | InGaAs | Al, Rh, Pt, TiO2 | 5-100 nm |
| <400 | Diamond (235 nm), BN (215 nm), AlN (210 nm), AlGaN. AlGaInN | Al, Rh, Pt, TiO2 | 5-75 nm |
| White | Blue LED (e.g. GaN) with yellow phosphor | Ag, Al, Rh, Pt, TiO2 | 5-125 nm |

As described above, embodiments of the disclosed subject matter may provide a device that may include an inorganic emissive layer, a first electrode layer (e.g., an enhancement layer), and an outcoupling structure. The first electrode layer may be spaced from the inorganic emissive layer by a predetermined threshold distance that is a distance at which a total non-radiative decay rate constant is equal to a total radiative decay rate constant. The device may include at least one of at least one down-conversion layer, and at least one color filter disposed on the inorganic emissive layer. The device may include an inorganic transporting material. The device may include an inorganic transporting material and/or an organic transporting material.

The first electrode layer of the device may be at least one of a metal, a stack of metal films and dielectric layers, a plasmonic system, a hyperbolic metamaterial, and/or an optically active metamaterial. The first electrode layer may be at least one of Al, Au, Ir, Pt, Ni, Cu, W, Ta, Fe, Cr, Mg, Ga, Rh, Ti, Ru, Pd, In, Bi, and/or Ca. The first electrode layer may have a thickness from 5 nm to 1000 nm. The material may be stacked or layered, and may have a plurality of layers. Each layer of the plurality of layers may include a unit cell having a plurality of unit cell subcomponent layers. Each unit cell may a first unit cell subcomponent and a second unit cell subcomponent. In some embodiments, the first electrode layer may be patterned with an additional material, or may be patterned with nano-sized holes.

The outcoupling structure of the device may include a plurality of nanoparticles that are formed from at least one Ag particles, Al particles, Ag—Al alloys, Au particles, Au—Ag alloys, dielectric material, semiconductor materials, an alloy of metal, a mixture of dielectric materials, a stack of one or more materials, and/or a core of one type of material and that is coated with a shell of a different type of material. The outcoupling structure may include a plurality of nanoparticles that are colloidally-synthesized nanoparticles formed from a solution. The outcoupling structure may include a plurality of nanoparticles are arranged in a periodic array, which may have a predetermined array pitch. The outcoupling structure may include a plurality of nanoparticles that are arranged in a non-periodic array. A shape of the plurality of nanoparticles may be at least one of cubes, spheres, spheroids, cylindrical, parallelepiped, rod-shaped, star-shaped, pyramidal, and multi-faceted three-dimensional objects.

The outcoupling structure may include a plurality of nanoparticles, and the device may include an adhesion layer disposed between the material and the plurality of nanoparticles. At least one property of the nanoparticles may be selected to change a spectrum of light emitted by the emissive layer, or change an angular dependence of light emitted by the emissive layer. The selected property may be the size of the nanoparticles, composition of the nanoparticles, and/or distribution of the nanoparticles. The device may include at least one additional layer disposed on the plurality of nanoparticles. The additional layer may match a refractive index beneath the first electrode layer. A thickness of the additional layer may be 3000 nm to 1000 nm, and/or 1000 nm to 10 nm. The additional layer may be transparent. In some embodiments, the device may include a material disposed between the first electrode and the plurality of nanoparticles. In some embodiments, the device may include an organic transporting material.

The outcoupling structure may include a plurality of nanoparticles that include at least one of a metal, a dielectric material, and/or a hybrid of metal and dielectric material. The plurality of nanoparticles may be coated with an oxide layer, and where a thickness of the oxide layer is selected to tune a plasmonic resonance wavelength of the plurality of nanoparticles or a nanopatch antenna. A size of at least one of the plurality of nanoparticles may be from 5 nm to 1000 nm. At least one of the plurality of nanoparticles may include an additional material to provide lateral conduction among the plurality of nanoparticles. In some embodiments, the outcoupling structure may include a plurality of nanoparticles that are coated. IN some embodiments, the outcoupling structure may have a plurality of nanoparticles that are metallic and coated with a non-metallic coating.

The inorganic emissive layer of the device may be at least one of GaAs, AlGaAs, GaAsP, AlGaInP, GaP, GaAsP, GaN, InGaN, ZnSe, SiC, Si3N4, Si, Ge, Sapphire, BN, ZnO, AlGaN, perovskites, and/or quantum confined systems. The inorganic emissive layer may be electroluminescent, and may include quantum confined materials that include a mixture of inorganic quantum confined materials such as CdS quantum dots, an organic transport layer, and/or an inorganic transport layer.

The inorganic emissive layer of the device may include at least one of GaAs and/or AlGaAs, where the outcoupling structure comprises a plurality of nanoparticles, which may be at least one of Ag, Au, ITO, Si, and/or Ge. A size of the nanoparticles may be 100-250 nm, and a wavelength of light emitted by the device may be 760 nm to 2000 nm.

In some embodiments, the inorganic emissive layer of the device may include at least one of AlGaAs, GaAsP, AlGaInP, and/or GaP, where the outcoupling structure comprises a plurality of nanoparticles, and where the nanoparticles comprise at least one of Ag, Au, SiO2, Si, and/or Ge. A size of the nanoparticles may be 75-200 nm, and a wavelength of light emitted by the device may be greater than 610-760 nm.

In some embodiments, the inorganic emissive layer of the device may include at least one of GaAsP, AlGaInP, and/or GaP, where the outcoupling structure includes a plurality of nanoparticles, and where the nanoparticles may be at least one of Ag, Au, SiO2, Si, and/or Ge. A size of the nanoparticles may be 60-150 nm, and a wavelength of light emitted by the device may be 590-610 nm.

In some embodiments, the inorganic emissive layer of the device may include at least one of GaAsP, AlGaInP, and/or GaP, where the outcoupling structure comprises a plurality of nanoparticles, where the nanoparticles may include at least one of Au, SiO2, Si, and/or Ge, a size of the nanoparticles may be 50-100 nm, and a wavelength of light emitted by the device may be 570-590 nm.

In some embodiments, the inorganic emissive layer of the device may include at least one of GaAsP, AlGaInP, GaP, and/or InGaN/GaN. The outcoupling structure may include a plurality of nanoparticles, where the nanoparticles may include at least one of Ag, Al, Rh, Pt, SiO2, Si, Ge, and/or TiO2, where a size of the nanoparticles is 40-125 nm, and/or where a wavelength of light emitted by the device may be 500-570 nm.

In some embodiments, the inorganic emissive layer of the device may include at least one of ZnSe, InGaN, SiC, and/or Si, where the outcoupling structure may include a plurality of nanoparticles, where the nanoparticles include at least one of Ag, Al, Rh, Pt, and/or TiO2, where a size of the nanoparticles may be 40-125 nm, and/or a wavelength of light emitted by the device may be 450-500 nm.

In some embodiments, the inorganic emissive layer of the device may include InGaAs, where the outcoupling structure may include a plurality of nanoparticles, where the nanoparticles may include at least one of Al, Rh, Pt, and/or TiO2, where a size of the nanoparticles may be 50-100 nm, and where a wavelength of light emitted by the device may be 400-450 nm.

In some embodiments, the inorganic emissive layer of the device may include at least one of diamond, BN, AlN AlGaN, and/or AlGaInN, where the outcoupling structure may include a plurality of nanoparticles, where the nanoparticles may include at least one of Al, Rh, Pt, and/or TiO2, where a size of the nanoparticles may be 30-75 nm, and where a wavelength of light emitted by the device may be 200 nm to 400 nm.

The inorganic emissive layer of the device may include a blue light emitting diode with yellow phosphor, where the outcoupling structure may include a plurality of nanoparticles, where the nanoparticles may include at least one selected from the group consisting of: Ag, Al, Rh, Pt, and/or TiO2, where a size of the nanoparticles may be 40-125 nm, and where white light may be emitted by the device.

The inorganic emissive layer of the device may include at least one of GaAs and/or AlGaAs, where the outcoupling structure may include a plurality of nanoparticles, where the nanoparticles may include at least one of Ag, Au, ITO, Si, Ge, SiO2, Al, Rh, and/or Pt, where a size of the nanoparticles may be 5-250 nm, and where a wavelength of light emitted by the device may be 760 nm to 2000 nm.

The inorganic emissive layer of the device may include at least one of AlGaAs, GaAsP, AlGaInP, and/or GaP, wherein the outcoupling structure may include a plurality of nanoparticles, where the nanoparticles include at least one of Ag, Au, SiO2, Al, Rh, Pt, Si, and/or Ge, where a size of the nanoparticles may be 5-200 nm, and a wavelength of light emitted by the device may be 610-760 nm.

The inorganic emissive layer of the device may include at least one of AlGaAs, GaAsP, AlGaInP, and/or GaP, where the outcoupling structure may include a plurality of nanoparticles, where the nanoparticles may include at least one of Ag, Au, SiO2, Al, Rh, Pt, Si, and/or Ge, where a size of the nanoparticles may be 5-150 nm, and where a wavelength of light emitted by the device may be 590-610 nm.

The inorganic emissive layer of the device may include at least one selected from the group consisting of: GaAsP, AlGaInP, and/or GaP, where the outcoupling structure may include a plurality of nanoparticles, where the nanoparticles may include at least one of Ag, Au, SiO2, Al, Rh, Pt, Si, and/or Ge, where a size of the nanoparticles may be 5-100 nm, and where a wavelength of light emitted by the device may be 570-590 nm.

The inorganic emissive layer of the device may include at least one of GaAsP, AlGaInP, GaP, and/or InGaN/GaN, where the outcoupling structure may include a plurality of nanoparticles, where the nanoparticles may include at least one of Ag, Al, Rh, Pt, SiO2, TiO2, Si, and/or Ge, where a size of the nanoparticles may be 5-125 nm, and/or where a wavelength of light emitted by the device may be 500-570 nm.

The inorganic emissive layer of the device may include at least one of Se, InGaN, SiC, and/or Si, where the outcoupling structure may include a plurality of nanoparticles, where the nanoparticles may include at least one of Ag, Al, Rh, Pt, and/or TiO2, where a size of the nanoparticles may be 5-125 nm, and where a wavelength of light emitted by the device may be 450-500 nm.

The inorganic emissive layer of the device include InGaAs, where the outcoupling structure may include a plurality of nanoparticles, where the nanoparticles may include at least one selected from the group consisting of: Al, Rh, Pt, and/or TiO2, where a size of the nanoparticles may be 5-100 nm, and where a wavelength of light emitted by the device may be 400-450 nm.

The inorganic emissive layer of the device may include at least one of diamond (235 nm), BN, AlN, AlGaN, and/or AlGaInN, where the outcoupling structure may include a plurality of nanoparticles, where the nanoparticles may include at least one of Al, Rh, Pt, and/or TiO2, where a size of the nanoparticles may be 5-75 nm, and where a wavelength of light emitted by the device may be 200 nm to 400 nm.

The inorganic emissive layer of the device may include a blue light emitting diode with yellow phosphor, where the outcoupling structure may include a plurality of nanoparticles, where the nanoparticles may include at least one of Al, Rh, Pt, and/or TiO2, where a size of the nanoparticles may be 5-125 nm, and where light emitted by the device may be white light.

The device may include a material that is disposed over the first electrode, and the material may be a dielectric layer disposed on the first electrode layer, and an electrical contact layer may be disposed on the dielectric layer. The material may include a voltage-tunable refractive index material between the electrical contact layer and the first electrode layer. The voltage-tunable refractive index material may be aluminum-doped zinc oxide. The material may include an insulating layer.

The first electrode layer may include nano-sized features. The nano-sized features may be at least partially etched though a depth of the first electrode layer. The nano-sized features may include a bullseye pattern disposed on the first electrode layer or disposed on a gap material that is disposed on the first electrode layer. The nano-sized features may be disposed on at least one side of the first electrode layer. A size of the nano-sized features in a smallest direction may be at least 10 nm, at least 20 nm, and/or 50 nm to 750 nm. In some embodiments, an arrangement of the pattern of nano-sized holes may be an array of the nano-sized holes, a random arrangement of the nano-sized holes, and/or a pseudo-random arrangement of holes.

In an embodiment of the disclosed subject matter, a device may include an inorganic emissive layer, a first electrode layer, an outcoupling structure, a material disposed between the first electrode and the outcoupling structure. The first electrode layer may be spaced from the inorganic emissive layer by a predetermined threshold distance that is a distance at which a total non-radiative decay rate constant is equal to a total radiative decay rate constant. The device may include an organic transporting material.

The first electrode layer of the device may be at least one of a metal, a stack of metal films and dielectric layers, a plasmonic system, a hyperbolic metamaterial, and/or an optically active metamaterial. The first electrode layer may include at least one of Ag, Al, Au, Ir, Pt, Ni, Cu, W, Ta, Fe, Cr, Mg, Ga, Rh, Ti, Ru, Pd, In, Bi, and/or Ca. The first electrode layer of the device may be patterned with nano-sized holes.

The inorganic emissive layer of the device may include at least one of GaAs, AlGaAs, GaAsP, AlGaInP, GaP, GaAsP, GaN, InGaN, ZnSe, SiC, Si3N4, Si, Ge, Sapphire, BN, ZnO, AlGaN, perovskites, and/or quantum confined systems. The quantum confined systems may include a particle having a size of an exciton's Bohr radius. The quantum confined systems may include at least one of mixed organic-inorganic perovskite materials, CsPbBr3, InP/ZnS, CuInS/ZnS, Si, Ge, C, and/or peptides.

The outcoupling structure of the device may include a plurality of nanoparticles that are formed from at least one of Ag particles, Al particles, Ag—Al alloys, Au particles, Au—Ag alloys, dielectric material, semiconductor materials, an alloy of metal, a mixture of dielectric materials, a stack of one or more materials, and/or a core of one type of material and that is coated with a shell of a different type of material. The outcoupling structure may include a plurality of nanoparticles that are colloidally-synthesized nanoparticles formed from a solution. The outcoupling structure may include a plurality of nanoparticles that are arranged in a periodic array. The periodic array may have a predetermined array pitch. The outcoupling structure may include a plurality of nanoparticles that are arranged in a non-periodic array. The outcoupling structure may include a plurality of nanoparticles, where a shape of the plurality of nanoparticles is at least one selected from the group consisting of: cubes, spheres, spheroids, cylindrical, parallelepiped, rod-shaped, star-shaped, pyramidal, and/or multi-faceted three-dimensional objects. The outcoupling structure may include a plurality of nanoparticles, and the device may include an adhesion layer disposed between the material and the plurality of nanoparticles. The outcoupling structure may include a plurality of nanoparticles, and at least one of the plurality of nanoparticles may include an additional material to provide lateral conduction among the plurality of nanoparticles.

The outcoupling structure of the device may include a plurality of nanoparticles, and the device may include at least one additional layer disposed on the plurality of nanoparticles. The at least one additional layer may encapsulate the device. The at least one additional layer may include one or more emitter molecules. The at least one additional layer may have a refractive index between 1.01 and 5. The at least one additional layer may modify a color or efficiency of an emission of the device.

Figure 19:
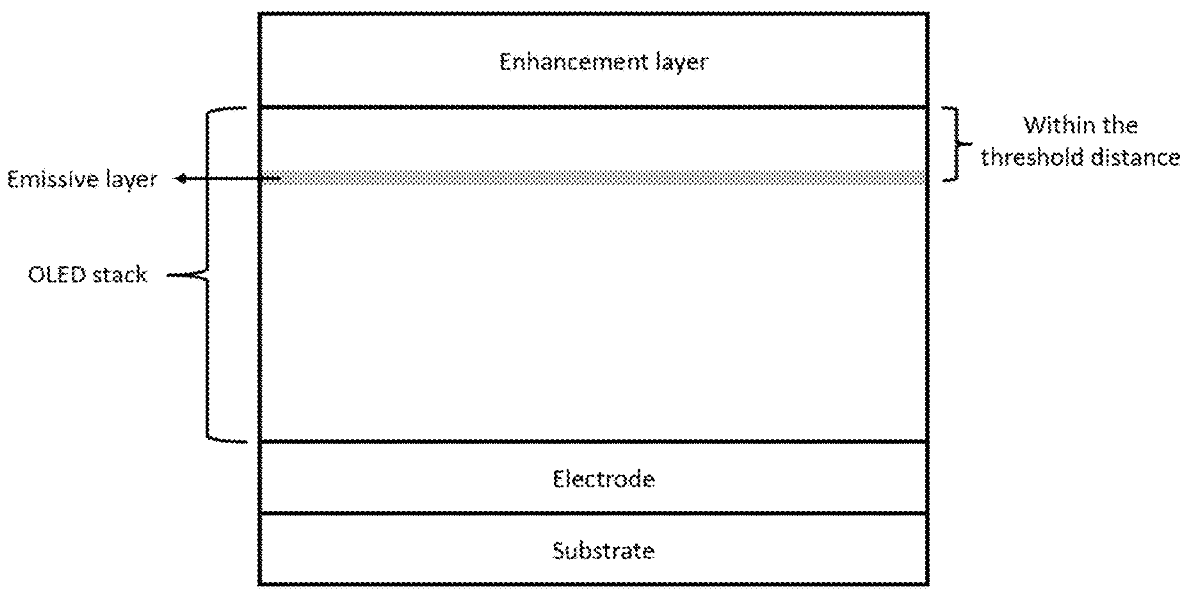
FIG. 19 shows an example device architecture, where the emissive layer is placed within a threshold distance of the enhancement layer according to an embodiment of the disclosed subject matter.
Figure 20:
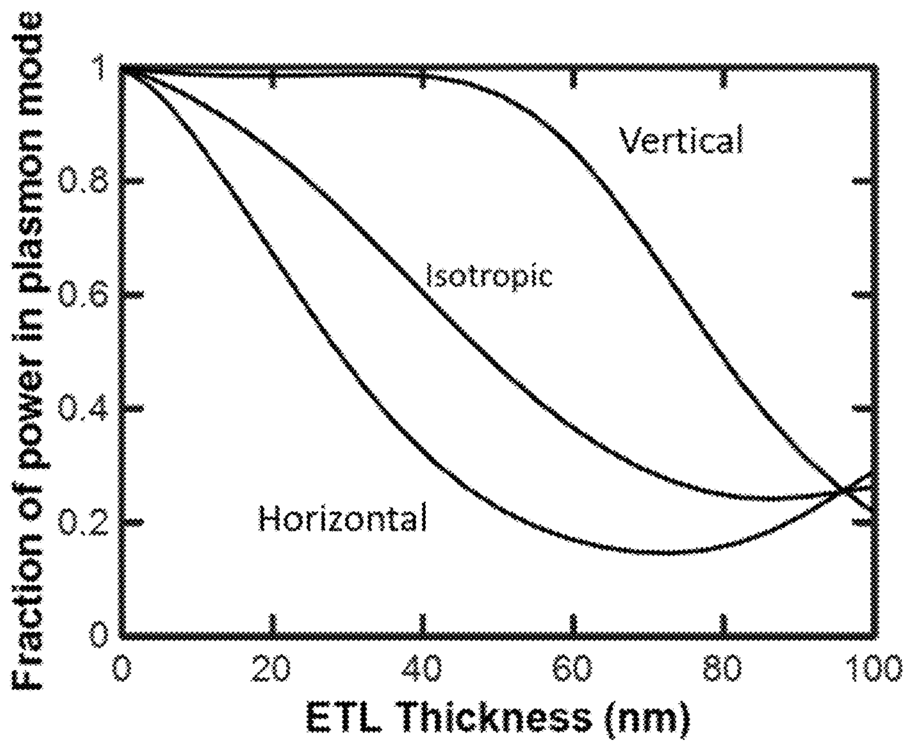
FIG. 20 shows a simulated mode analysis of the fraction of power in the plasmon mode as a function of electron transport layer (ETL) thickness for horizontal, vertical, or isotropic dipoles according to embodiments of the disclosed subject matter.

Organic light emitting devices (OLEDs) that are configured to couple most or all excited state energy into the surface plasmon mode may provide more stable devices. By taking advantage of the increased density of optical states when an emissive layer is placed within a threshold distance of an enhancement layer shown in FIG. 19, radiative and non-radiative rates of the emitter of the device are increased, thereby decreasing the steady state exciton population density and reducing destabilizing excited state interactions. As used throughout, a threshold distance may be the distance at which the total non-radiative decay rate constant is equal to the total radiative decay rate constant. Embodiments of the disclosed subject matter provide efficient coupling of the excited state energy to the surface plasmon mode. As shown in FIGS. 19-20, vertical dipoles, as used throughout, may have a transition dipole moment perpendicular to the enhancement layer, couple most efficiently and at farther distances from the enhancement layer than horizontal dipoles, and as used throughout, which may have a transition dipole moment parallel to the enhancement layer. In FIG. 20, the electron transport layer (ETL) thickness may be a proxy for the distance between the dipole and the enhancement layer. Embodiments of the disclosed subject matter may provide devices that include materials and/or material layer designs with increased fractions of vertical dipoles to enhance coupling of excited state energy into the surface plasmon mode.

That is, embodiments of the disclosed subject matter provide devices and material combinations that may increase the fraction of vertical dipoles. Emitter molecules of other devices typically use chemistry to achieve a desired molecular orientation. Other device configurations teach away from vertical dipoles, because the dipoles increase coupling to the plasmon mode, which is considered an energy loss pathway in conventional and/or commercial OLED designs.

In OLEDs, an exciplex or charge transfer (CT) state may form if it is the lowest energy state in the device. Exciplexes or CT states may form between an emitter and its host components, or between neighboring molecules at the interface with the emissive layer (EML). In phosphorescent devices, an exciplex may form and contribute to the emission spectrum if the condition $0<E_{ET}-\Delta E$ is met, where $E_{ET}$ may be the lowest triplet ($T_1$) energy of the phosphor, and the CT state energy ($\Delta E$) may be the energy difference between the HOMO level of the material having the highest HOMO energy in the organic emissive layer and the LUMO level of the material having the lowest LUMO energy in the organic emissive layer. In fluorescent devices, an exciplex may form and contribute to the emission spectrum if the condition $0<E_{ES}-\Delta E$ is met, where $E_{ES}$ may be the lowest singlet ($S_1$) energy.

Figure 21:
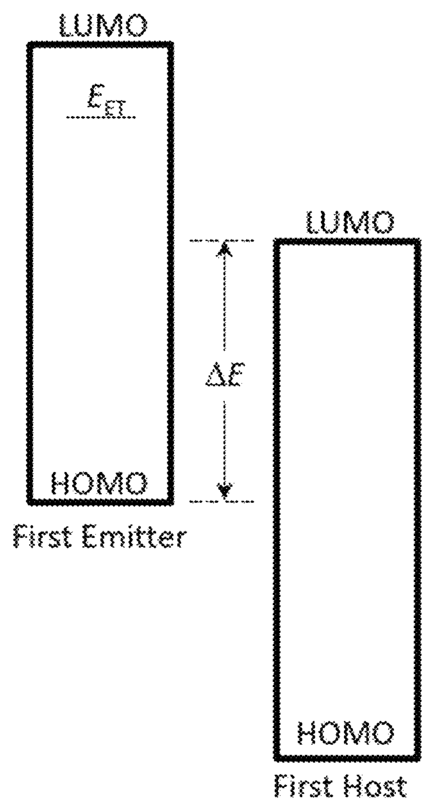
FIG. 21 shows a simulated fraction of power in the plasmon mode as a function of the ETL thickness according to an embodiment of the disclosed subject matter.

In one embodiment, the layer(s) adjacent the EML in a stack, typically, but not limited to, blocking or transport layers, may be chosen such that their energy levels satisfy the condition above to form an exciplex across the layer interface as shown in FIG. 21. The exciplex dipole may take on a vertical orientation perpendicular to the enhancement layer, thereby enabling strong coupling to the plasmon mode. For the condition where $0\leq E_{ET}-\Delta E$, exciplex formation with perpendicular dipole may occur, resulting in efficient coupling of the exciplex energy into the surface plasmon mode, which may provide a more stable device.

Figure 22:
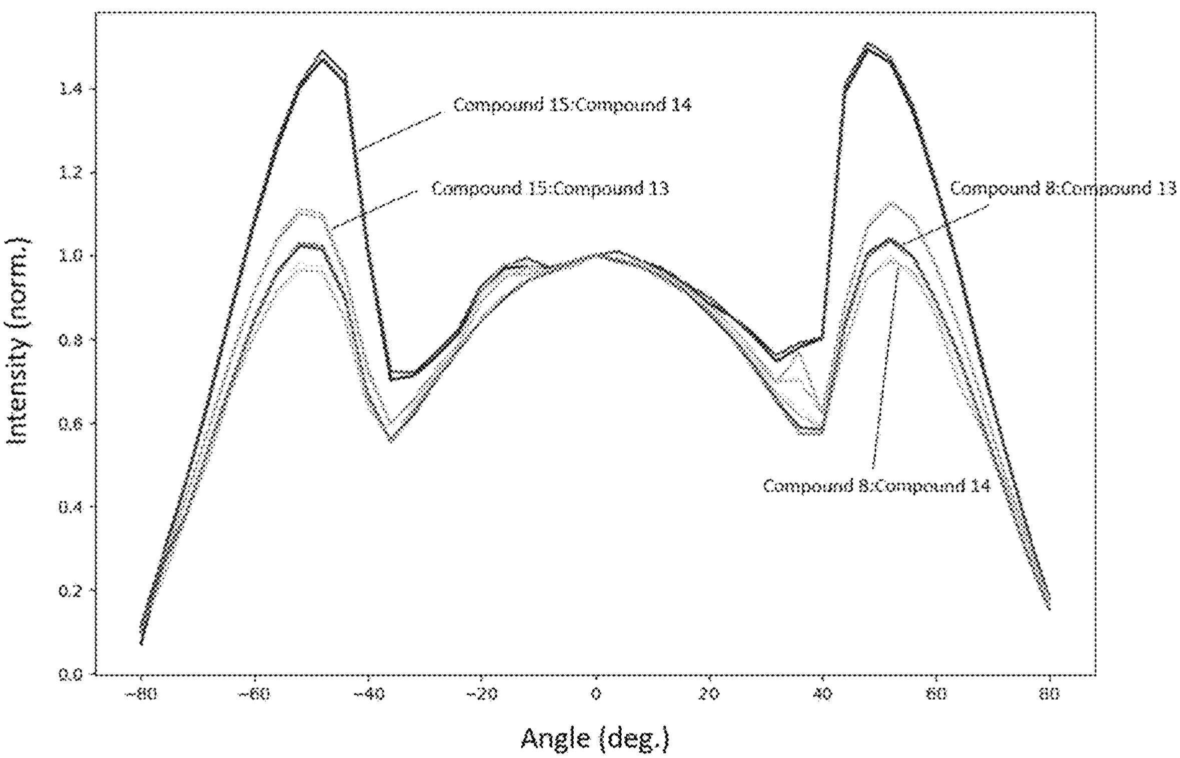
FIG. 22 shows a plot of the p-polarized emission intensity as a function of angle for various host:emitter combinations according to embodiments of the disclosed subject matter.

In another embodiment, the host may affect the orientation the emitter molecule. The data of FIG. 22 illustrates that while Compound 13 shows no angle dependence difference when doped into either Compound 8 or Compound 15, Compound 14 exhibits a significant enhancement in the wide-angle p-polarized emission intensity when doped into Compound 15, as compared to Compound 8. Given the lack of any change for Compound 13, which exhibits isotropic emission in both hosts, the change in Compound 14 emission between hosts may be attributed to an unexpectedly large increase in the vertical dipole ratio (VDR) of Compound 14 in Compound 15. The VDR shows the fraction of vertically-oriented transition dipoles in the EML, and may be an ensemble average dipole orientation of all the emitter molecules in the EML. The measured VDR values for the various host:emitter combinations in FIG. 22 can be found in Table 3 below.

TABLE 3

| Host:Emitter | VDR |
|---|---|
| Compound 15:Compound 14 (10%) | 0.47 ± 0.05 |
| Compound 15:Compound 13 (10%) | 0.32 ± 0.05 |
| Compound 8:Compound 14 (10%) | 0.34 ± 0.05 |
| Compound 8:Compound 13 (10%) | 0.29 ± 0.05 |

In another embodiment, a templating layer may be used to orient the emitter molecule. Growing zinc phthalocyanine (ZnPc) on a thin templating layer of copper iodide may cause the ZnPc molecules to lie more horizontally than without the templating layer. A thin layer of the organic small molecule hexaazatriphenylene-hexacarbonitrile (HAT-CN) may template the growth of copper phthalocyanine (CuPc) and may the molecular orientation more horizontal. Templating layers may be used to align the emissive dipole more vertically. Embodiments of the disclosed subject matter provide templated EML within a threshold distance of the enhancement layer.

An emissive layer VDR may be measured on the film (with or without a templating layer) of the composition of the emissive layer in the OLED device. An emissive material VDR may be measured in a film in which the emission spectrum is due to that material, most preferably a film composed of the material and one inert component.

Figure 23:
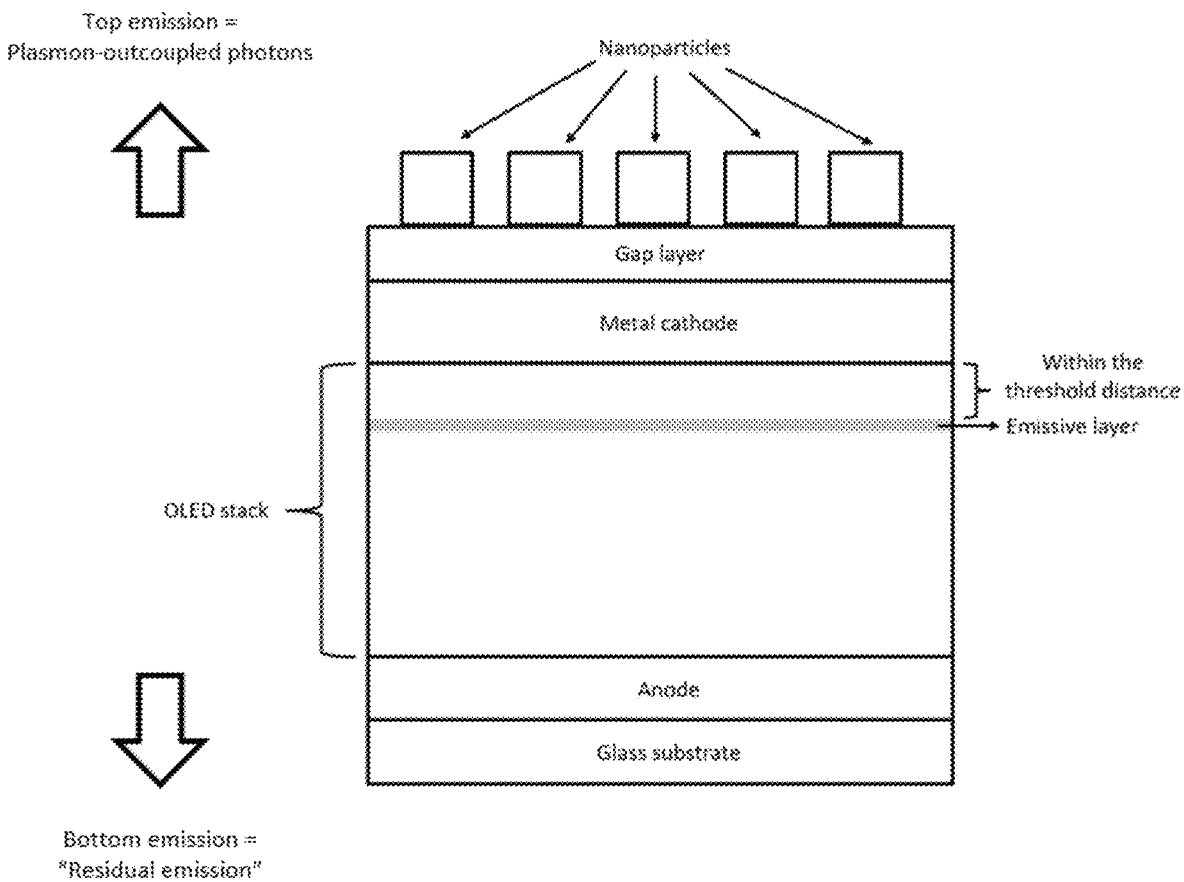
FIG. 23 shows a device stack used to compare the effects of dipole orientation on top and bottom emission characteristics. The device incorporates a nanoparticle-based outcoupling scheme to convert plasmon energy into top emission photons according to embodiments of the disclosed subject matter.
Figures 24A, 24B, 24C, 24D:
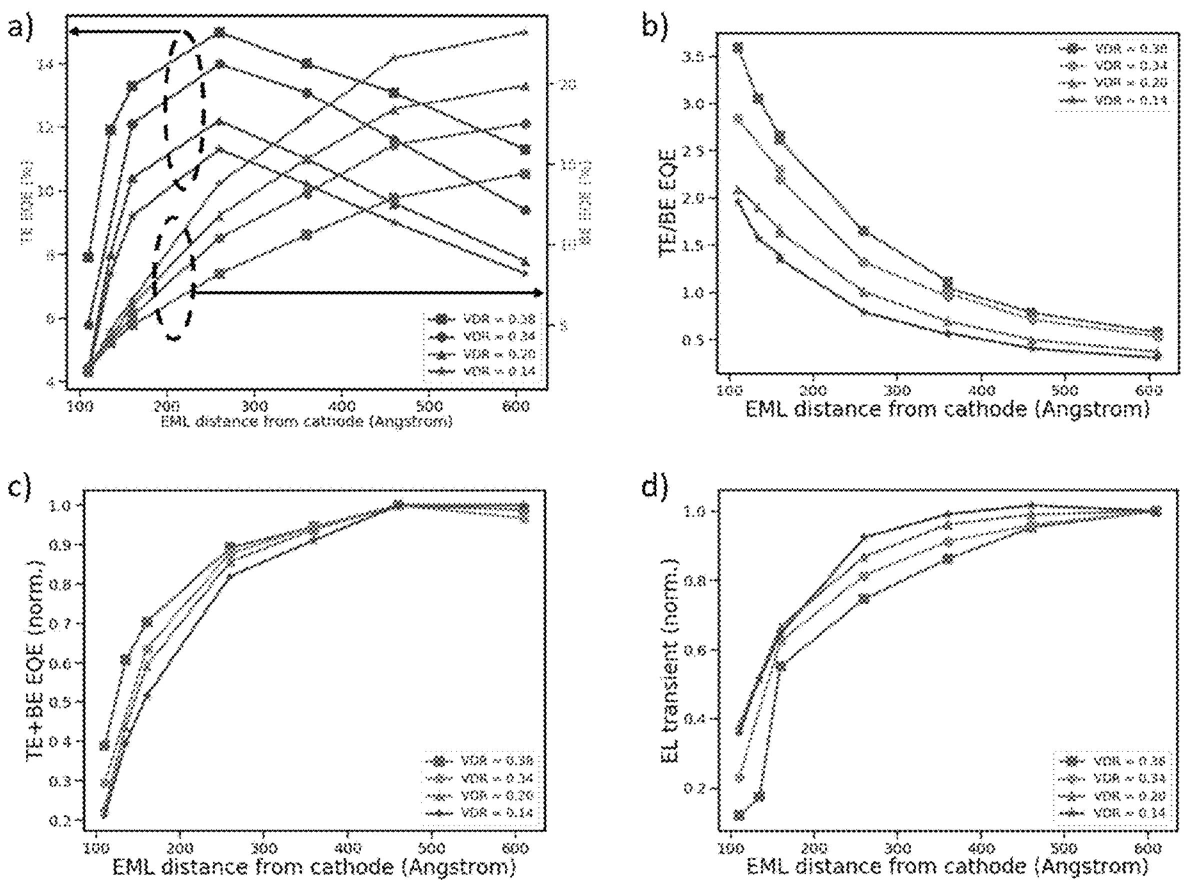
FIGS. 24*a*-24*d* shows a plot of the top emission (TE) or bottom emission (BE) external quantum efficiency (EQE) as a function of emissive layer distance from the cathode for devices of structure shown in FIG. 23, and FIGS. 24*b*-24*d* show a plot of the ratio of TE/BE, the sum TE+BE, and the EL transient, respectively, as a function of emissive layer distance from the cathode for these same devices according to embodiments of the disclosed subject matter.

FIGS. 24*a*-24*d* show the effect of modifying the VDR on device performance for several different red emitters with similar emission peak wavelengths. The device, such as shown in FIG. 5*a*, and FIG. 23, may use a nanoparticle-based outcoupling scheme to extract energy from the plasmon mode and convert it to photons emitted from the topside of the device as top emission (TE) light. Bottom emission (BE) light may be dominated by exciton recombination directly producing photons without going through the plasmon mode, which may be referred to as “residual emission.” In this example device structure, the enhancement layer may be a metal cathode. In FIG. 24*a*, the BE and TE external quantum efficiency (EQE) are plotted as a function of distance from the edge of the EML to the cathode. As the EML is moved closer to the cathode, BE decreases as more excited state energy is coupled into the surface plasmon mode. It is for the same reason that TE may increase, when decreasing a distance between the EML and the cathode down to about 260 Å. At shorter distances than 260 Å, the excited state energy may be coupled into lossy, high-k modes and/or forms other species, such as electron-hole pairs, in the metal. Higher-VDR emitters may couple energy more efficiently into the plasmon mode at farther distances from the metal cathode, leading to a positive correlation between TE, EQE, and VDR, and a negative correlation between BE, EQE, and VDR. Since the lossy mode coupling at close distances between the EML and metal cathode may reduce both TE and BE equally, the ratio of TE/BE for the various VDR emitters may be compared. Higher VDR emitters may have a higher TE/BE ratio. This ratio may continue to increase as the emitter is brought closer to the metal cathode. This ratio may account for any differences in intrinsic emitter efficiency. These trends may be expected based on the tendency of a more vertically aligned transition dipole emitter to couple more efficiently to the plasmon mode. A normalized plot of the sum of TE, BE, and EQE may be plotted as a function of EML distance from the cathode for the various VDR emitters as shown in FIG. 24*c*. As VDR increases, the reduction of TE+BE EQE is slower. This suggests that emissive layers within OLEDs may be configured to have higher fractions of vertical emitters (higher VDR) in order to reduce the lossy mode coupling and to increase the TE EQE and total EQE of the device. This underscores the importance of high-VDR emitter molecules and emissive layer designs to plasmonic OLEDs. Coupling to the plasmon mode may be enhanced with high VDR, and coupling to lossy modes is simultaneously reduced. As shown in FIG. 24*d*, the relative speed up in EL transient may be greater as the VDR increases. That is, high VDR may be used to achieve a faster EL transient, and hence improved device stability, at a given EML distance from the enhancement layer, and/or a higher VDR EML placed farther from the enhancement layer may achieve the same or faster EL transient as a lower VDR EML placed closer to the enhancement layer, thereby allowing for greater OLED design flexibility.

Figure 25:
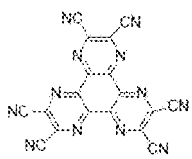
FIG. 25 shows example compounds according to embodiments of the disclosed subject matter.
Figure 25:
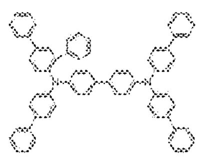
Figure 25:
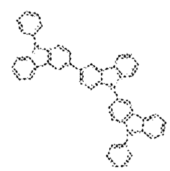
Figure 25:
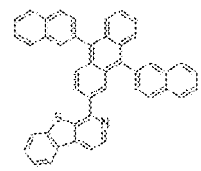
Figure 25:
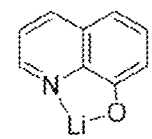
Figure 25:
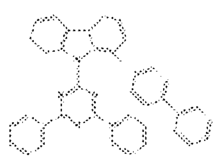
Figure 25:
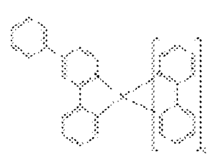
Figure 25:
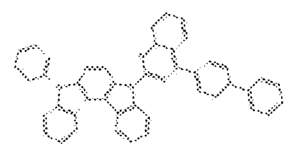
Figure 25:
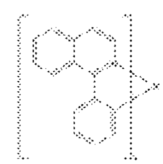
Figure 25:
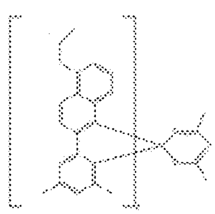
Figure 25:
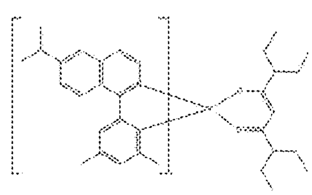
Figure 25:
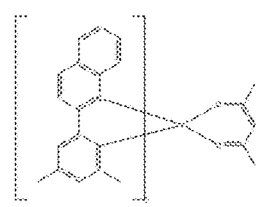
Figure 25:
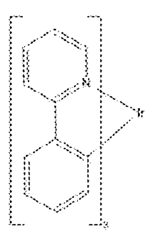
Figure 25:
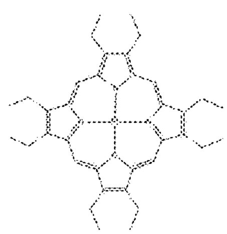
Figure 25:
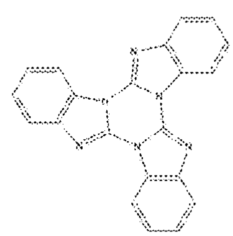

OLEDs were grown on a glass substrate pre-coated with an indium-tin-oxide (ITO) layer having a sheet resistance of 15-Ω/sq. Prior to any organic layer deposition or coating, the substrate was degreased with solvents and then treated with an oxygen plasma for 1.5 minutes with 50 W at 100 mTorr and with UV ozone for 5 minutes. The devices in FIGS. 23 and 24*a*-24*d* were fabricated in high vacuum ($<10^{-6}$ Torr) by thermal evaporation. The anode electrode was 750 Å of indium tin oxide (ITO). FIG. 25 shows example compounds. The device example had organic layers consisting of, sequentially, from the ITO surface, 100 Å thick Compound 1 (HIL), 250 Å layer of Compound 2 (HTL), 50 Å of Compound 3 (EBL), 50 Å of Compound 4 doped with 18% Compound 5 and doped with 3% of Compound [9, 10, 11, 12] (EML), 50 Å of Compound 4 (BL), [50, 75, 100, 200, 300, 400, 550] A of Compound 7 doped with 35% of Compound 6 (ETL), 10 Å of Compound 7 (EIL), 10 Å of Ca followed by 340 Å of Ag (Cath), 400 Å of Compound 2 (gap layer), and topped with spin cast 100 nm Ag nanocubes in 7 mg/ml concentration solution. All devices were encapsulated with a glass lid sealed with an epoxy resin in a nitrogen glove box (<1 ppm of $H_2O$ and $O_2$,) immediately after fabrication with a moisture getter incorporated inside the package. Doping percentages are in volume percent. The films in FIG. 22 were also fabricated in high vacuum ($<10^{-6}$ Torr) by thermal evaporation. The films had organic layers consisting of, sequentially, from the substrate, either 400 Å of Compound 8 doped with 10% of Compound 13 or 14, or 400 Å of Compound 15 doped with 10% of Compound 13 or 14. In FIG. 22, the P-polarized emission intensity as a function of angle was measured using a Fluxim Phelos instrument. A 405 nm LED is used to photoexcite a sample consisting of the 400 Å host:dopant (emissive) layer encapsulated onto a glass substrate attached to a hemispherical prism with index matching fluid. Optical constants were measured and fit using a Woollam M2000 variable angle spectroscopic ellipsometer for identical emissive layer films on a silicon wafer. VDR values were obtained by fitting the P-polarized emission data using Fluxim Setfos software using the measured optical constants and varying the emitter VDR, emission intensity, and exciton profile.

In embodiments of the disclosed subject matter disclosed above, a device may include a substrate, first electrode, and an organic emissive layer. The first electrode of the device may include is at least one of: a metal, a semiconductor, and/or a transparent conducting oxide. The electrode layer of the device may include at least one of: Ag, Al, Au, Ir, Pt, Ni, Cu, W, Ta, Fe, Cr, Mg, Ga, Rh, Ti, Ru, Pd, In, Bi, and/or Ca. The organic emissive layer may include an organic emissive material, and may be disposed over the first electrode. An enhancement layer of the device may include a plasmonic material exhibiting surface plasmon resonance that non-radiatively couples to the organic emissive material and transfers excited state energy from the organic emissive material to the non-radiative mode of surface plasmon polaritons, and may be disposed over the organic emissive layer. The enhancement layer is provided no more than a threshold distance away from the organic emissive layer. The enhancement layer of the device may include a second electrode layer. The organic emissive material of the device may have a total non-radiative decay rate constant and a total radiative decay rate constant due to the presence of the enhancement layer, and the threshold distance may be where the total non-radiative decay rate constant is equal to the total radiative decay rate constant. At least one of the organic emissive material and the organic emissive layer may have a vertical dipole ratio (VDR) value of equal or greater than 0.33.

In some embodiments, the organic emissive layer of the device may have a VDR value equal or greater than 0.33. The organic emissive material of the device may have a VDR value equal or greater than 0.33.

The organic emissive layer of the device may include a first layer having the organic emissive material, and a second layer disposed immediately adjacent to the first layer and comprising a second material. The first layer and the second layer may satisfy the condition $0 \leq Ex-\Delta E$, where Ex is the lowest emissive state energy level of the first layer or the second layer, and ΔE is the difference between a highest HOMO (Highest Occupied Molecular Orbital) energy level and a lowest LUMO (Lowest Unoccupied Molecular Orbital) energy level within the organic emissive layer. Ex may be the lowest triplet (Ti) energy level of the first layer and the first layer is phosphorescent. In some embodiments, Ex may be the lowest singlet (S1) energy level of the first layer and the first layer is fluorescent.

The organic emissive layer of the device may further comprises a host. The host may include at least one chemical group selected from the group of: triphenylene, carbazole, dibenzothiphene, dibenzofuran, dibenzoselenophene, azatriphenylene, azacarbazole, aza-dibenzothiophene, aza-dibenzofuran, and/or aza-dibenzoselenophene.

In some embodiments, the host of the organic emissive layer may be selected from the group of:

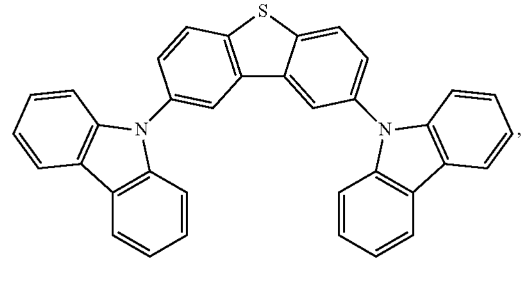

,

-continued
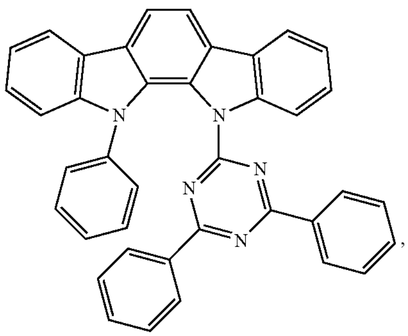
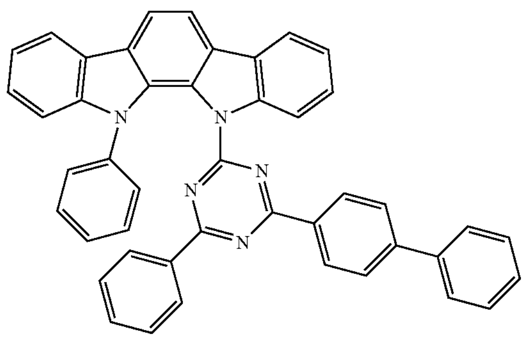
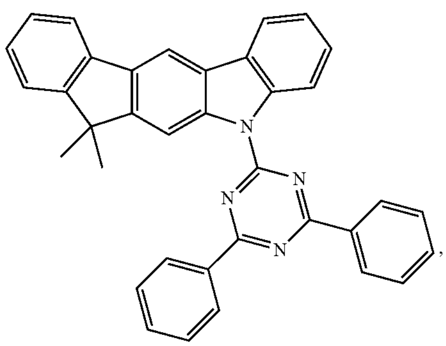
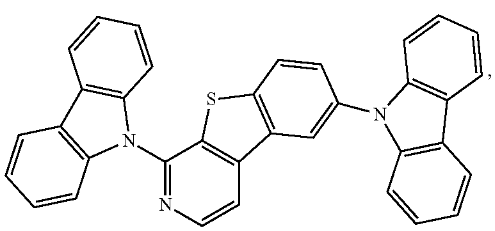
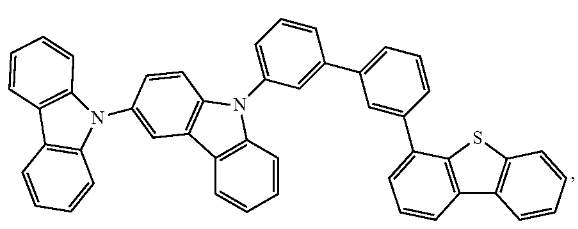
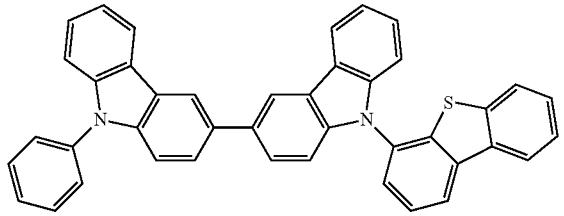
-continued
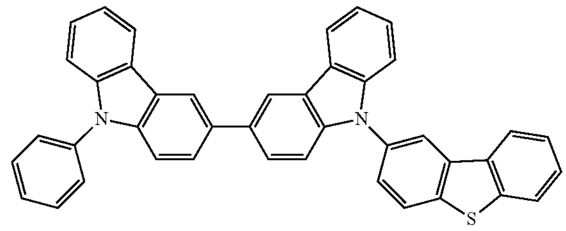
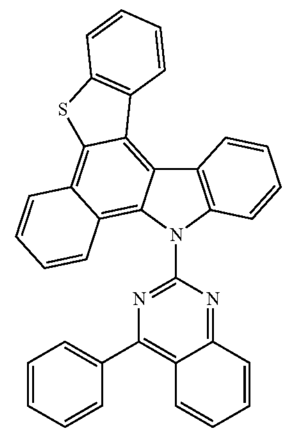
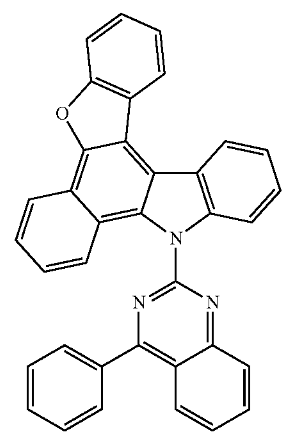
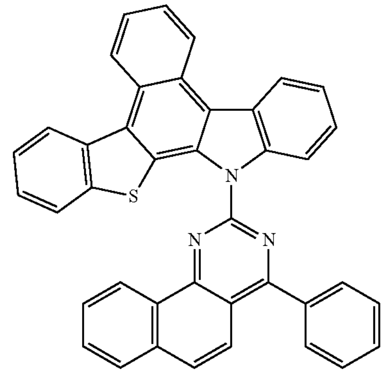

-continued
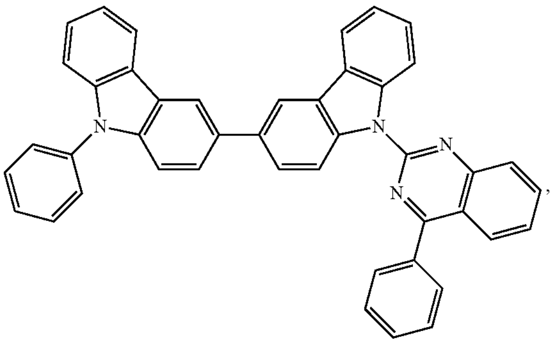
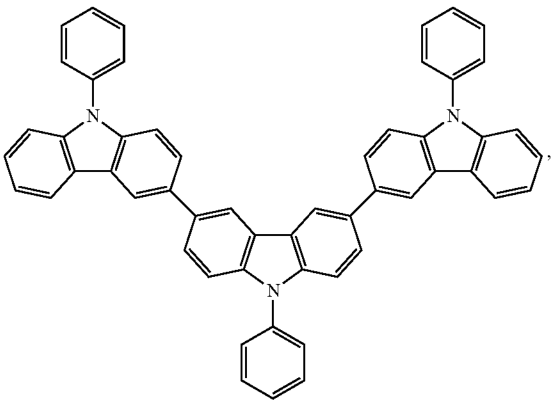
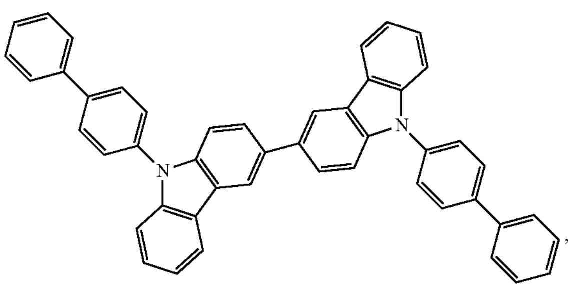
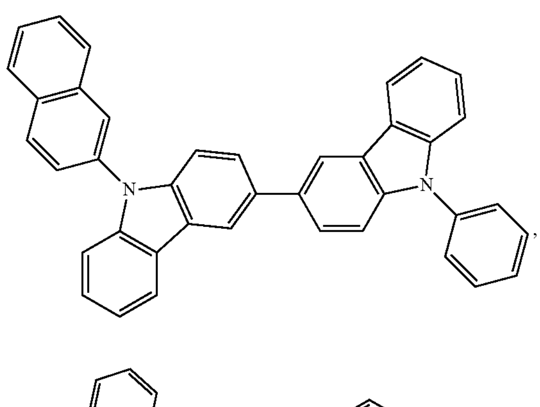
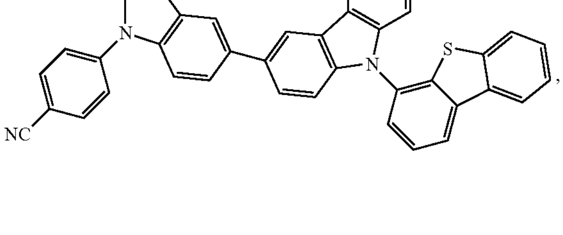
-continued
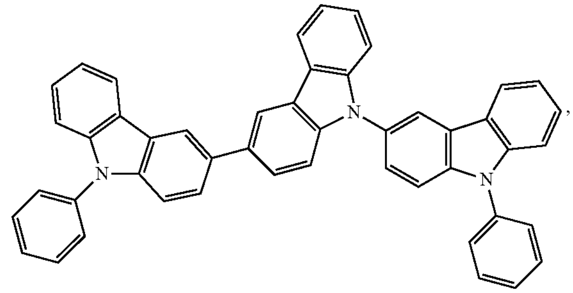
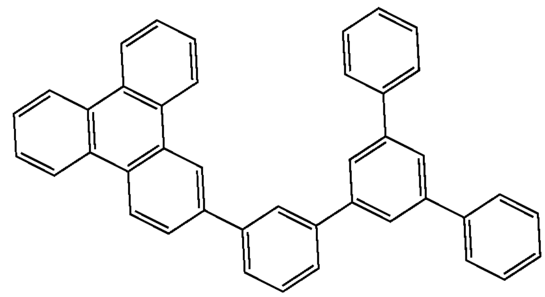
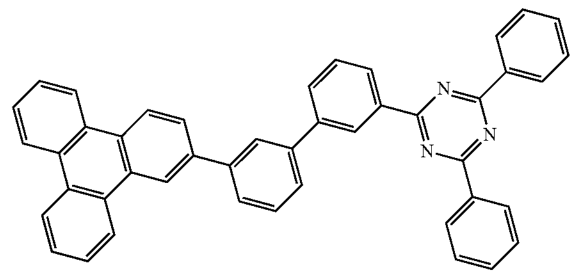
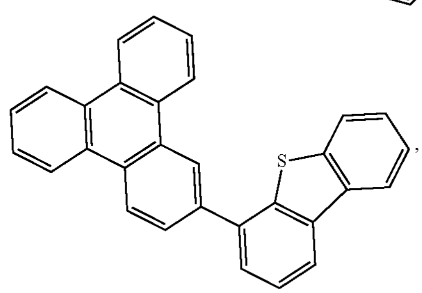
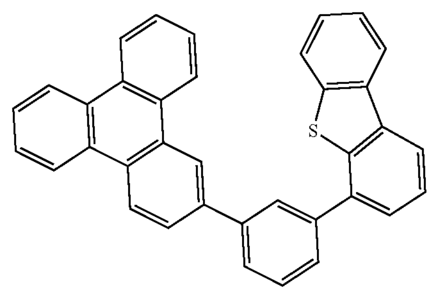
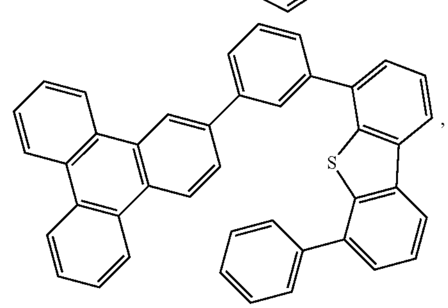

-continued

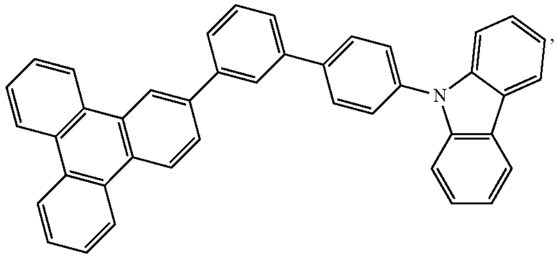

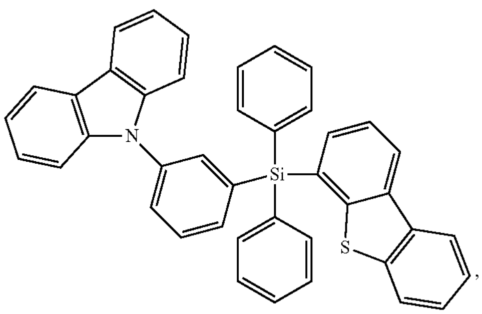

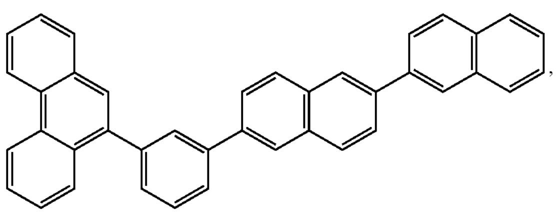

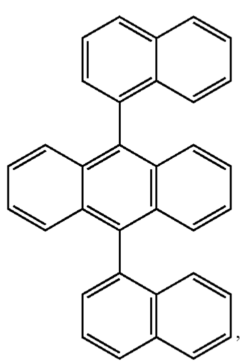

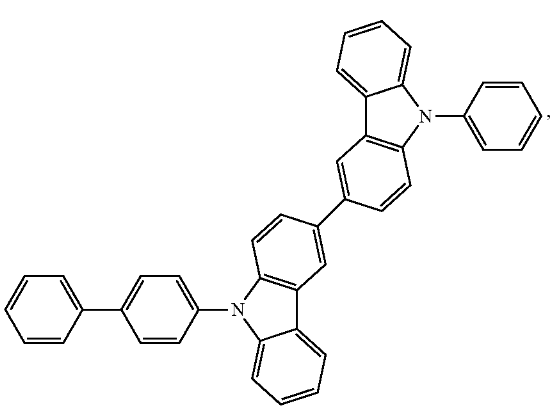

-continued

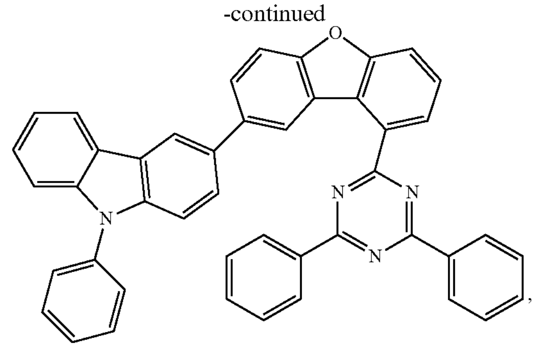

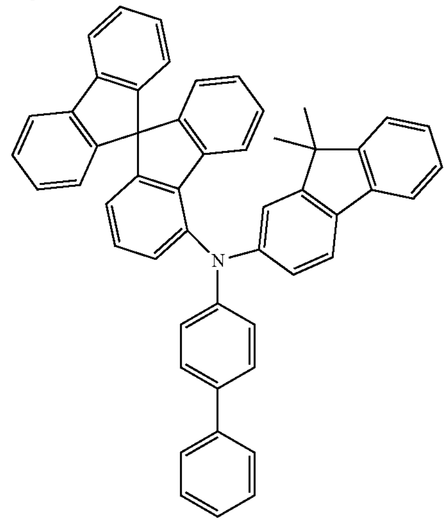

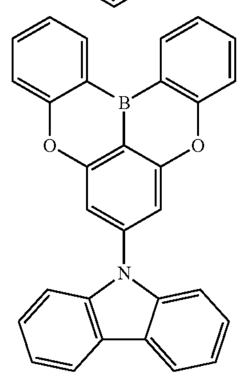

and/or combinations thereof.

In some embodiments, the device may include a templating layer selected and arranged to orient molecules of the organic emissive layer. The templating layer may align dipoles of the organic emissive material and increases the verticality of the dipoles. As used throughout, vertical dipoles may be perpendicular to a substrate/electrode interface, and an increase in verticality of the dipoles may be that the templating layer makes the dipoles more vertical than they would be without the templating layer. The templating layer may be within the threshold distance of the enhancement layer.

The organic emissive layer may include a plurality of sub-layers. In some embodiment, the organic emissive material emits from a doublet state. The organic emissive material may include fluorescent materials with S1 values (i.e., lowest singlet energy levels) that are lower than $T_1$ values (i.e., lowest triplet ($T_1$) energy levels).

The emission of the device may originate from a combination of materials within the organic emissive layer. The combination of materials of the organic emissive layer may include a first material and a second material, where an exciplex is formed within the organic emissive layer. A first material and the second material may satisfy the condition $0 \leq Ex - \Delta E$, where Ex is the lowest emissive state energy level of the first material or the second material, and $\Delta E$ is the difference between a highest HOMO (Highest Occupied Molecular Orbital) energy level and a lowest LUMO (Lowest Unoccupied Molecular Orbital) energy level within the organic emissive layer.

The organic emissive material of the device may be a phosphorescent material. The phosphorescent material may be a metal coordination complex having a metal-carbon bond, and/or a metal-nitrogen bond and/or a metal-oxygen bond. The metal may be Ir, Rh, Re, Ru, Os, Pt, Au, and/or Cu.

In some embodiments, the phosphorescent material of the device may have the formula of $M(L^1)_x(L^2)_y(L^3)_z$, where $L^1$, $L^2$, and $L^3$ can be the same or different, where x is 1, 2, or 3, where y is 0, 1, or 2, where z is 0, 1, or 2, where x+y+z may be the oxidation state of the metal M, and where $L^1$ may be selected from the group consisting of:

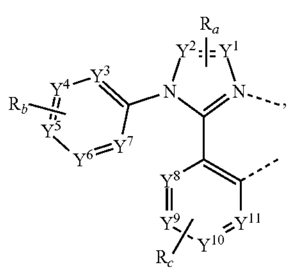

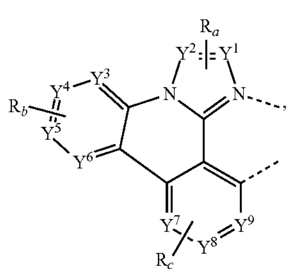

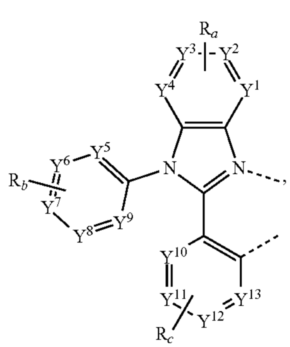

-continued

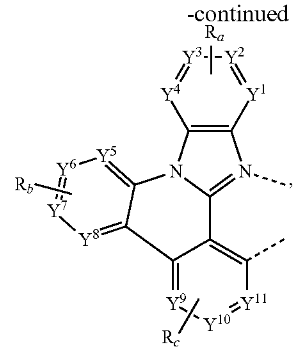

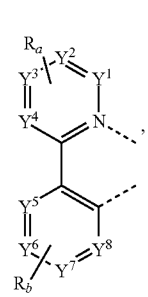

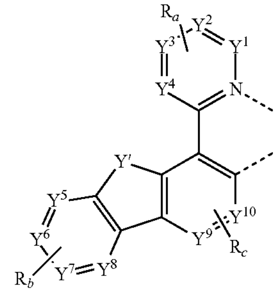

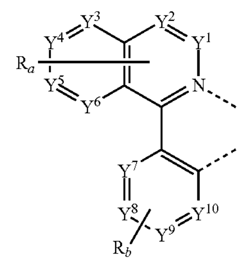

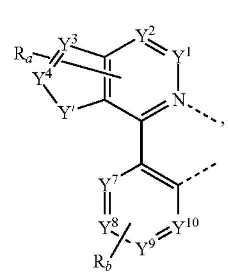

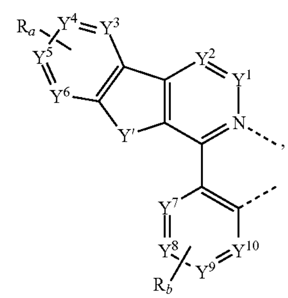

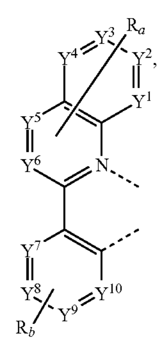

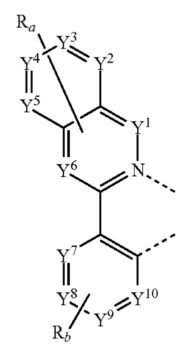

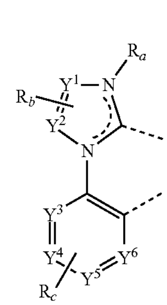

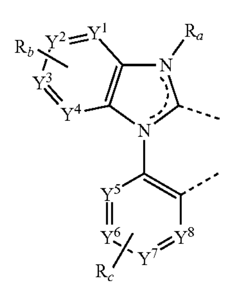

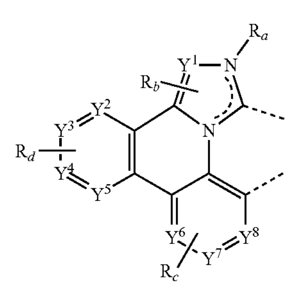

-continued
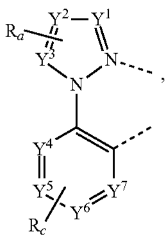
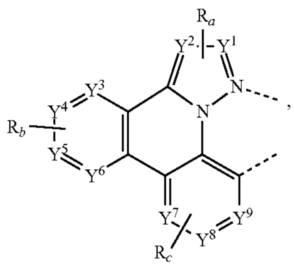
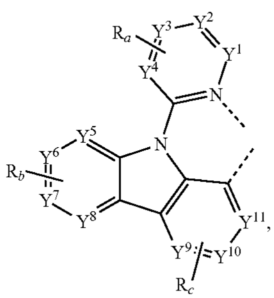
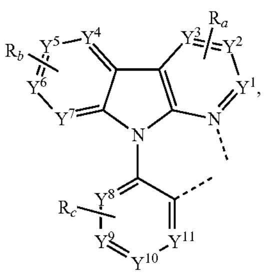
and
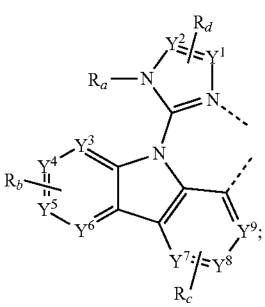
where $L^2$ and $L^3$ are independently selected from the group consisting of
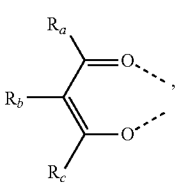
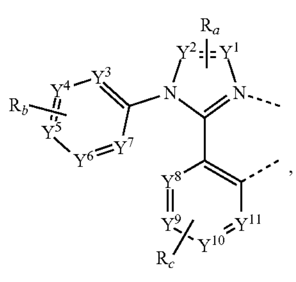
-continued
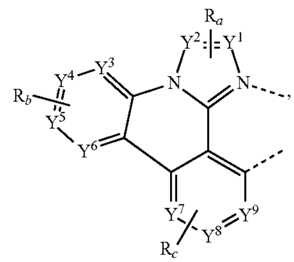
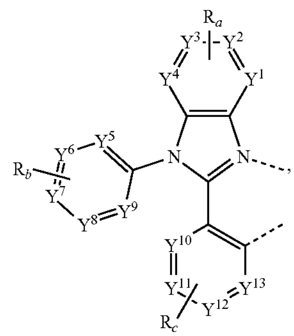
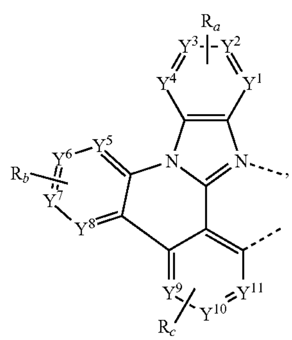
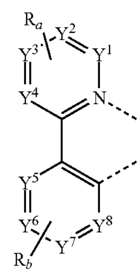
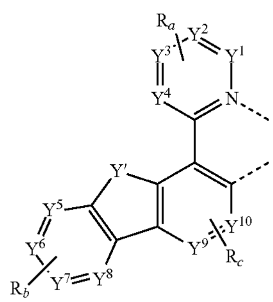
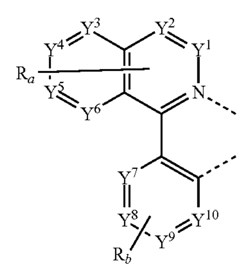
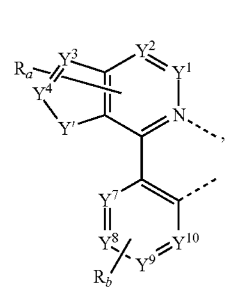
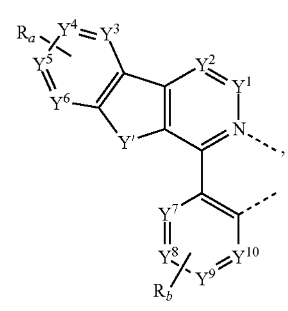

-continued

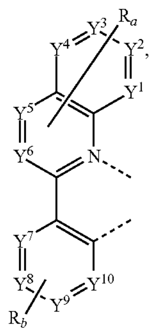

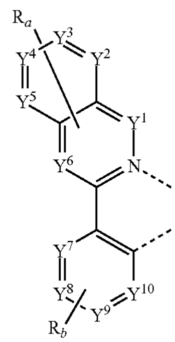

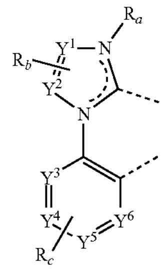

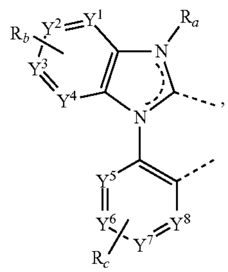

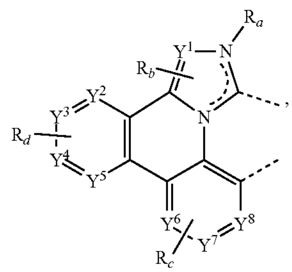

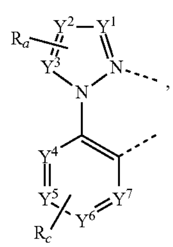

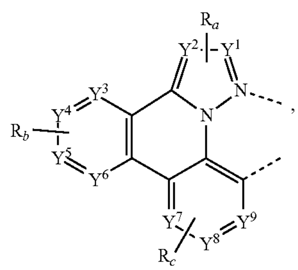

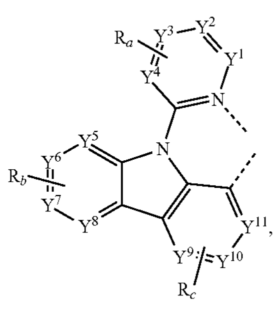

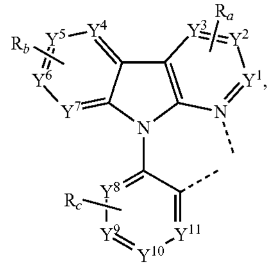

and

-continued

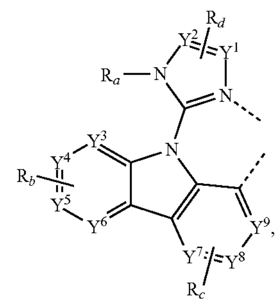

where each $Y^1$ to $Y^{13}$ may be independently selected from carbon and/or nitrogen, where Y' is selected from the group consisting of B $R_e$, N $R_e$, P $R_e$, O, S, Se, C═O, S═O, $SO_2$, $CR_eR_f$, $SiR_eR_f$, and $GeR_eR_f$, where $R_e$ and $R_f$ can be fused or joined to form a ring, where each $R_a$, $R_b$, $R_c$, and $R_d$ can independently represent from mono to the maximum possible number of substitutions, or no substitution, where each $R_a$, $R_b$, $R_c$, $R_d$, $R_e$, and $R_f$ may be independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof, and where any two adjacent substituents of $R_a$, $R_b$, $R_c$, and $R_d$ can be fused or joined to form a ring or form a multidentate ligand.

In some embodiments, the phosphorescent material of the device may have a formula selected from the group consisting of $Ir(L_A)_3$, $Ir(L_A)(L_B)_2$, $Ir(L_A)_2(L_B)$, $Ir(L_A)_2(L_C)$, $Ir(L_A)(L_B)(L_C)$, and $Pt(L_A)(L_B)$, where $L_A$, $L_B$, and $L_C$ are different from each other in the Ir compounds, where $L_A$ and $L_B$ can be the same or different in the Pt compounds, and where $L_A$ and $L_B$ can be connected to form a tetradentate ligand in the Pt compounds.

The organic emissive material of the device may be a fluorescent material. The fluorescent material may comprise at least one organic group selected from the group consisting of:

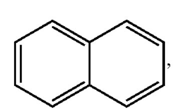

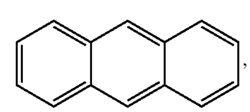

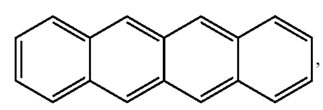

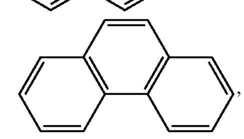

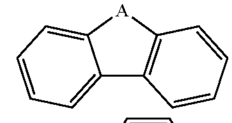

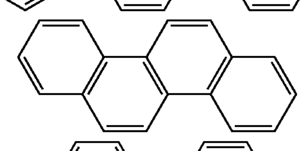

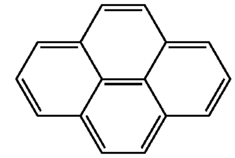

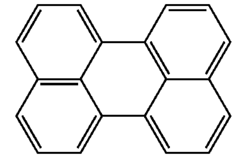

-continued

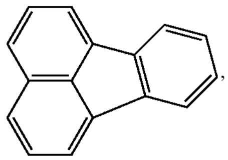

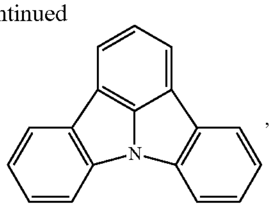

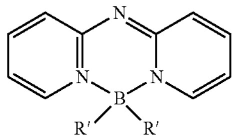

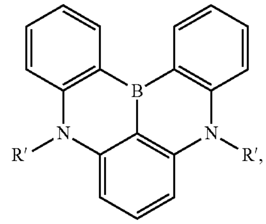

and aza analogues thereof, where A is selected from the group consisting of O, S, Se, NR' and CR'R'', where each R' can be the same or different and each R' is independently selected from the group consisting of alkyl, cycloalkyl, aryl, heteroaryl, and combinations thereof.

The fluorescent material of the device may be selected from the group consisting of:

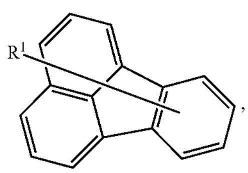

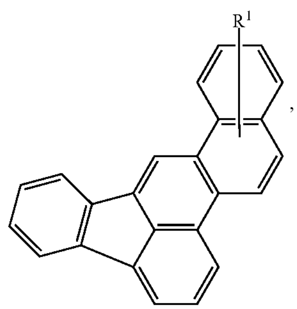

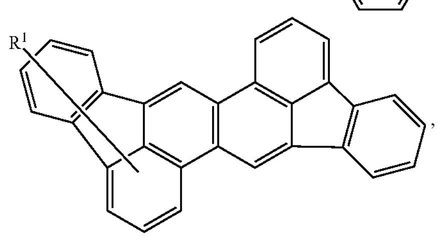

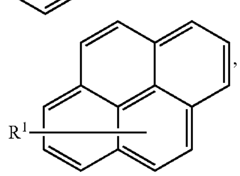

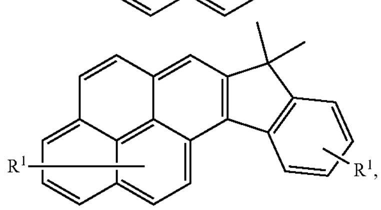

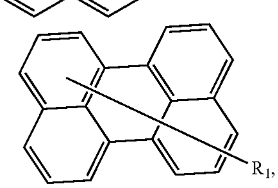

-continued

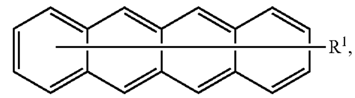

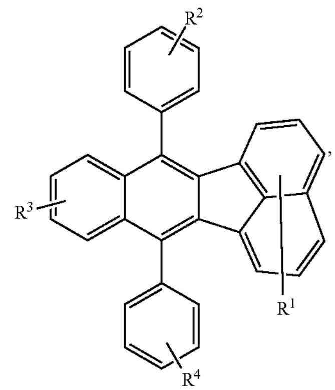

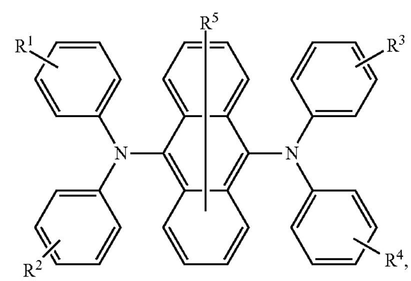

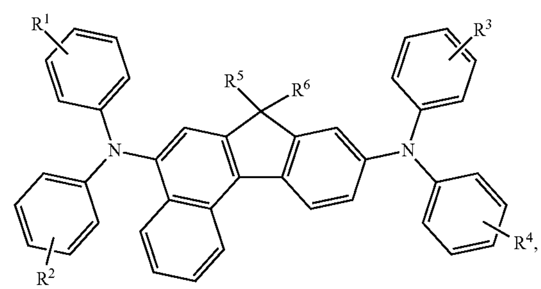

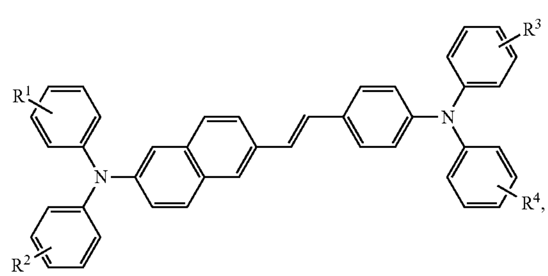

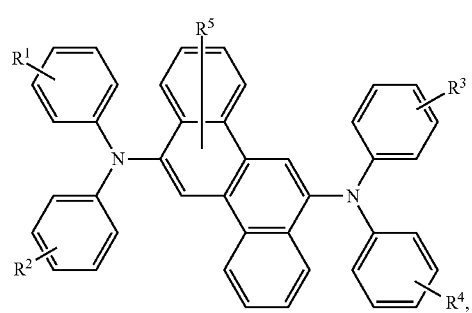

-continued

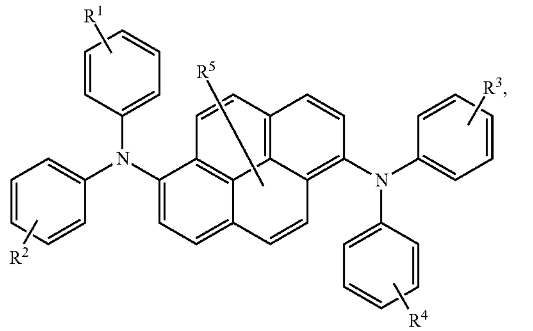

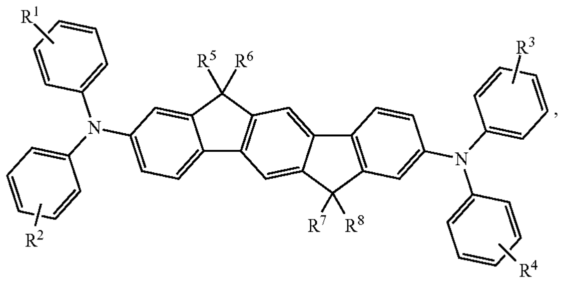

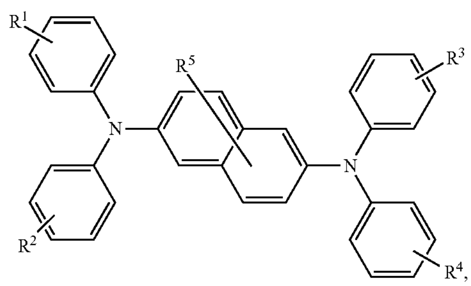

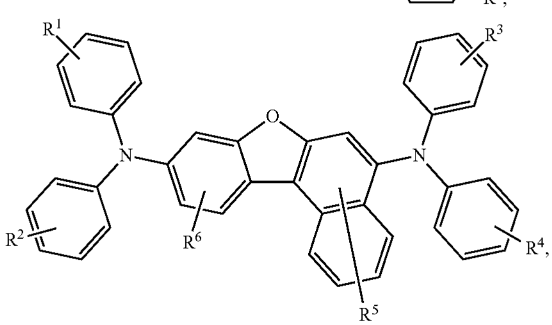

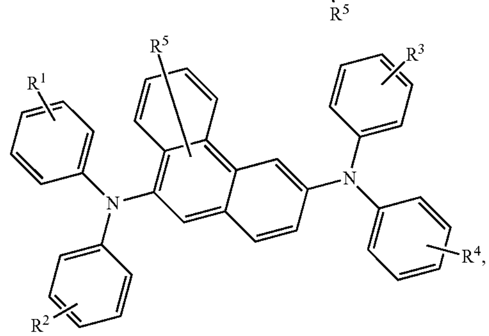

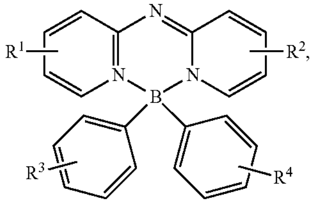

and

-continued

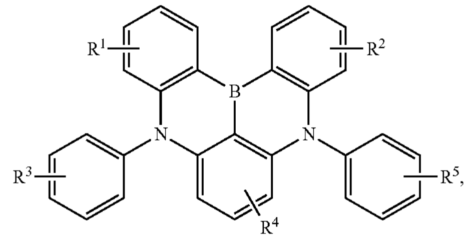

wherein $R^1$ to $R^5$ each independently represents from mono to maximum possible number of substitutions, or no substitution, and where $R^1$ to $R^5$ are each independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof.

In some embodiments, the organic emissive material of the device may be a Thermally Activated Delayed Fluorescence (TADF) material. The TADF material may have at least one donor group and at least one acceptor group. The TADF material may be a metal complex, and/or may be a non-metal complex. In some embodiments, the TADF material may be a Cu, Ag, or Au complex.

The TADF material of the device may include at least one of the chemical moieties selected from the group of:

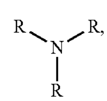

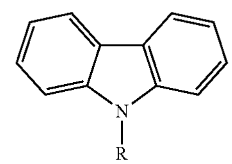

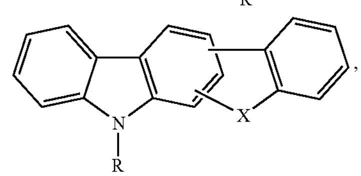

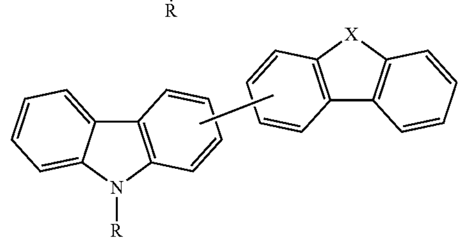

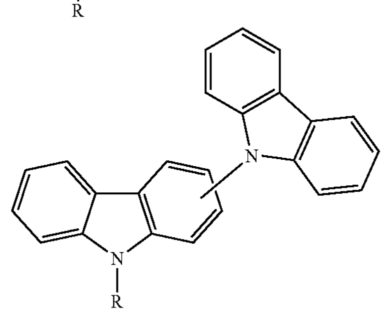

-continued

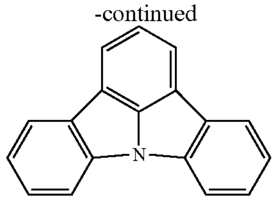
,

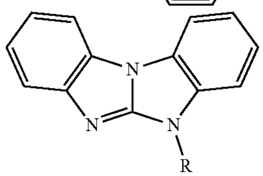
,

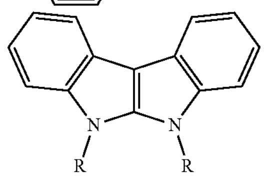
,

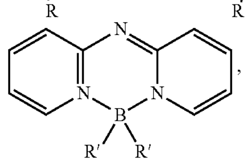
, and

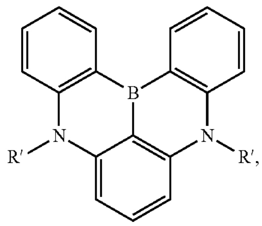

where X is selected from the group consisting of O, S, Se, and NR, where each R can be the same or different and each R is independently an acceptor group, an organic linker bonded to an acceptor group, or a terminal group selected from the group consisting of alkyl, cycloalkyl, heteroalkyl, heterocycloalkyl, arylalkyl, aryl, heteroaryl, and combinations thereof, and where each R' can be the same or different and each R' is independently selected from the group consisting of alkyl, cycloalkyl, aryl, heteroaryl, and/or combinations thereof. In some embodiments, the TADF material of the device may include at least one of the chemical moieties selected from the group consisting of nitrile, isonitrile, borane, fluoride, pyridine, pyrimidine, pyrazine, triazine, aza-carbazole, aza-dibenzothiophene, aza-dibenzofuran, aza-dibenzoselenophene, aza-triphenylene, imidazole, pyrazole, oxazole, thiazole, isoxazole, isothiazole, triazole, thiadiazole, and oxadiazole.

In some embodiments, The device may include an outcoupling structure. The outcoupling structure may have a plurality of nanoparticles, and the device may have a material disposed between the enhancement layer and the plurality of nanoparticles. The plurality of nanoparticles are formed from at least one of: Ag particles, Al particles, Ag—Al alloys, Au particles, Au—Ag alloys, dielectric material, semiconductor materials, an alloy of metal, a mixture of dielectric materials, a stack of one or more materials, and/or a core of one type of material and that is coated with a shell of a different type of material. At least one of the plurality of nanoparticles may include an additional layer to provide lateral conduction among the plurality of nanoparticles. The plurality of nanoparticles may be coated. In some embodiments, the plurality of nanoparticles may be metallic and coated with a non-metallic coating. The plurality of nanoparticles may include at least one of a metal, a dielectric material, and/or a hybrid of metal and dielectric material.

The plurality of nanoparticles of the device may be coated with an oxide layer. A thickness of the oxide layer may be selected to tune a plasmonic resonance wavelength of the plurality of nanoparticles or a nanopatch antenna. The plurality of nanoparticles may be colloidally-synthesized nanoparticles formed from a solution. The plurality of nanoparticles may be arranged in a periodic array, which may have a predetermined array pitch. In some embodiments, the plurality of nanoparticles may be arranged in a non-periodic array. A shape of the plurality of nanoparticles may be at least one of: cubes, spheres, spheroids, cylindrical, parallelepiped, rod-shaped, star-shaped, pyramidal, and/or multi-faceted three-dimensional objects. A size of at least one of the plurality of nanoparticles may be from 5 nm to 1000 nm.

The material of the device may include a dielectric layer disposed on the enhancement layer, and an electrical contact layer disposed on the dielectric layer. The material may be a voltage-tunable refractive index material between the electrical contact layer and the first electrode. The voltage-tunable refractive index material may be aluminum-doped zinc oxide. The material may include an insulating layer.

According to an embodiment, a consumer product may include a device having a substrate, a first electrode, and an organic emissive layer comprising an organic emissive material disposed over the first electrode. The device of the consumer product may include an enhancement layer, having a plasmonic material exhibiting surface plasmon resonance that non-radiatively couples to the organic emissive material and transfer excited state energy from the organic emissive material to non-radiative mode of surface plasmon polaritons, disposed over the organic emissive layer. The enhancement layer may be provided no more than a threshold distance away from the organic emissive layer. The organic emissive material has a total non-radiative decay rate constant and a total radiative decay rate constant due to the presence of the enhancement layer, and the threshold distance is where the total non-radiative decay rate constant is equal to the total radiative decay rate constant. At least one of the organic emissive material and the organic emissive layer has a vertical dipole ratio (VDR) value of equal or greater than 0.33.

The consumer product may be at least one of: display screens, lighting devices such as discrete light source devices or lighting panels, flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, cell phones, tablets, phablets, personal digital assistants (PDAs), wearable devices, laptop computers, digital cameras, camcorders, viewfinders, micro-displays that are less than 2 inches diagonal, 3-D displays, vehicle, aviation displays, a large area wall, a video walls comprising multiple displays tiled together, theater or stadium screen, a light therapy device, a sign, augmented reality (AR) or virtual reality (VR) displays, displays or visual elements in glasses or contact lenses, light emitting diode (LED) wallpaper, LED jewelry, and clothing.

In some embodiments, the organic layer may further comprise a host, wherein the host comprises a triphenylene containing benzo-fused thiophene or benzo-fused furan, wherein any substituent in the host is an unfused substituent independently selected from the group consisting of $C_nH_{2n+1}$, $OC_nH_{2n+1}$, $OAr_1$, $N(C_nF_{n2+1})_2$, $N(Ar_1)(Ar_2)$, $CH{=}CH{-}C_nH_{2n+1}$, $C{\equiv}CC_nH_{2n+1}$, $Ar_1$, $Ar_1{-}Ar_2$, $C_nH_{2n}$—

Ar$_1$, or no substitution, wherein n is from 1 to 10; and wherein Ar$_1$ and Ar$_2$ are independently selected from the group consisting of benzene, biphenyl, naphthalene, triphenylene, carbazole, and heteroaromatic analogs thereof.

In some embodiments, the organic layer may further comprise a host, wherein host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

In some embodiments, the host may be selected from the HOST Group consisting of:

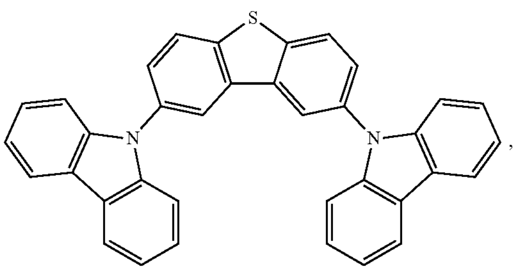

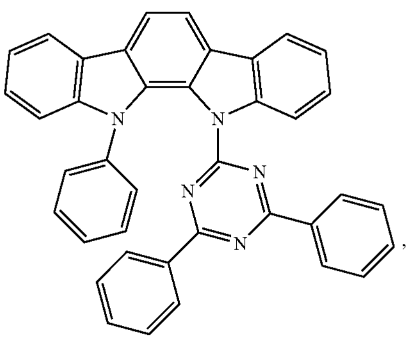

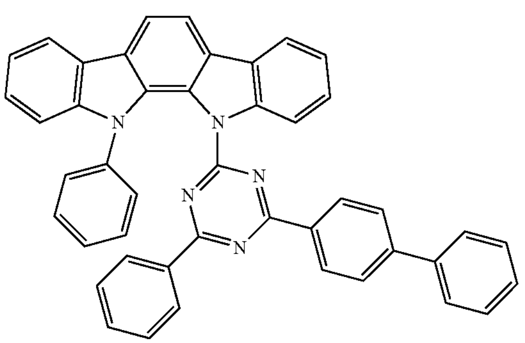

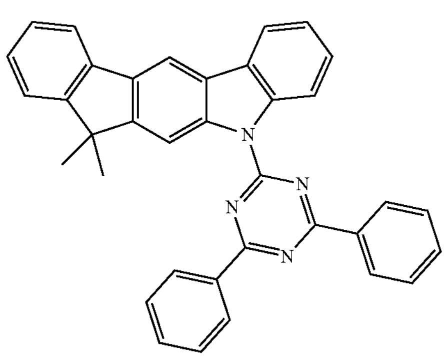

-continued

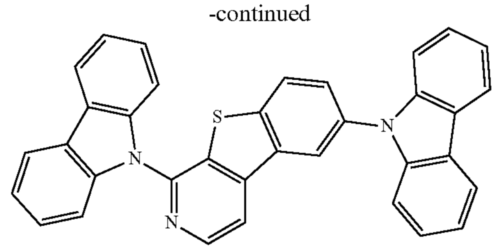

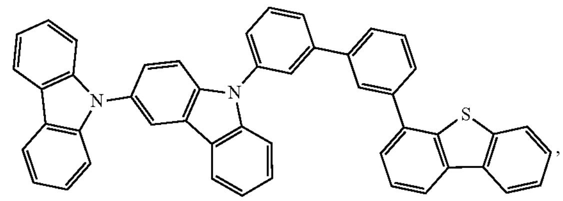

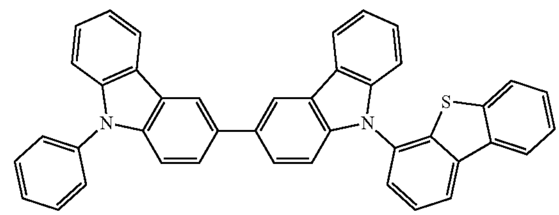

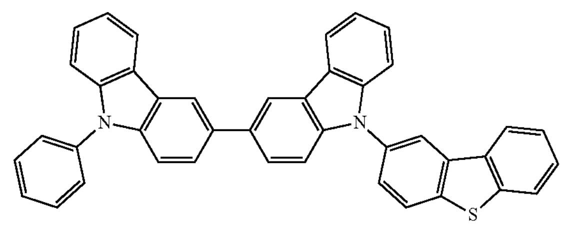

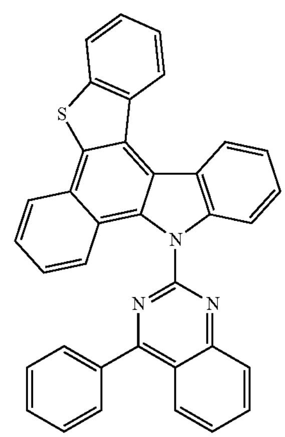

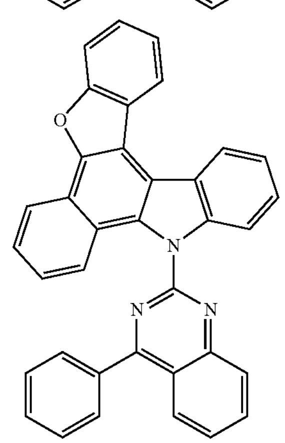

-continued
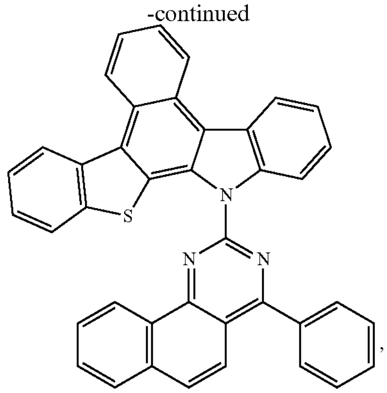
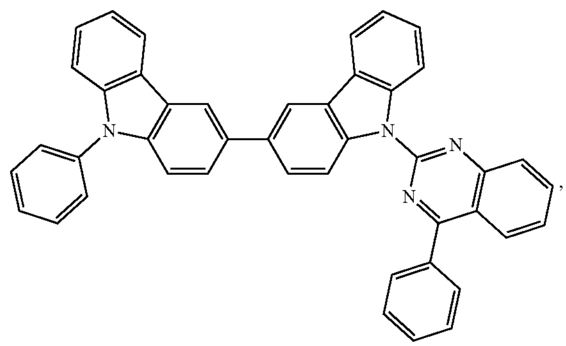
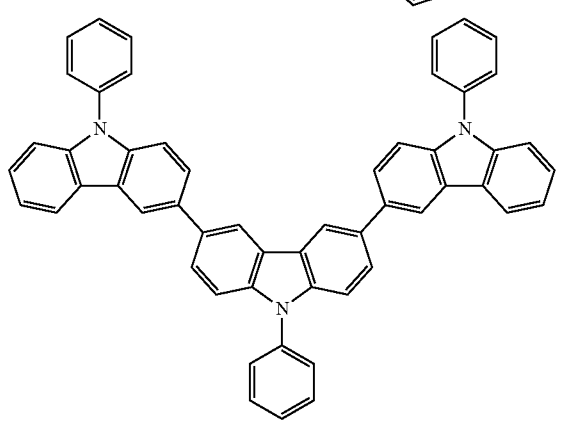
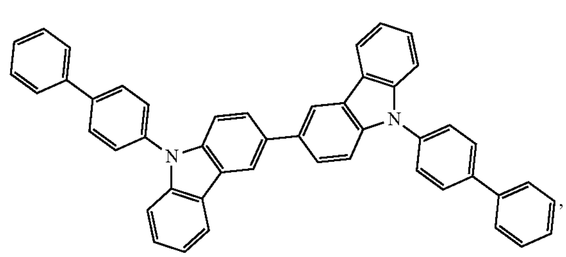
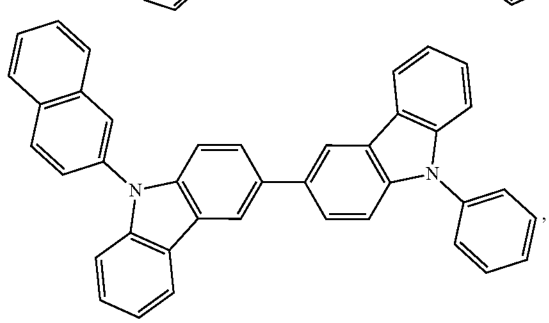
-continued
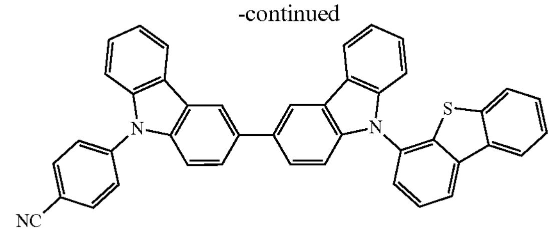
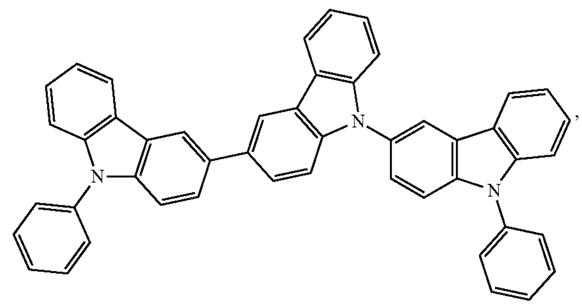 [SMILES: c1ccc(-n2c3ccccc3c3cc(-c4ccc5c(c4)c4ccccc4n5-c4ccc5c(c4)c4ccccc4n5-c4ccccc4)ccc32)cc1]
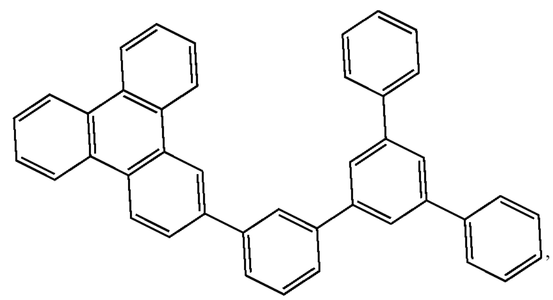
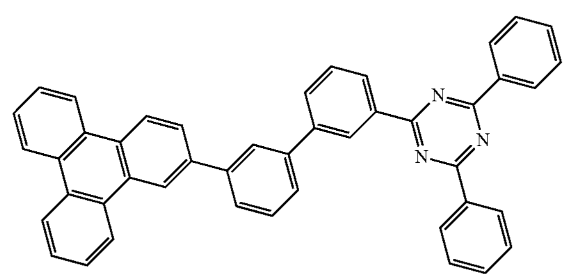
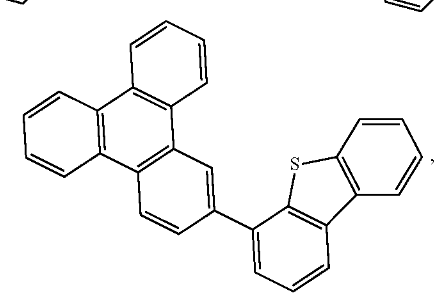
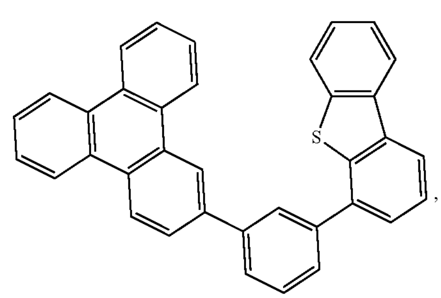

-continued
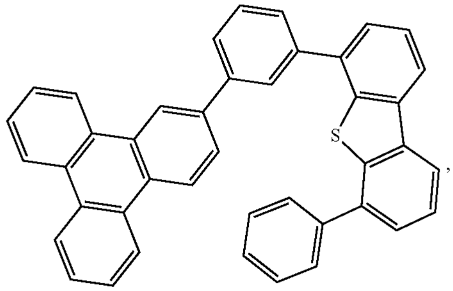
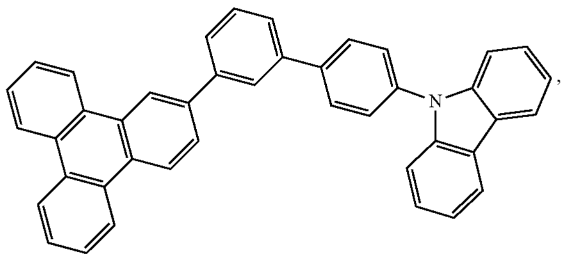
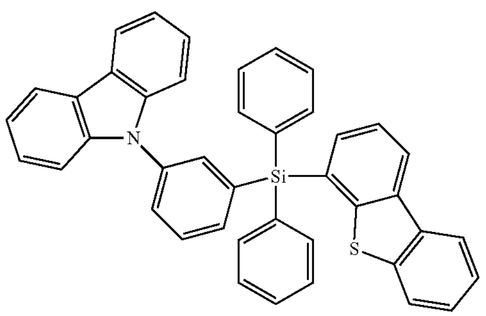
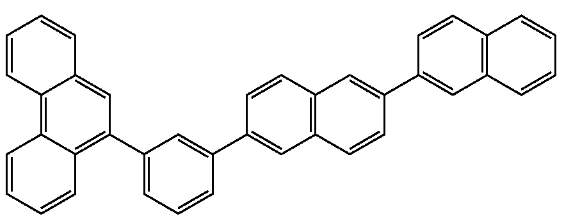
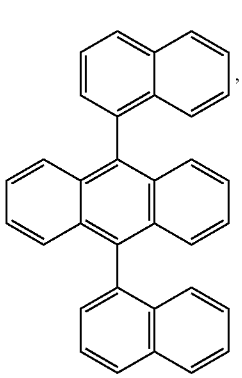
-continued
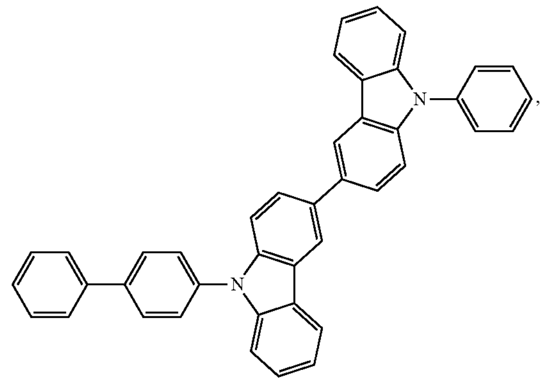
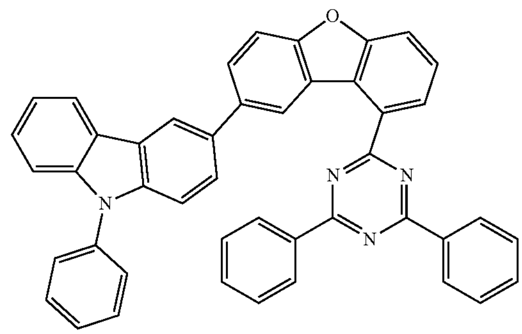
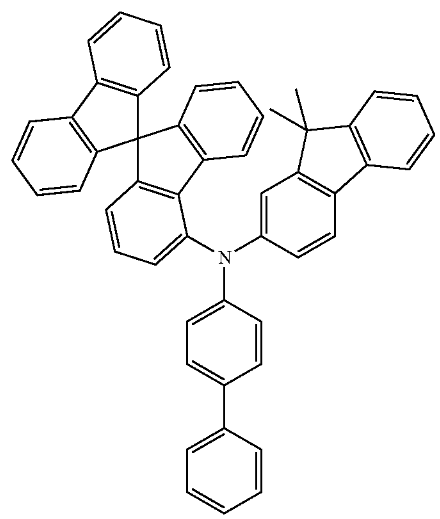
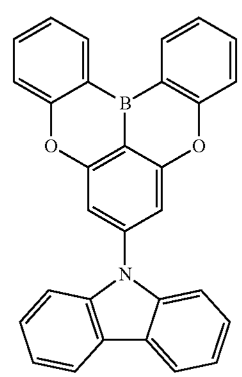

-continued

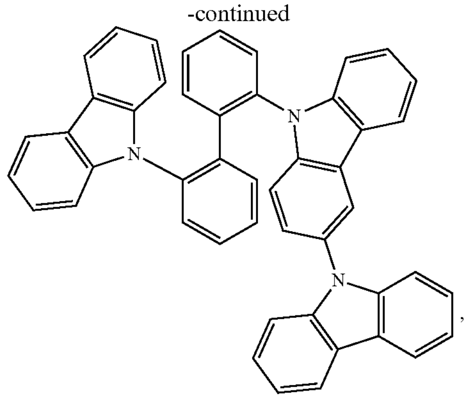

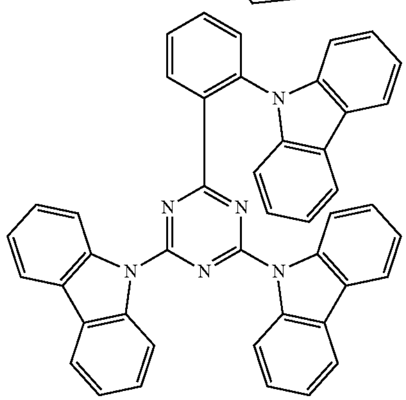

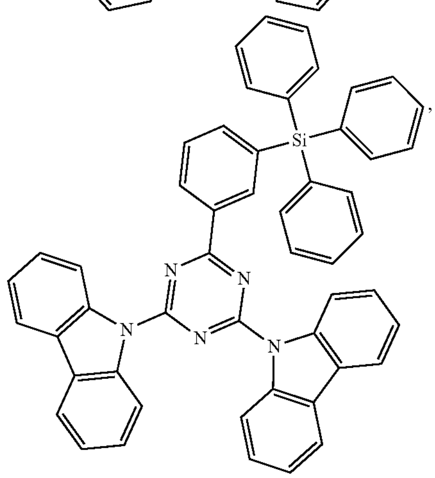

and combinations thereof.

In some embodiments, the organic layer may further comprise a host, wherein the host comprises a metal complex.

In some embodiments, the compound as described herein may be a sensitizer; wherein the device may further comprise an acceptor; and wherein the acceptor may be selected from the group consisting of fluorescent emitter, delayed fluorescence emitter, and combination thereof.

In yet another aspect, the OLED of the present disclosure may also comprise an emissive region containing a compound as disclosed in the above compounds section of the present disclosure.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for interventing layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

In yet another aspect, the present disclosure also provides a consumer product comprising an organic light-emitting device (OLED) having an anode; a cathode; and an organic layer disposed between the anode and the cathode, wherein the organic layer may comprise a compound as disclosed in the above compounds section of the present disclosure.

In some embodiments, the consumer product comprises an organic light-emitting device (OLED) having an anode; a cathode; and an organic layer disposed between the anode and the cathode, wherein the organic layer may comprise claim 1 as described herein.

In some embodiments, the consumer product can be one of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Several OLED materials and configurations are described in U.S. Pat. Nos. 5,844,363, 6,303,238, and 5,707,745, which are incorporated herein by reference in their entirety.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
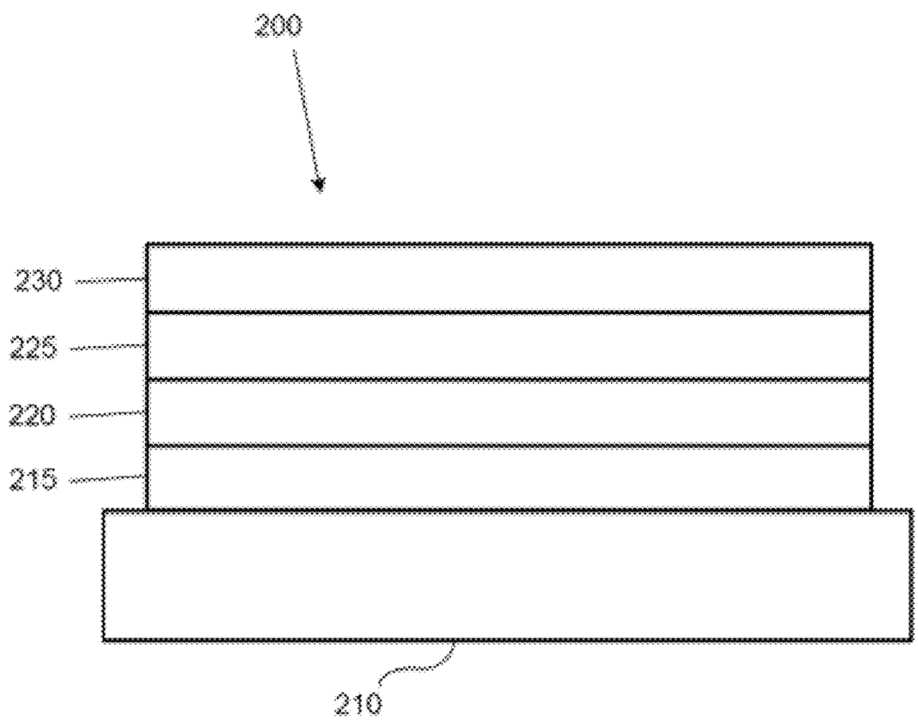
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the present disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons are a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the present disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the present disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 degrees C. to 30 degrees C., and more preferably at room temperature (20-25° C.), but could be used outside this temperature range, for example, from −40 degree C. to +80° C.

More details on OLEDs, and the definitions described above, can be found in U.S. Pat. No. 7,279,704, which is incorporated herein by reference in its entirety.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer. In some embodiments, the compound can be homoleptic (each ligand is the same). In some embodiments, the compound can be heteroleptic (at least one ligand is different from others). When there are more than one ligand coordinated to a metal, the ligands can all be the same in some embodiments. In some other embodiments, at least one ligand is different from the other ligands. In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds.

C. Combination of the Compounds of the Present Disclosure with Other Materials The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

a) Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

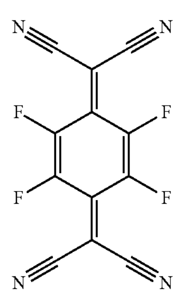

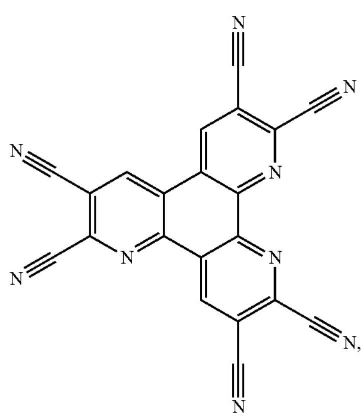

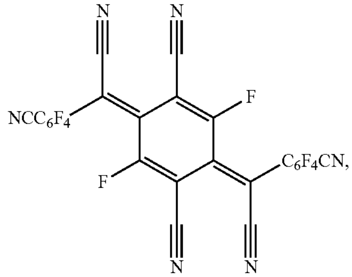

-continued

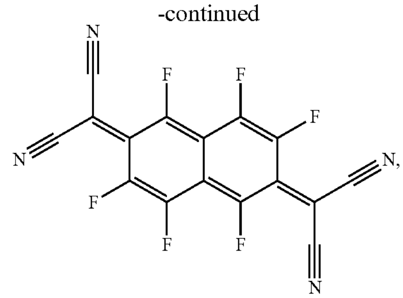

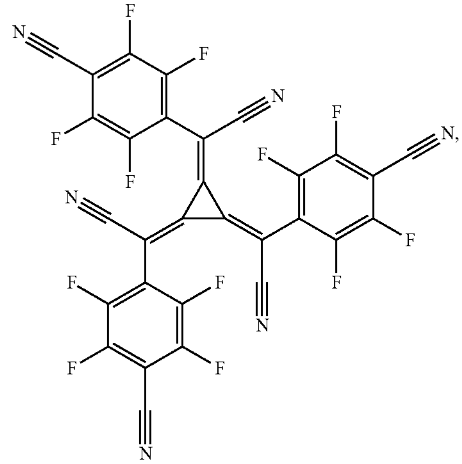

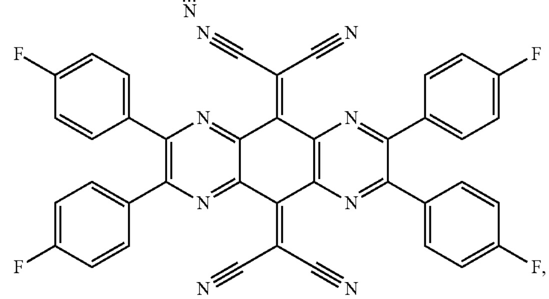

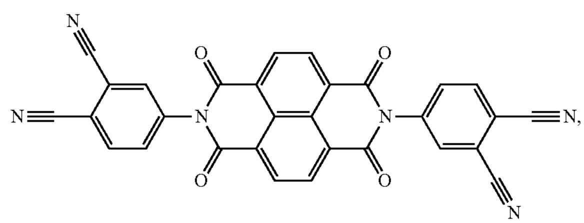

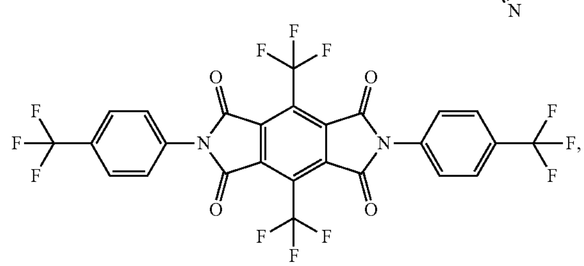

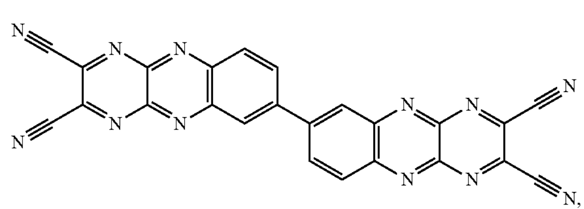

-continued

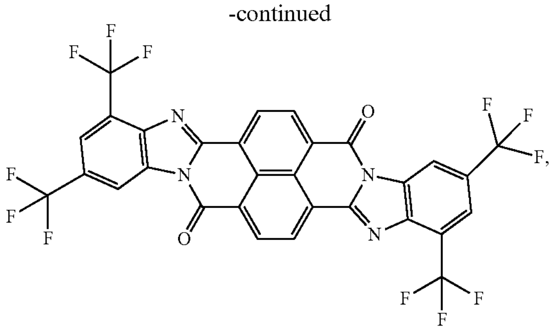

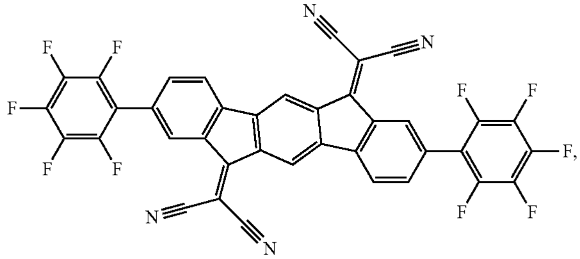

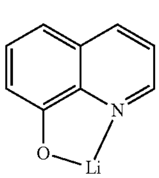,

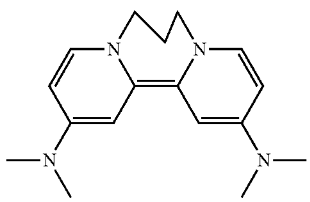

and

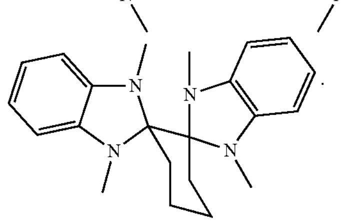.

b) HIL/HTL:

A hole injecting/transporting material to be used in the present disclosure is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

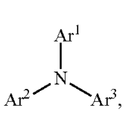

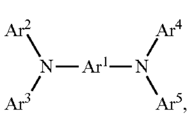

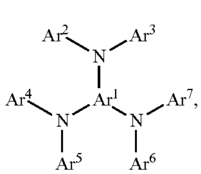

-continued

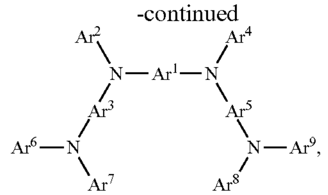

and

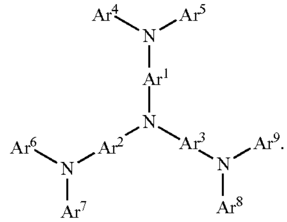

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

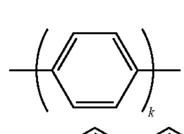,

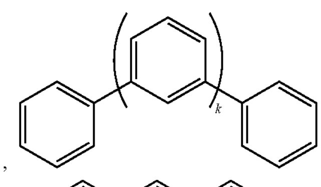,

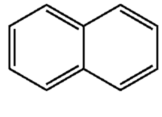,

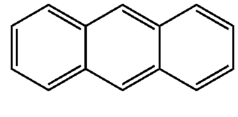,

-continued

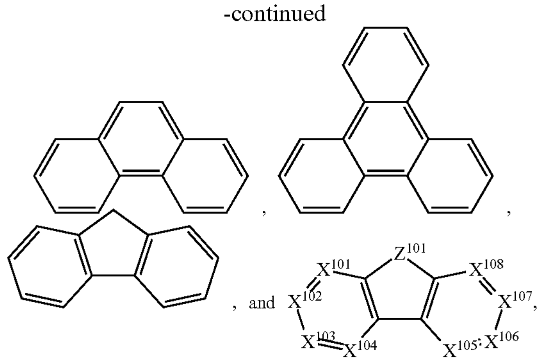

wherein k is an integer from 1 to 20; $X^{101}$ to $X^{108}$ is (including CH) or N; $Z^{101}$ is $NAr^1$, O, or S; $Ar^1$ has the same group defined above.

Examples of metal complexes used in HIL or HTL include, but are not limited to the following general formula:

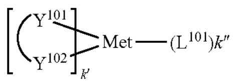

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

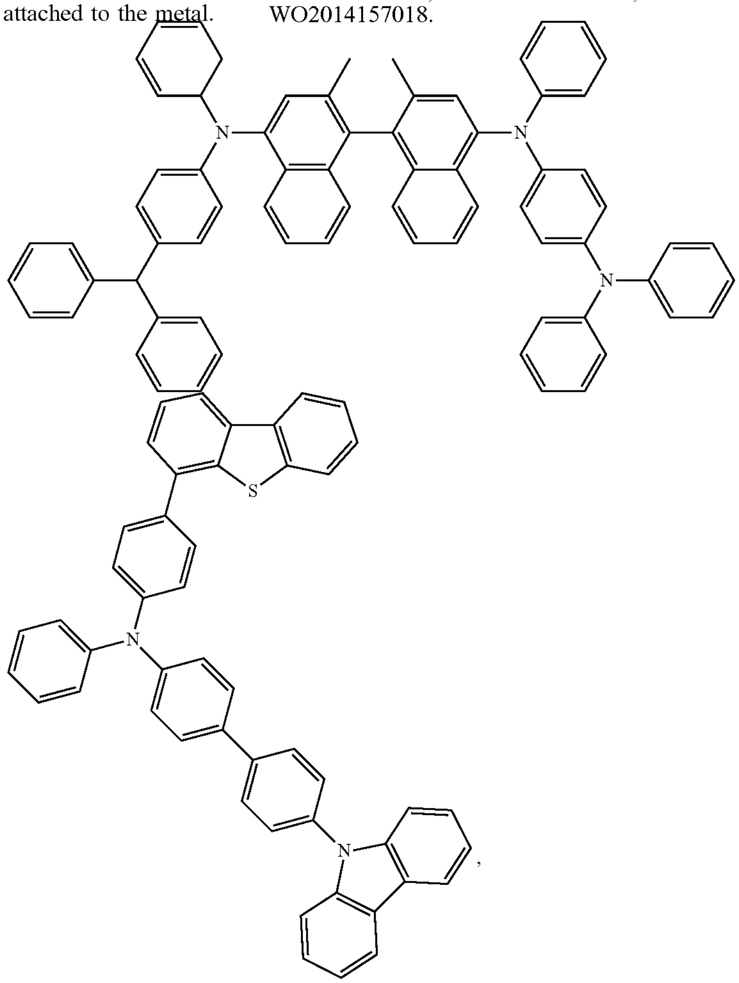

-continued
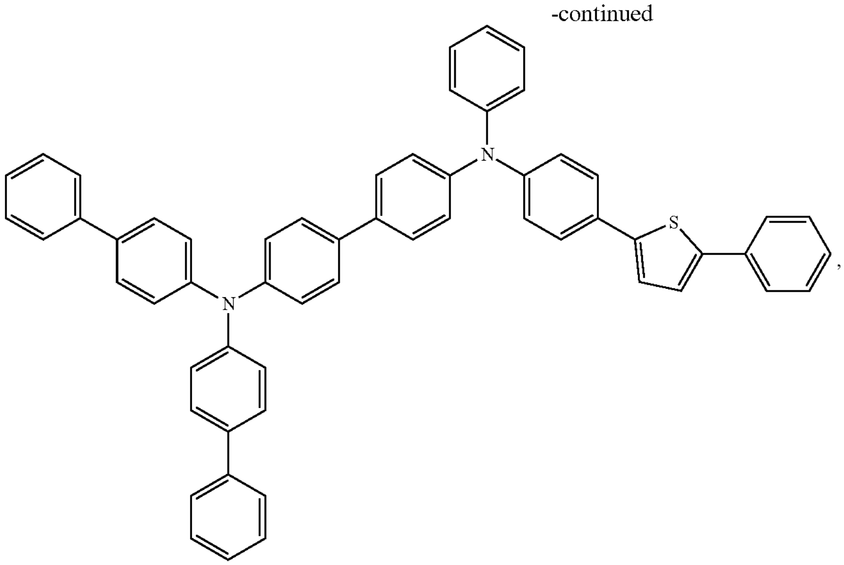
,
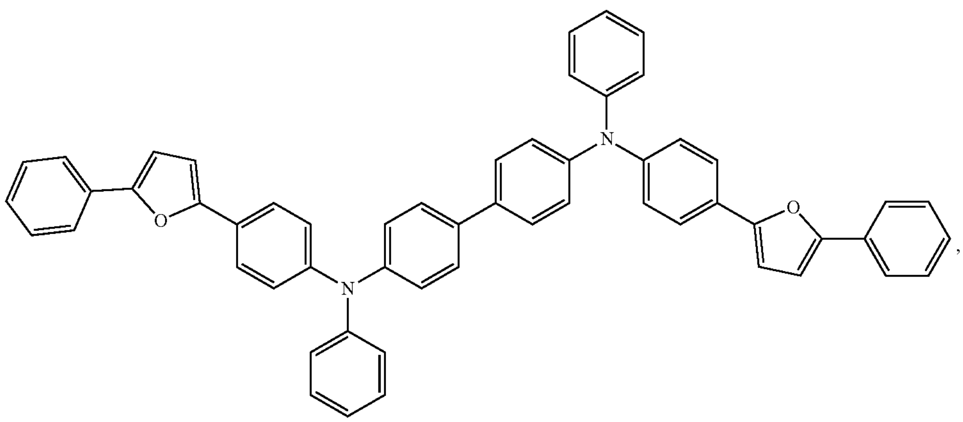
,
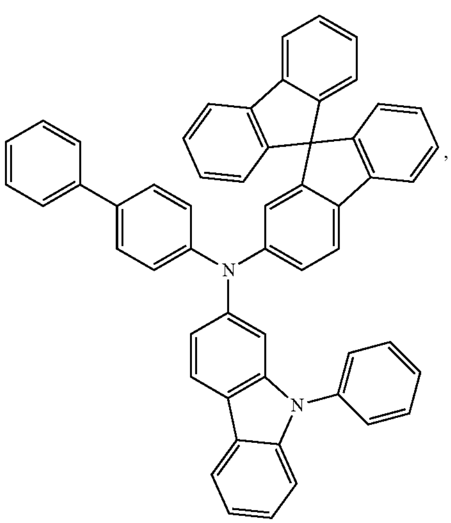
,
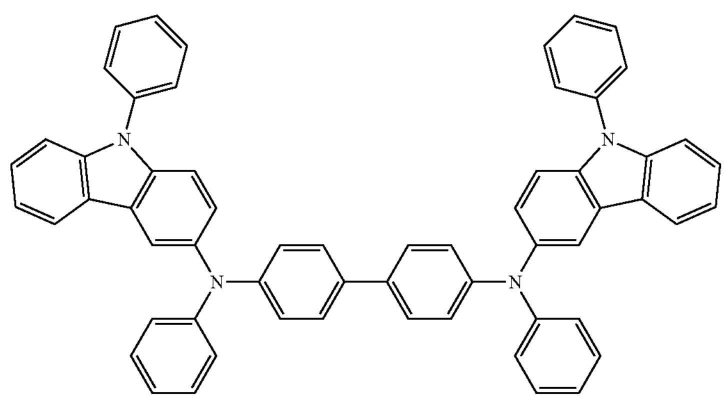
,

-continued
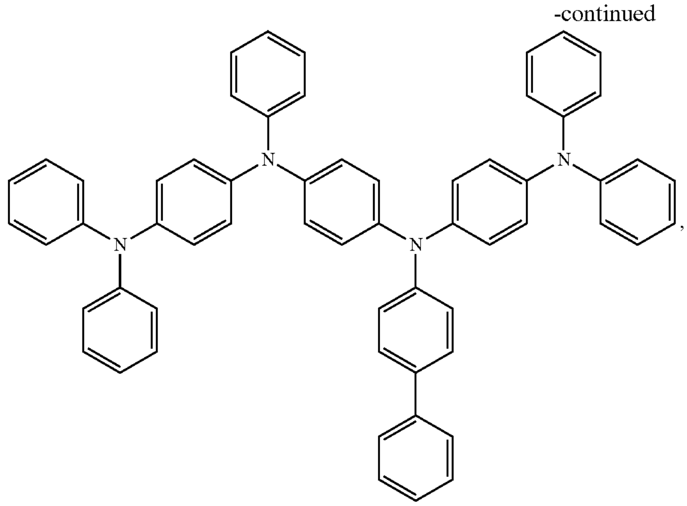
,
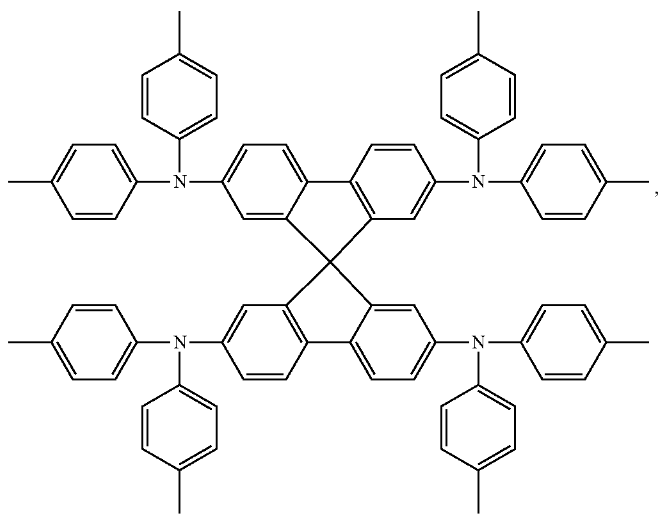
,
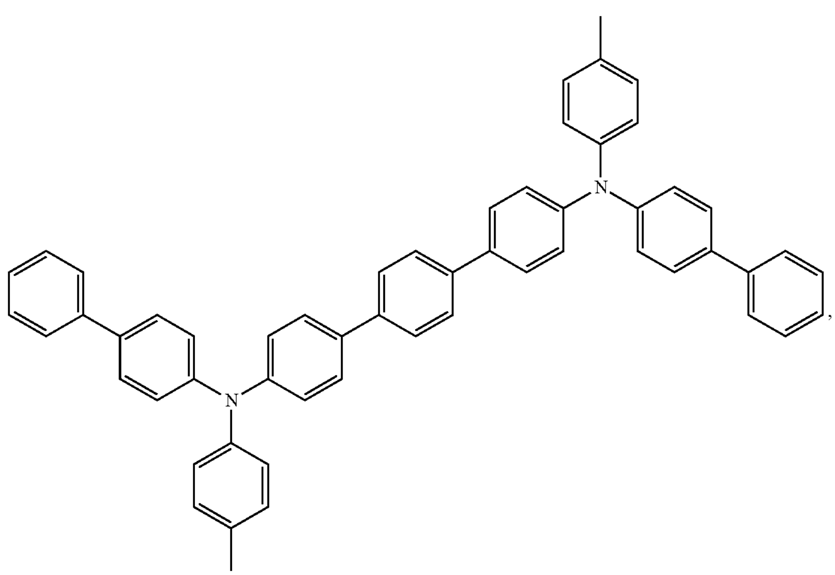
,

-continued
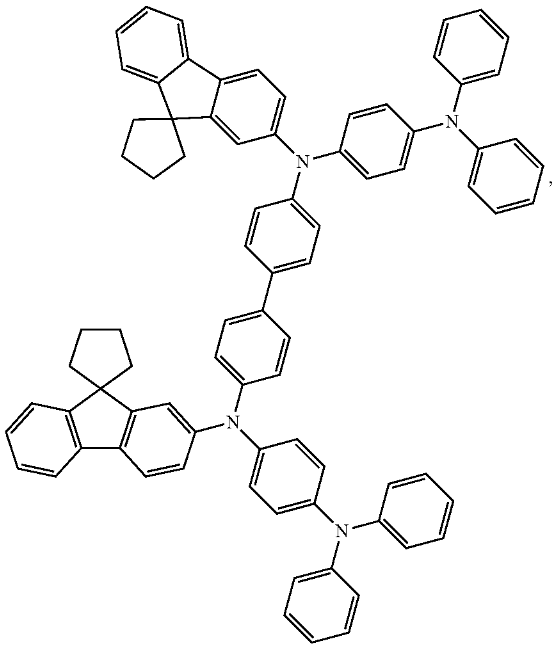
,
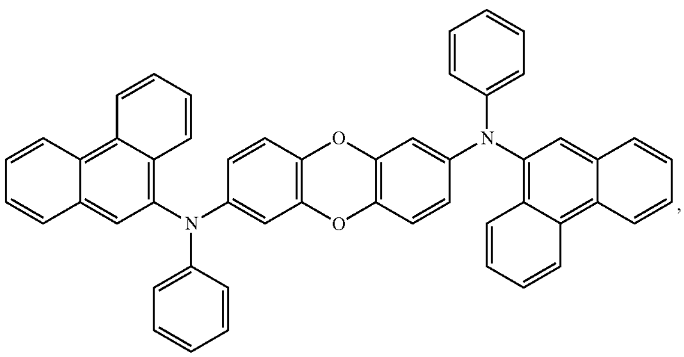
,
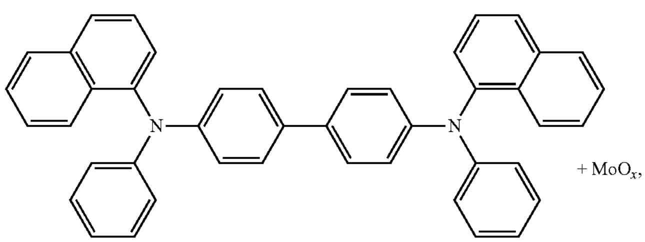
+ $MoO_x$,
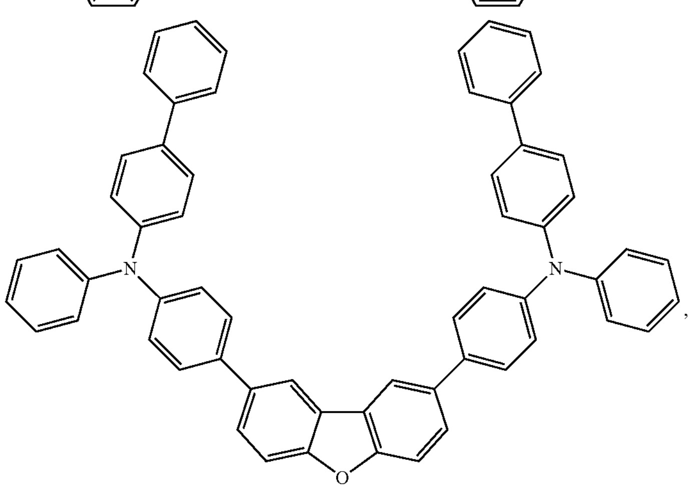
,
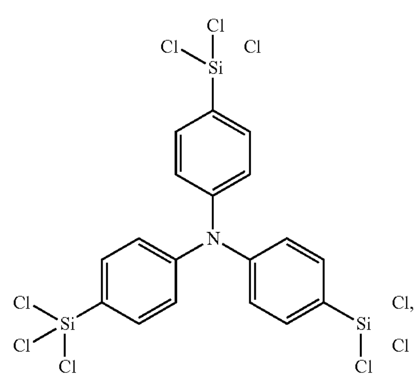

-continued
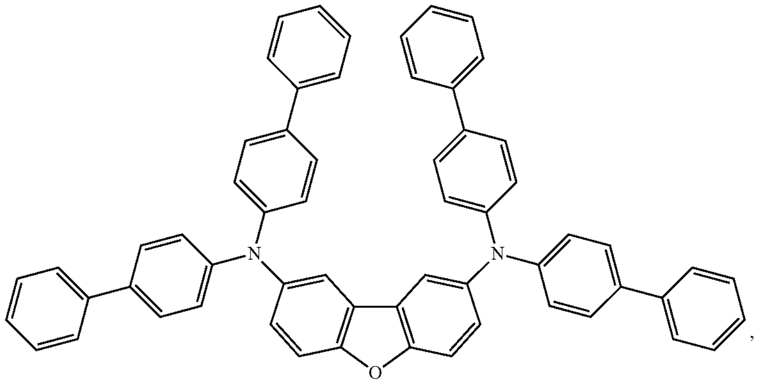
,
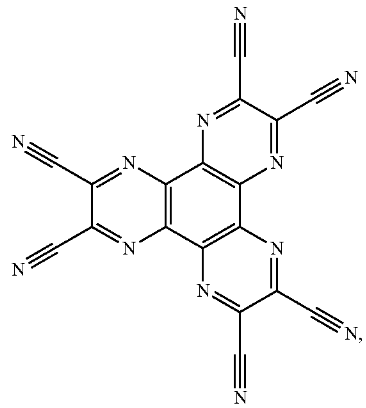
,
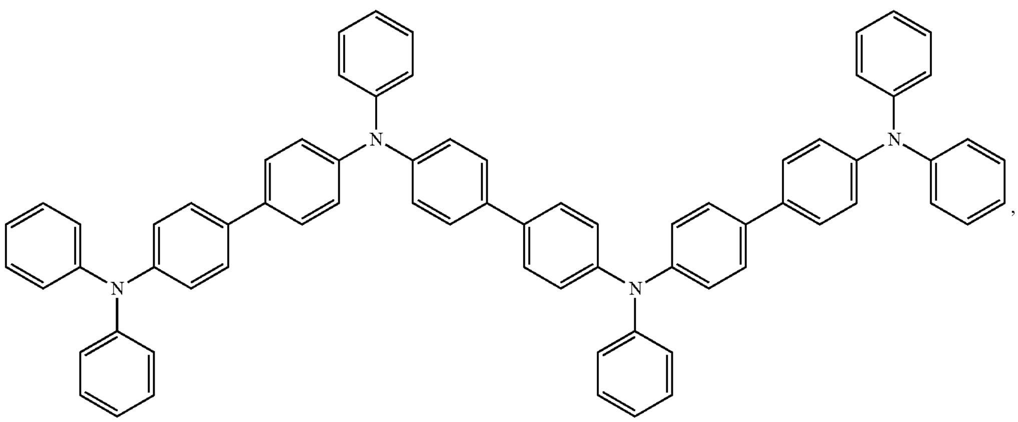
,
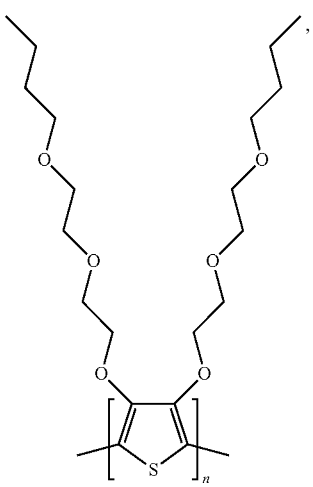
,
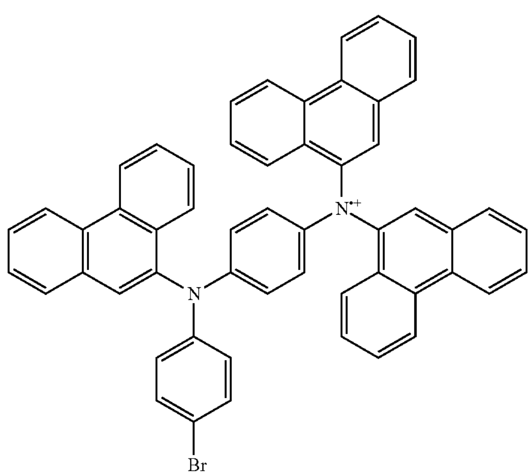

-continued
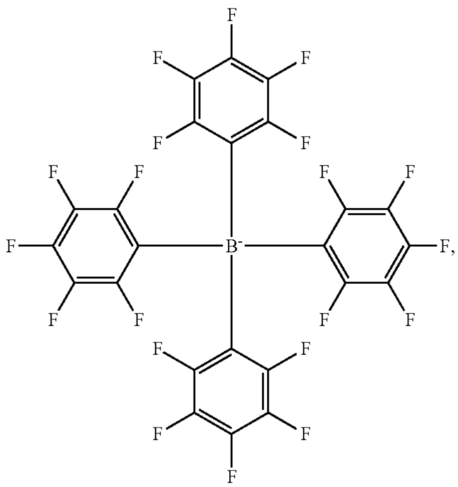
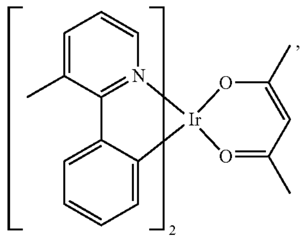
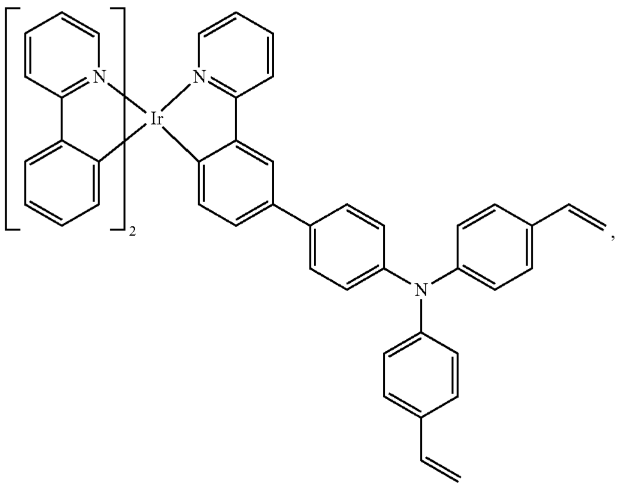
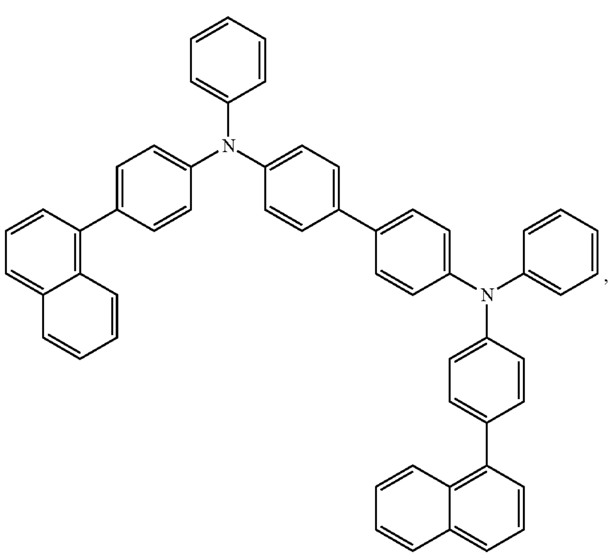

-continued
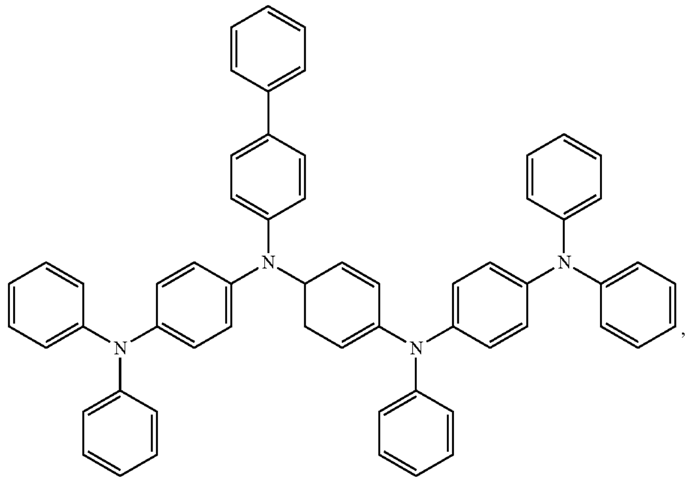
,
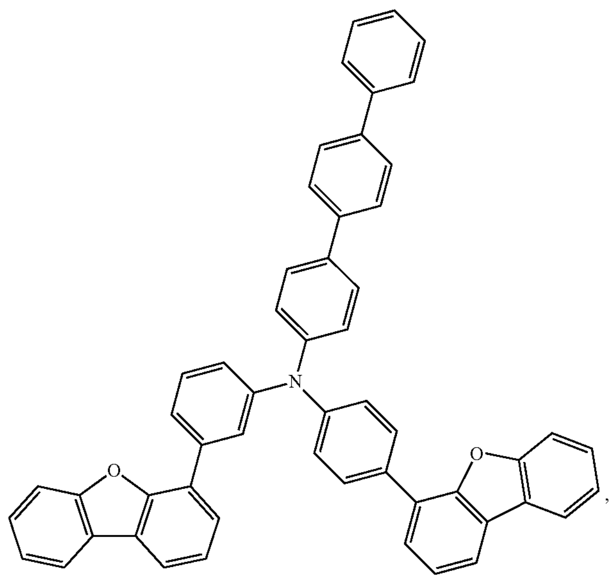
,
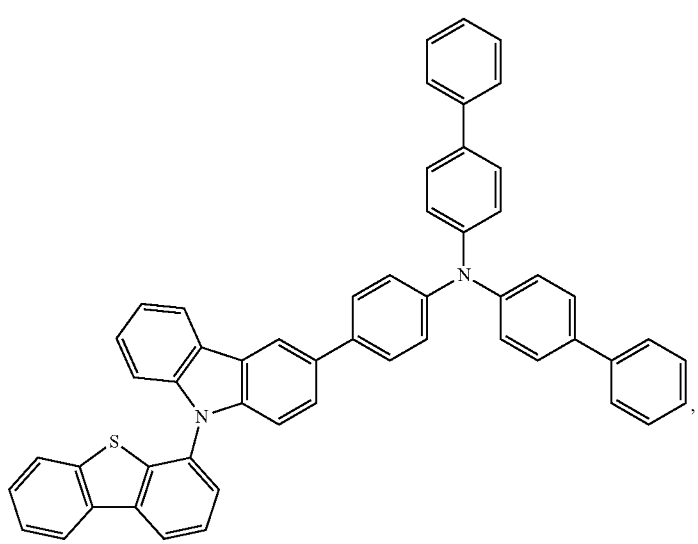
,

-continued
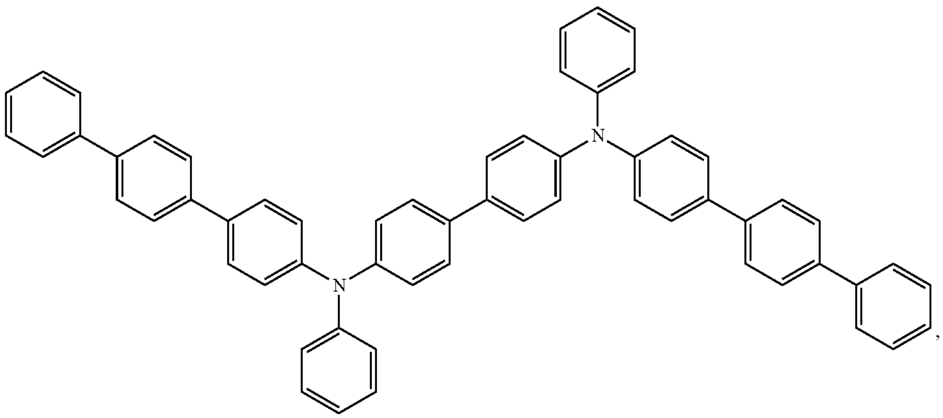
,
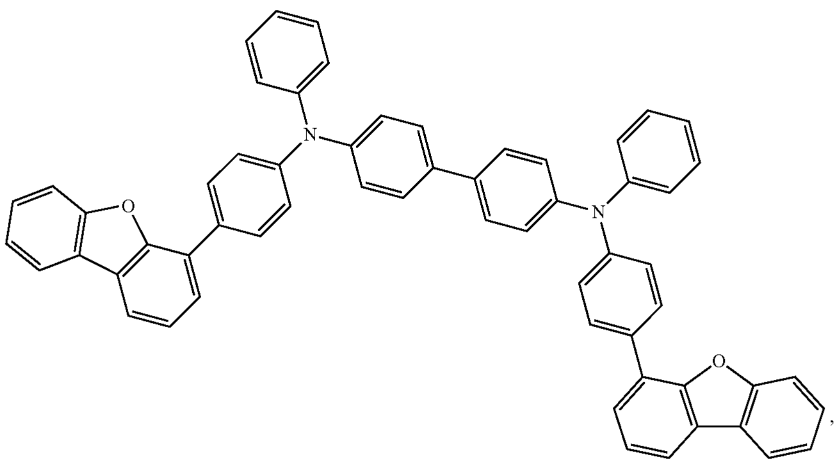
,
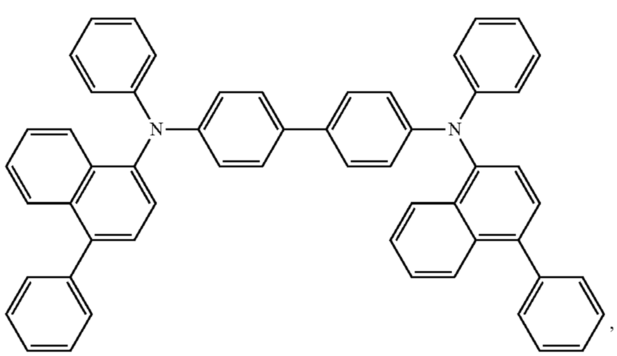
,

-continued
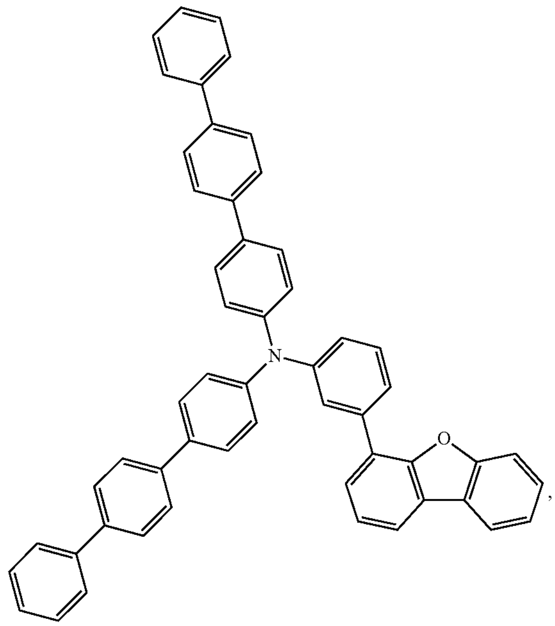
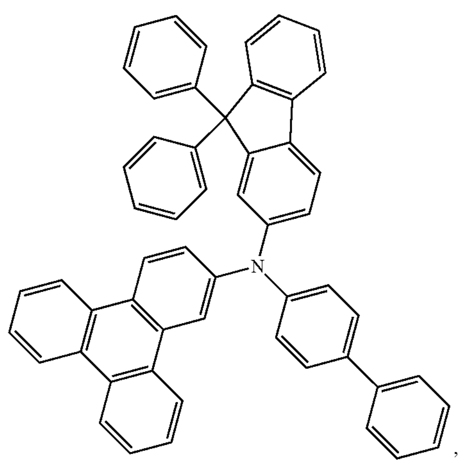
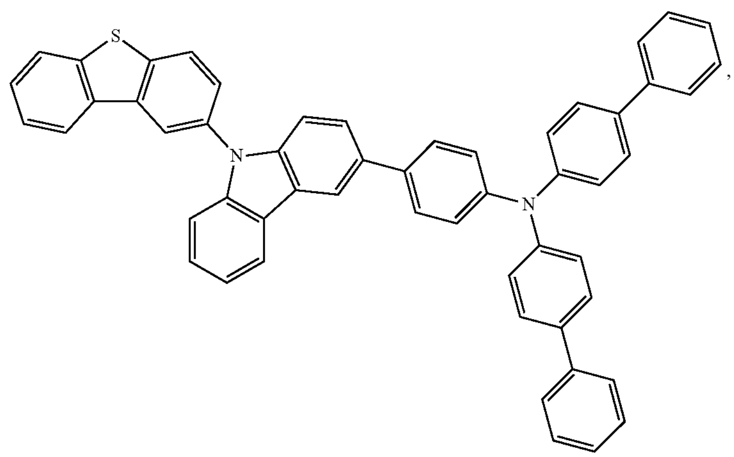
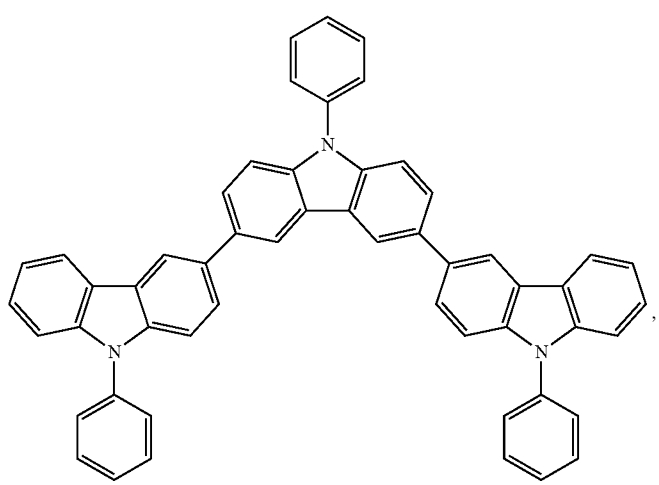
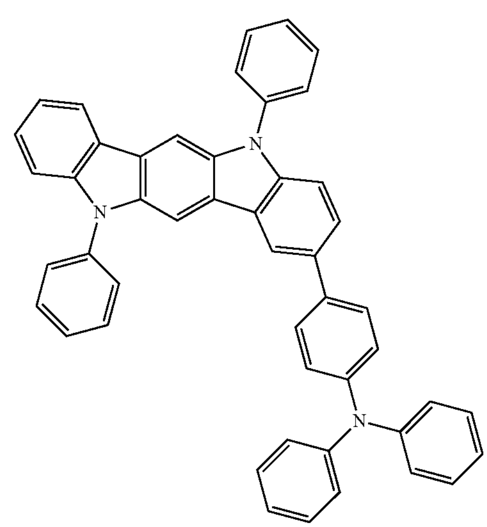

-continued
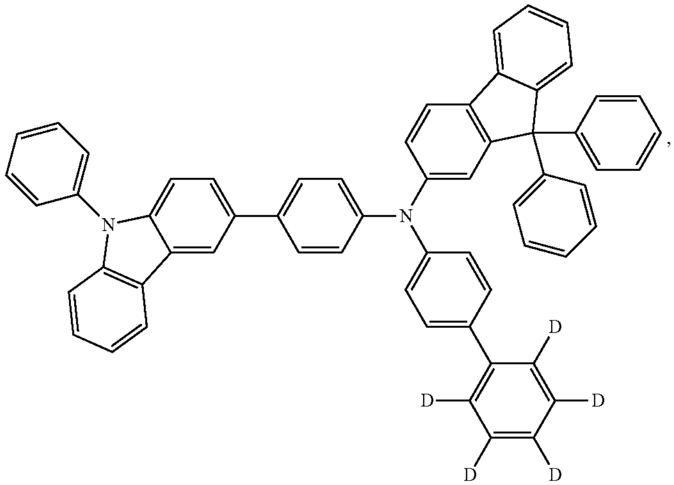
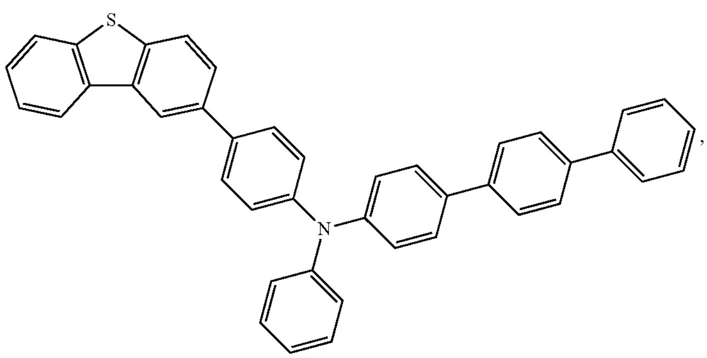
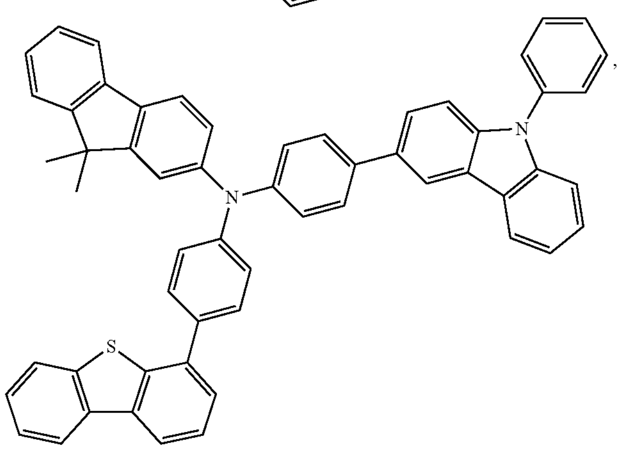
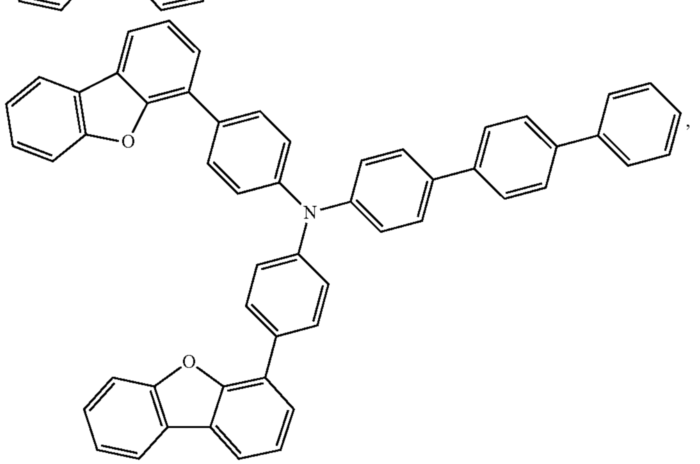

-continued
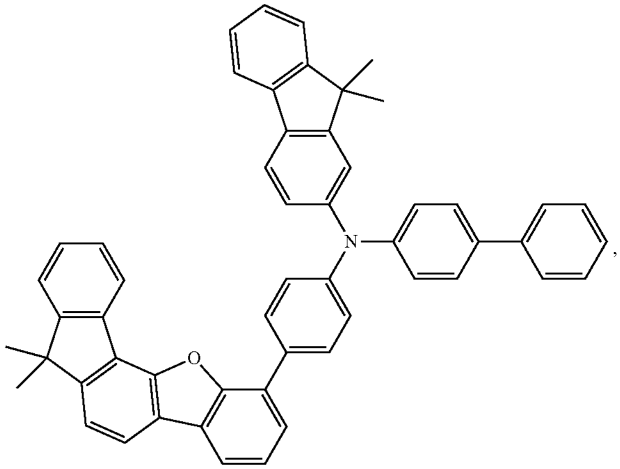,
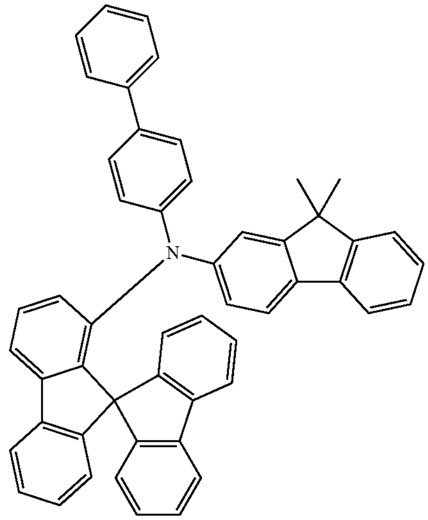,
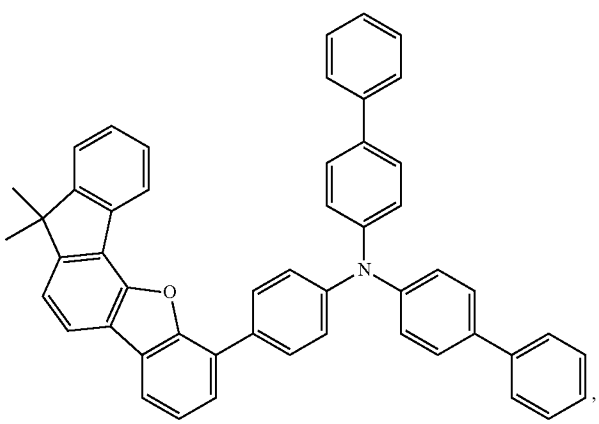,
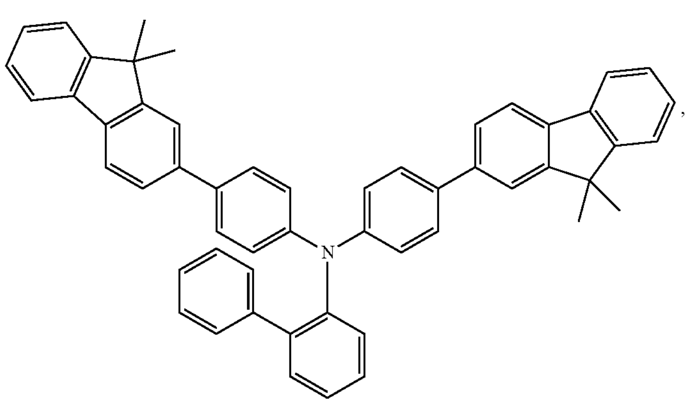,
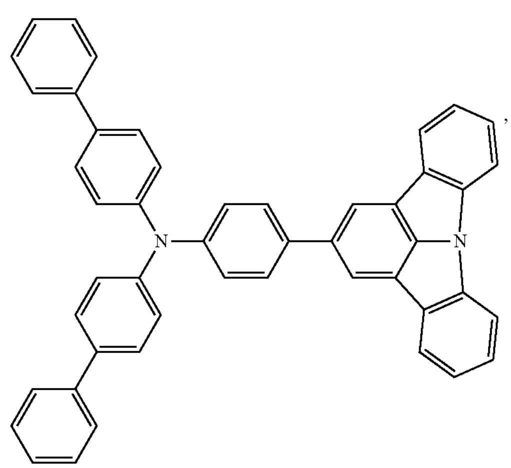,

-continued
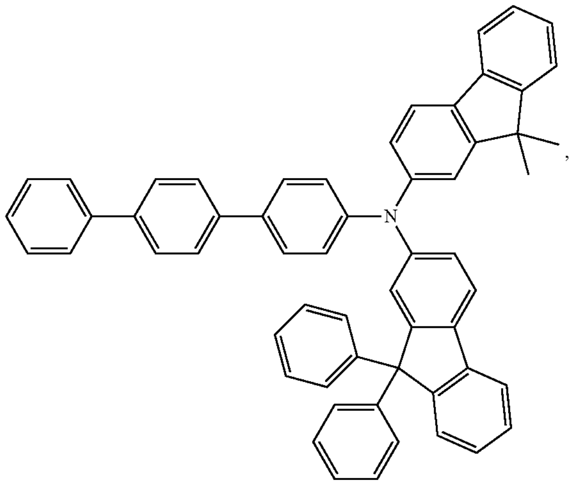
,
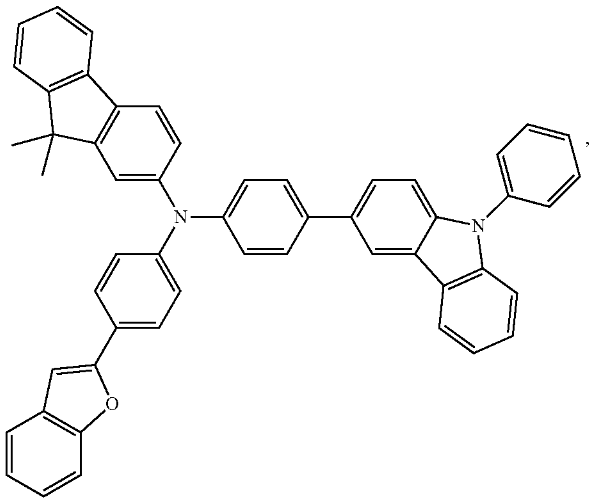
,
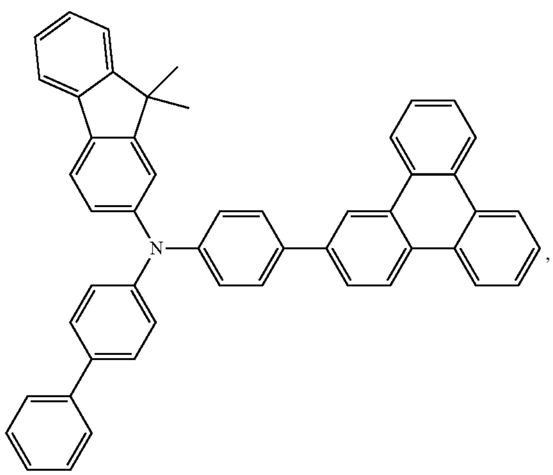
,
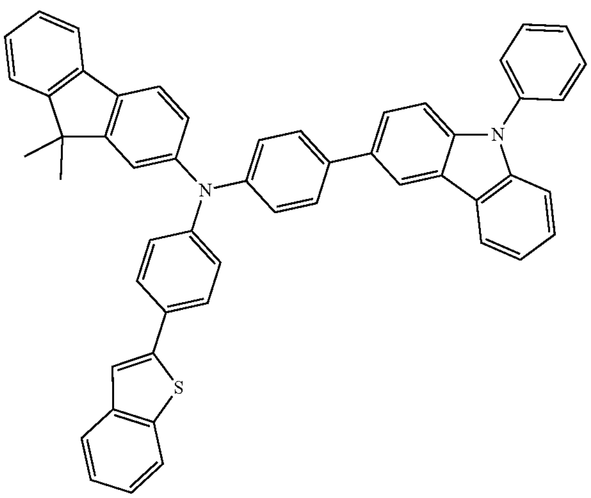
,
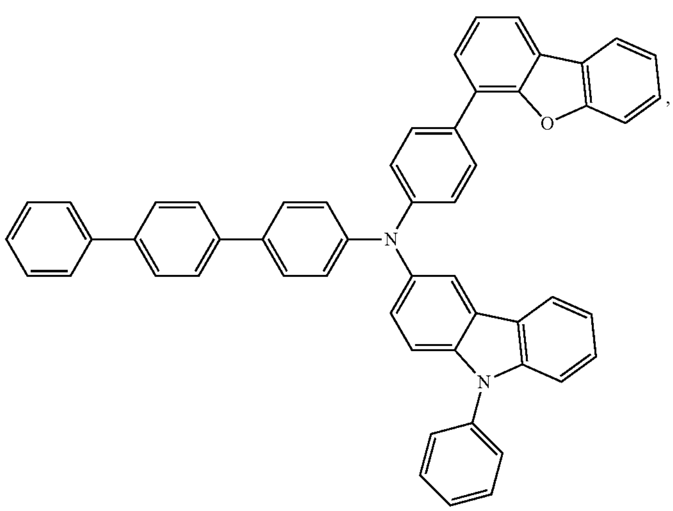
, -continued
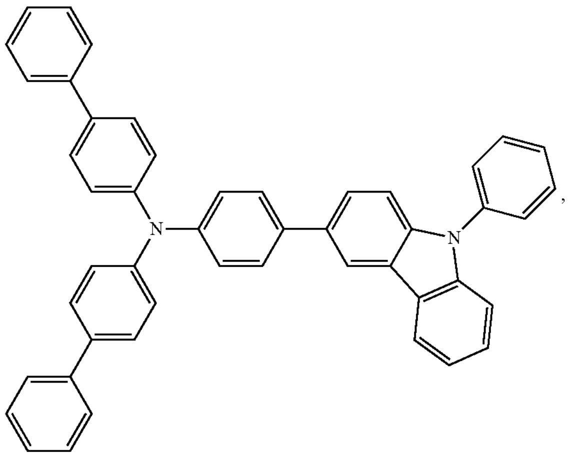
,
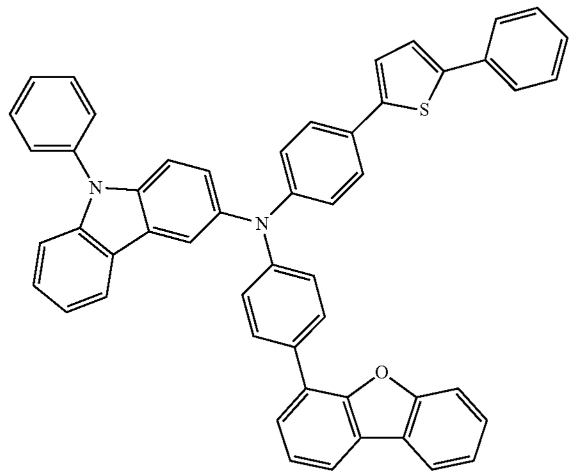
,
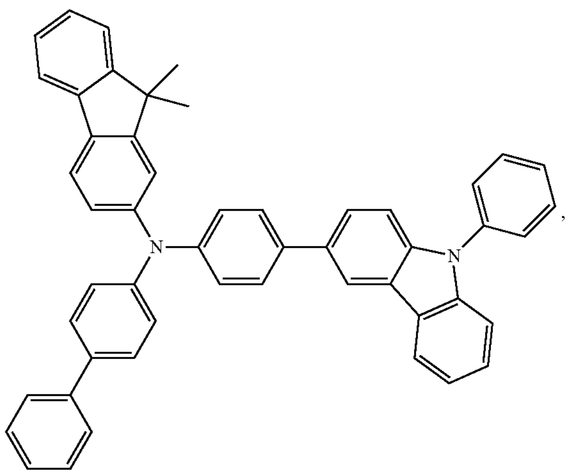
,
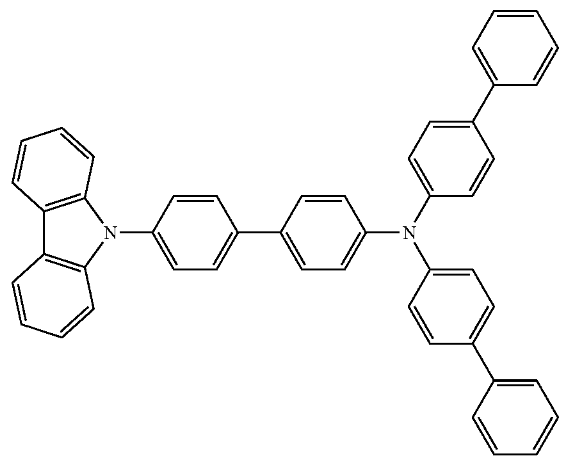
,
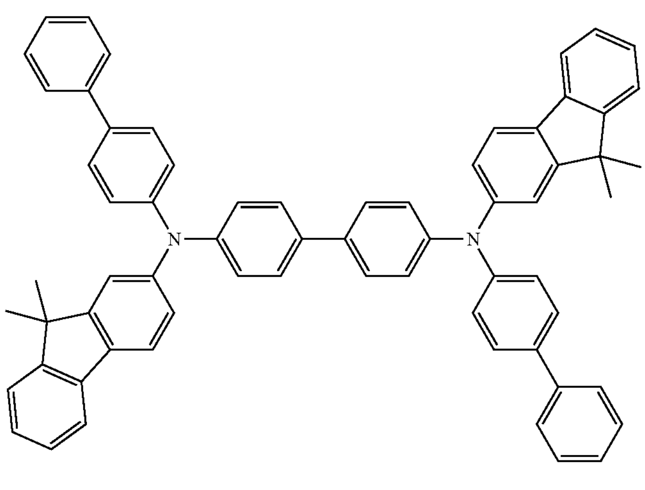
, -continued
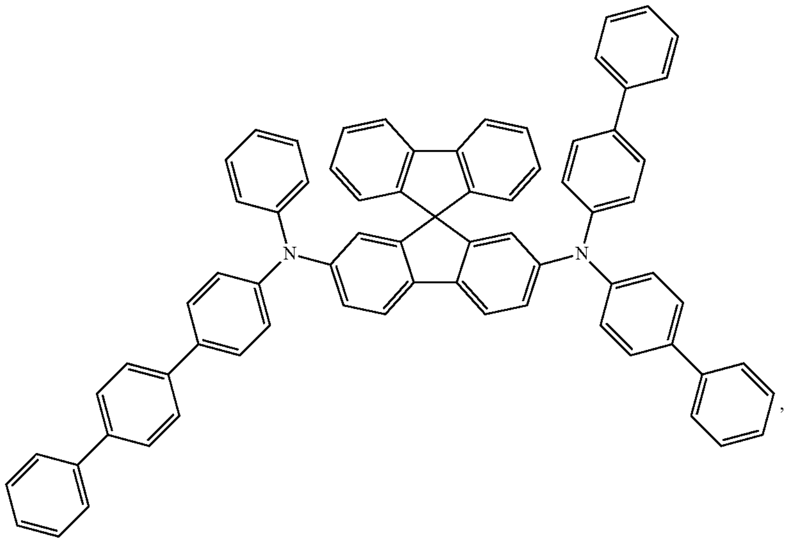
,
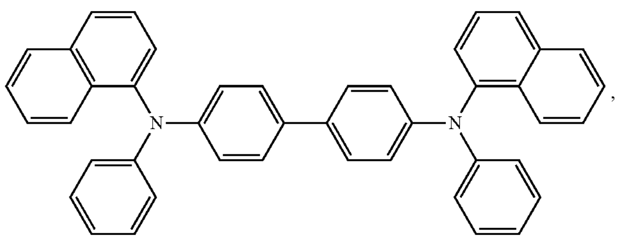
,
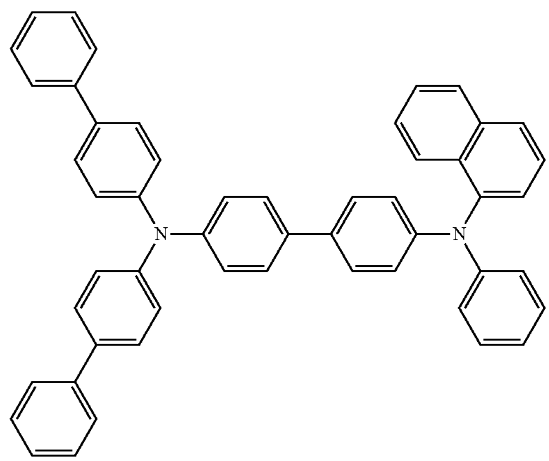
,
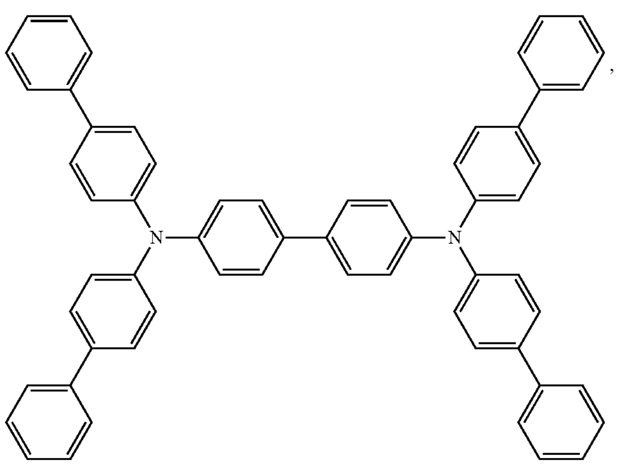
, -continued
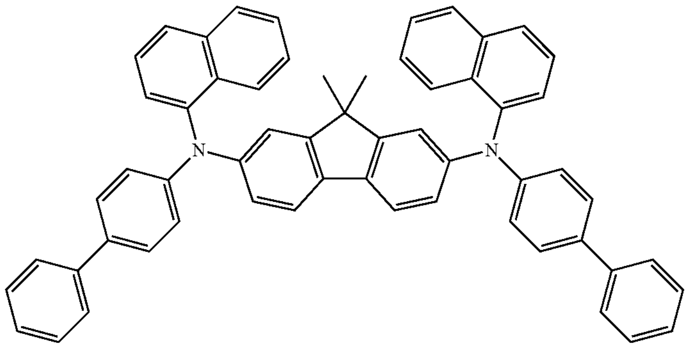
,
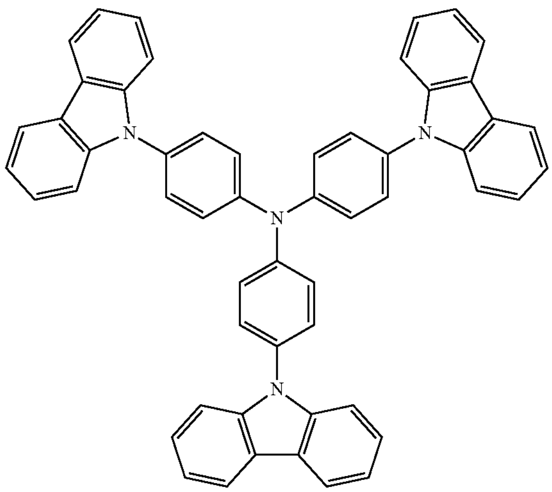
,
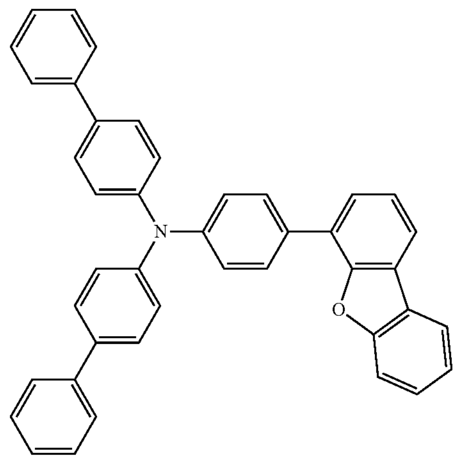
,
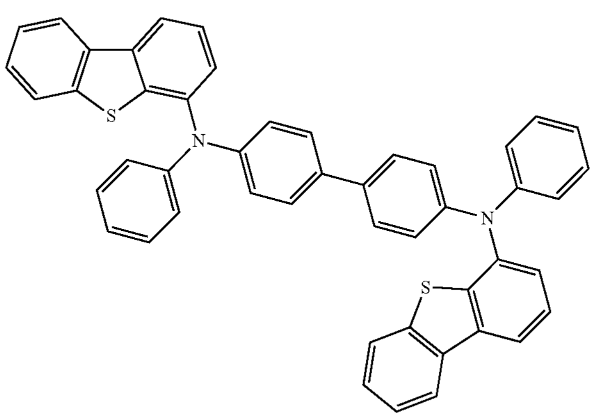
,
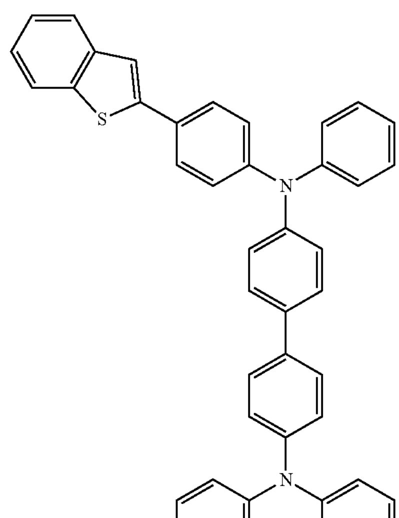
,
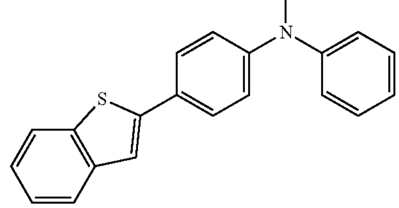
, and -continued

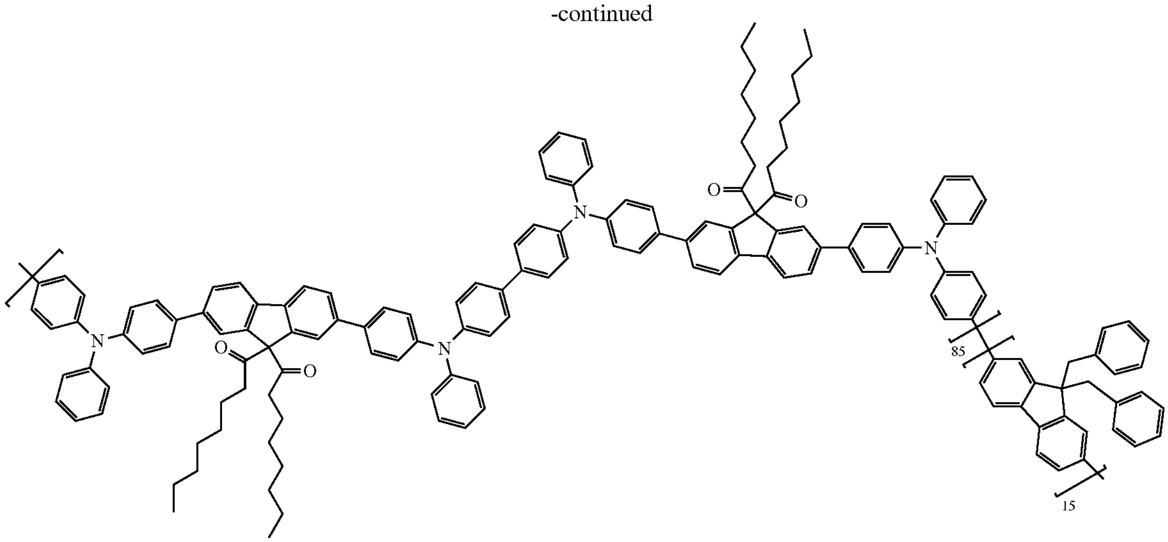

c) EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

d) Hosts:

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

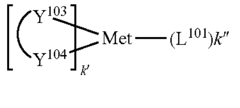

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

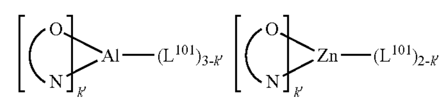

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

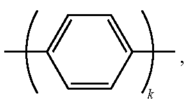
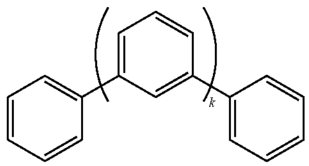
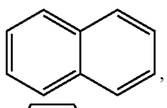
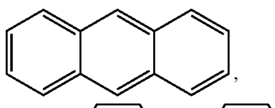
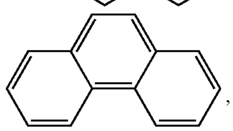
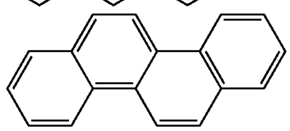
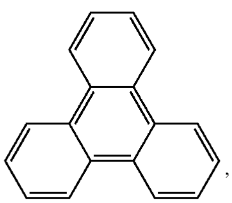
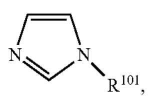
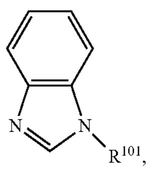
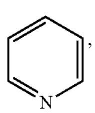
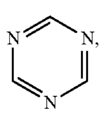
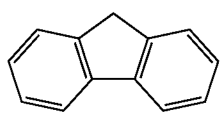
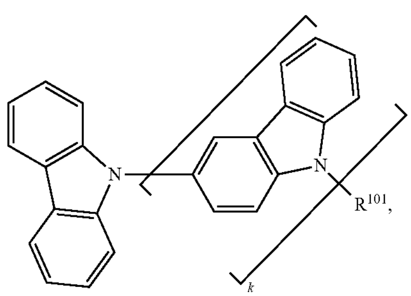
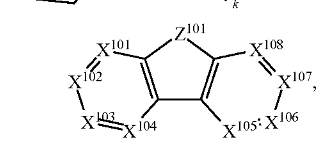
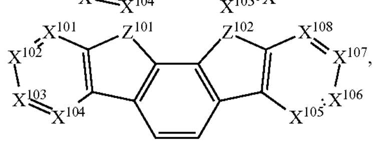
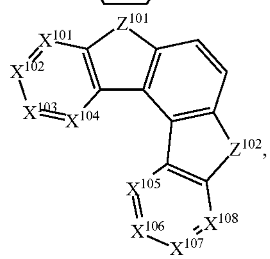

-continued

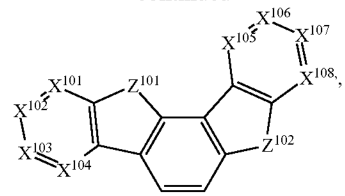
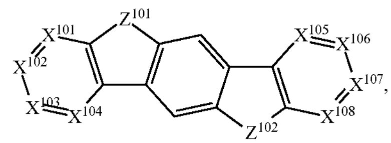

and

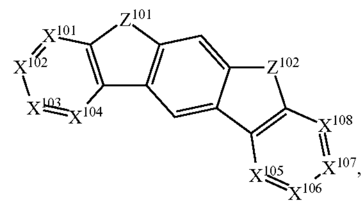

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

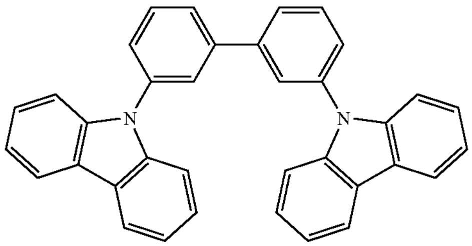
,
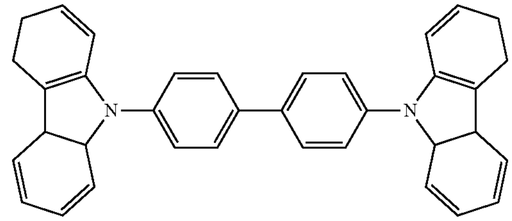
,
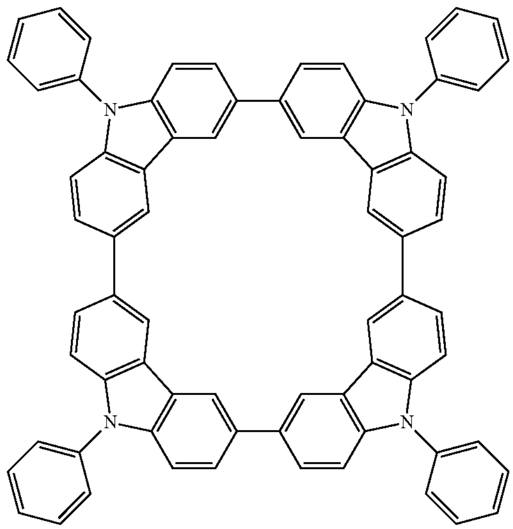
,
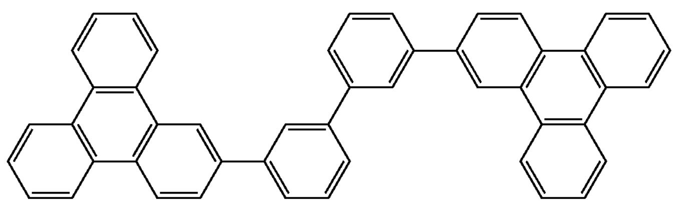
,
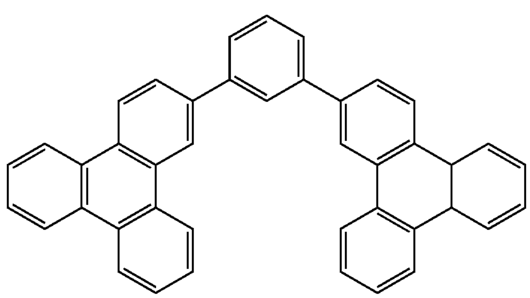
,
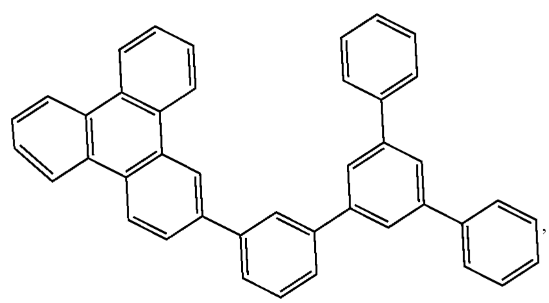
,
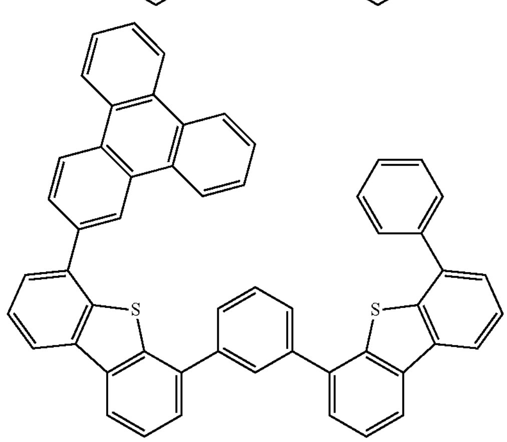
,
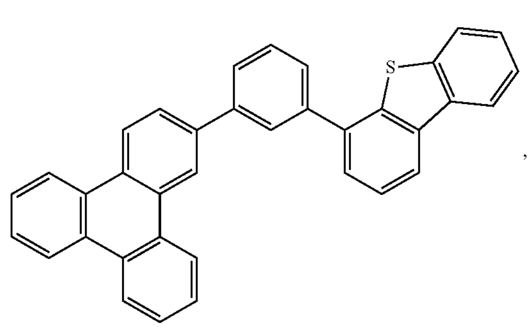
, -continued
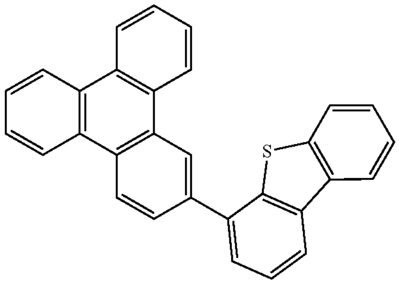
,
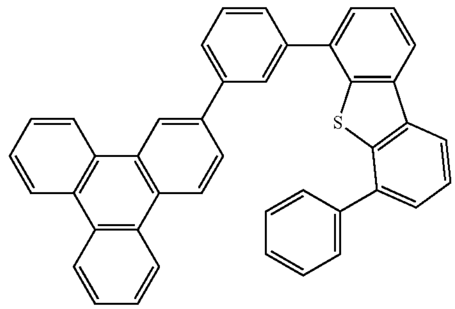
,
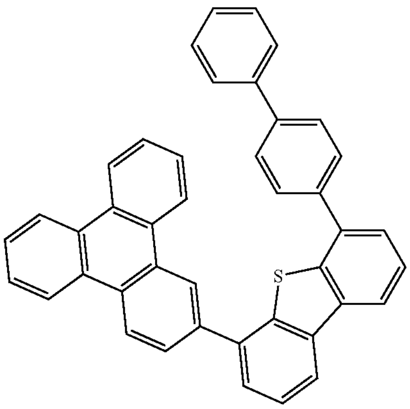
,
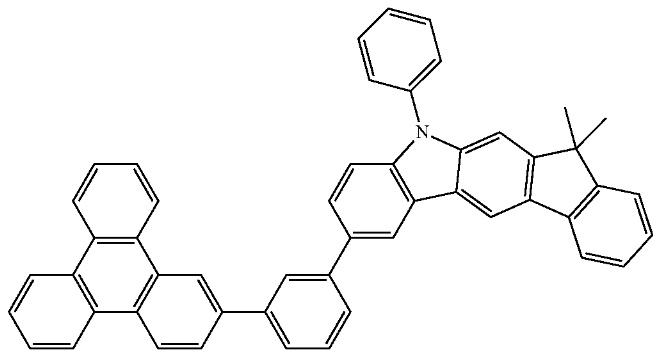
,
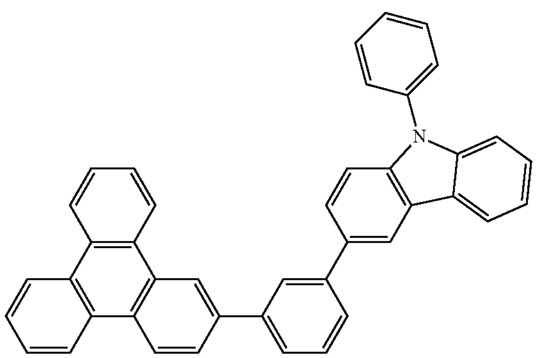
,
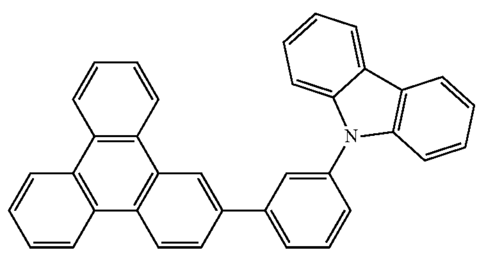
,
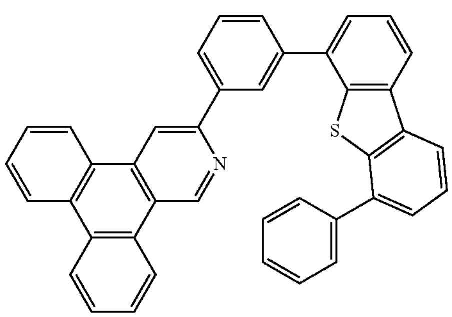
,
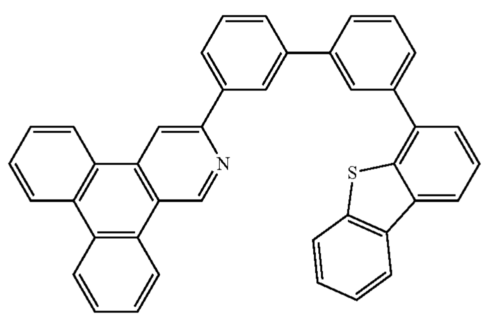
,
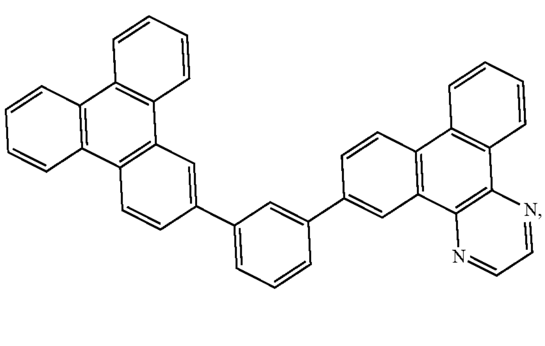
,
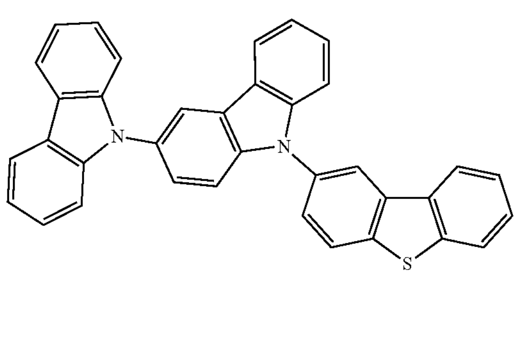
, -continued
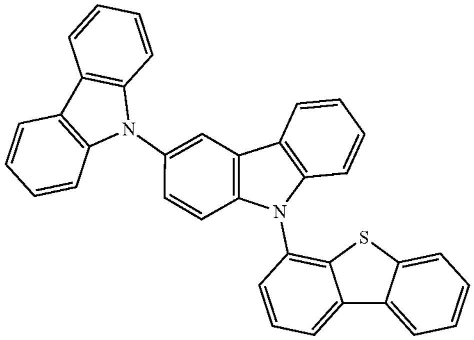
,
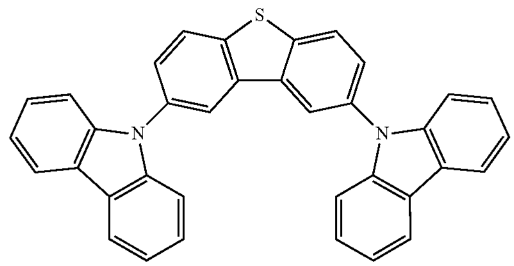
,
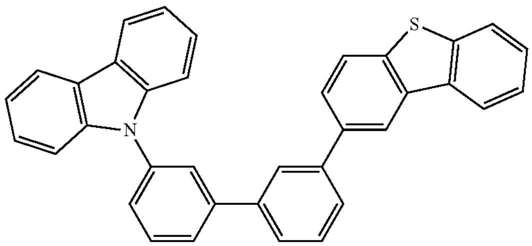
,
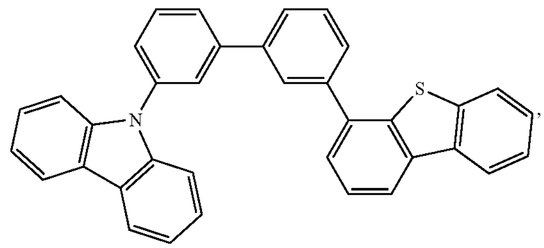
,
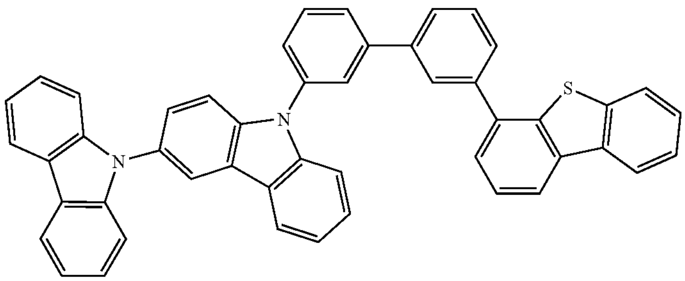
,
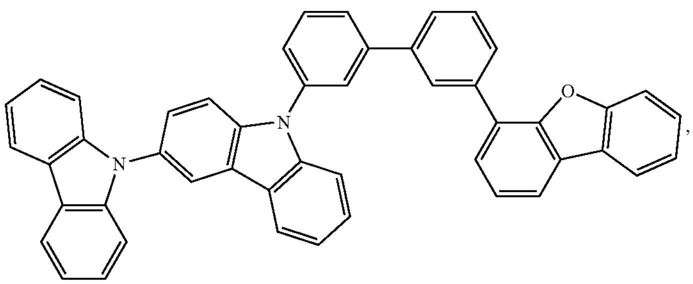
,
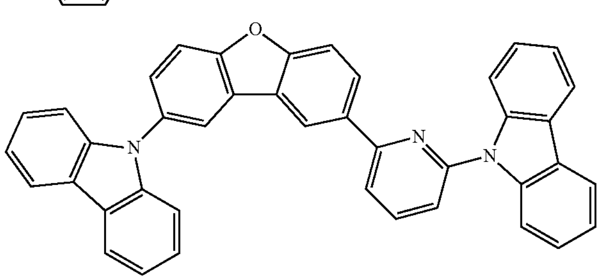
,
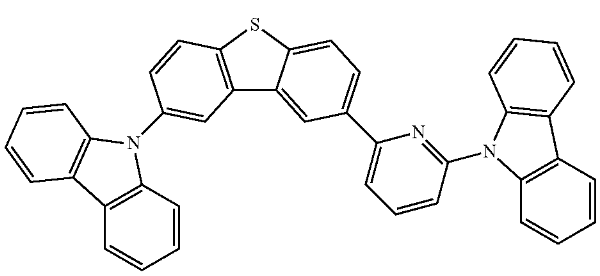
, -continued
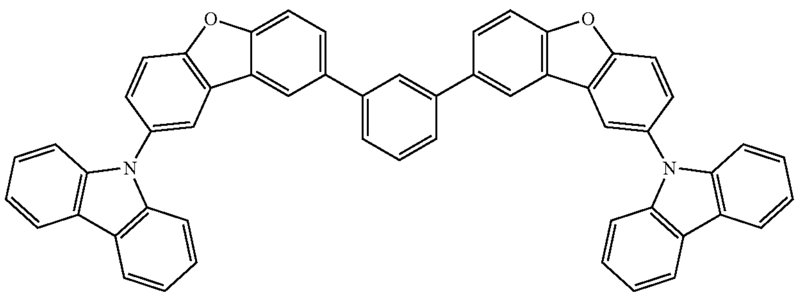
,
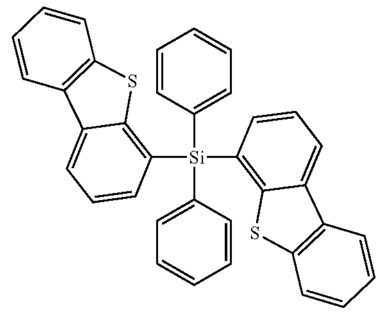
,
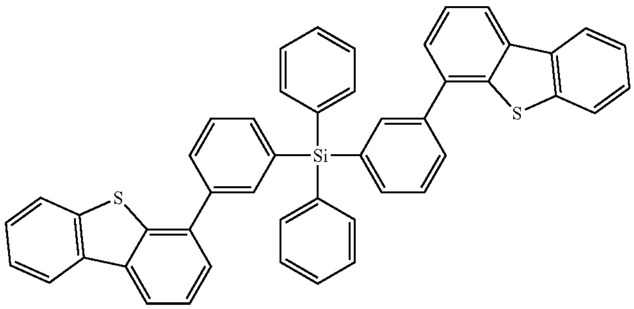
,
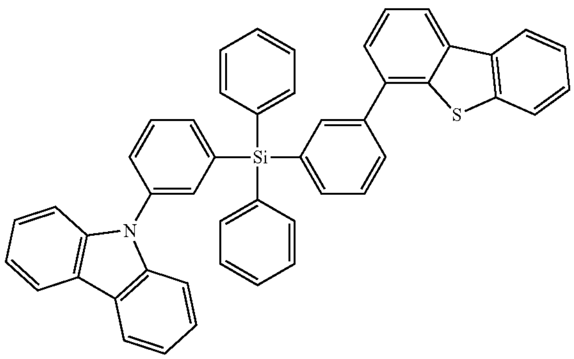
,
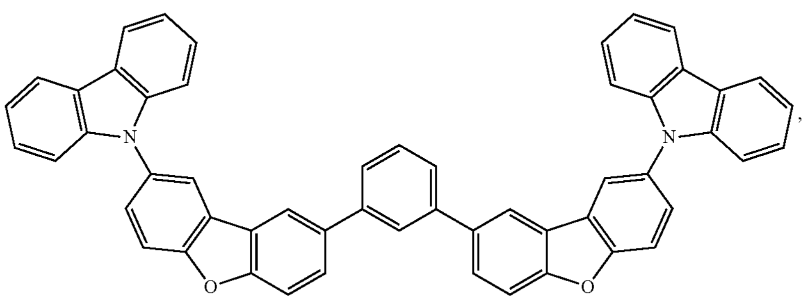
,
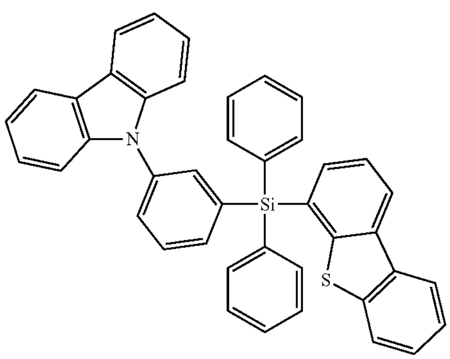
,
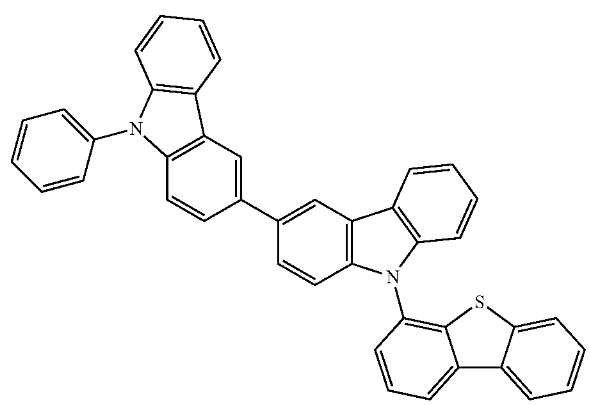
, -continued
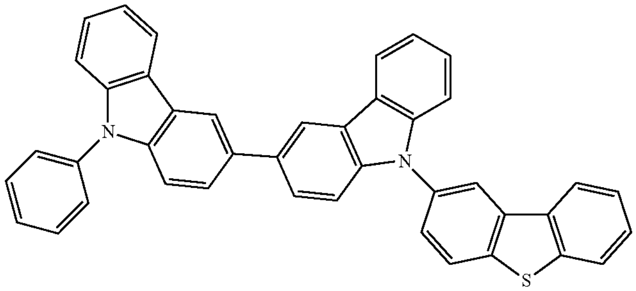
,
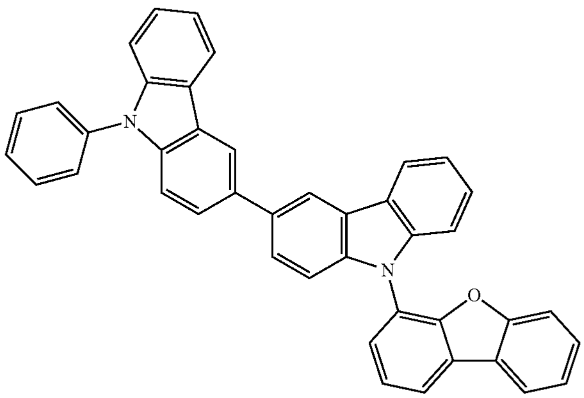
,
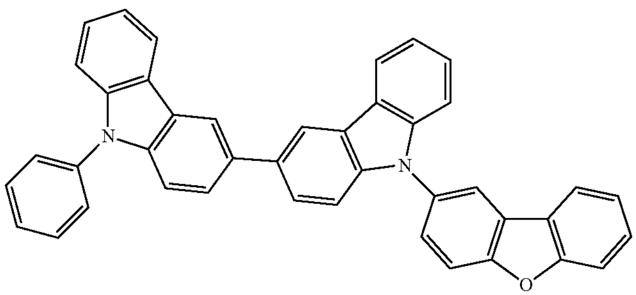
,
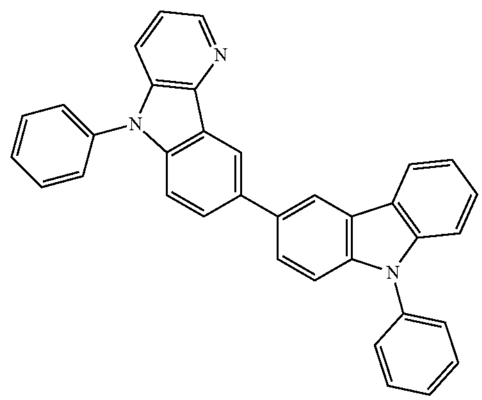
,
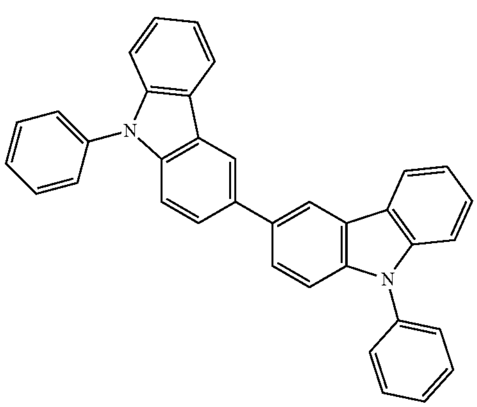
,
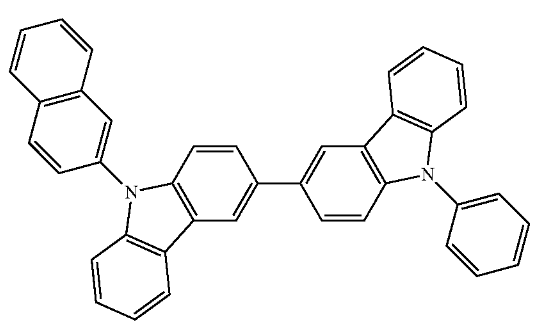
, -continued
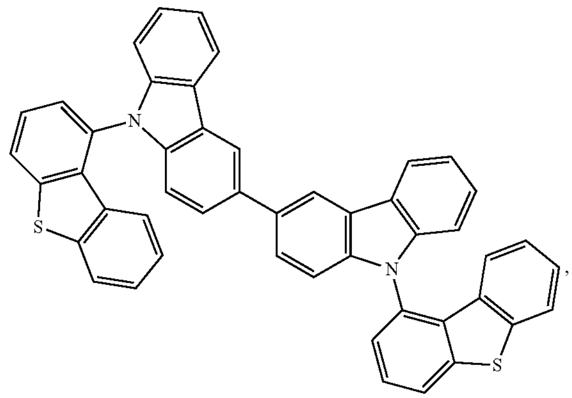
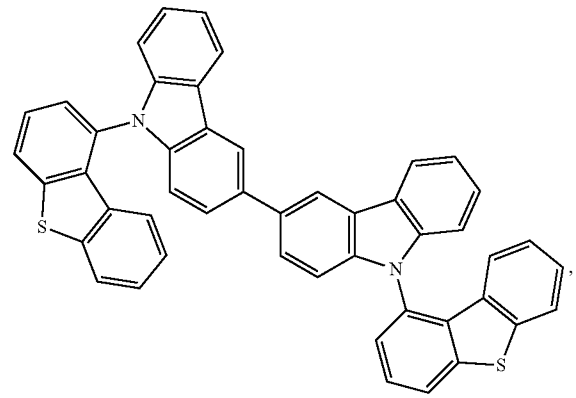
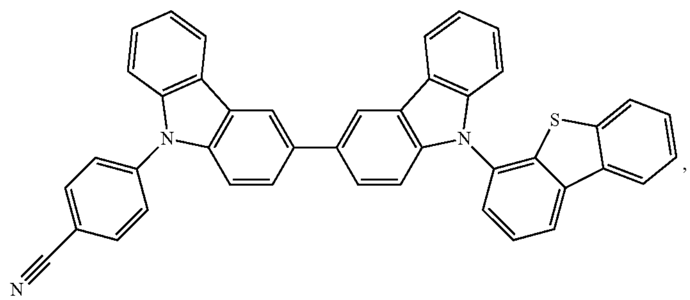
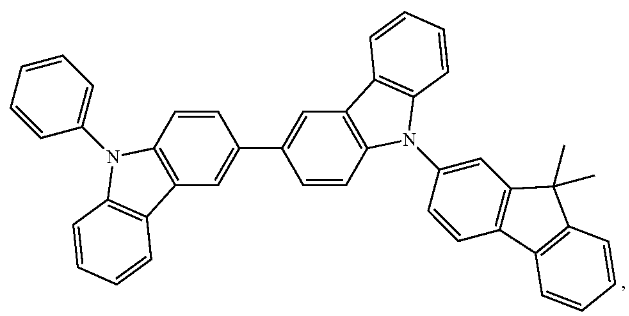
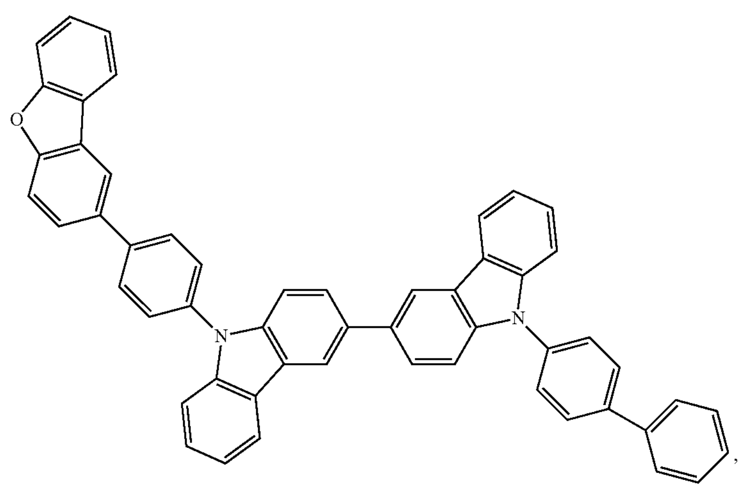

-continued
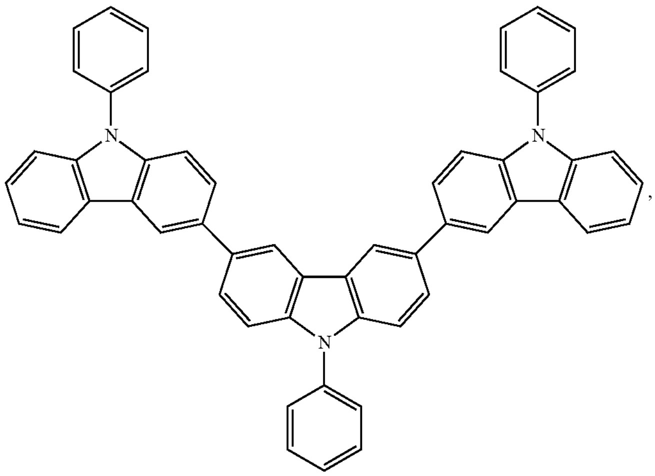
,
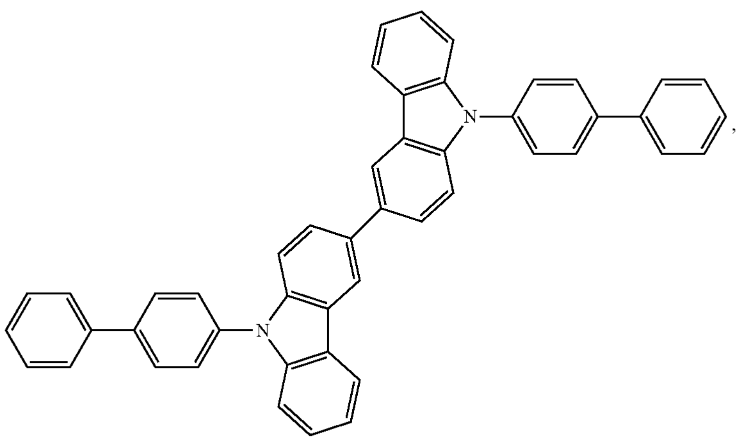
,
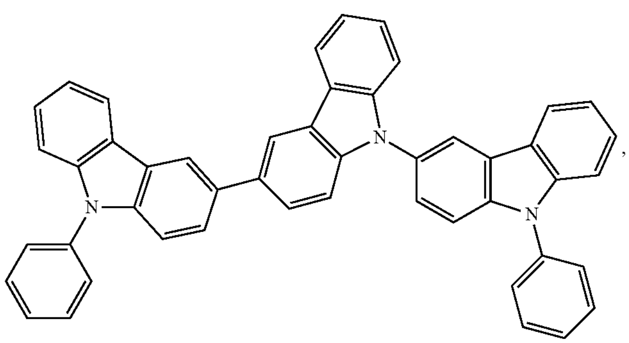
,
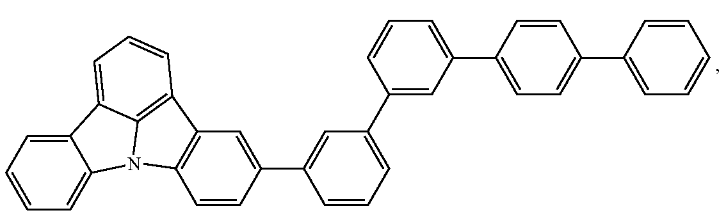
,

-continued
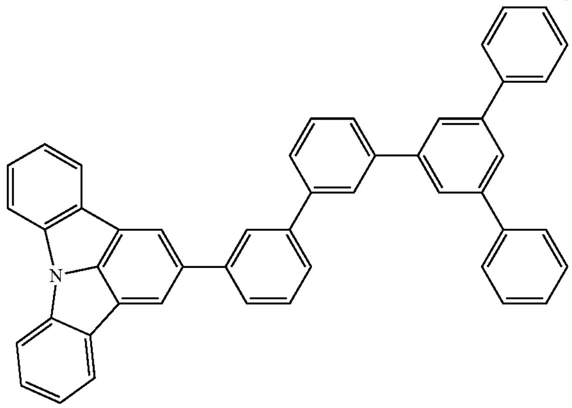
,
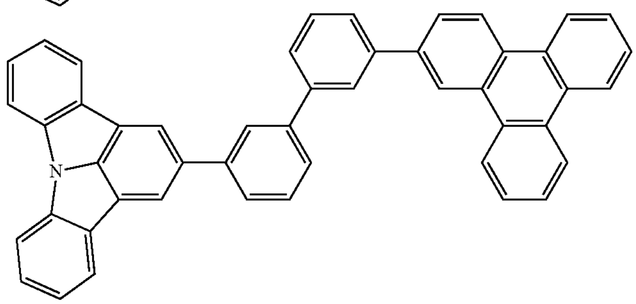
,
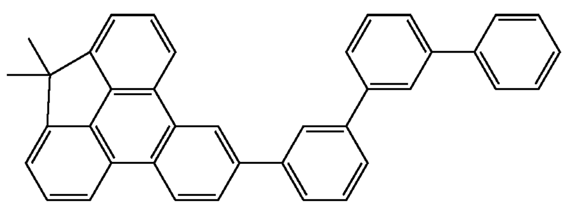
,
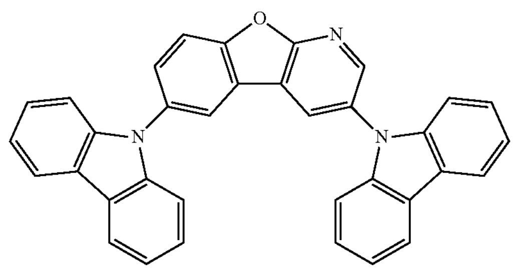
,
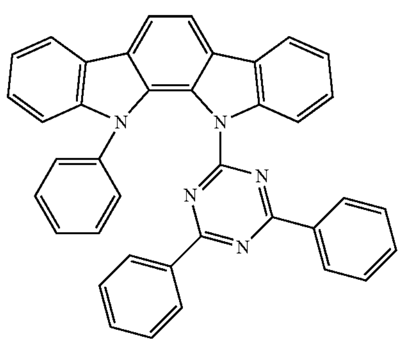
,
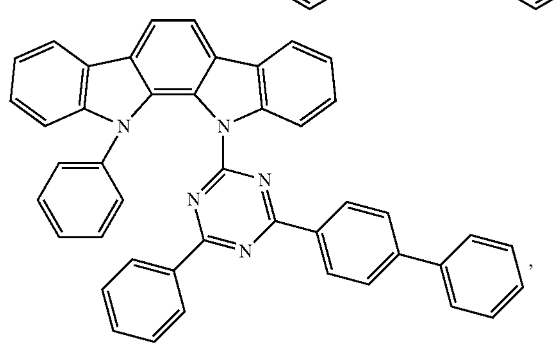
,
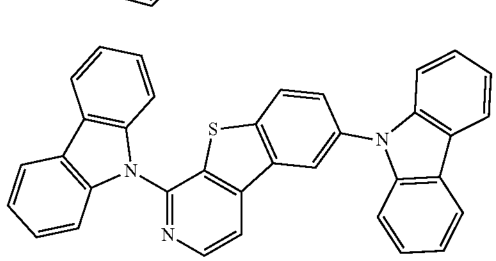
,
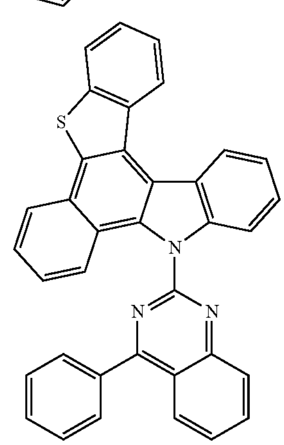
,
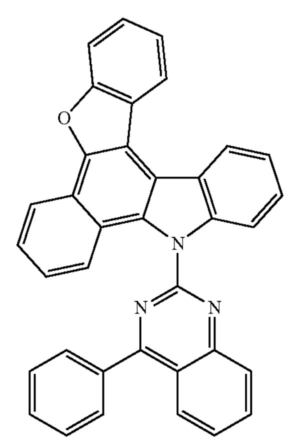
, -continued
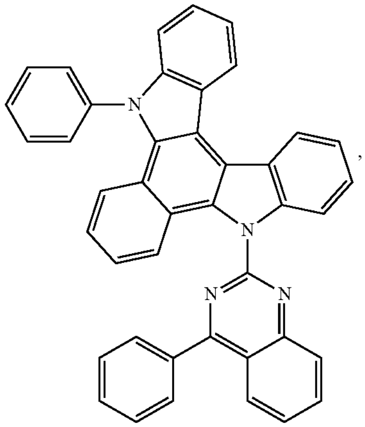,
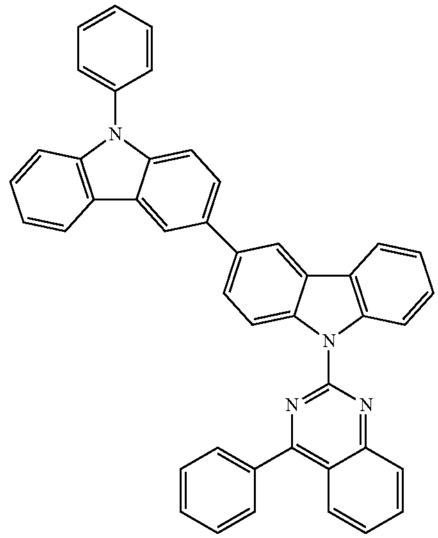,
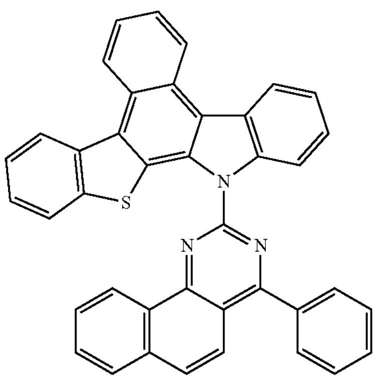,
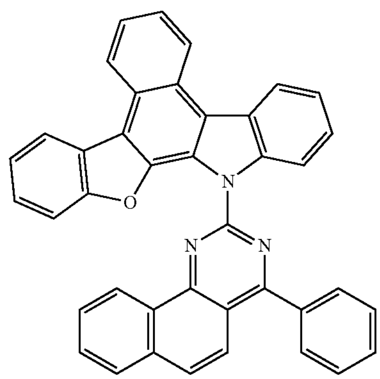,
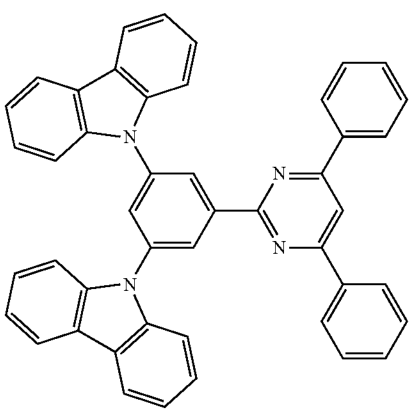,
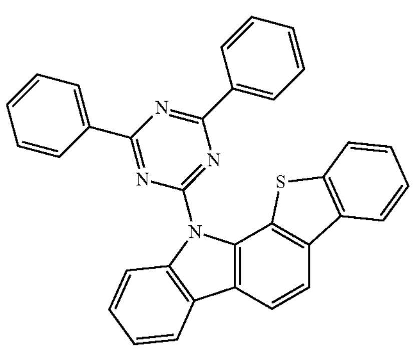, -continued
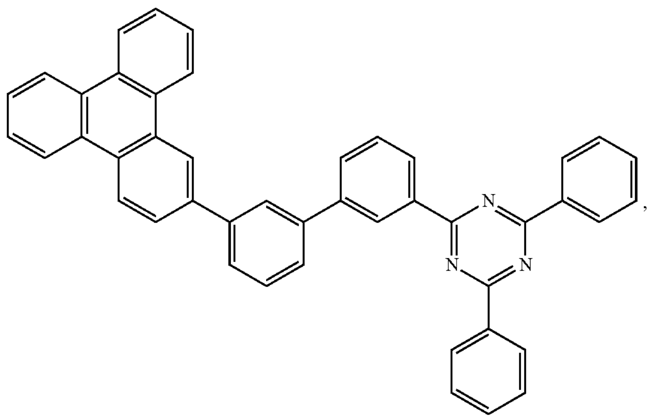
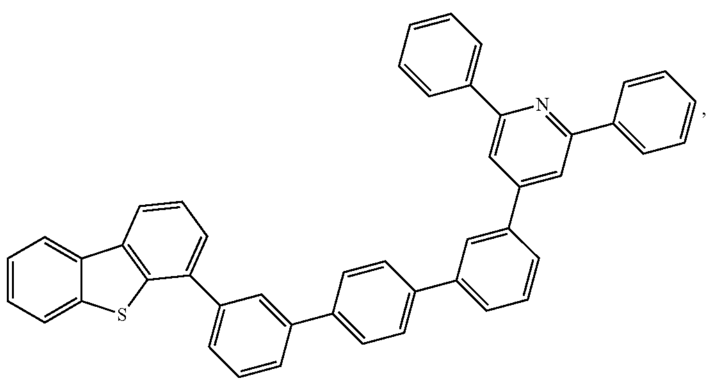
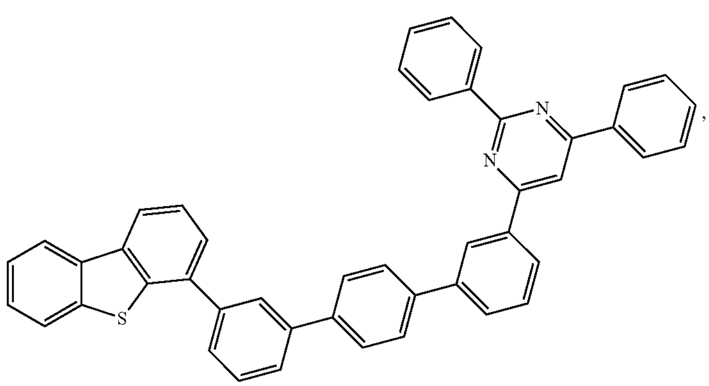
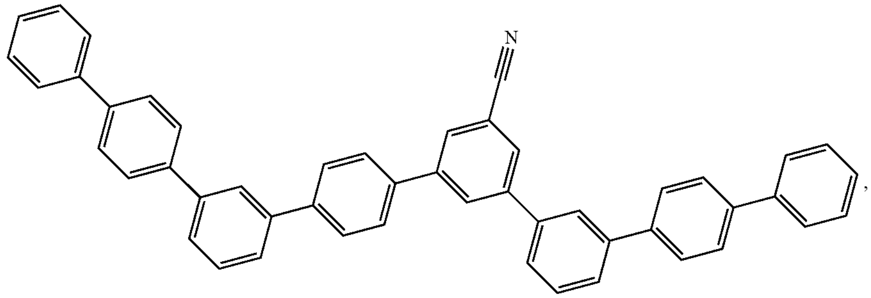

-continued

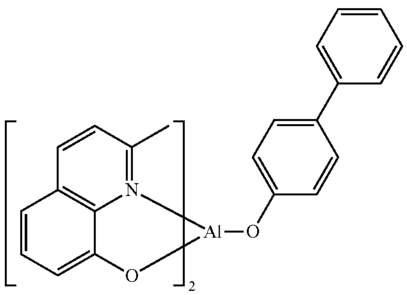
,
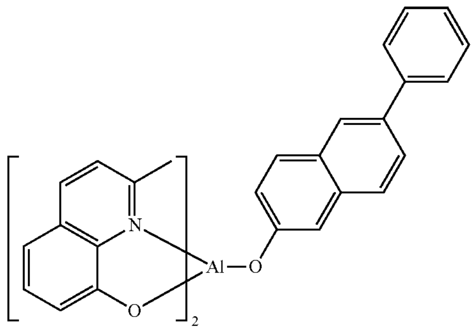
,
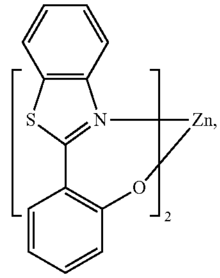

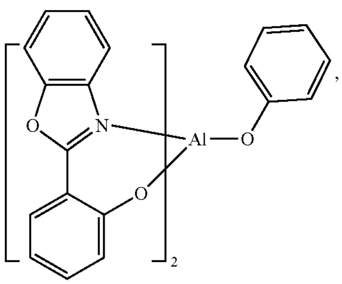
,
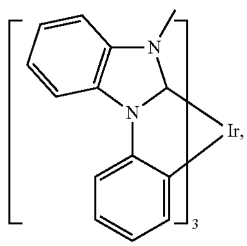

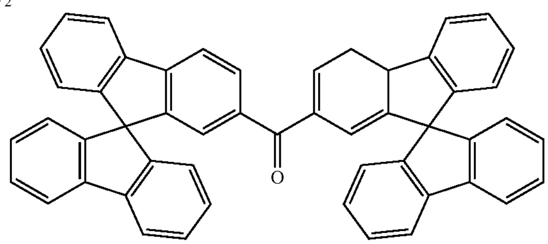
,

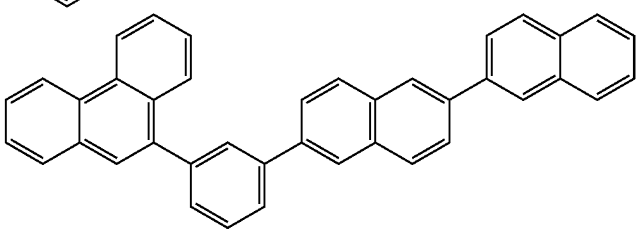
,

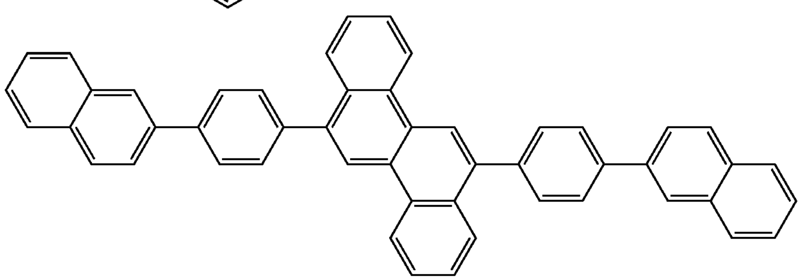
, and

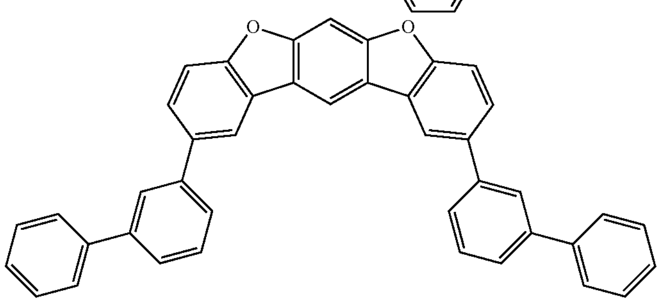
.

e) Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
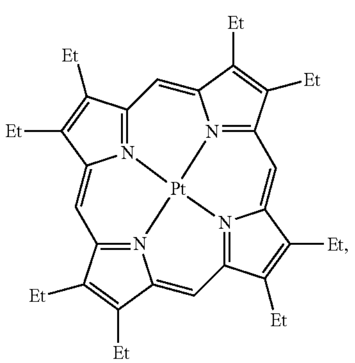
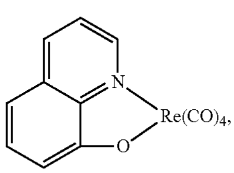
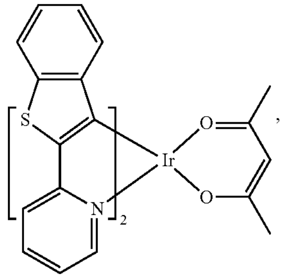
-continued
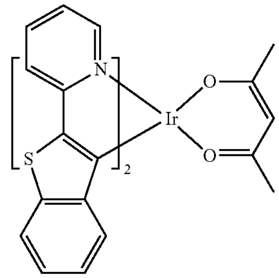
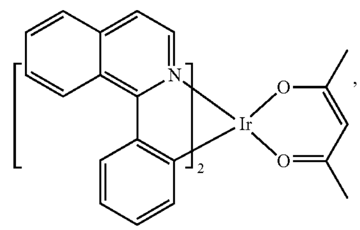
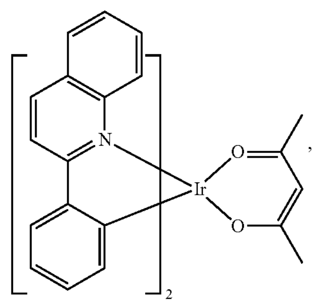
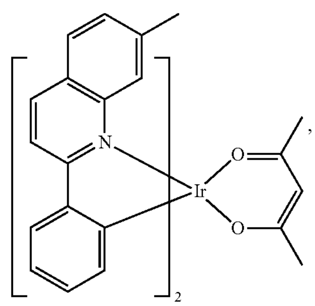
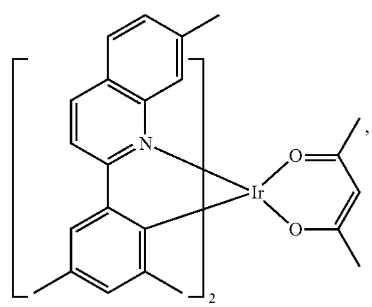
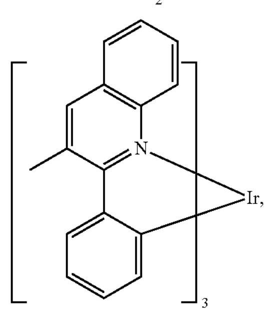

-continued
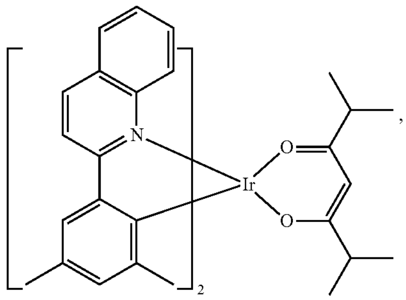
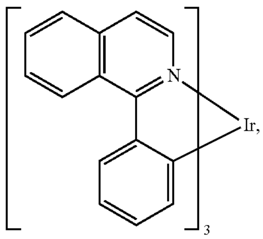
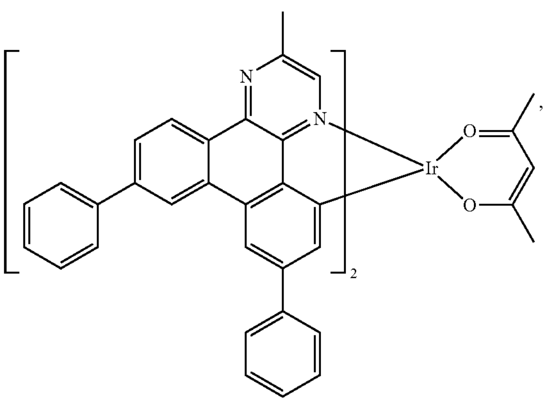
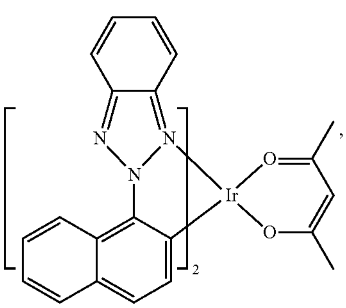
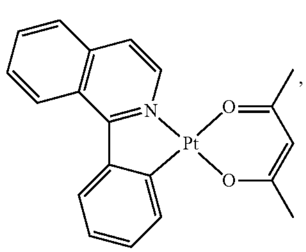
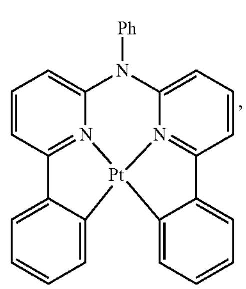
-continued
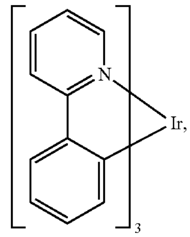
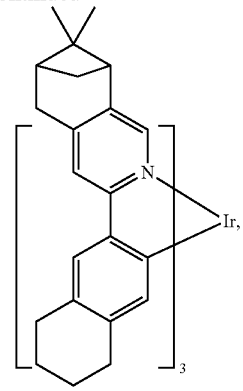
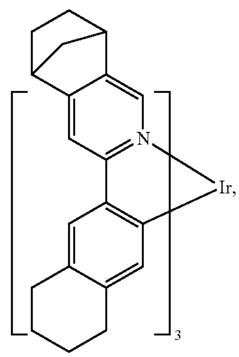
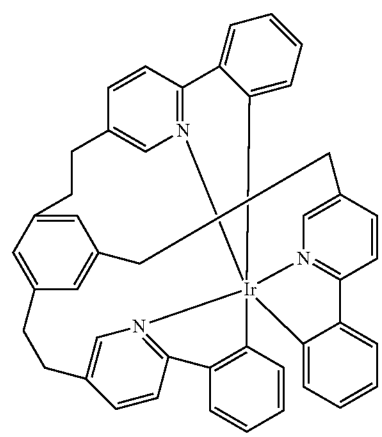
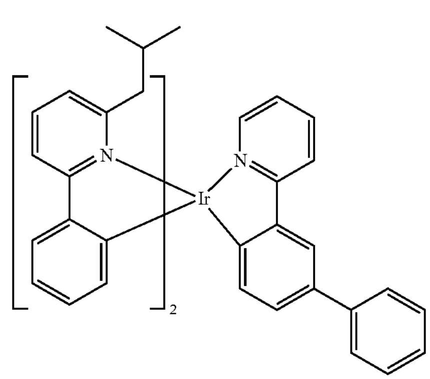

-continued
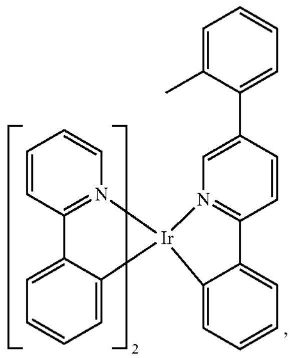
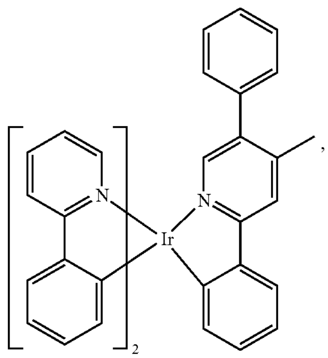
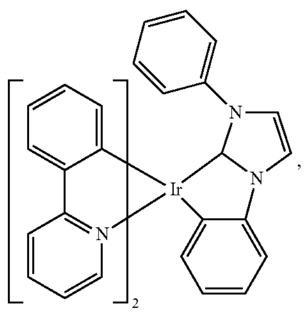
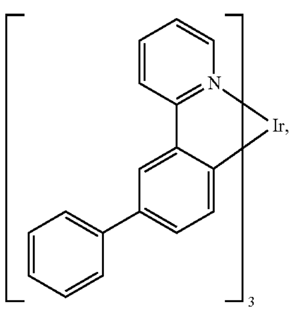
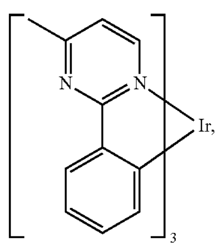
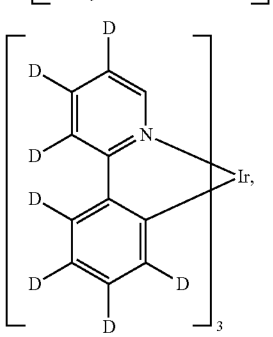
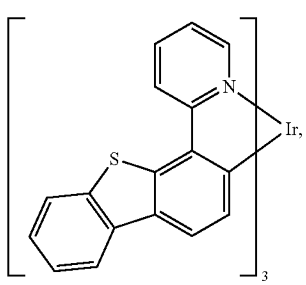
-continued
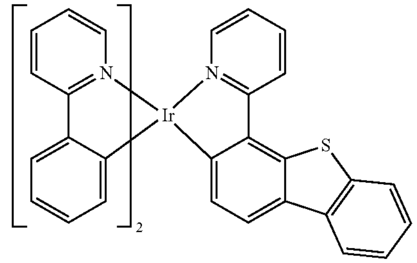
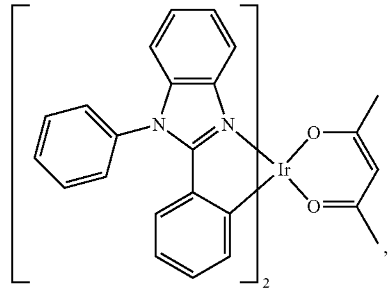
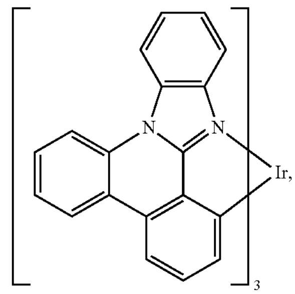
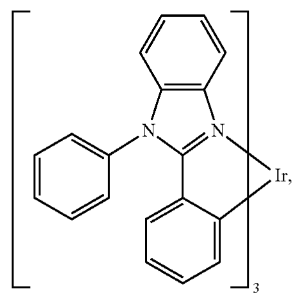
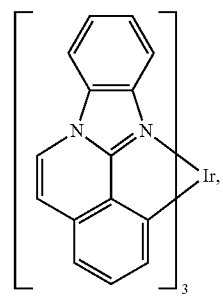
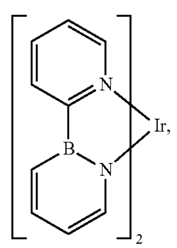
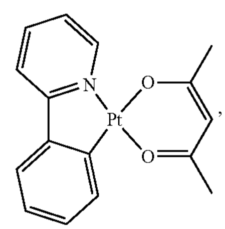
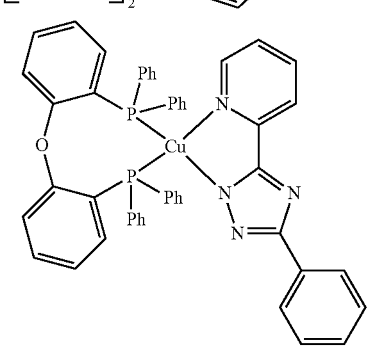

-continued
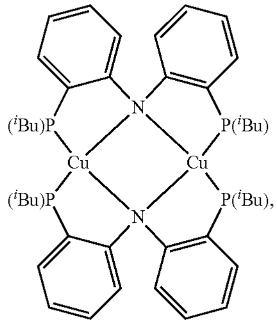
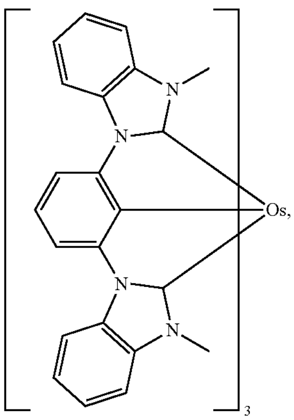
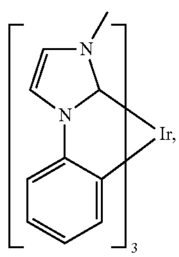
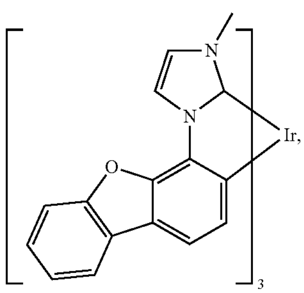
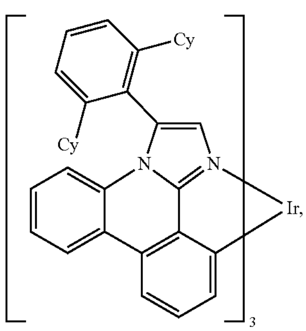
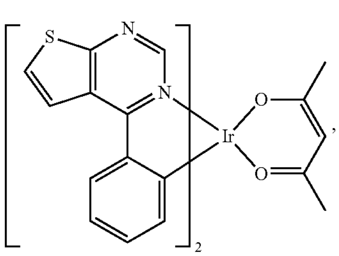
-continued
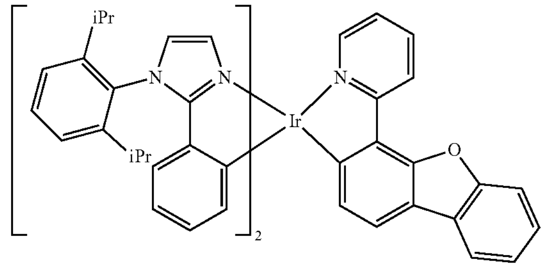
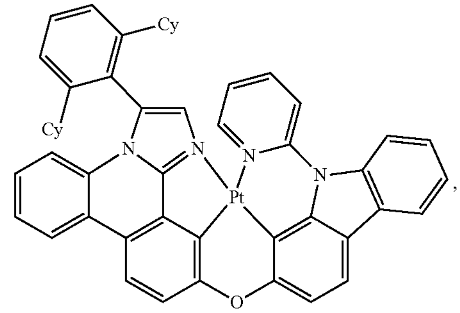
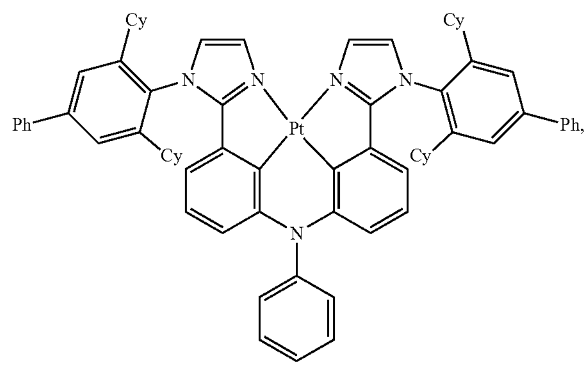
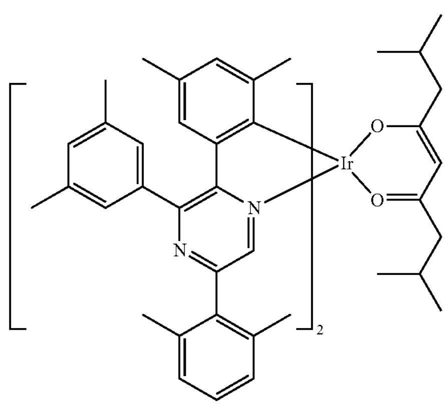
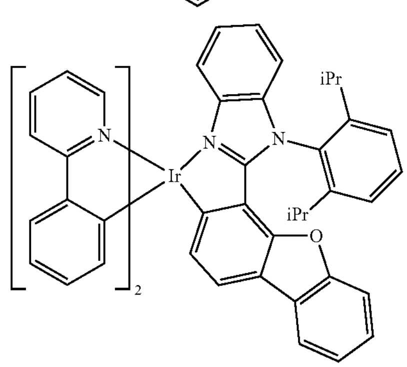

-continued
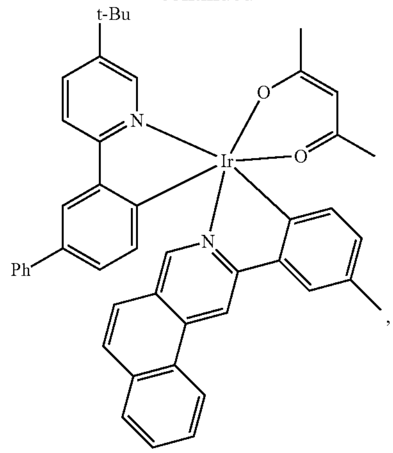
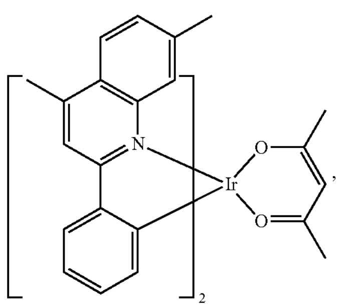
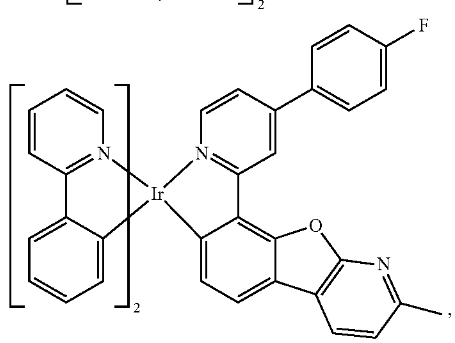
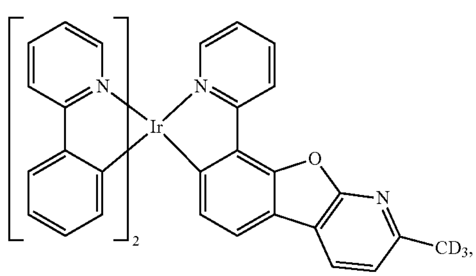
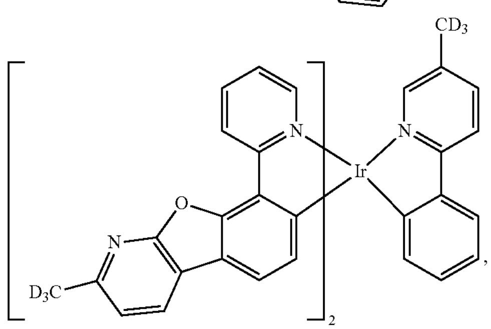
-continued
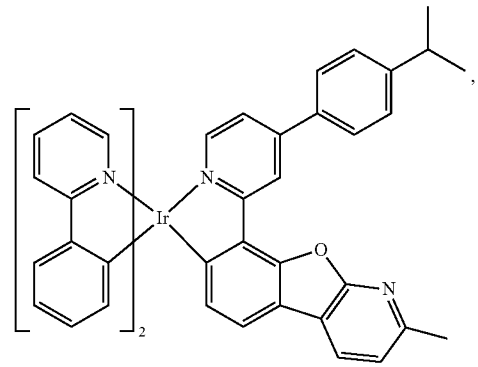
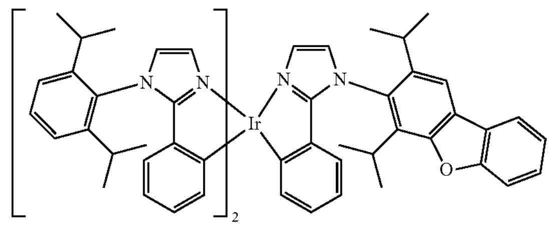
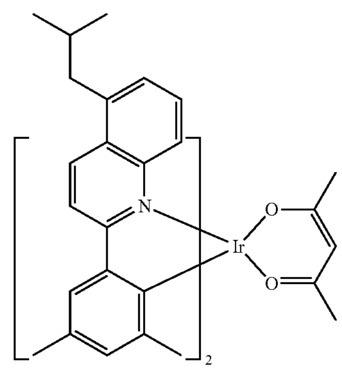
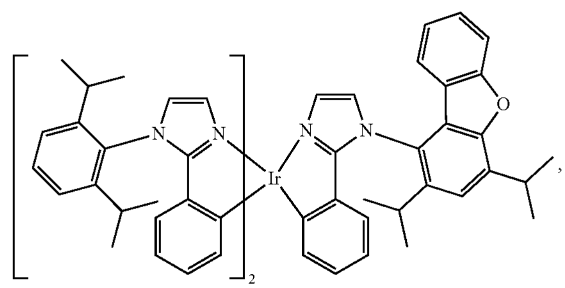
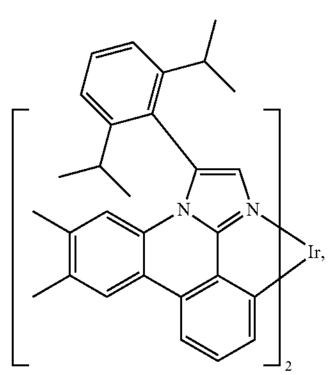

-continued
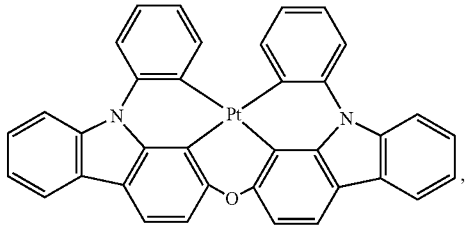
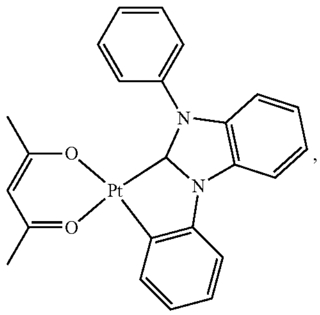
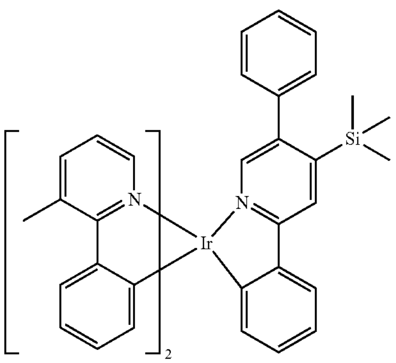
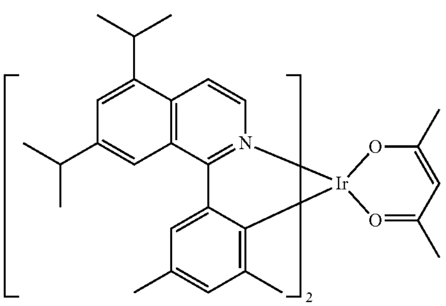
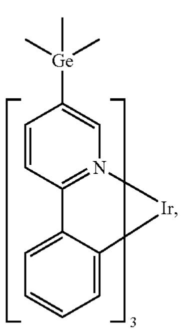
-continued
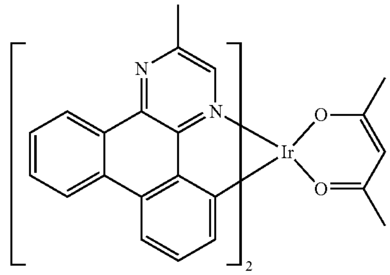
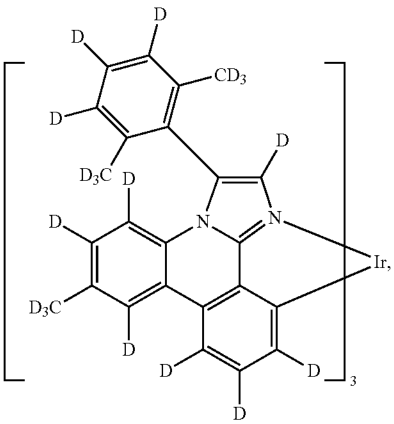
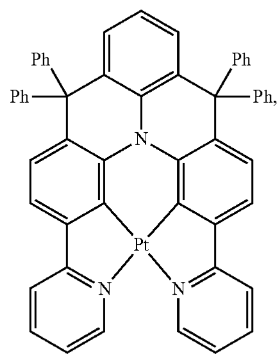
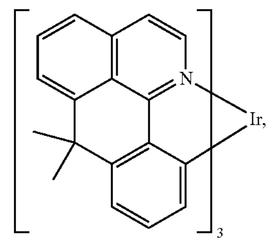
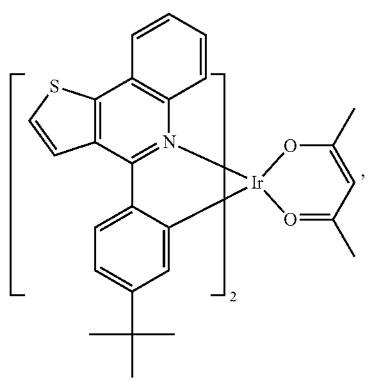
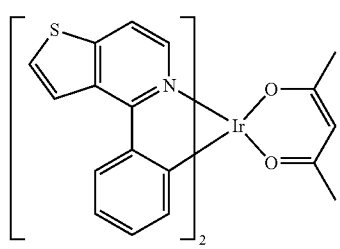

-continued
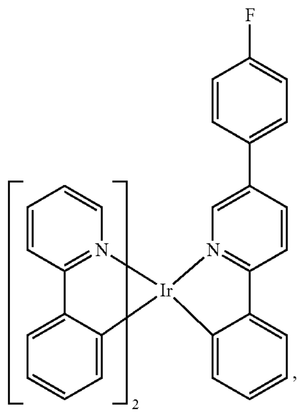
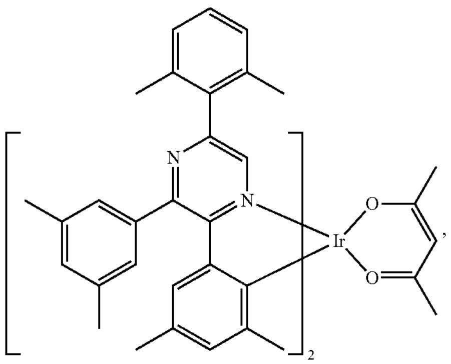
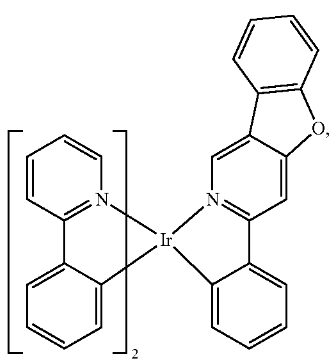
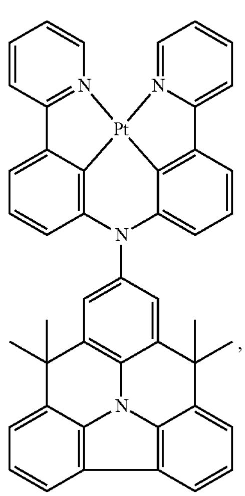
-continued
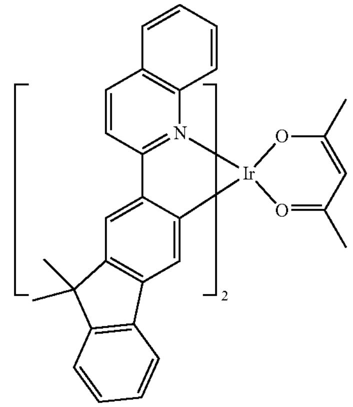
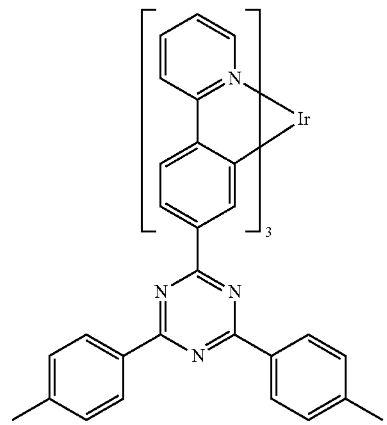
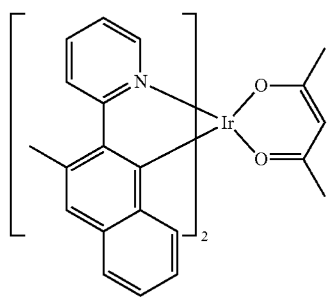
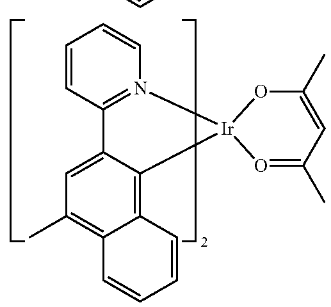
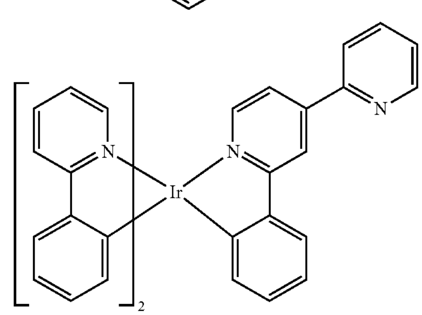

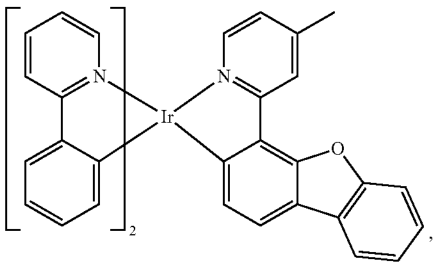
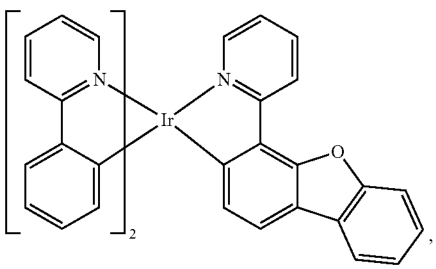
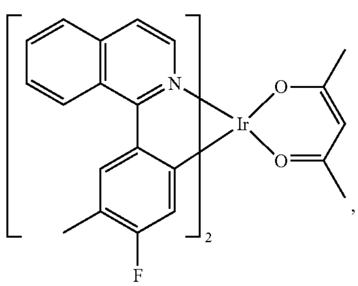
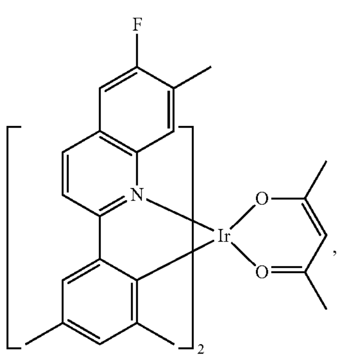
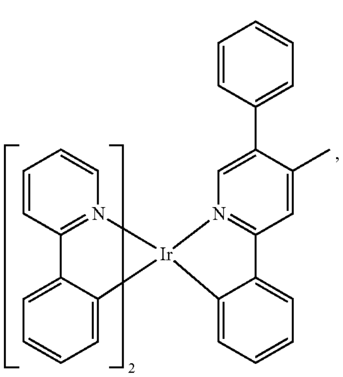
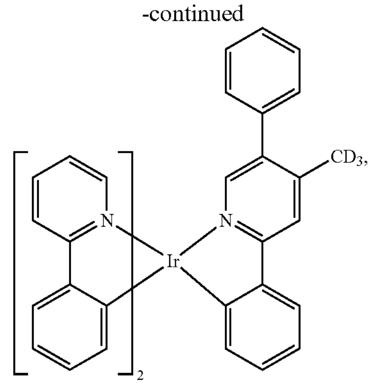
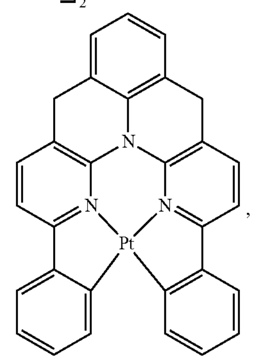
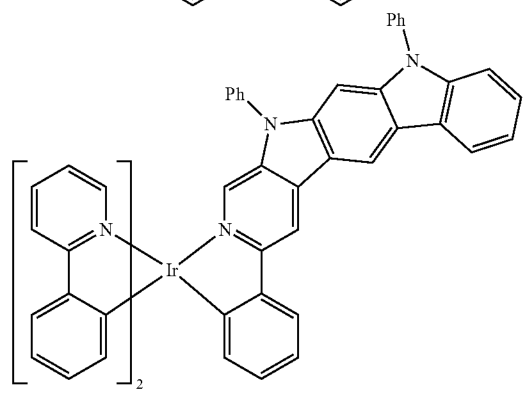
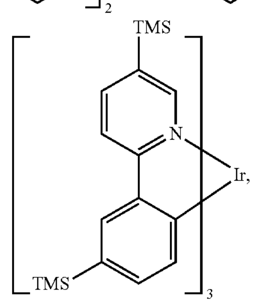
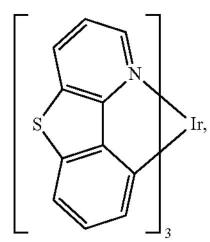
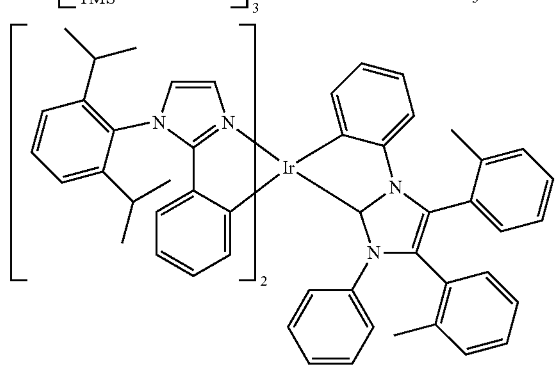

-continued
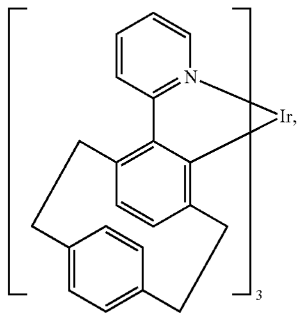
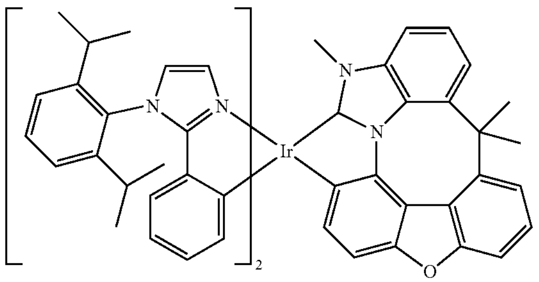
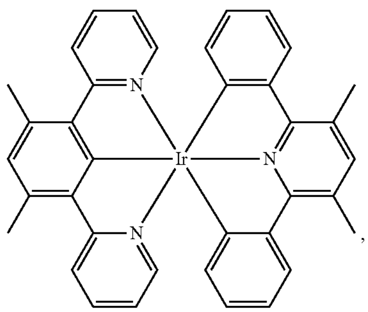
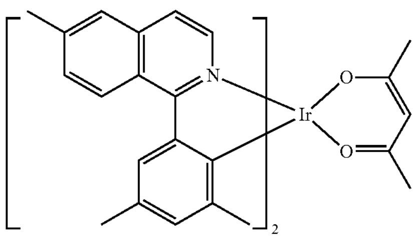
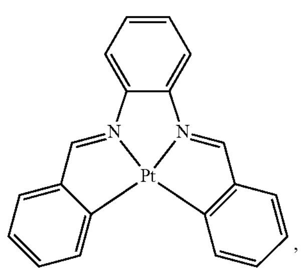
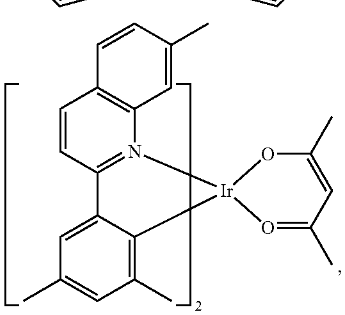
-continued
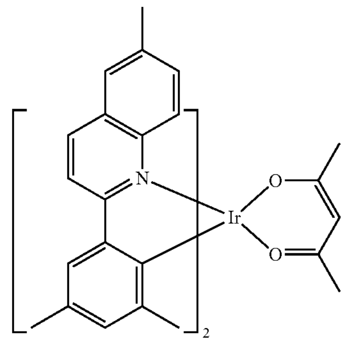
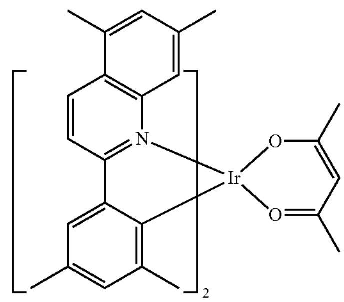
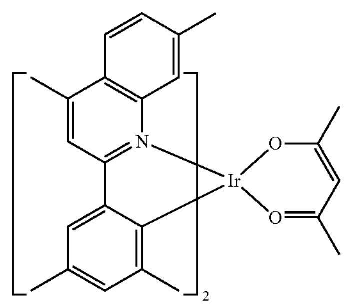
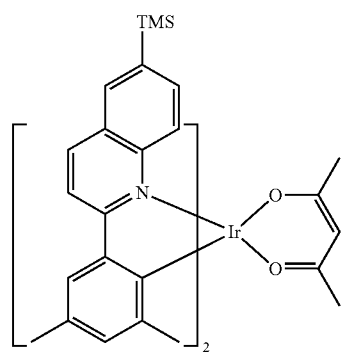
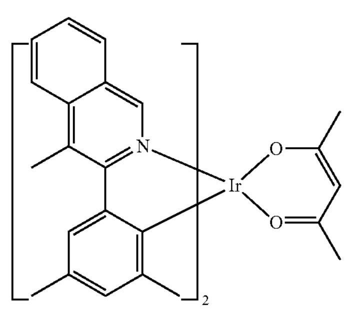

-continued
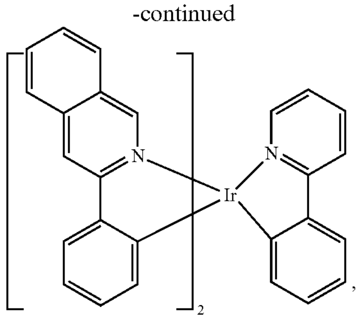
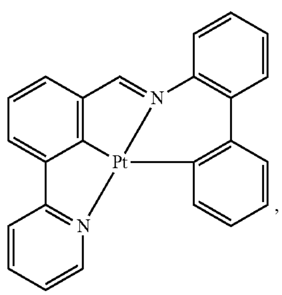
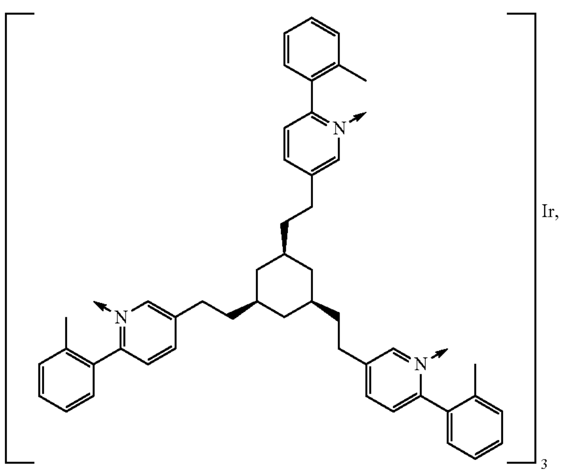
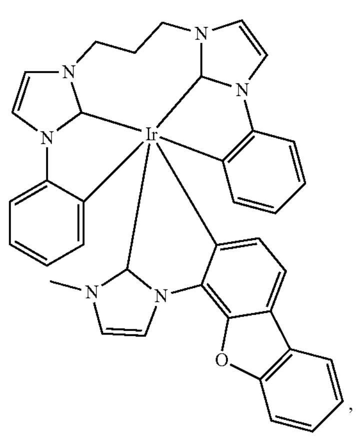
-continued
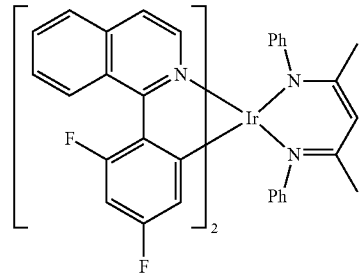
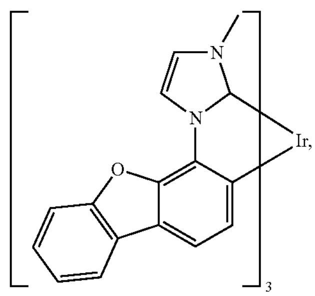
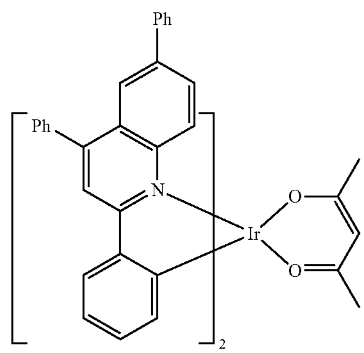
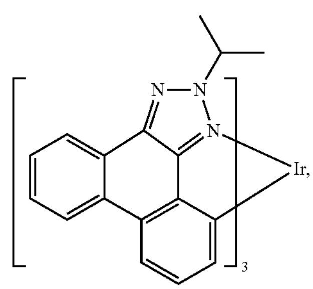
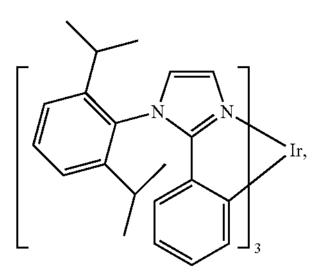

-continued

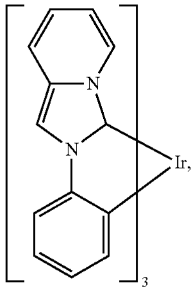

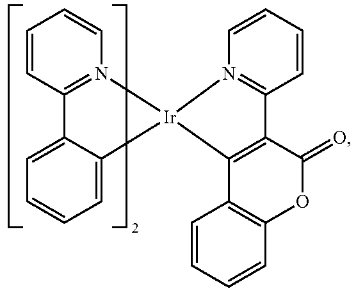

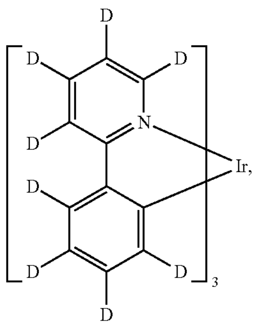

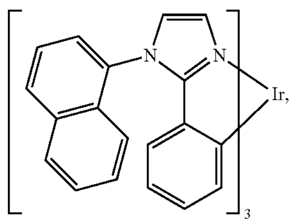

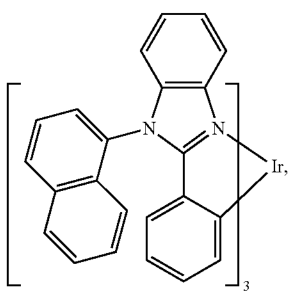

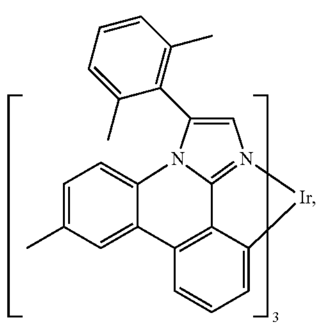

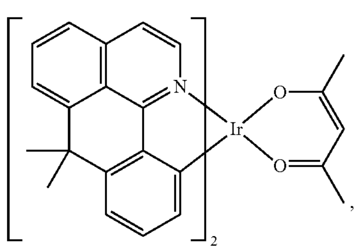

-continued

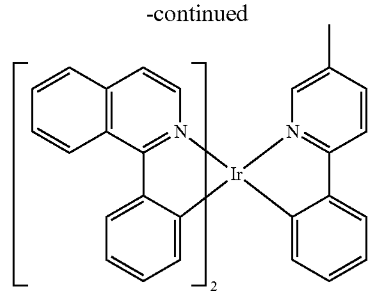

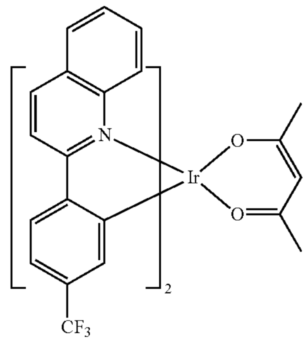

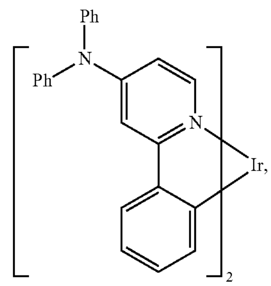

and

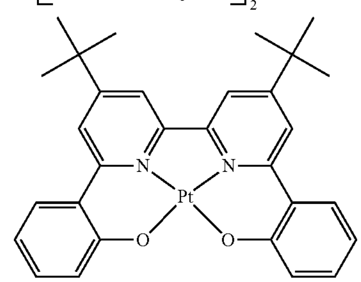

f) HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

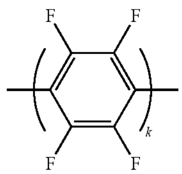

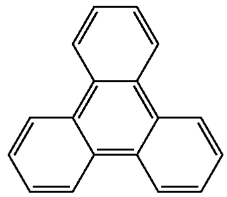

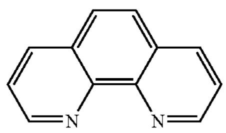

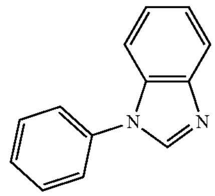

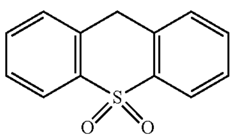

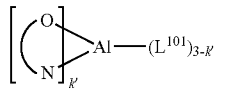

wherein k is an integer from 1 to 20; $L^{101}$ is another ligand, k' is an integer from 1 to 3.

g) ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

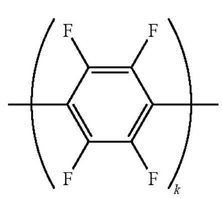

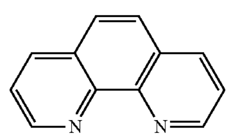

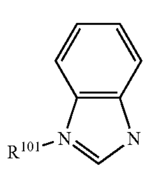

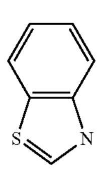

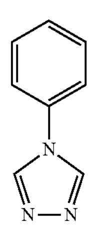

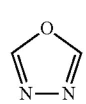

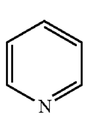

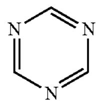

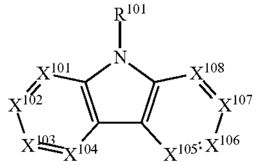

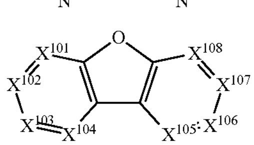

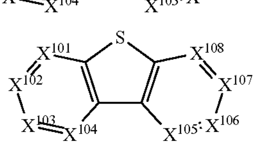

-continued

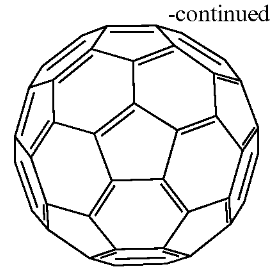

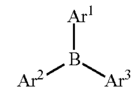

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

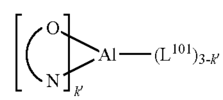

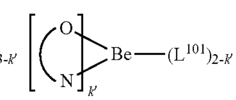

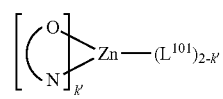

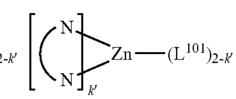

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535, -continued
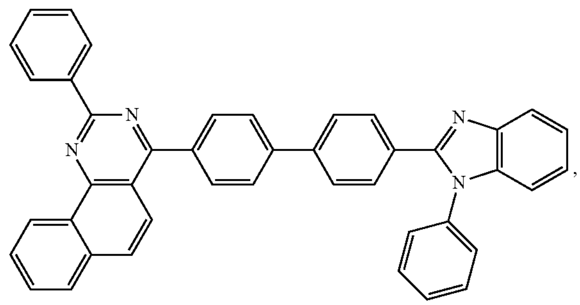
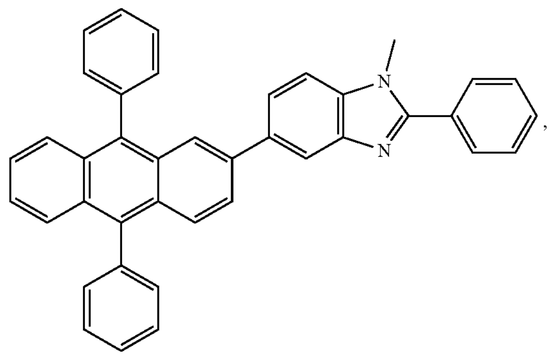
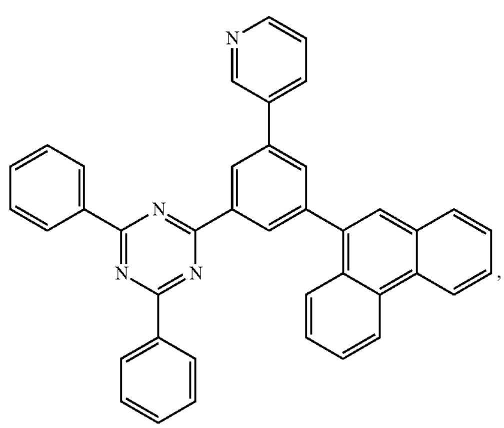
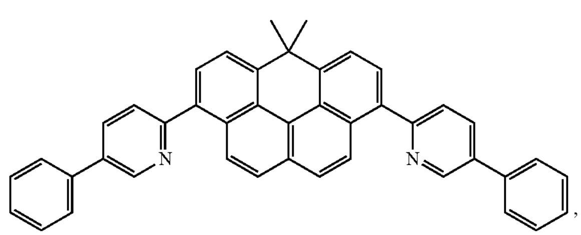
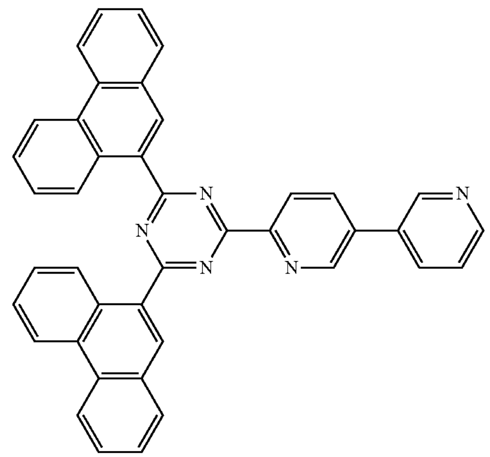
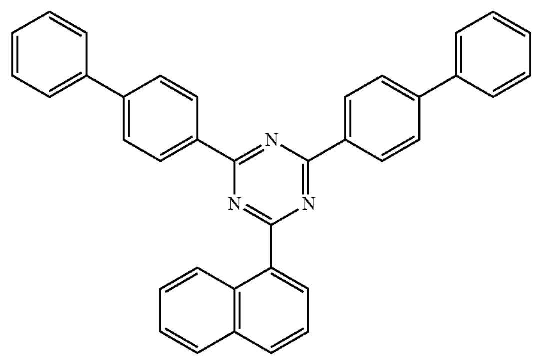
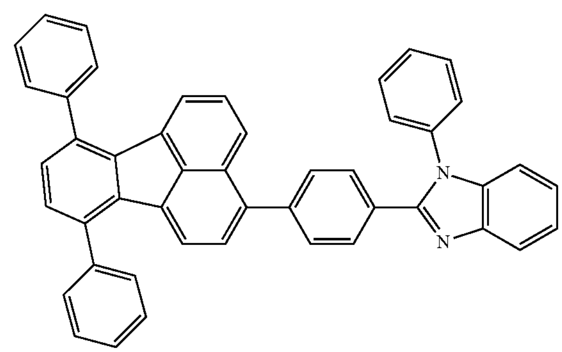
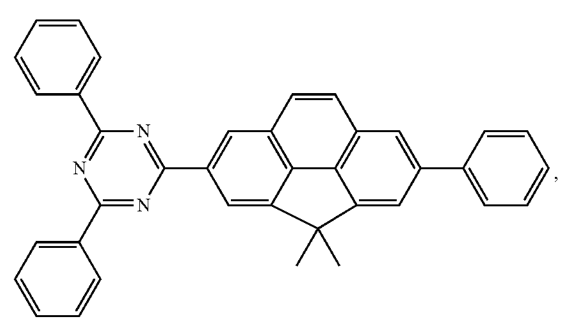

-continued
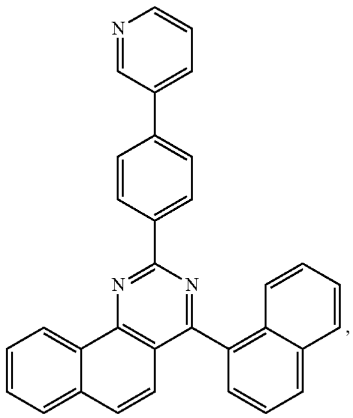
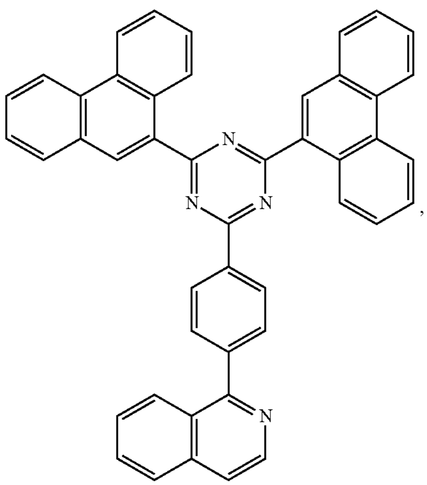
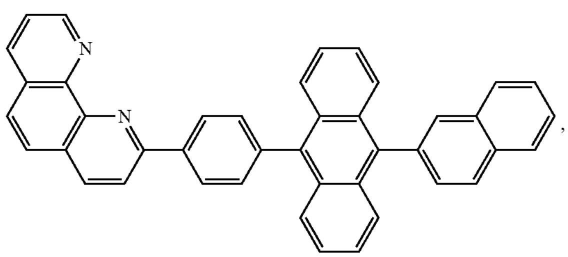
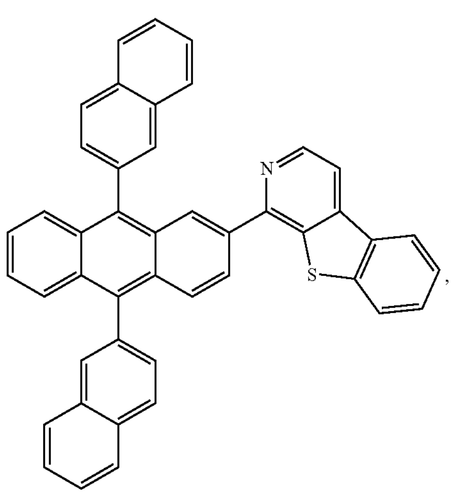
-continued
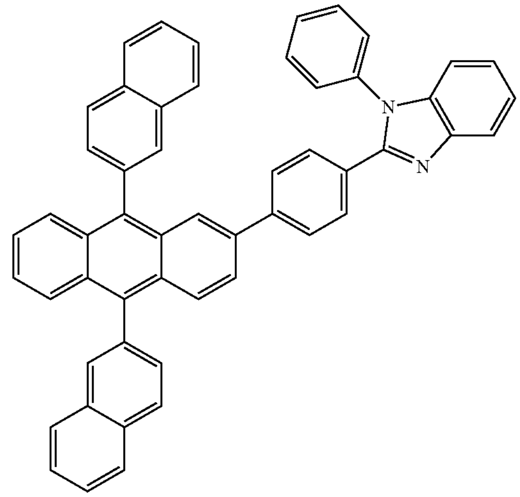
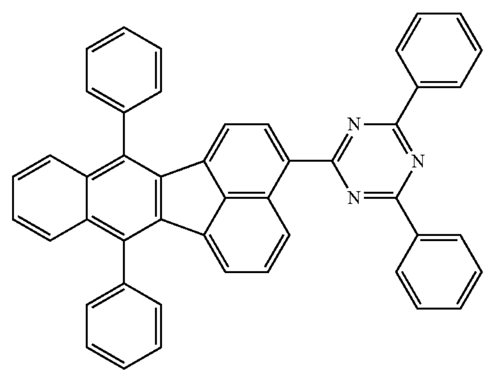
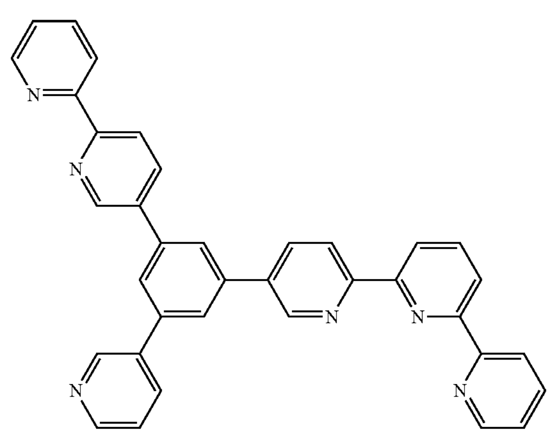

-continued
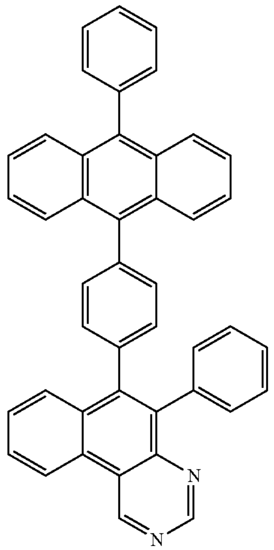
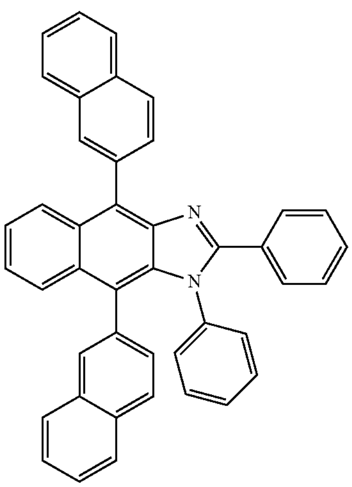
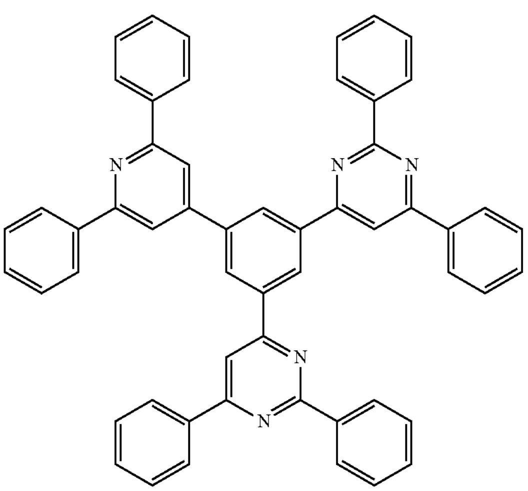
-continued
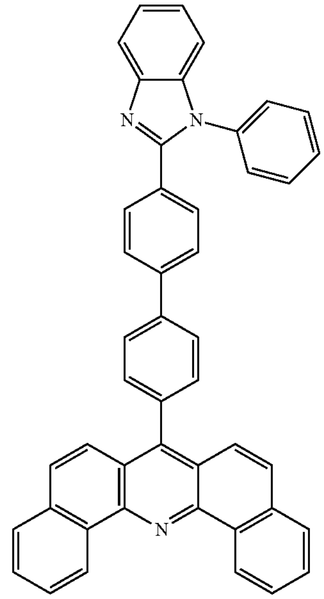
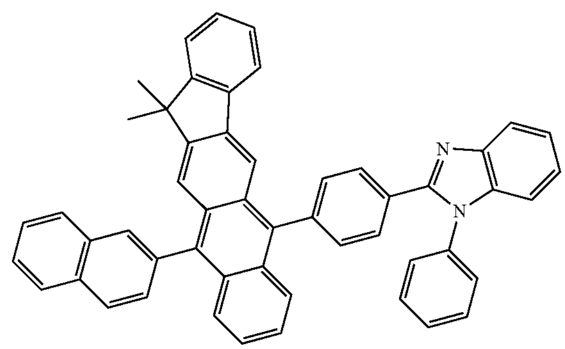
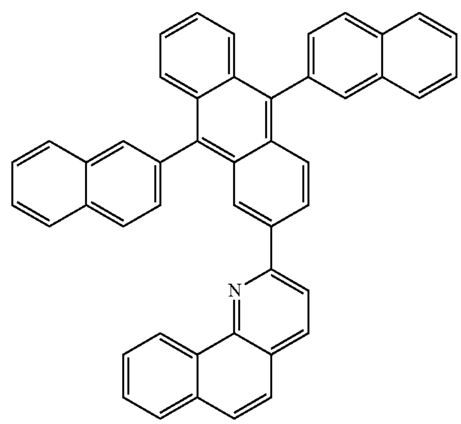
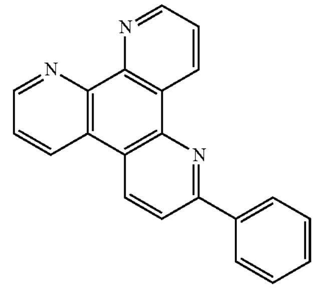

-continued
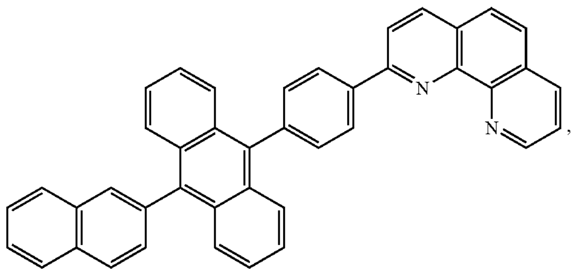
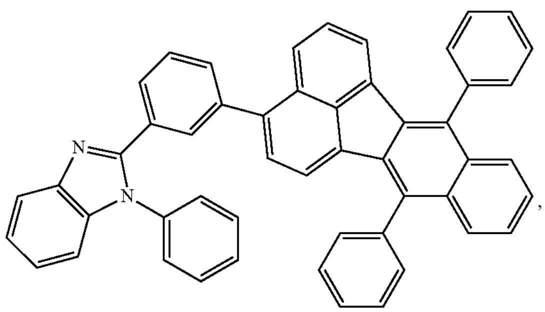
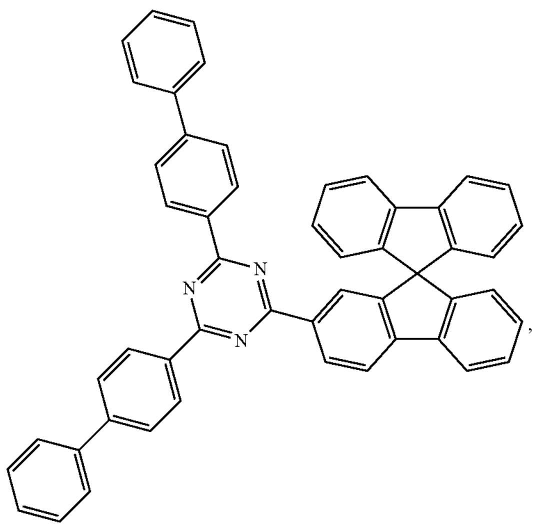
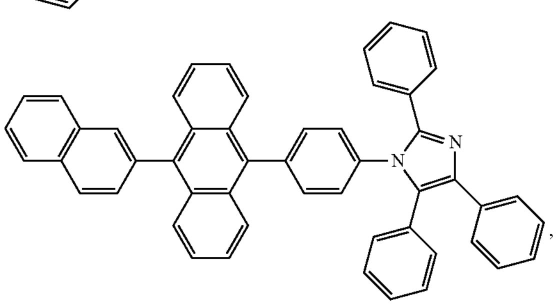
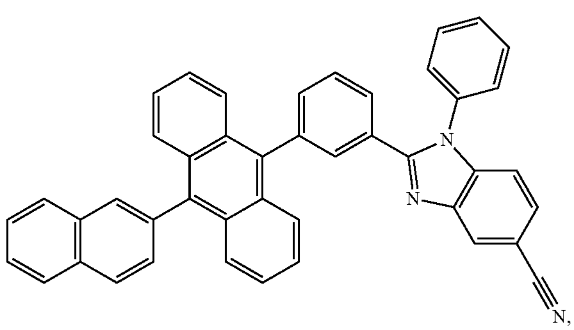
-continued
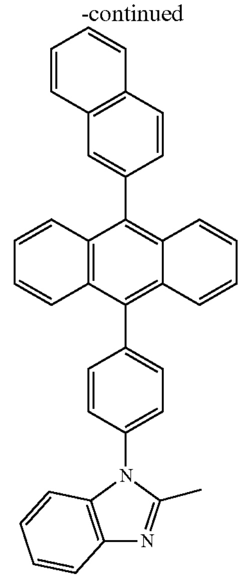
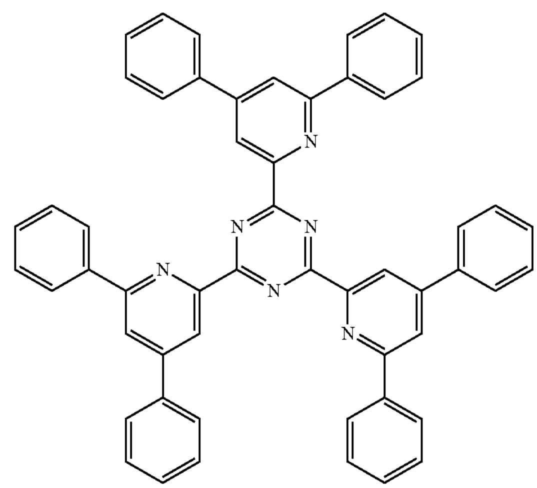
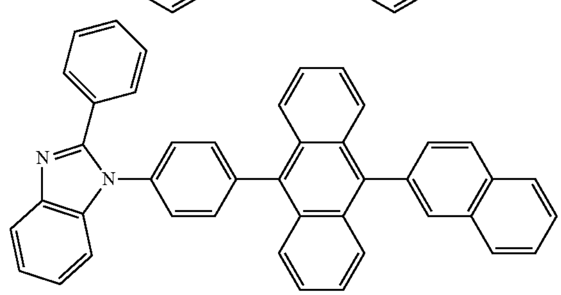
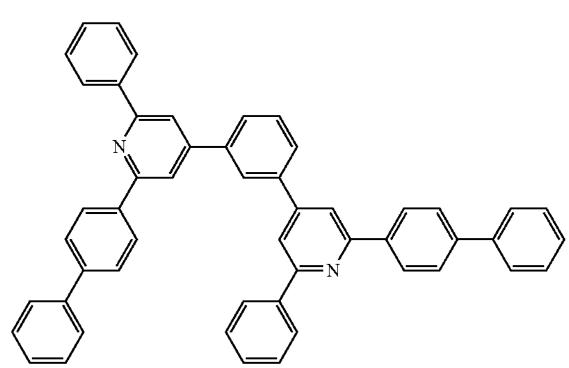

-continued

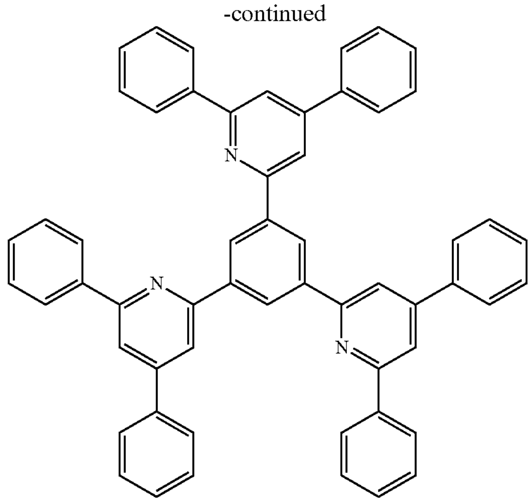

,

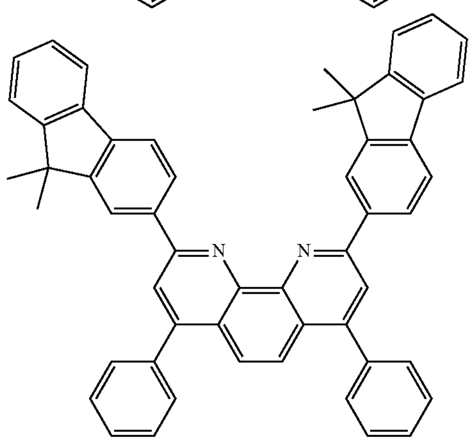

, and

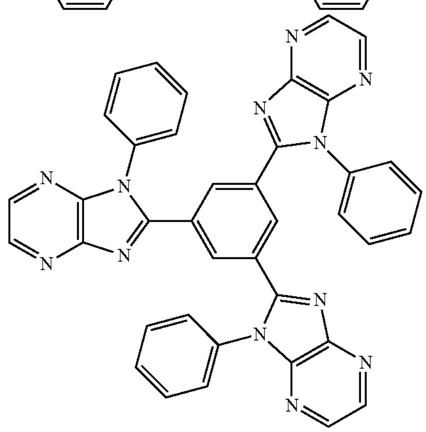

.

h) Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:

a substrate;

a first electrode;

an organic emissive layer comprising an organic emissive material disposed over the first electrode; and an enhancement layer, comprising a plasmonic material exhibiting surface plasmon resonance that non-radiatively couples to the organic emissive material and transfers excited state energy from the organic emissive material to the non-radiative mode of surface plasmon polaritons, disposed over the organic emissive layer, wherein the enhancement layer is provided no more than a threshold distance away from the organic emissive layer, and wherein the organic emissive material has a total non-radiative decay rate constant and a total radiative decay rate constant due to the presence of the enhancement layer, and the threshold distance is where the total non-radiative decay rate constant is equal to the total radiative decay rate constant.

2. The device of claim 1, wherein the organic emissive layer has a vertical dipole ratio (VDR) value equal or greater than 0.33.

3. The device of claim 1, wherein the organic emissive material has a vertical dipole ratio (VDR) value equal or greater than 0.33.

4. The device of claim 1, further comprising an outcoupling structure that comprises a plurality of nanoparticles.

5. The device of claim 4, further comprising:

a material disposed between the enhancement layer and the plurality of nanoparticles.

6. The device of claim 4, wherein the plurality of nanoparticles are formed from at least one selected from the group consisting of: Ag particles, Al particles, Ag—Al alloys, Au particles, Au—Ag alloys, dielectric material, semiconductor materials, an alloy of metal, a mixture of dielectric materials, a stack of one or more materials, and a core of one type of material and that is coated with a shell of a different type of material.

7. The device of claim 4, wherein the plurality of nanoparticles are coated.

8. The device of claim 4, wherein the plurality of nanoparticles are metallic and coated with a non-metallic coating.

9. The device of claim 4, wherein the plurality of nanoparticles include at least one from the group consisting of: a metal, a dielectric material, and a hybrid of metal and dielectric material.

10. The device of claim 4, wherein the plurality of nanoparticles are coated with an oxide layer, and wherein a thickness of the oxide layer is selected to tune a plasmonic resonance wavelength of the plurality of nanoparticles or a nanopatch antenna.

11. The device of claim 4, wherein the plurality of nanoparticles are colloidally-synthesized nanoparticles formed from a solution.

12. The device of claim 4, wherein the plurality of nanoparticles are arranged in a periodic array.

13. The device of claim 12, wherein the periodic array has a predetermined array pitch.

14. The device of claim 4, wherein the plurality of nanoparticles are arranged in a non-periodic array.

15. The device of claim 4, wherein a shape of the plurality of nanoparticles is at least one selected from the group consisting of: cubes, spheres, spheroids, cylindrical, parallelepiped, rod-shaped, star-shaped, pyramidal, and multifaceted three-dimensional objects.

16. The device of claim 4, wherein a size of at least one of the plurality of nanoparticles is from 5 nm to 1000 nm.

17. The device of claim 1, wherein the first electrode is at least one selected from a group consisting of: a metal, a semiconductor, and a transparent conducting oxide.

18. The device of claim 1, wherein the electrode layer is comprised of at least one from the group consisting of: Ag, Al, Au, Ir, Pt, Ni, Cu, W, Ta, Fe, Cr, Mg, Ga, Rh, Ti, Ru, Pd, In, Bi, and Ca.

19. A consumer product comprising:

a device comprising:

a substrate;

a first electrode;

an organic emissive layer comprising an organic emissive material disposed over the first electrode;

an enhancement layer, comprising a plasmonic material exhibiting surface plasmon resonance that non-radiatively couples to the organic emissive material and transfer excited state energy from the organic emissive material to non-radiative mode of surface plasmon polaritons, disposed over the organic emissive layer, wherein the enhancement layer is provided no more than a threshold distance away from the organic emissive layer, and wherein the organic emissive material has a total non-radiative decay rate constant and a total radiative decay rate constant due to the presence of the enhancement layer, and the threshold distance is where the total non-radiative decay rate constant is equal to the total radiative decay rate constant.

20. The consumer product of claim 19, wherein the consumer product is at least one type selected from the group consisting of: display screens, lighting devices such as discrete light source devices or lighting panels, flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, cell phones, tablets, phablets, personal digital assistants (PDAs), wearable devices, laptop computers, digital cameras, camcorders, viewfinders, micro-displays that are less than 2 inches diagonal, 3-D displays, vehicle, aviation displays, a large area wall, a video walls comprising multiple displays tiled together, theater or stadium screen, a light therapy device, a sign, augmented reality (AR) or virtual reality (VR) displays, displays or visual elements in glasses or contact lenses, light emitting diode (LED) wallpaper, LED jewelry, and clothing.

* * * * *